(12) United States Patent
Kigoshi et al.

(10) Patent No.: US 12,413,044 B2
(45) Date of Patent: Sep. 9, 2025

(54) SEMICONDUCTOR LIGHT EMITTING DEVICE

(71) Applicant: ROHM CO., LTD., Kyoto (JP)

(72) Inventors: Satohiro Kigoshi, Kyoto (JP); Yuki Tanuma, Kyoto (JP); Gen Muto, Kyoto (JP); Minoru Murayama, Kyoto (JP); Okimoto Kondo, Kyoto (JP); Chikoto Ikeda, Kyoto (JP); Yusuke Nakakohara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 758 days.

(21) Appl. No.: 17/605,457

(22) PCT Filed: Apr. 17, 2020

(86) PCT No.: PCT/JP2020/016810
§ 371 (c)(1),
(2) Date: Oct. 21, 2021

(87) PCT Pub. No.: WO2020/218175
PCT Pub. Date: Oct. 29, 2020

(65) Prior Publication Data
US 2022/0190556 A1    Jun. 16, 2022

(30) Foreign Application Priority Data

Apr. 26, 2019 (JP) .................................. 2019-085562
Nov. 14, 2019 (JP) .................................. 2019-206439

(51) Int. Cl.
H01S 5/183 (2006.01)
H01S 5/0239 (2021.01)
H01S 5/042 (2006.01)

(52) U.S. Cl.
CPC ........ *H01S 5/04256* (2019.08); *H01S 5/0239* (2021.01); *H01S 5/183* (2013.01)

(58) Field of Classification Search
CPC .................................................... H01S 5/0239
See application file for complete search history.

(56) References Cited

U.S. PATENT DOCUMENTS

2012/0146084 A1   6/2012  Chang et al.
2021/0313762 A1*  10/2021  Minamiru .............. G01B 11/24

FOREIGN PATENT DOCUMENTS

JP    2000312033    11/2000
JP    2011044418    3/2011
(Continued)

OTHER PUBLICATIONS

Pimenta, Tales & Moreno, Robson & Zoccal, Leonardo. (2011). Rf CMOS Background. 10.5772/20663. (Year: 2011).*

(Continued)

*Primary Examiner* — Minsun O Harvey
*Assistant Examiner* — Stephen Sutton Kotter
(74) *Attorney, Agent, or Firm* — HSML P.C.

(57) ABSTRACT

A semiconductor light emitting device includes a substrate, a common conductive portion formed on the substrate, a semiconductor light emitting element mounted on the common conductive portion, and an electronic component mounted on the common conductive portion and electrically connected to the semiconductor light emitting element by the common conductive portion. This structure shortens the conductive path between the semiconductor light emitting element and the electronic component, thereby reducing capacitance caused by the conductive path between the semiconductor light emitting element and the electronic component. Thus, while reducing parasitic capacitance, the semiconductor light emitting element and the electronic component are electrically connected.

16 Claims, 81 Drawing Sheets

(56) References Cited

FOREIGN PATENT DOCUMENTS

| | | |
|---|---|---|
| JP | 2012015438 | 1/2012 |
| JP | 2013041866 | 2/2013 |
| JP | 2015023229 | 2/2015 |
| JP | 2015115389 | 6/2015 |

OTHER PUBLICATIONS

International Search Report and Written Opinion issued for International Patent Application No. PCT/JP2020/016810, Date of mailing: Jul. 28, 2020, 11 pages including English translation of Search Report.
Notice of Reasons for Refusal issued for Japanese Patent Application No. 2021-516066, Dispatch Date: Oct. 17, 2023, 6 pages including English machine translation.
International Preliminary Report on Patentability issued for International Patent Application No. PCT/JP2020/016810, Date of mailing: Nov. 4, 2021, 11 pages including English translation.
Notice of Reasons for Refusal issued for Japanese Patent Application No. 2023-211301, Dispatch date: Feb. 25, 2025, 7 pages including English machine translation.

\* cited by examiner

SEMICONDUCTOR LIGHT EMITTING DEVICE

TECHNICAL FIELD

The present disclosure relates to a semiconductor light emitting device.

BACKGROUND ART

Patent Document 1 discloses a widely-known example of a semiconductor light emitting device including a semiconductor light emitting element as a light source. The semiconductor light emitting device disclosed in Patent Document 1 includes the semiconductor light emitting element and a substrate on which the semiconductor light emitting element is mounted.

PRIOR ART DOCUMENT

Patent Document

Patent Document 1: Japanese Laid-Open Patent Publication No. 2013-41866

SUMMARY OF THE INVENTION

Problems that the Invention is to Solve

For example, when the semiconductor light emitting device is used with an electronic component such as a capacitor or a switching element that drives the semiconductor light emitting element, the electronic component is arranged separately from the semiconductor light emitting device and electrically connected to the semiconductor light emitting device by a wire or the like. Such a structure has concern about parasitic capacitance caused by the wire or the like.

It is an objective of the present disclosure to provide a semiconductor light emitting device that electrically connects a semiconductor light emitting element to an electronic component while reducing parasitic capacitance.

Means for Solving the Problems

To achieve the above objective, a semiconductor light emitting device includes a substrate, a common conductive portion formed on the substrate, a semiconductor light emitting element mounted on the common conductive portion, and an electronic component mounted on the common conductive portion and electrically connected to the semiconductor light emitting element by the common conductive portion.

This structure shortens the conductive path between the semiconductor light emitting element and the electronic component. As a result, parasitic capacitance caused by the conductive path between the semiconductor light emitting element and the electronic component is reduced. Thus, while reducing the parasitic capacitance, the semiconductor light emitting element and the electronic component are electrically connected.

Effects of the Invention

With the semiconductor light emitting device described above, the semiconductor light emitting element is electrically connected to the electronic component while reducing parasitic capacitance.

MODES FOR CARRYING OUT THE INVENTION

First Embodiment

An embodiment of a semiconductor light emitting device will be described below with reference to the drawings. The embodiments described below exemplify configurations and methods for embodying a technical concept and are not intended to limit the material, shape, structure, layout, dimensions, and the like of each component to those described below. The embodiments described below may undergo various modifications.

Figure 1:
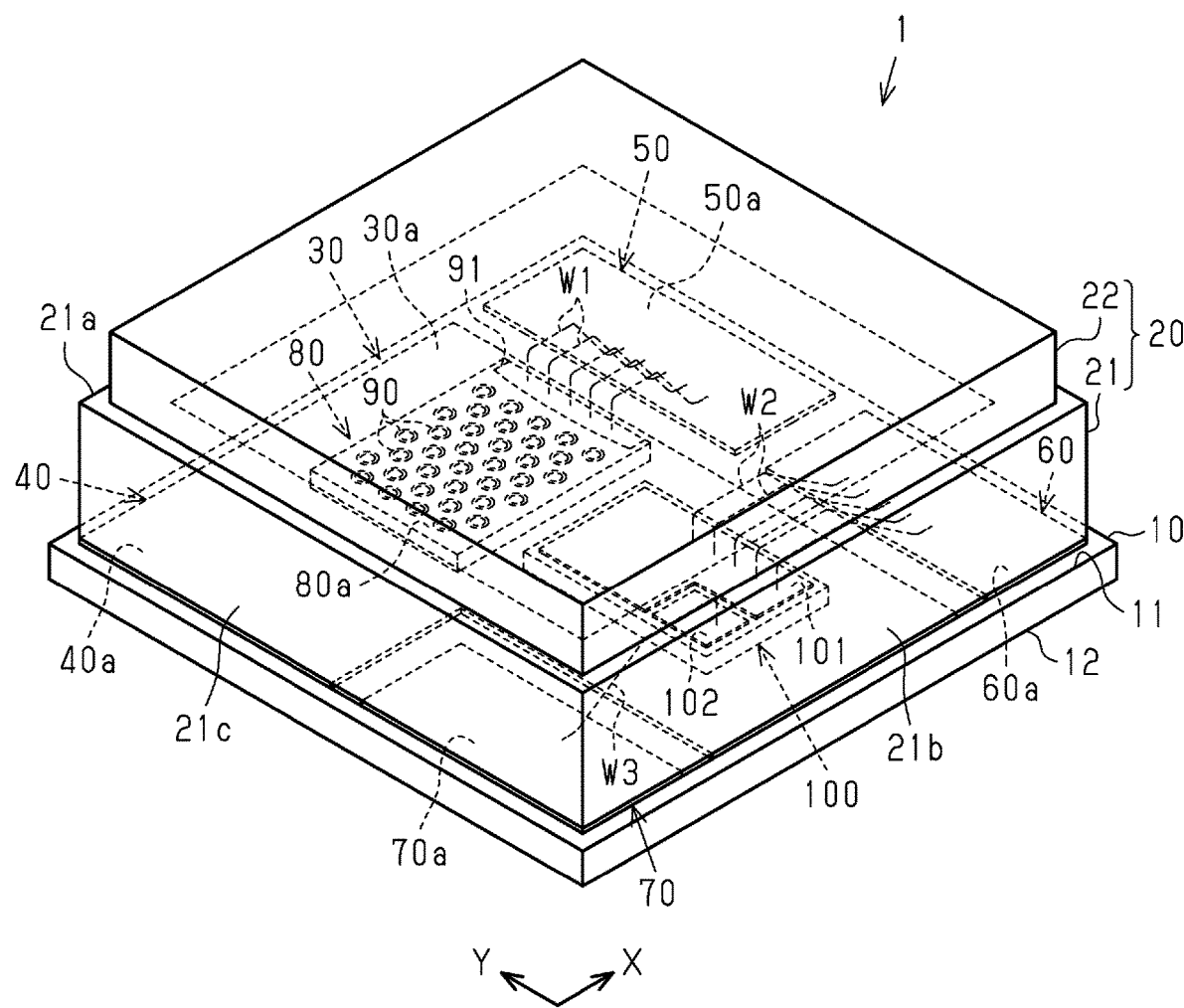
FIG. 1 is a perspective view showing an embodiment of a semiconductor light emitting device.
Figure 2:
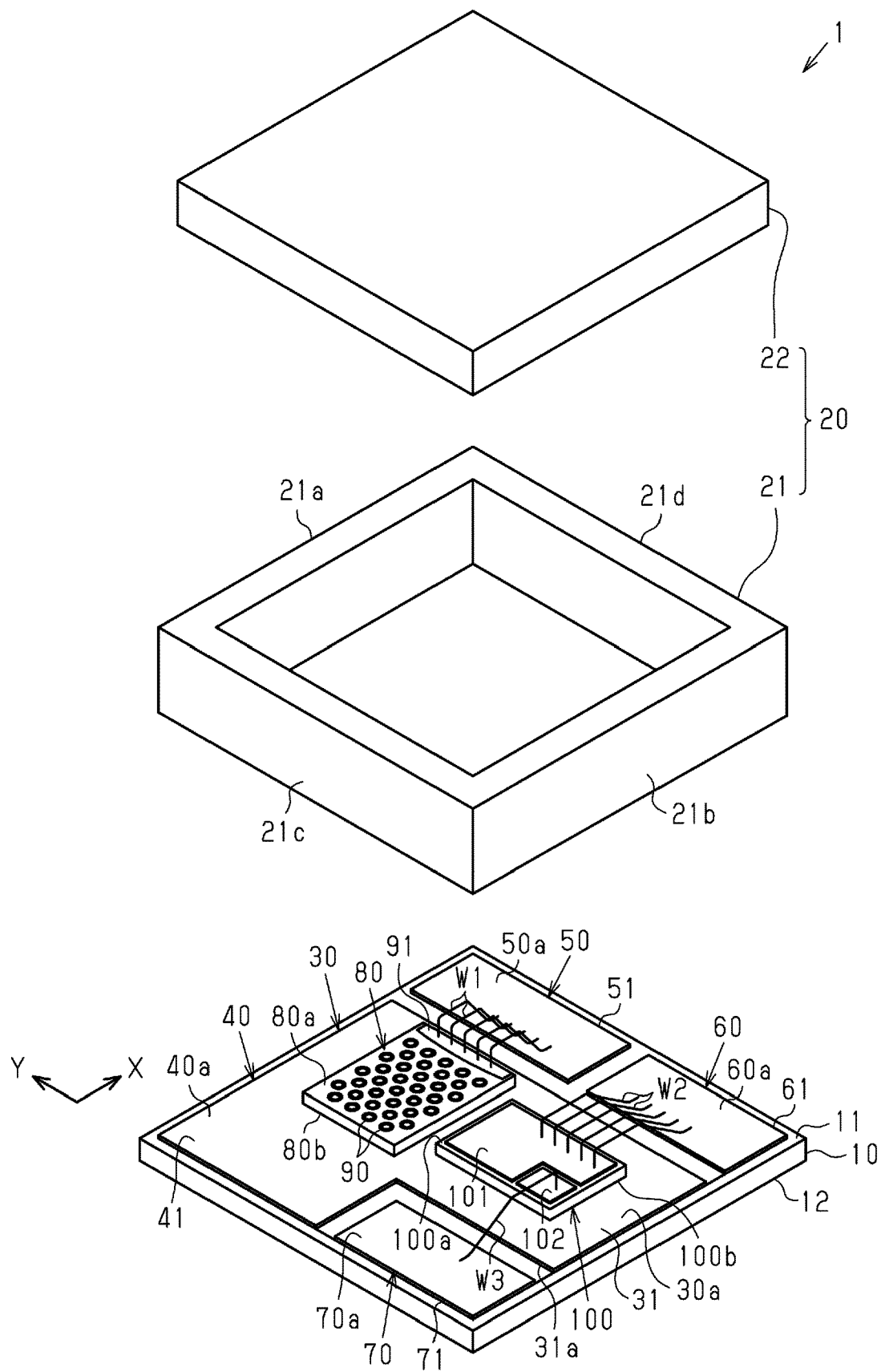
FIG. 2 is an exploded perspective view of the semiconductor light emitting device.
Figure 3:
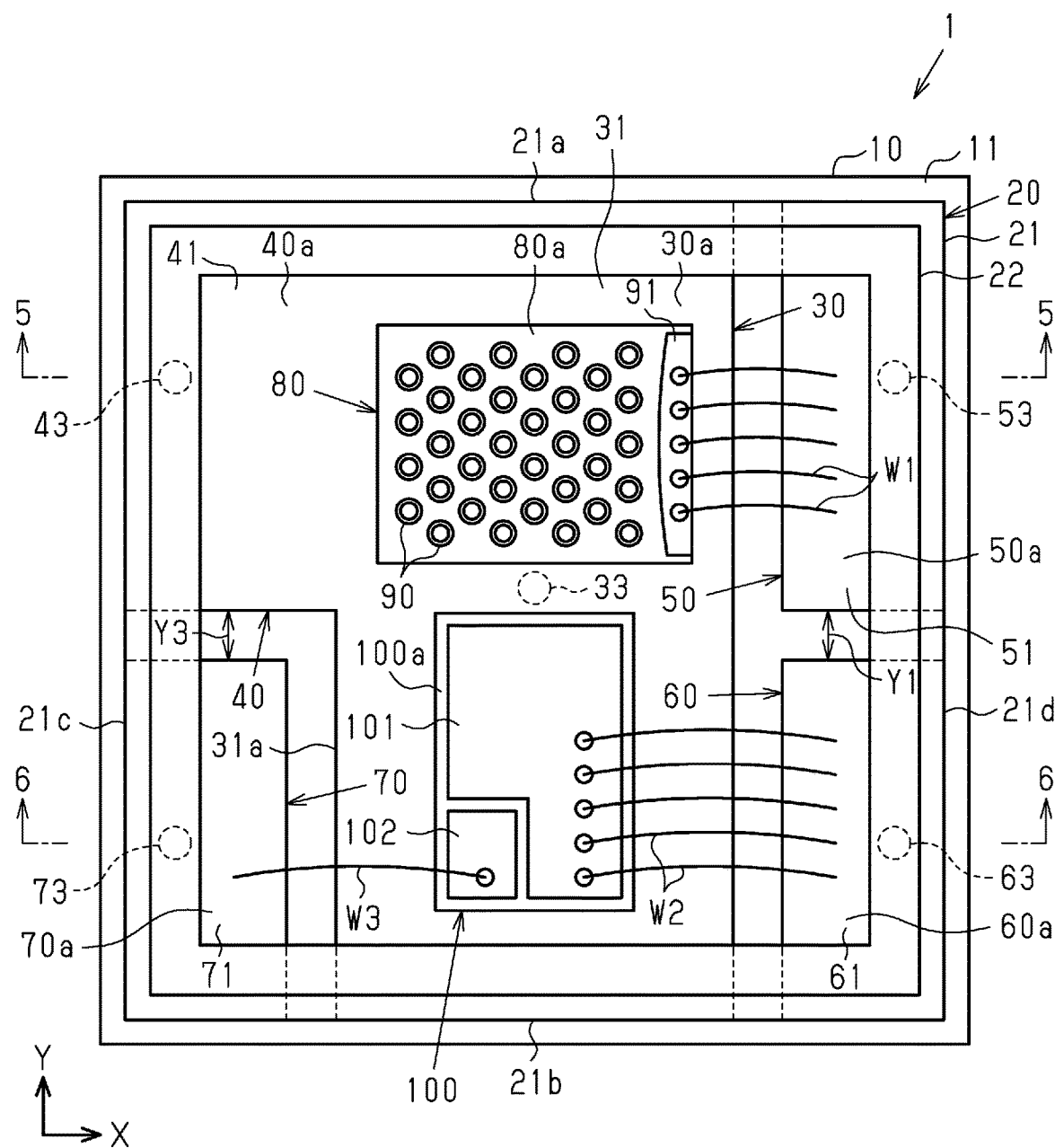
FIG. 3 is a front view of the semiconductor light emitting device.

FIG. 1 is a perspective view showing a first embodiment of a semiconductor light emitting device 1. FIG. 2 is an exploded perspective view showing the semiconductor light emitting device 1 of the first embodiment. FIG. 3 is a front view showing the semiconductor light emitting device 1 of the first embodiment. In FIG. 3, a lower side of a cover 22 is indicated by solid lines.

As shown in FIG. 1, the semiconductor light emitting device 1 is, for example, cuboid-shaped. In a plan view of the semiconductor light emitting device 1, a direction extending along one side of the semiconductor light emitting device 1 is referred to as the X-direction, and a direction orthogonal to the X-direction is referred to as the Y-direction. In the present embodiment, the dimension of the semiconductor light emitting device 1 in the X-direction is approximately 3.5 mm. The dimension of the semiconductor light emitting device 1 in the Y-direction is approximately 3.5 mm. The dimensions of the semiconductor light emitting device 1 in the X-direction and the Y-direction may be changed in any manner.

As shown in FIGS. 1 to 3, the semiconductor light emitting device 1 includes a substrate 10, a case 20, conductive portions 30, 40, 50, 60, and 70, a semiconductor light emitting element 80, and an electronic component 100.

The substrate 10 has the shape of, for example, a square extending in the X-direction and the Y-direction. The X-direction and the Y-direction are two directions that are orthogonal to each other in a planar direction of the substrate 10. The substrate 10 includes a substrate front surface 11 and a substrate back surface 12.

In the present embodiment, the substrate 10 is formed from an insulative material. The substrate 10 may be, for example, a ceramic such as alumina or aluminum nitride, a silicon substrate, or a glass epoxy. For the sake of convenience, in the thickness-wise direction of the substrate 10, a direction extending away from the substrate front surface 11 is referred to as "upward", and a direction extending toward the substrate front surface 11 is referred to as "downward."

The case 20 accommodates the semiconductor light emitting element 80 and the electronic component 100. The case 20 is attached to the substrate 10. The case 20 is, for example, hollow. However, alternatively, the case 20 may be filled with another member.

The case 20 includes a frame 21 that is open upward and the cover 22 that closes the opening of the frame 21. The frame 21 is, for example, formed from a light-blocking material such as a colored resin. Light from the semiconductor light emitting element 80 is blocked by the frame 21. The frame 21 has the shape of a square that is slightly smaller than the substrate 10. As shown in FIG. 2, the frame 21 includes opposite side walls in the Y-direction, namely, a first side wall 21a and a second side wall 21b, and opposite side walls in the X-direction, namely, a third side wall 21c and a fourth side wall 21d. The first side wall 21a and the second side wall 21b are opposed in the Y-direction. The third side wall 21c and the fourth side wall 21d are opposed in the X-direction.

The cover 22 is plate-shaped and is slightly smaller than the outer edges of the frame 21. The cover 22 is formed from a transparent material, which is, for example, glass. The cover 22 is transmissive to light from the semiconductor light emitting element 80.

As shown in FIGS. 2 and 3, the conductive portions 30, 40, 50, 60, and 70 are formed on the substrate 10. The conductive portions 30, 40, 50, 60, and 70 are formed from a conductive material. For example, Cu, Ni, Ti, or Au is appropriately selected. In addition, a surface layer formed from Sn may be formed on the conductive portions 30, 40, 50, 60, and 70.

Each of the conductive portions 30, 40, 50, 60, and 70 includes, for example, a front surface conductive layer formed on the substrate front surface 11, a back surface conductive layer formed on the substrate back surface 12, a joint electrically connecting the front surface conductive layer to the back surface conductive layer.

Figure 4:
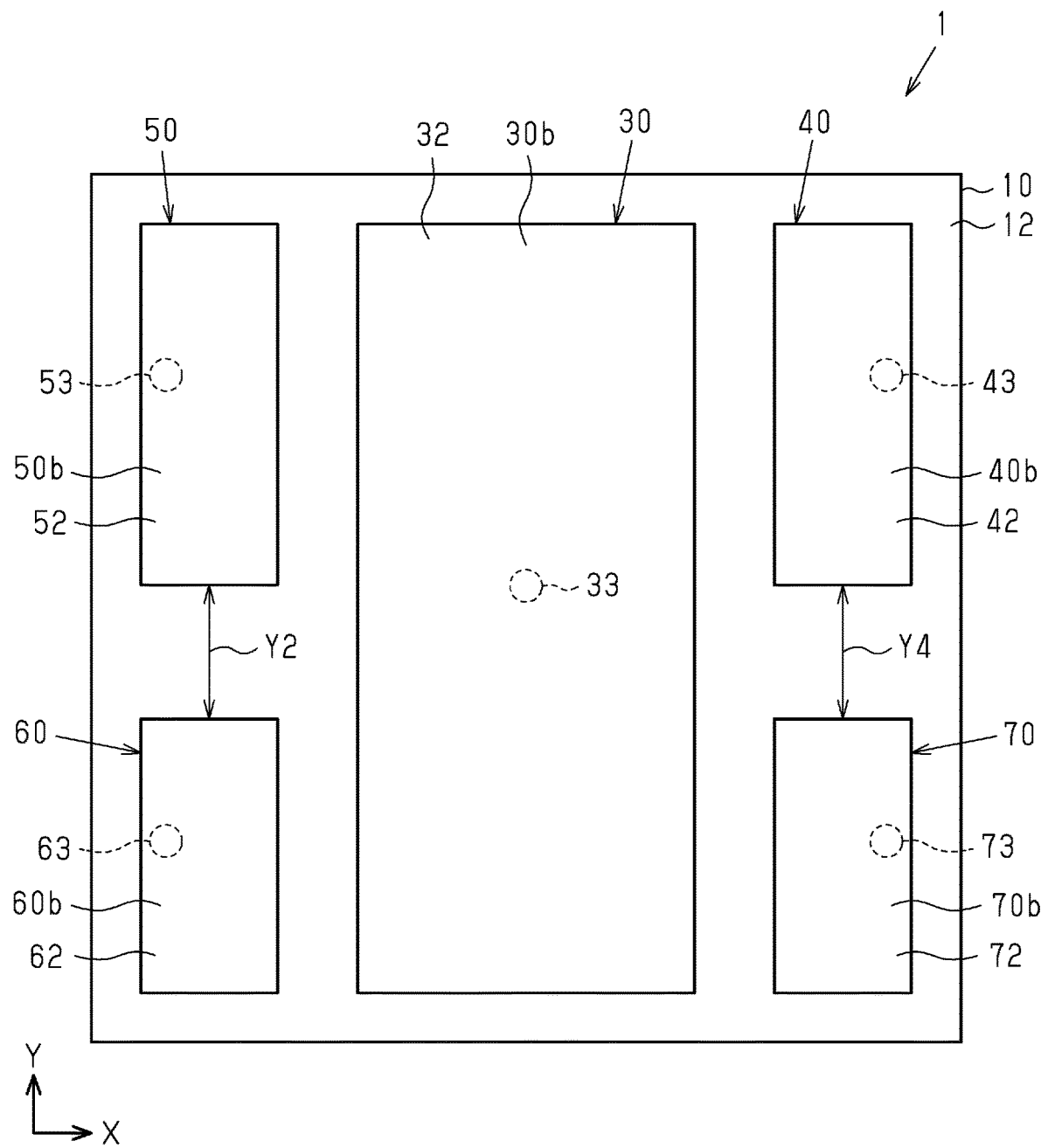
FIG. 4 is a bottom view of the semiconductor light emitting device.
Figure 5:
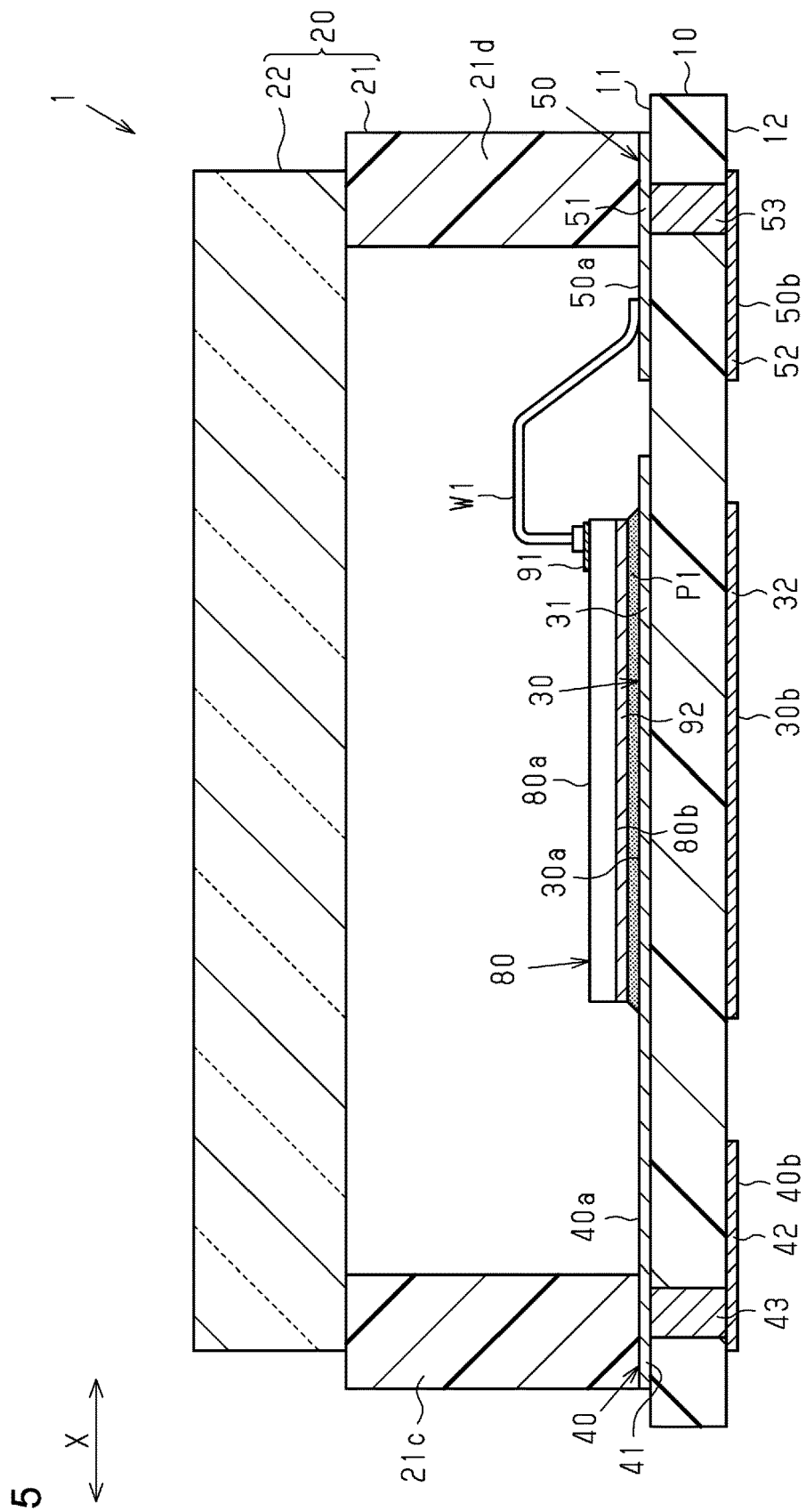
FIG. 5 is a cross-sectional view taken along line 5-5 in FIG. 3.

As shown in FIGS. 3 to 5, the conductive portions 30, 40, 50, 60, and 70 include a common conductive portion 30 that includes a common front surface conductive layer 31 formed on the substrate front surface 11, a common back surface conductive layer 32 formed on the substrate back surface 12, and a common joint 33 electrically connecting the common front surface conductive layer 31 to the common back surface conductive layer 32. The common conductive portion 30 includes a common contact front surface 30a located on the substrate front surface 11 and a common contact back surface 30b located on the substrate back surface 12. In the present embodiment, the common contact front surface 30a is a front surface of the common front surface conductive layer 31, and the common contact back surface 30b is a back surface of the common back surface conductive layer 32.

The common contact front surface 30a is located closer to a central part of the substrate front surface 11 in the X-direction than the third side wall 21c and the fourth side wall 21d. In the present embodiment, the common contact front surface 30a is located on the central part of the substrate front surface 11 in the X-direction. The common contact front surface 30a extends in the Y-direction. The common contact front surface 30a is rectangular so that the long sides extend in the Y-direction and the short sides extend in the X-direction. The common contact front surface 30a extends to a position that overlaps the frame 21. As viewed from above, opposite ends of the common contact front surface 30a in the Y-direction coincide with an outer surface of the first side wall 21a and an outer surface of the second side wall 21b.

A connection conductive portion 40 and a control conductive portion 70 are located at one side of the common contact front surface 30a in the X-direction. An element conductive portion 50 and a drive conductive portion 60 are located at the other side of the common contact front surface 30a in the X-direction.

The connection conductive portion 40 includes a connection front surface conductive layer 41 formed on the substrate front surface 11, a connection back surface conductive layer 42 formed on the substrate back surface 12, and a connection joint 43 electrically connecting the connection front surface conductive layer 41 to the connection back surface conductive layer 42.

The common front surface conductive layer 31 includes an end 31a in the X-direction located at a side opposite from the element conductive portion 50. The connection front surface conductive layer 41 is a portion of the common front surface conductive layer 31 projecting from the end 31a in the X-direction. The connection front surface conductive layer 41 and the common front surface conductive layer 31 are formed integrally. Thus, the connection conductive portion 40 is electrically connected to the common conductive portion 30.

The connection conductive portion 40 includes a connection contact front surface 40a located on the substrate front surface 11 and a connection contact back surface 40b located on the substrate back surface 12. In the present embodiment, the connection contact front surface 40a is a front surface of the connection front surface conductive layer 41 and projects in the X-direction from one of the opposite ends of the common contact front surface 30a in the X-direction located at a side opposite from the element conductive portion 50. The connection contact front surface 40a is continuous with the common contact front surface 30a. The connection contact back surface 40b is a back surface of the connection back surface conductive layer 42.

The element conductive portion 50 includes the element front surface conductive layer 51 formed on the substrate front surface 11, the element back surface conductive layer 52 formed on the substrate back surface 12, and an element joint 53 electrically elementing the element front surface conductive layer 51 to the element back surface conductive layer 52. The element conductive portion 50 includes an element contact front surface 50a located on the substrate front surface 11 and an element contact back surface 50b located on the substrate back surface 12. In the present embodiment, the element contact front surface 50a is a front surface of the element front surface conductive layer 51, and the element contact back surface 50b is a back surface of the element back surface conductive layer 52.

Figure 6:
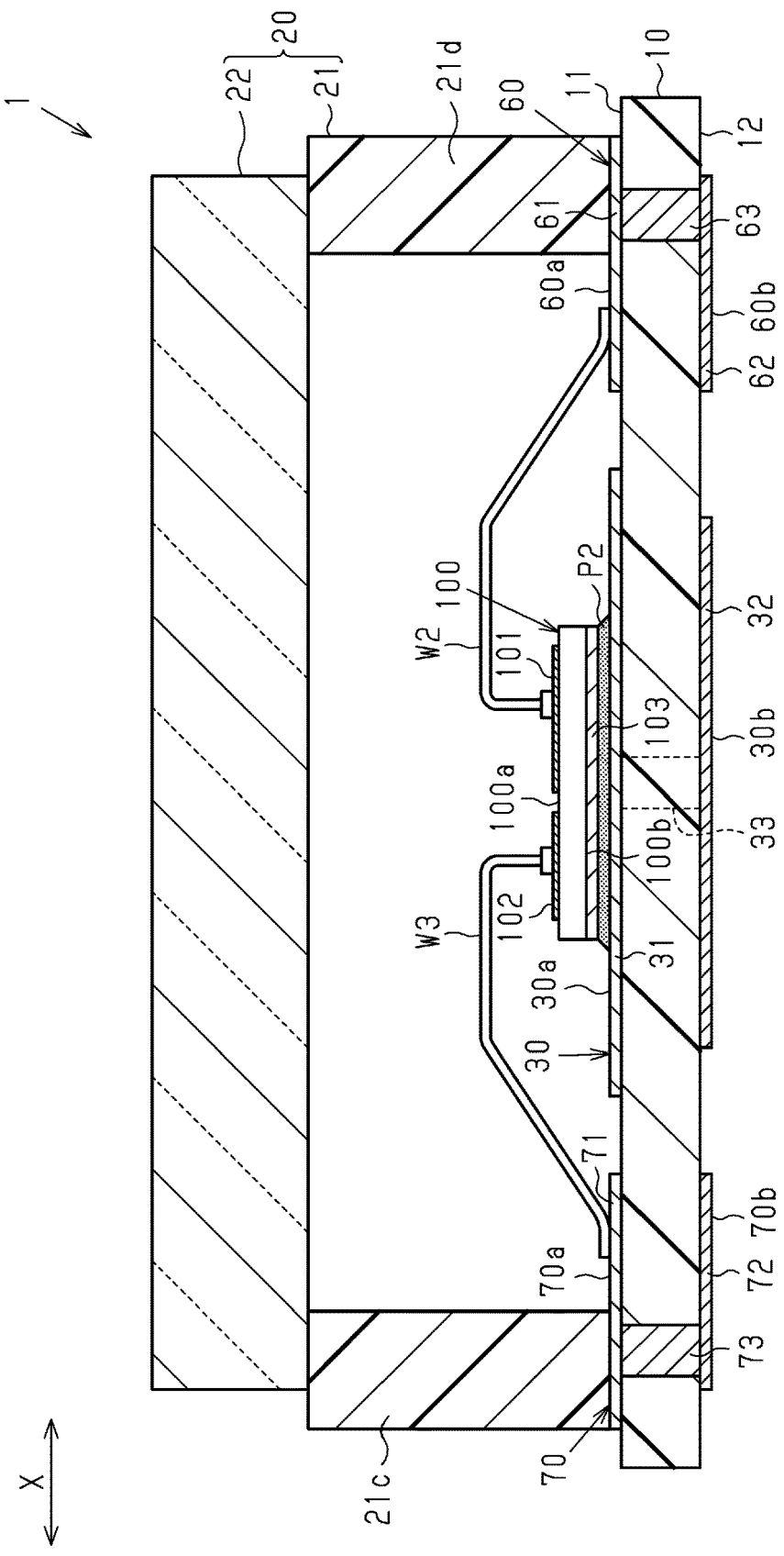
FIG. 6 is a cross-sectional view taken along line 6-6 in FIG. 3.

As shown in FIGS. 3, 4, and 6, the drive conductive portion 60 includes a drive front surface conductive layer 61 formed on the substrate front surface 11, the drive back surface conductive layer 62 formed on the substrate back surface 12, and a drive joint 63 electrically driving the drive front surface conductive layer 61 and the drive back surface conductive layer 62. The drive conductive portion 60 includes a drive contact front surface 60a located on the substrate front surface 11 and a drive contact back surface 60b located on the substrate back surface 12. In the present embodiment, the drive contact front surface 60a is a front surface of the drive front surface conductive layer 61, and the drive contact back surface 60b is a back surface of the drive back surface conductive layer 62.

The control conductive portion 70 includes a control front surface conductive layer 71 formed on the substrate front surface 11, a control back surface conductive layer 72 formed on the substrate back surface 12, and a control joint 73 electrically controlling the control front surface conductive layer 71 and the control back surface conductive layer 72. The control conductive portion 70 includes a control contact front surface 70a located on the substrate front surface 11 and a control contact back surface 70b located on the substrate back surface 12. In the present embodiment, the control contact front surface 70a is a front surface of the control front surface conductive layer 71, and the control contact back surface 70b is a back surface of the control back surface conductive layer 72.

The semiconductor light emitting element 80 is a light source of the semiconductor light emitting device 1 and emits light in a predetermined wavelength band. The semiconductor light emitting element 80 is not particularly limited to a specific configuration and is, for example, a semiconductor laser element or a light emitting diode (LED) element. In the present embodiment, the semiconductor light emitting element 80 is a semiconductor laser element. Particularly, a vertical cavity surface emitting laser (VCSEL) element is used. Light from the semiconductor light emitting element 80 is transmitted through the cover 22 and emitted to the outside.

Figure 7:
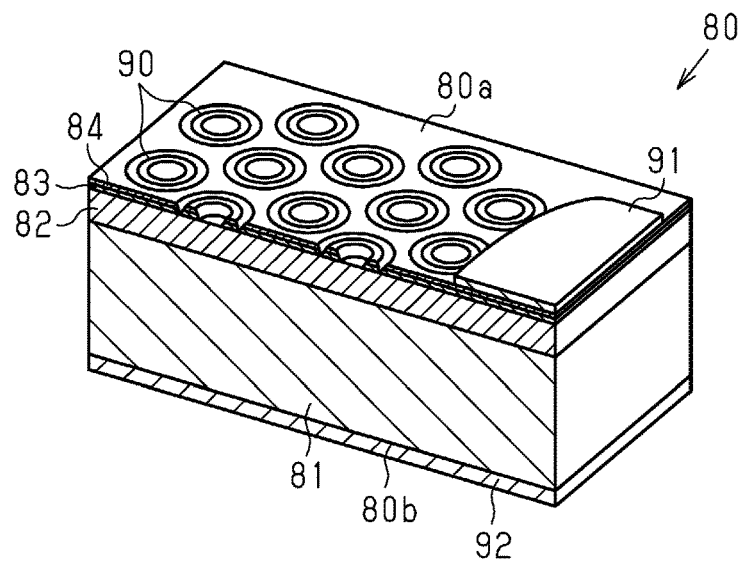
FIG. 7 is a perspective view showing a cross-sectional structure of a semiconductor light emitting element.
Figure 8:
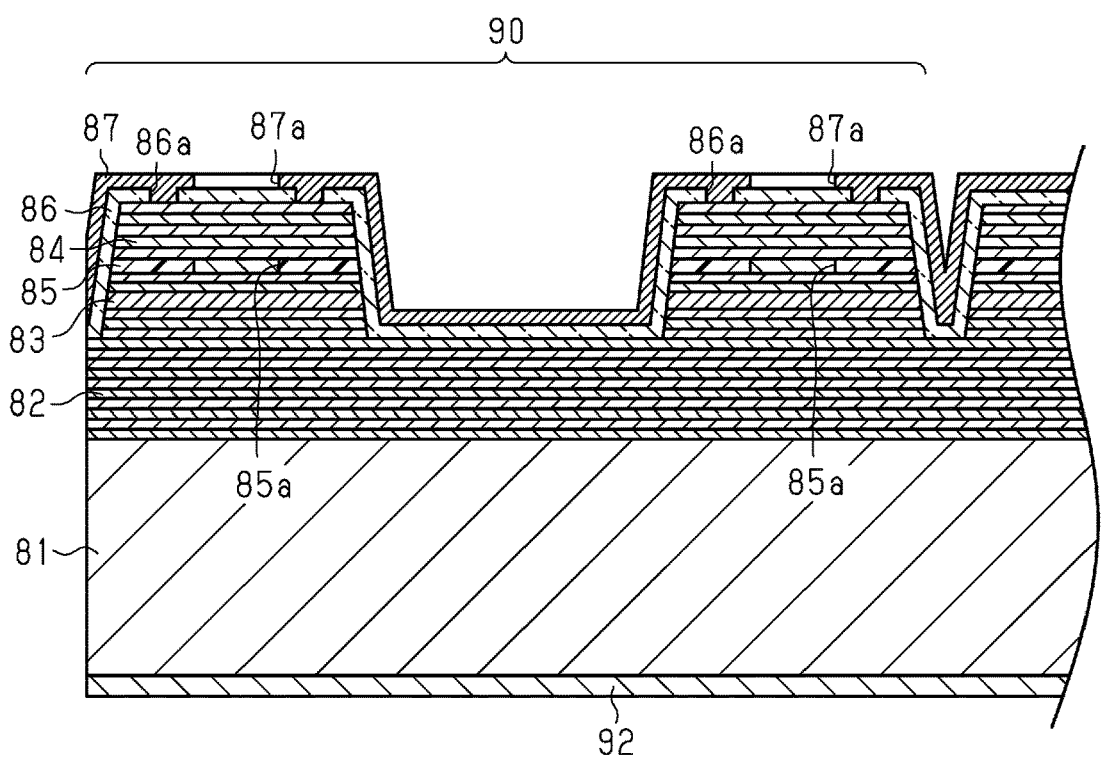
FIG. 8 is a partial cross-sectional view of the semiconductor light emitting element.

As shown in FIGS. 7 and 8, the present example of the semiconductor light emitting element 80 includes an element substrate 81, a first semiconductor layer 82, an active layer 83, a second semiconductor layer 84, a current narrow layer 85, an insulation layer 86, and a conductive layer 87. Light emitting regions 90 are formed in the semiconductor light emitting element 80. FIG. 8 shows an enlarged portion including one light emitting region 90.

The element substrate 81 is formed of a semiconductor. The semiconductor forming the element substrate 81 is, for example, GaAs. The semiconductor forming the element substrate 81 may be other than GaAs.

The active layer 83 is formed of a compound semiconductor that limits light having, for example, a wavelength band of 980 nm (hereafter, denoted by "$\lambda a$") through spontaneous emission and simulated emission. The active layer 83 is disposed between the first semiconductor layer 82 and the second semiconductor layer 84. In the present embodiment, undoped GaAs well layers and undoped AlGaAs block layers (barrier layers) are alternately stacked to form a multilayer quantum well structure. For example, undoped $Al_{0.35}Ga_{0.65}As$ block layers and undoped GaAs well layers are alternately formed in two to six cycles of repetition.

The first semiconductor layer 82 is typically a distributed Bragg reflector (DBR) layer and is formed on the element substrate 81. The first semiconductor layer 82 is formed of a semiconductor having a first conductive type. In the present example, the first conductive type is n-type. The first semiconductor layer 82 is formed as a DBR for efficiently reflecting the light emitted from the active layer 83. More specifically, the active layer 83 is formed by stacking pairs of two AlGaAs layers having different reflectances and a thickness of $\lambda a/4$. More specifically, the first semiconductor layer 82 is formed, for example, by alternately stacking n-type $Al_{0.16}Ga_{0.84}As$ layers having a thickness of 600 Å and a relatively low Al composition (low Al composition layers) and n-type $Al_{0.84}Ga_{0.16}As$ layers having a thickness of 700 Å and a relatively high Al composition (high Al composition layers) in cycles (for example, 20 cycles) of repetition. The n-type $Al_{0.16}Ga_{0.84}As$ layers and the n-type $Al_{0.84}Ga_{0.16}As$ layers are doped with, for example, an n-type impurity (e.g., Si) in concentration of $2 \times 10^{17}$ cm$^{-3}$ to $3 \times 10^{18}$ cm$^{-3}$ and $2 \times^{17}$ cm$^{-3}$ to $3 \times 10^{18}$ cm$^{-3}$, respectively.

The second semiconductor layer 84 is typically a DBR layer and is formed of a semiconductor having a second conductive type. In the present example, the second conductive type is p-type. Other than the present embodiment, the first conductive type may be p-type, the second conductive type may be n-type. The first semiconductor layer 82 is disposed between the second semiconductor layer 84 and the element substrate 81. The second semiconductor layer 84 is formed as a DBR for efficiently reflecting the light emitted from the active layer 83. More specifically, the second semiconductor layer 84 is formed by stacking pairs of two AlGaAs layers having different reflectances and a thickness of $\lambda/4$. The second semiconductor layer 84 is formed, for example, by alternately stacking p-type $Al_{0.16}Ga_{0.84}As$ layers having relatively low Al composition (low Al composition layers) and p-type $Al_{0.84}Ga_{0.16}As$ layers having a relatively high Al composition (high Al composition layers) in cycles (for example, twenty cycles) of repetition.

The current narrow layer 85 is disposed in the second semiconductor layer 84. The current narrow layer 85 is formed from, for example, an easily-oxidizable layer containing a large amount of Al. The current narrow layer 85 is formed by oxidizing the easily-oxidizable layer. However, the current narrow layer 85 does not necessarily have to be formed by oxidization and may be formed by using another process (e.g., ion implantation). The current narrow layer 85 has an opening 85a. Current flows through the opening 85a.

The insulation layer 86 is formed on the second semiconductor layer 84. The insulation layer 86 is, for example, formed from $SiO_2$. The insulation layer 86 has an opening 86a.

The conductive layer 87 is formed on the insulation layer 86. The conductive layer 87 is formed from a conductive material (e.g., metal). The conductive layer 87 is electrically connected to the second semiconductor layer 84 through the opening 86a in the insulation layer 86. The conductive layer 87 has an opening 87a.

The light emitting region 90 is a region to which light from the active layer 83 is directly emitted or the light is reflected and then emitted. In the present example, the light emitting region 90 is annular in plan view but is not limited to a particular shape. The light emitting region 90 is formed by stacking the second semiconductor layer 84, the current narrow layer 85, the insulation layer 86, and the conductive layer 87 and forming the opening 85a in the current narrow layer 85, the opening 86a in the insulation layer 86, and the opening 87a in the conductive layer 87 as described above. In the light emitting region 90, the light from the active layer 83 is emitted through the opening 87a in the conductive layer 87.

As shown in FIGS. 3 and 5, the semiconductor light emitting element 80 includes an element upper surface 80a on which the light emitting regions 90 and an element upper surface electrode 91 are formed and an element lower surface 80b on which an element lower surface electrode 92 is formed. The element upper surface 80a is, for example, rectangular so that the long sides extend in the X-direction and the short sides extend in the Y-direction. The element upper surface electrode 91 is formed on an end of the element upper surface 80a in the X-direction. The element upper surface electrode 91 is located closer to the fourth side wall 21d than the third side wall 21c. The element upper surface electrode 91 extends in the Y-direction. The element upper surface electrode 91 is, for example, formed from metal and is electrically connected to the second semiconductor layer 84. The element lower surface electrode 92 is, for example, formed on the entirety of the element lower surface 80b and is formed of, for example, metal. In the present embodiment, the semiconductor light emitting element 80 is a VCSEL element. The element upper surface electrode 91 is an anode electrode, and the element lower surface electrode 92 is a cathode electrode.

The electronic component 100 is, for example, used to drive the semiconductor light emitting element 80. The electronic component 100 is, for example, a switching element and is an n-type metal-oxide-semiconductor field-effect transistor (MOSEFT) in the present embodiment.

As shown in FIGS. 3 and 6, the electronic component 100 includes an upper surface 100a on which a first drive electrode 101 and a control electrode 102 are formed and a lower surface 100b on which a second drive electrode 103 is formed. In the present embodiment, the electronic component 100 is a MOSFET. The first drive electrode 101 is a source electrode, the second drive electrode 103 is a drain electrode, and the control electrode 102 is a gate electrode.

As shown in FIG. 3, the upper surface 100a of the electronic component 100 is rectangular. As viewed from above, the control electrode 102 is formed on a lower left portion, and the remaining portion is the first drive electrode 101. The first drive electrode 101 has a larger area than the control electrode 102. The lower surface 100b is, for example, rectangular. The second drive electrode 103 is, for example, formed on the entire back surface of the electronic component 100 and is formed from, for example, metal.

The positional relationship among the conductive portions 30, 40, 50, 60, and 70, the semiconductor light emitting element 80, and the electronic component 100 will be described below in detail.

With reference to FIG. 3, the layout at the side of the substrate front surface 11 will be described.

The semiconductor light emitting element 80 and the electronic component 100 are mounted on the common conductive portion 30 and are electrically connected to each other by the common conductive portion 30. In the present embodiment, the semiconductor light emitting element 80 and the electronic component 100 are disposed on the common contact front surface 30a, which is formed of the front surface of the common front surface conductive layer 31, and electrically connected by the common front surface conductive layer 31.

More specifically, the common contact front surface 30a extends in the Y-direction, and the semiconductor light emitting element 80 and the electronic component 100 are arranged on the common contact front surface 30a in the Y-direction. In other words, in the present embodiment, the common contact front surface 30a extends in the arrangement direction of the semiconductor light emitting element 80 and the electronic component 100. The Y-direction corresponds to the arrangement direction or the first direction. The X-direction corresponds to the second direction.

The semiconductor light emitting element 80 is located closer to the first side wall 21a than the electronic component 100. The electronic component 100 is located closer to the second side wall 21b than the semiconductor light emitting element 80. The semiconductor light emitting element 80 and the electronic component 100 are located at positions displaced from the central part of the substrate front surface 11 in the Y-direction, for example, at opposite sides of the central part in the Y-direction. In the illustrated example, the semiconductor light emitting element 80 is disposed on the common contact front surface 30a between the central part of the substrate front surface 11 in the Y-direction and the first side wall 21a. In the present example, the semiconductor light emitting element 80 is located closer to the central part of the substrate front surface 11 in the Y-direction than the first side wall 21a. The electronic component 100 is disposed between the central part of the substrate front surface 11 in the Y-direction and the second side wall 21b. In the present example, the electronic component 100 is located closer to the central part of the substrate front surface 11 in the Y-direction than the second side wall 21b. Thus, the semiconductor light emitting element 80 and the electronic component 100 are located at opposite sides of the central part of the substrate front surface 11 in the Y-direction and separated by a short distance in the Y-direction.

As shown in FIG. 5, the element lower surface electrode 92, which is formed on the element lower surface 80b of the semiconductor light emitting element 80, is die-bonded to the common contact front surface 30a by a conductive bonding material P1 such as solder or a paste containing metal, for example, Ag. Thus, the element lower surface electrode 92 is bonded to the common conductive portion 30.

As shown in FIG. 6, the second drive electrode 103, which is formed on the lower surface 100b of the electronic component 100, is die-bonded to the common contact front surface 30a by a conductive bonding material P2 such as solder or a paste containing metal, for example, Ag. Thus, the second drive electrode 103 is bonded to the common conductive portion 30. The common conductive portion 30 electrically connects the element lower surface electrode 92 and the second drive electrode 103.

As shown in FIG. 3, the element conductive portion 50 is located on the substrate front surface 11 at one side of the common contact front surface 30a in the X-direction, and the connection conductive portion 40 is located at the other side of the common contact front surface 30a in the X-direction. In the present embodiment, the connection contact front surface 40a and the element contact front surface 50a are separately disposed at opposite sides of the semiconductor light emitting element 80 in the X-direction. The connection conductive portion 40 is located closer to the third side wall 21c than the semiconductor light emitting element 80. The connection contact front surface 40a is located at an upper left portion of the substrate front surface 11. The element conductive portion 50 is located closer to the fourth side wall 21d than the semiconductor light emitting element 80. The element contact front surface 50a is located at an upper right portion of the substrate front surface 11. The connection contact front surface 40a, the element upper surface 80a, and the element contact front surface 50a are arranged in the X-direction.

The connection contact front surface 40a is, for example, rectangular so that the long sides extend in the Y-direction and the short sides extend in the X-direction. The connection contact front surface 40a overlaps the frame 21 in plan view. An end of the connection contact front surface 40a in the long-side direction coincides with the outer surface of the first side wall 21a as viewed from above. An end of the connection contact front surface 40a in the short-side direction coincides with the outer surface of the third side wall 21c as viewed from above.

The element contact front surface 50a is, for example, rectangular so that the long sides extend the Y-direction and the short sides extend in the X-direction. The element contact front surface 50a overlaps the frame 21 in plan view. An end of the element contact front surface 50a in the long-side direction coincides with the outer surface of the first side wall 21a as viewed from above. An end of the element contact front surface 50a in the short-side direction coincides with the outer surface of the fourth side wall 21d as viewed from above.

The element contact front surface 50a is electrically connected to the element upper surface electrode 91 by wires W1. The wires W1 are, for example, formed from metal such as Au and bonded to the element upper surface electrode 91 and the element contact front surface 50a. The number of wires W1 is not particularly limited. In the illustrated example, multiple wires W1 (five wires W1) are arranged. In the illustrated example, the wires W1 have a first bonding portion disposed on the element upper surface electrode 91 and a second bonding portion disposed on the element contact front surface 50a.

In the illustrated example, the element upper surface electrode 91 is formed on one of the opposite ends of the element upper surface 80a in the X-direction that is located closer to the element conductive portion 50. Thus, the wires W1 are shortened.

The drive conductive portion 60 and the control conductive portion 70 are separately disposed at opposite sides of the common contact front surface 30a in the X-direction. The drive contact front surface 60a and the control contact front surface 70a are located at opposite sides of the electronic component 100 in the Y-direction. In the illustrated example, the drive conductive portion 60 is located closer to the fourth side wall 21d than the electronic component 100. The drive contact front surface 60a is located at a lower right portion of the substrate front surface 11. The control conductive portion 70 is located closer to the third side wall 21c than the electronic component 100. The control contact front surface 70a is located at a lower left portion of the substrate front surface 11. The control contact front surface 70a, the upper surface 100a of the electronic component 100, and the drive contact front surface 60a are arranged in the X-direction.

The element conductive portion 50 and the drive conductive portion 60 are located at the same side of the common contact front surface 30a in the Y-direction. In other words, the element contact front surface 50a is located at one of the opposite sides of the common contact front surface 30a in the X-direction where the drive contact front surface 60a is located.

The drive contact front surface 60a is, for example, rectangular so that the long sides extend the Y-direction and the short sides extend in the X-direction. The drive contact front surface 60a overlaps the frame 21. An end of the drive contact front surface 60a in the long-side direction coincides with the outer surface of the second side wall 21b as viewed from above. An end of the drive contact front surface 60a in the short-side direction coincides with the outer surface of the fourth side wall 21d as viewed from above.

The drive contact front surface 60a is connected to the first drive electrode 101 by wires W2. Thus, the drive conductive portion 60 is electrically connected to the first drive electrode 101. The wires W2 are, for example, formed from metal such as Cu and bonded to the drive contact front surface 60a and the first drive electrode 101. The number of wires W2 is not particularly limited. In the illustrated example, multiple wires W2 (five wires W2) are arranged. In the illustrated example, the wires W2 have a first bonding portion disposed on the first drive electrode 101 and a second bonding portion disposed on the drive contact front surface 60a.

In the illustrated example, the number of wires W1 is equal to the number of wires W2. However, the number of wires W1 may differ from the number of wires W2. For example, the number of wires W1 may be greater than the number of wires W2. This configuration allows a larger amount of current to flow to the semiconductor light emitting element 80 than to the electronic component 100.

The control contact front surface 70a is, for example, rectangular so that the long sides extend the Y-direction and the short sides extend in the X-direction. The control contact front surface 70a overlaps the frame 21. An end of the control contact front surface 70a in the long-side direction coincides with the outer surface of the second side wall 21b as viewed from above. An end of the control contact front surface 70a in the short-side direction coincides with the outer surface of the third side wall 21c.

The control contact front surface 70a is connected to the control electrode 102 by a wire W3. Thus, the control conductive portion 70 is electrically connected to the control electrode 102. The wire W3 is, for example, formed from metal such as Cu and bonded to the control contact front surface 70a and the control electrode 102. The number of wires W3 is not particularly limited. In the illustrated example, the number of wires W3 is one. In the illustrated example, the wire W3 has a first bonding portion disposed on the control electrode 102 and a second bonding portion disposed on the control contact front surface 70a. The control electrode 102 is formed on one of the opposite ends of the upper surface 100a in the X-direction that is located closer to the control contact front surface 70a. Thus, the wire W3 is shortened.

In the illustrated example, the common contact front surface 30a is larger than other contact front surfaces 40a, 50a, 60a, and 70a. The element contact front surface 50a is larger than the drive contact front surface 60a and the control contact front surface 70a. The connection contact front surface 40a is larger than the drive contact front surface 60a and the control contact front surface 70a and is larger than the element contact front surface 50a. The drive contact front surface 60a and the control contact front surface 70a have the same size.

The layout at the side of the substrate back surface 12 will be described with reference FIGS. 4 to 6.

As shown in FIG. 4, the common contact back surface 30b (common back surface conductive layer 32) is formed on the central part of the substrate back surface 12. The common contact back surface 30b and the common contact front surface 30a are formed on opposite sides. In the same manner as the common contact front surface 30a, the common contact back surface 30b is rectangular so that the short sides extend in the X-direction and the long sides extend in the Y-direction. As viewed from above, the common contact back surface 30b is smaller than the common contact front surface 30a. The dimension of the common contact back surface 30b in the X-direction is less than the dimension of the common contact front surface 30a in the X-direction. Opposite ends of the common contact back surface 30b in the X-direction are located closer to the center than opposite ends of the common contact front surface 30a in the X-direction.

The element contact back surface 50b and the drive contact back surface 60b are located at one side of the common contact back surface 30b in the X-direction. The connection contact back surface 40b and the control contact back surface 70b are located at the other side of the common contact back surface 30b in the X-direction.

The connection contact back surface 40b (connection back surface conductive layer 42) is formed on the substrate back surface 12 at a position opposite to the connection contact front surface 40a. As shown in FIG. 4, the connection contact back surface 40b is formed on an upper right portion of the substrate back surface 12. The connection contact back surface 40b is rectangular so that the short sides extend in the X-direction and the long sides extend in the Y-direction. The connection contact back surface 40b is smaller than the connection contact front surface 40a. The connection contact back surface 40b and the common contact back surface 30b are separate and are not connected to each other.

As shown in FIG. 5, as viewed from above (substrate front surface 11), the left end of the connection contact back surface 40b is located closer to the center of the substrate 10 than the left end of the connection contact front surface 40a. The left end of the connection contact back surface 40b and the left end of the connection contact front surface 40a are ends of the connection contact back surface 40b and the connection contact front surface 40a in the X-direction that are located loser to the edge of the substrate 10.

As shown in FIG. 4, the element contact back surface 50b (element back surface conductive layer 52) is formed on the substrate back surface 12 at a position opposite to the element contact front surface 50a. In the illustrated example, the element contact back surface 50b is formed on an upper left portion of the substrate back surface 12. The element contact back surface 50b and the common contact back surface 30b are separate and are not connected to each other.

The element contact back surface 50b is rectangular so that the short sides extend in the X-direction and the long sides extend in the Y-direction. The element contact back surface 50b is smaller than the element contact front surface 50a.

As shown in FIG. 5, as viewed from above, the left end of the element contact back surface 50b coincides with the left end of the element contact front surface 50a. The right end of the element contact back surface 50b is located closer to the center than the right end of the element contact front surface 50a. The left end of the element contact back surface 50b and the left end of the element contact front surface 50a are ends of the element contact back surface 50b and the element contact front surface 50a in the X-direction that are located closer to the center of the substrate 10. The right end of the element contact back surface 50b and the right end of the element contact front surface 50a are ends of the element contact back surface 50b and the element contact front surface 50a in the X-direction that are located closer to the edge of the substrate 10.

As shown in FIG. 4, the drive contact back surface 60b (drive back surface conductive layer 62) is formed on the substrate back surface 12 at a position opposite to the drive contact front surface 60a. In the illustrated example, the drive contact back surface 60b is formed on a lower left portion of the substrate back surface 12. The drive contact back surface 60b is rectangular so that the short sides extend in the X-direction and the long sides extend in the Y-direction.

The drive contact back surface 60b and the common contact back surface 30b are separated from each other in the X-direction. The element contact back surface 50b and the drive contact back surface 60b are separated from each other in the Y-direction. The dimension of the drive contact back surface 60b in the Y-direction is less than the dimension of the element contact back surface 50b in the Y-direction. Distance Y2 between the element contact back surface 50b and the drive contact back surface 60b is greater than distance Y1 between the element contact front surface 50a and the drive contact front surface 60a (FIG. 3).

As shown in FIG. 6, as viewed from above, the left end of the drive contact back surface 60b coincides with the left end of the drive contact front surface 60a. The right end of the drive contact back surface 60b is located closer to the center than the right end of the drive contact front surface 60a. The left end of the drive contact back surface 60b and the left end of the drive contact front surface 60a are ends of the drive contact back surface 60b and the drive contact front surface 60a in the X-direction that are located closer to the center of the substrate 10. The right end of the drive contact back surface 60b and the right end of the drive contact front surface 60a are ends of the drive contact back surface 60b and the drive contact front surface 60a in the X-direction that are located closer to the edge of the substrate 10.

As shown in FIG. 4, the control contact back surface 70b is formed on the substrate back surface 12 at a position opposite to the control contact front surface 70a. In the illustrated example, the control contact back surface 70b is formed on a lower right portion of the substrate back surface 12. The control contact back surface 70b is rectangular so that the short sides extend in the X-direction and the long sides extend in the Y-direction. The control contact back surface 70b is smaller than the control contact front surface 70a.

The control contact back surface 70b and the common contact back surface 30b are separated in the X-direction. The connection contact back surface 40b and the control contact back surface 70b are separated from each other in the Y-direction. The dimension of the control contact back surface 70b in the Y-direction is less than the dimension of the connection contact back surface 40b in the Y-direction. Distance Y4 between the connection contact back surface 40b and the control contact back surface 70b is greater than distance Y3 between the connection contact front surface 40a and the control contact front surface 70a (FIG. 3).

As shown in FIG. 6, as viewed from above, the right end of the control contact back surface 70b coincides with the right end of the control contact front surface 70a. The left end of the control contact back surface 70b is located closer to the center than the left end of the control contact front surface 70a. The right end of the control contact back surface 70b and the right end of the control contact front surface 70a are ends of the control contact back surface 70b and the control contact front surface 70a in the X-direction that are located closer to the center of the substrate 10. The left end of the control contact back surface 70b and the left end of the control contact front surface 70a are ends of the control contact back surface 70b and the control contact front surface 70a in the X-direction that are located closer to the edge of the substrate 10.

In the present embodiment, the common contact back surface 30b is larger than the connection contact back surface 40b, the element contact back surface 50b, the drive contact back surface 60b, and the control contact back surface 70b. The element contact back surface 50b and the connection contact back surface 40b are larger than the drive contact back surface 60b and the control contact back surface 70b. The drive contact back surface 60b and the control contact back surface 70b are identical in shape.

The joints 33, 43, 53, 63, and 73 will now be described.

The joints 33, 43, 53, 63, and 73 form conductive paths in the thickness-wise direction of the substrate 10. In the present embodiment, the joints 33, 43, 53, 63, and 73 extend through the substrate 10 in the thickness-wise direction.

As shown in FIGS. 3 and 4, the common joint 33 is disposed between the common front surface conductive layer 31 and the common back surface conductive layer 32. The common joint 33 is continuous with the common front surface conductive layer 31 and the common back surface conductive layer 32 to electrically connect the common front surface conductive layer 31 and the common back surface conductive layer 32.

As shown in FIG. 3, as viewed from above, the common joint 33 does not overlap the semiconductor light emitting element 80 and the electronic component 100. For example, the common joint 33 is located between the semiconductor light emitting element 80 and the electronic component 100. More specifically, the common joint 33 is located in the center of the substrate front surface 11.

As shown in FIG. 5, the connection joint 43 is disposed between the connection front surface conductive layer 41 and the connection back surface conductive layer 42. The connection joint 43 is continuous with the connection front surface conductive layer 41 and the connection back surface conductive layer 42 to electrically connect the connection front surface conductive layer 41 and the connection back surface conductive layer 42.

As shown in FIG. 3, as viewed from above, the connection joint 43 overlaps the case 20. For example, as viewed from above, the connection joint 43 overlaps the third side wall 21c.

As shown in FIG. 5, the element joint 53 is disposed between the element front surface conductive layer 51 and the element back surface conductive layer 52. The element joint 53 is continuous with the element front surface conductive layer 51 and the element back surface conductive layer 52 to electrically connect the element front surface conductive layer 51 and the element back surface conductive layer 52.

As shown in FIG. 3, as viewed from above, the element joint 53 overlaps the case 20. For example, as viewed from above, the element joint 53 overlaps the fourth side wall 21d.

As shown in FIG. 6, the drive joint 63 is disposed between the drive front surface conductive layer 61 and the drive back surface conductive layer 62. The drive joint 63 is continuous with the drive front surface conductive layer 61 and the drive back surface conductive layer 62 to electrically connect the drive front surface conductive layer 61 and the drive back surface conductive layer 62.

As shown in FIG. 3, as viewed from above, the drive joint 63 overlaps the case 20. For example, as viewed from above, the drive joint 63 overlaps the fourth side wall 21d.

As shown in FIG. 6, the control joint 73 is disposed between the control front surface conductive layer 71 and the control back surface conductive layer 72. The control joint 73 is continuous with the control front surface conductive layer 71 and the control back surface conductive layer 72 to electrically connect the control front surface conductive layer 71 and the control back surface conductive layer 72.

As shown in FIG. 3, as viewed from above, the control joint 73 overlaps the case 20. For example, as viewed from above, the control joint 73 overlaps the third side wall 21c.

Figure 9:
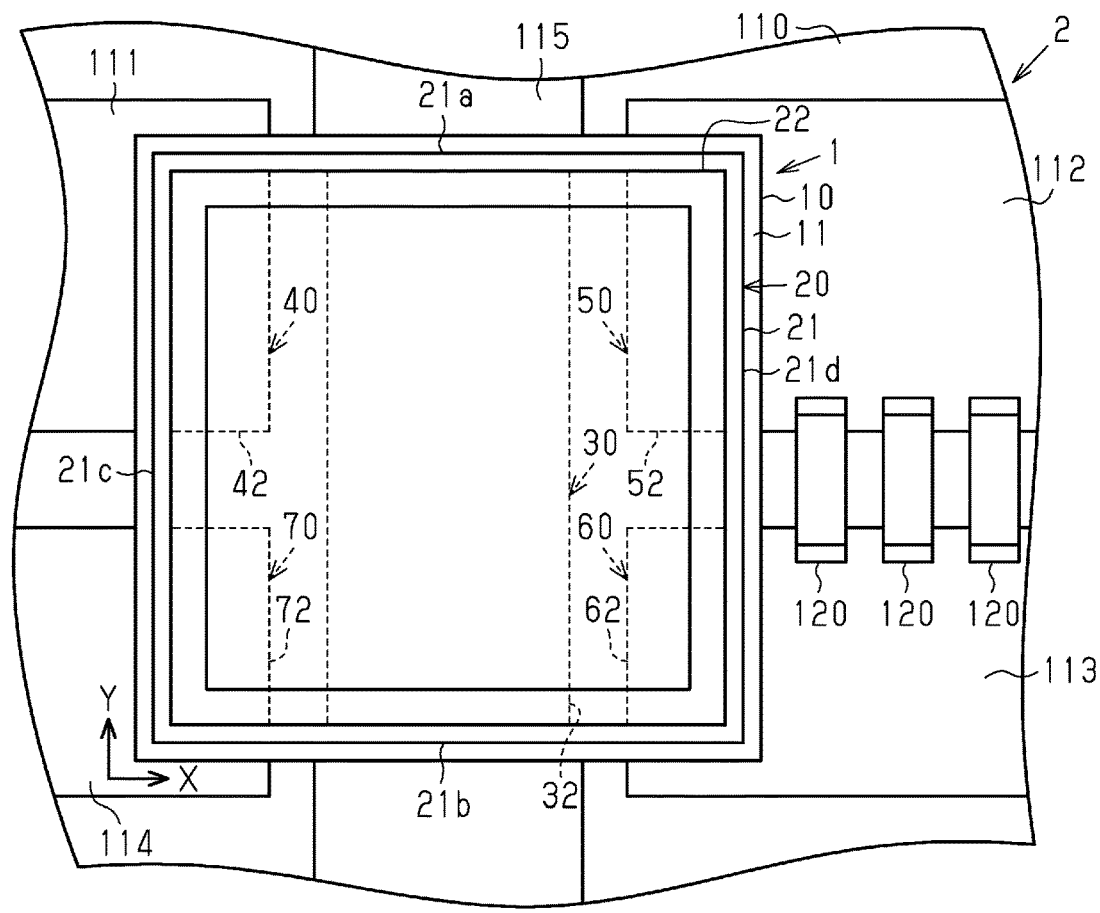
FIG. 9 is a front view showing part of an electronic apparatus.
Figure 10:
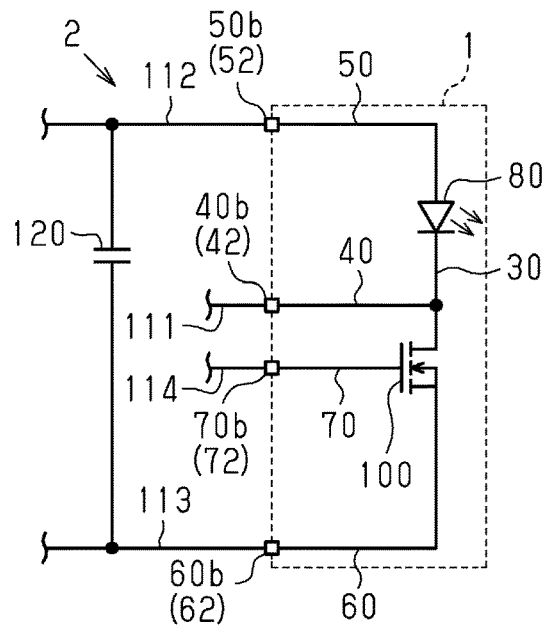
FIG. 10 is a circuit diagram showing part of the electronic apparatus.

FIGS. 9 and 10 are respectively a plan view and a circuit diagram showing an example of an electronic apparatus 2 that uses the semiconductor light emitting device 1. The electronic apparatus 2 is, for example, a sensor for measuring distance.

The electronic apparatus 2 includes the semiconductor light emitting device 1, a circuit substrate 110 on which the semiconductor light emitting device 1 is mounted, and wiring patterns 111 to 114 formed on the circuit substrate 110.

The wiring patterns 111 to 114 are separated from each other. The first wiring pattern 111 and the second wiring pattern 112 are arranged in the X-direction. The third wiring pattern 113 and the fourth wiring pattern 114 are arranged in the X-direction. The first wiring pattern 111 and the fourth wiring pattern 114 are arranged in the Y-direction. The second wiring pattern 112 and the third wiring pattern 113 are arranged in the Y-direction.

The connection back surface conductive layer 42 overlaps the first wiring pattern 111. The connection contact back surface 40b and the first wiring pattern 111 are bonded by solder or the like. Thus, the first wiring pattern 111 is electrically connected to the element lower surface electrode 92 of the semiconductor light emitting element 80 and the second drive electrode 103 of the electronic component 100.

The element back surface conductive layer 52 overlaps the second wiring pattern 112. The element contact back surface 50b and the second wiring pattern 112 are bonded by solder or the like. Thus, the second wiring pattern 112 is electrically connected to the element upper surface electrode 91, which is the anode electrode in the present embodiment.

The drive back surface conductive layer 62 overlaps the third wiring pattern 113. The drive contact back surface 60b and the third wiring pattern 113 are bonded by solder or the like. Thus, the third wiring pattern 113 is electrically connected to the first drive electrode 101, which is the source electrode in the present embodiment.

The control back surface conductive layer 72 overlaps the fourth wiring pattern 114. The control contact back surface 70b and the fourth wiring pattern 114 are bonded by solder or the like. Thus, the fourth wiring pattern 114 is electrically connected to the control electrode 102.

As described above, in the present embodiment, the contact back surfaces 40b, 50b, 60b, and 70b form external terminals of the semiconductor light emitting device 1.

In the illustrated example, the common back surface conductive layer 32 (common contact back surface 30b) is mounted via solder or the like on a heat dissipation pattern 115 formed on the circuit substrate 110. Heat of the semiconductor light emitting element 80 and the electronic component 100 is transmitted from the common contact back surface 30b to the circuit substrate 110. This improves the heat dissipation efficiency of the semiconductor light emitting device 1.

As shown in FIG. 9, the electronic apparatus 2 includes capacitors 120. The capacitors 120 are disposed so as to span between the second wiring pattern 112 and the third wiring pattern 113 and electrically connected to the second wiring pattern 112 and the third wiring pattern 113. Thus, as shown in FIG. 10, the capacitors 120 are connected in parallel to the semiconductor light emitting element 80 and the electronic component 100, which are connected in series. This simplifies the layout of the wiring patterns that connect the capacitors 120.

The operation of the present embodiment will now be described.

The semiconductor light emitting element 80 and the electronic component 100 are accommodated in the case 20. The semiconductor light emitting element 80 and the electronic component 100 are mounted on the common conductive portion 30 formed on the substrate front surface 11. Thus, the conductive path between the semiconductor light emitting element 80 and the electronic component 100 is shortened as compared to a structure in which the electronic component 100 is disposed outside the case 20.

The semiconductor light emitting device 1 of the present embodiment has the following advantages.

(1-1) The semiconductor light emitting device 1 includes the substrate 10, the common conductive portion 30 formed on the substrate 10, and the semiconductor light emitting element 80 and the electronic component 100 that are mounted on the common conductive portion 30. The semiconductor light emitting element 80 and the electronic component 100 are electrically connected by the common conductive portion 30. This structure shortens the conductive path between the semiconductor light emitting element 80 and the electronic component 100. As a result, parasitic capacitance caused by the conductive path between the semiconductor light emitting element 80 and the electronic component 100 is reduced. Thus, while reducing the parasitic capacitance, the semiconductor light emitting element 80 and the electronic component 100 are electrically connected.

(1-2) The element lower surface electrode 92 is formed on the element lower surface 80b of the semiconductor light emitting element 80. The electronic component 100 is used to drive the semiconductor light emitting element 80 and includes the upper surface 100a, on which the first drive electrode 101 and the control electrode 102 are formed, and the lower surface 100b, on which the second drive electrode 103 is formed. The element lower surface electrode 92 and the second drive electrode 103 are bonded to the common conductive portion 30. In this structure, the element lower surface electrode 92 and the second drive electrode 103 are electrically connected by the common conductive portion 30.

(1-3) The semiconductor light emitting element 80 and the electronic component 100 are arranged in a predetermined direction. The common conductive portion 30 includes the common contact front surface 30a extending in the Y-direction, that is, the arrangement direction of the semiconductor light emitting element 80 and the electronic component 100. The semiconductor light emitting element 80 and the electronic component 100 are disposed on the common contact front surface 30a. In this structure, the semiconductor light emitting element 80 and the electronic component 100 are disposed on the common conductive portion 30.

The common contact front surface 30a is shaped to have a long side extending in the Y-direction and a short side extending in the X-direction. This structure provides spaces at opposite sides of the common contact front surface 30a in the X-direction, so that other conductive portions are disposed in the spaces.

(1-4) The drive conductive portion 60 and the control conductive portion 70 are formed on the substrate 10. The drive conductive portion 60 includes the drive contact front surface 60a electrically connected to the first drive electrode 101. The control conductive portion 70 includes the control contact front surface 70a electrically connected to the control electrode 102. The drive conductive portion 60 and the control conductive portion 70 are separately disposed at opposite sides of the common contact front surface 30a in the X-direction. This structure ensures the areas of the drive contact front surface 60a and the control contact front surface 70a, while avoiding interference of the drive conductive portion 60 with the control conductive portion 70.

(1-5) The drive contact front surface 60a and the control contact front surface 70a are located at opposite sides of the electronic component 100 in the X-direction. This shortens the wire W3, thereby reducing the parasitic capacitance caused by the wire W3.

(1-6) The element conductive portion 50 including the element contact front surface 50a is formed at one side of the common contact front surface 30a in the X-direction. The connection conductive portion 40 electrically connected to the common conductive portion 30 is formed at the other side of the common contact front surface 30a in the X-direction. The connection conductive portion 40 includes the connection contact front surface 40a projecting in the X-direction from one of the opposite ends of the common contact front surface 30a in the X-direction that is located at a side opposite from the element conductive portion 50. In this structure, the connection conductive portion 40 is used for electrical connection with the common conductive portion 30 while avoiding interference with the element conductive portion 50.

(1-7) The element conductive portion 50 and the drive conductive portion 60 are located at the same side of the common conductive portion 30 in the X-direction. In this structure, the element conductive portion 50 and the drive conductive portion 60 are located close to each other so that a component (e.g., a capacitor) connected to the element conductive portion 50 and the drive conductive portion 60 is readily arranged.

(1-8) The connection conductive portion 40 includes the connection contact back surface 40b located on the substrate back surface 12 at a position opposite to the connection contact front surface 40a. The element conductive portion 50 includes the element contact back surface 50b located on the substrate back surface 12 at a position opposite to the element contact front surface 50a. The drive conductive portion 60 includes the drive contact back surface 60b located on the substrate back surface 12 at a position opposite to the drive contact front surface 60a. The control conductive portion 70 includes the control contact back surface 70b located on the substrate back surface 12 at a position opposite to the control contact front surface 70a. In this structure, the contact back surfaces 40b, 50b, 60b, and 70b are used to ensure contact of the semiconductor light emitting device 1 with an external device.

(1-9) The element contact back surface 50b is larger than the drive contact back surface 60b and the control contact back surface 70b. This structure improves the heat dissipation efficiency of the element conductive portion 50.

(1-10) The common conductive portion 30 includes the common contact back surface 30b located on the substrate back surface 12 at a position opposite to the common contact front surface 30a. In this structure, the common contact back surface 30b is used for heat dissipation. Thus, the heat dissipation efficiency of the common conductive portion 30 is improved.

(1-11) The common contact back surface 30b is separate from the connection contact back surface 40b. In this structure, either one or both of the common contact back surface 30b and the connection contact back surface 40b may be used when the semiconductor light emitting device 1 is mounted on the circuit substrate 110. This increases the degree of freedom for designing the circuit substrate 110 on which the semiconductor light emitting device 1 is mounted.

(1-12) The substrate 10 is formed of an insulative material. The contact front surfaces 30a, 40a, 50a, 60a, and 70a are the front surfaces of the front surface conductive layers 31, 41, 51, 61, and 71 formed on the substrate front surface 11. The contact back surfaces 30b, 40b, 50b, 60b, and 70b are the front surfaces of the back surface conductive layers 32, 42, 52, 62, and 72 formed on the substrate back surface 12. The conductive portions 30, 40, 50, 60, and 70 include the joints 33, 43, 53, 63, and 73 connecting the front surface conductive layers 31, 41, 51, 61, and 71 to the back surface conductive layers 32, 42, 52, 62, and 72. The joints 33, 43, 53, 63, and 73 are disposed below the case 20. This structure limits interference of the joints 33, 43, 53, 63, and 73 with the wires W1 to W3.

(1-13) The semiconductor light emitting device 1 includes the case 20 accommodating the semiconductor light emitting element 80 and the electronic component 100. This structure protects the semiconductor light emitting element 80 and the electronic component 100.

Second Embodiment

A second embodiment of a semiconductor light emitting device 1B will now be described with reference to FIGS. 11 to 38. In the following description, the same reference characters are given to those components that are the same as the corresponding components of the semiconductor light emitting device 1 of the first embodiment. Such components will not be described in detail. Those components having functions common to the corresponding components of the semiconductor light emitting device 1 of the first embodiment are denoted by the reference characters with a suffix "B." Such components may not be described in detail. In addition, the directions are referred to in the same manner as the first embodiment.

Figure 11:
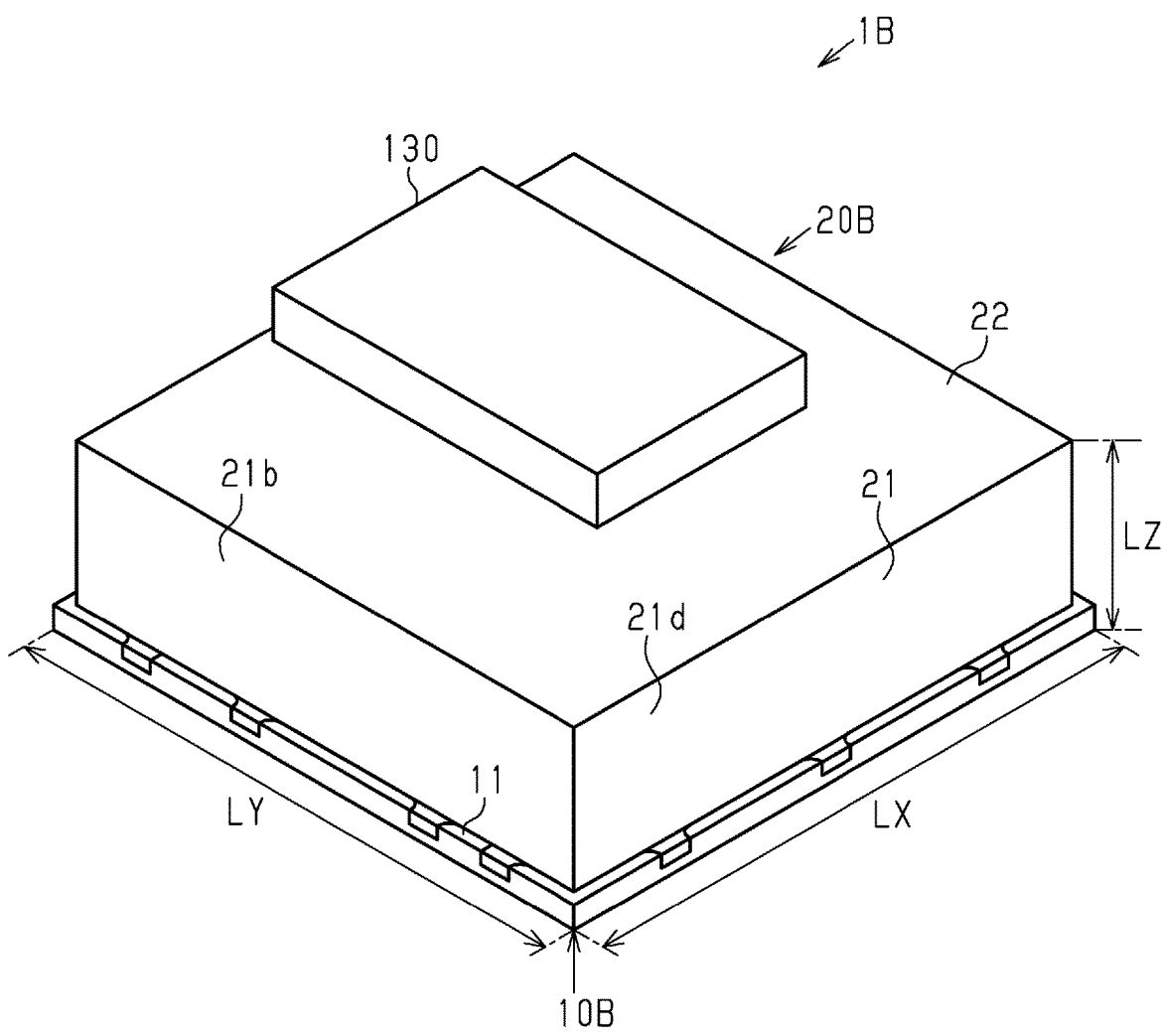
FIG. 11 is a perspective view showing a second embodiment of a semiconductor light emitting device.
Figure 12:
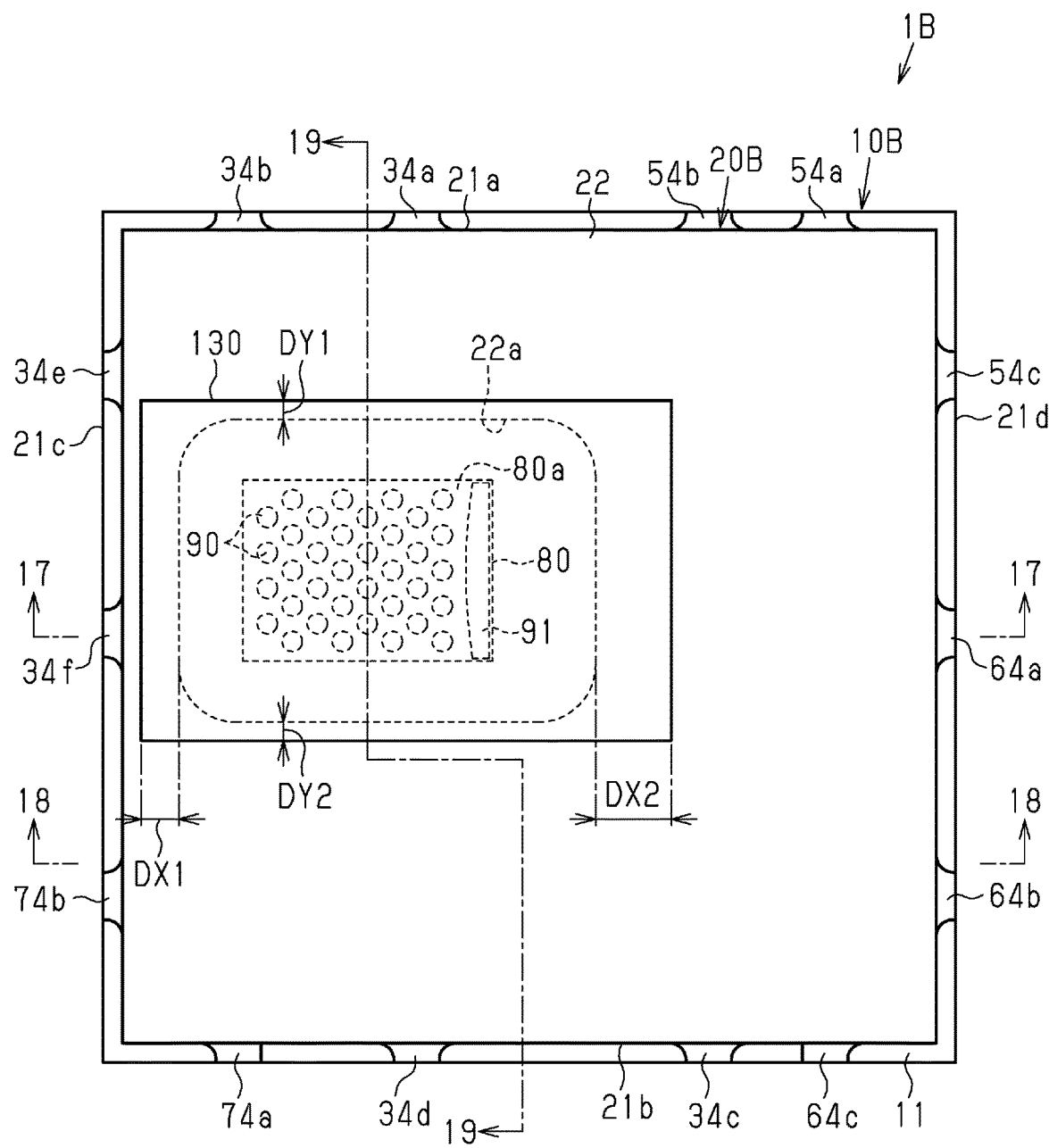
FIG. 12 is a front view of the semiconductor light emitting device.
Figure 13:
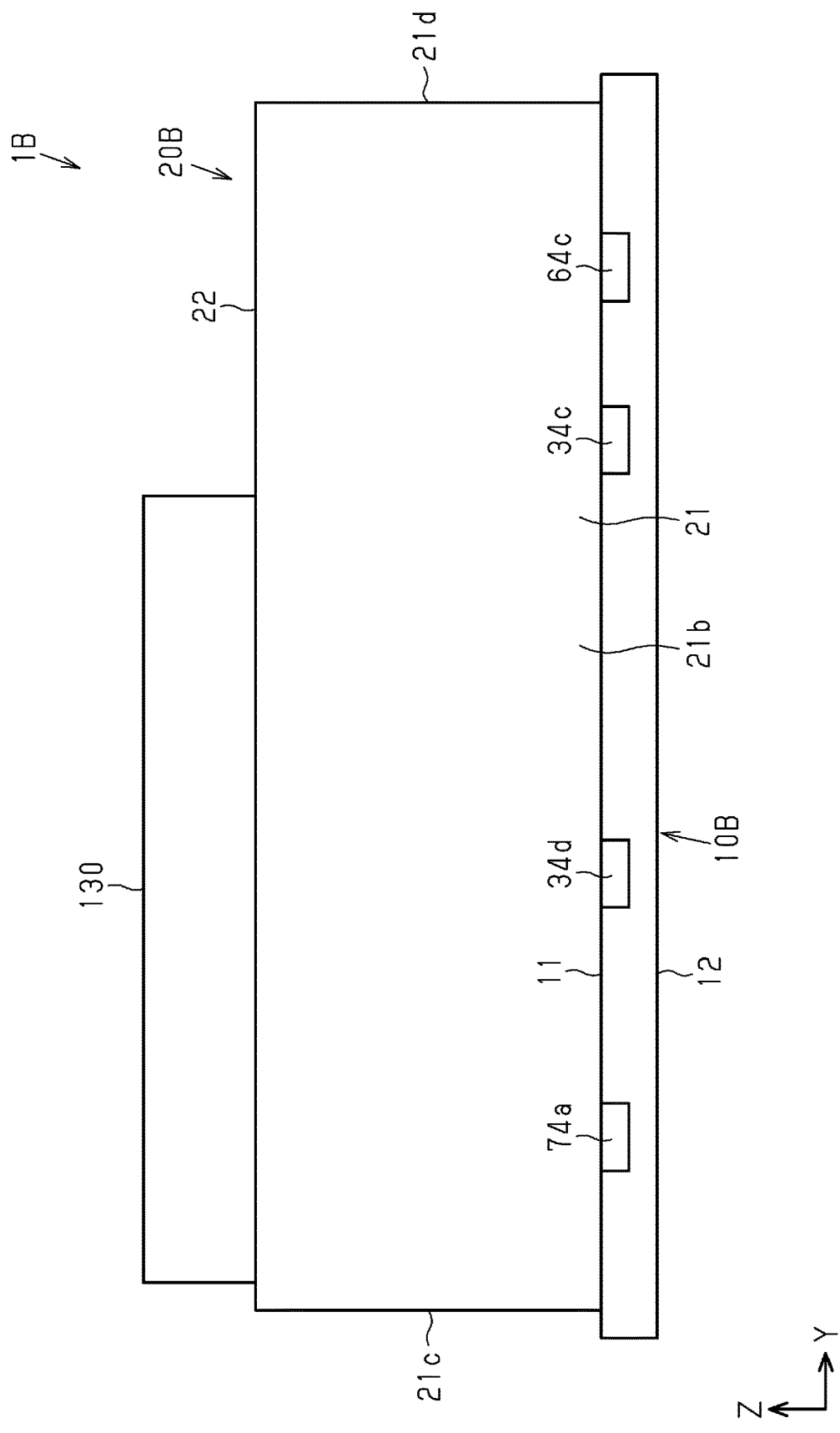
FIG. 13 is a side view of the semiconductor light emitting device.
Figure 14:
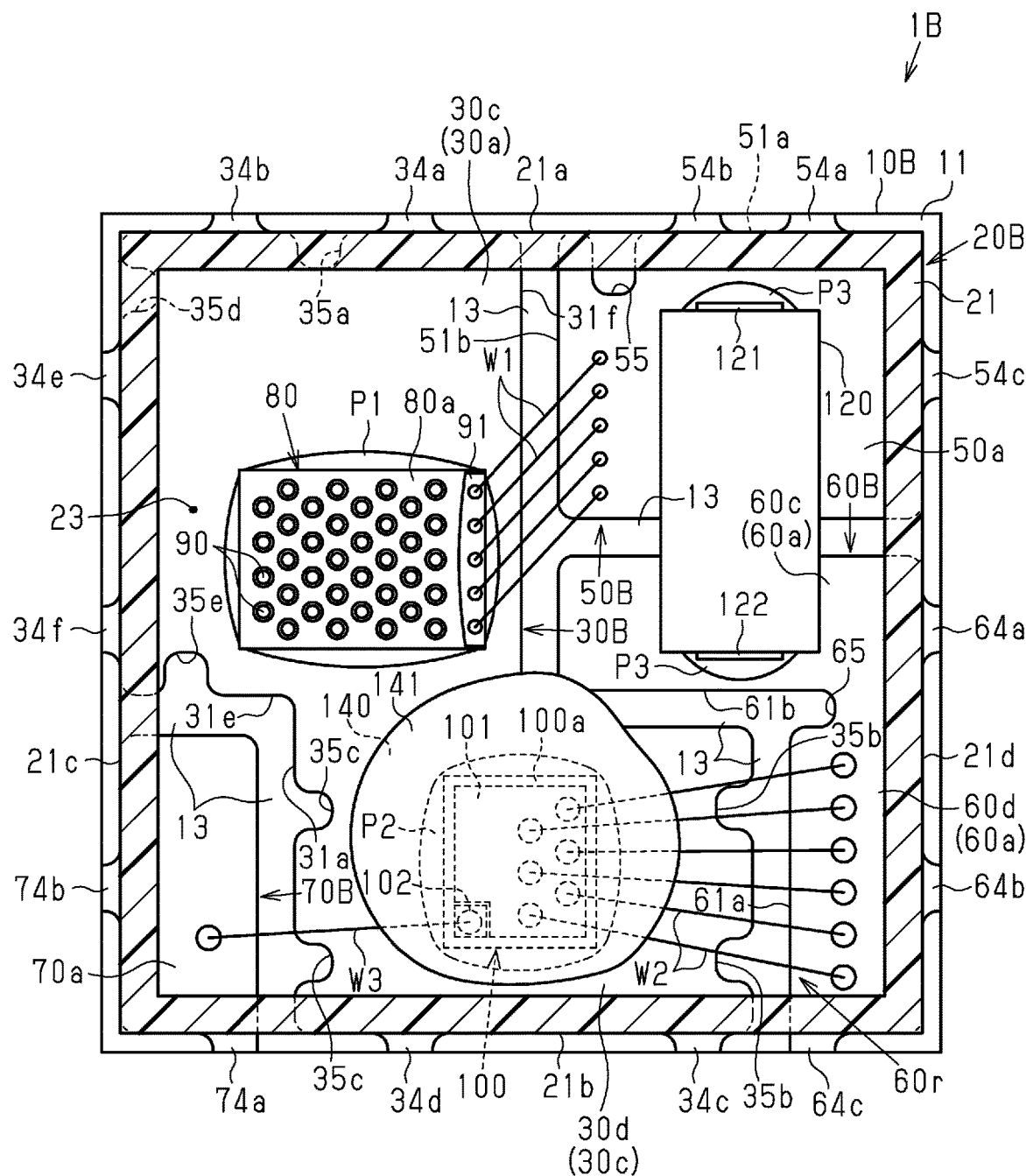
FIG. 14 is a front view showing a frame of the semiconductor light emitting device that is cut along a plane orthogonal to a thickness-wise direction of the substrate.
Figure 15:
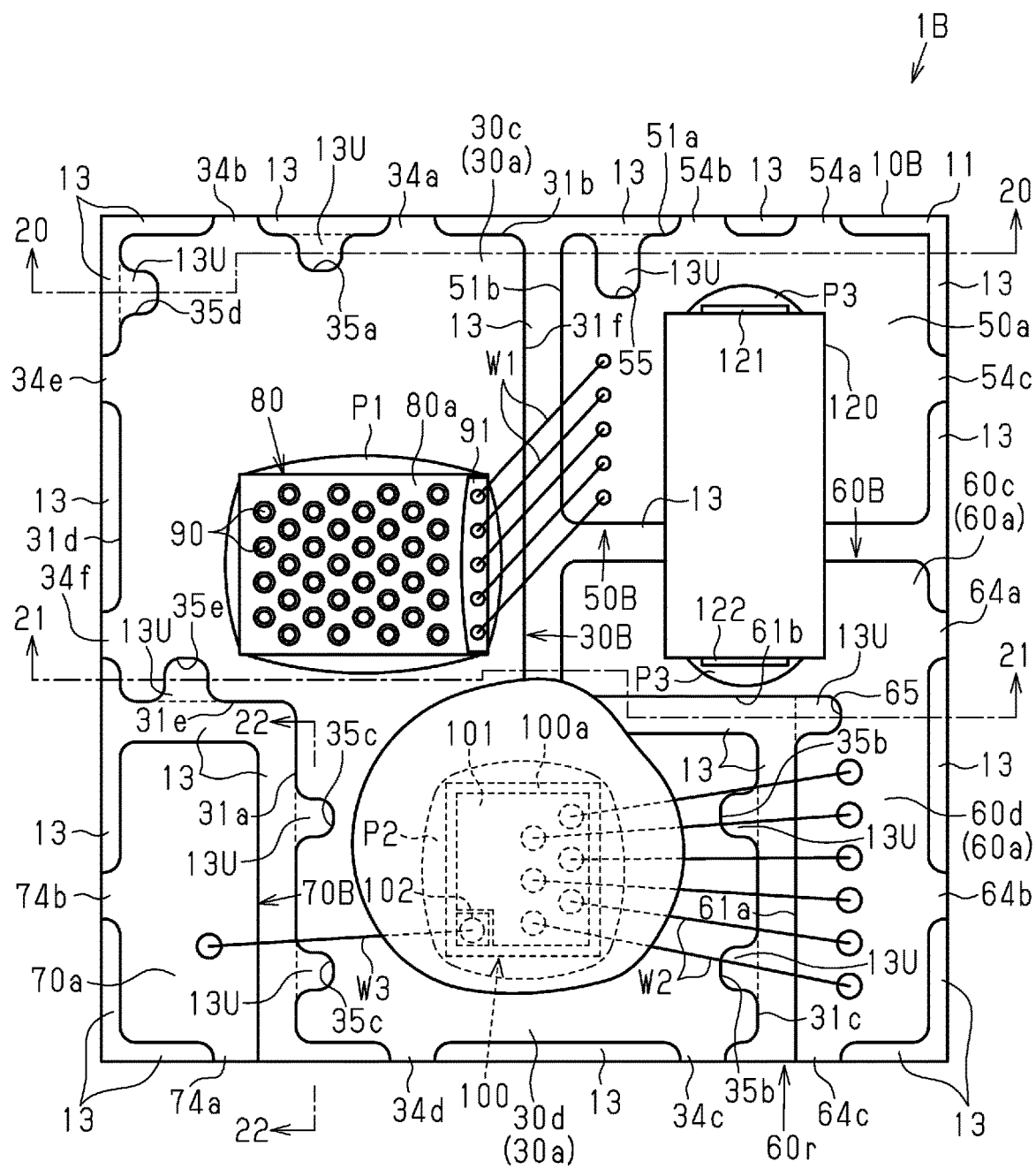
FIG. 15 is a front view of the semiconductor light emitting device with a case removed.

FIG. 11 is a perspective view showing the semiconductor light emitting device 1B of the second embodiment. FIGS. 12 and 14 are front views of the semiconductor light emitting device 1B. FIG. 13 is a side view of the semiconductor light emitting device 1B. FIG. 15 is a bottom view of the semiconductor light emitting device 1B. FIG. 14 shows the semiconductor light emitting device 1B without showing the case 20B.

The semiconductor light emitting device 1B differs from the semiconductor light emitting device 1 of the first embodiment in the structure of the substrate 10, in that the connection conductive portion 40 is omitted, in the shape of the conductive portions 30, 50, 60, and 70, and in the structure of the case 20. The semiconductor light emitting device 1B further includes a capacitor 120. In the following description, the substrate of the present embodiment is referred to as the substrate 10B. Conductive portions of the present embodiment are referred to as the conductive portions 30B, 50B, 60B, and 70B or the common conductive portion 30B, the element conductive portion 50B, the drive conductive portion 60B, and the control conductive portion 70B. The case of the present embodiment is referred to as the case 20B. In the present embodiment, the semiconductor light emitting device 1B has a dimension LX in the X-direction that is approximately 4.5 mm. The semiconductor light emitting device 1B has a dimension LY in the Y-direction that is approximately 4.5 mm. The semiconductor light emitting device 1B has a dimension LZ in a direction orthogonal to the X-direction and the Y-direction (hereafter, referred to as the Z-direction) that is approximately 1.83 mm. The Z-direction is also referred to as the thickness-wise direction of the substrate 10B.

Figure 17:
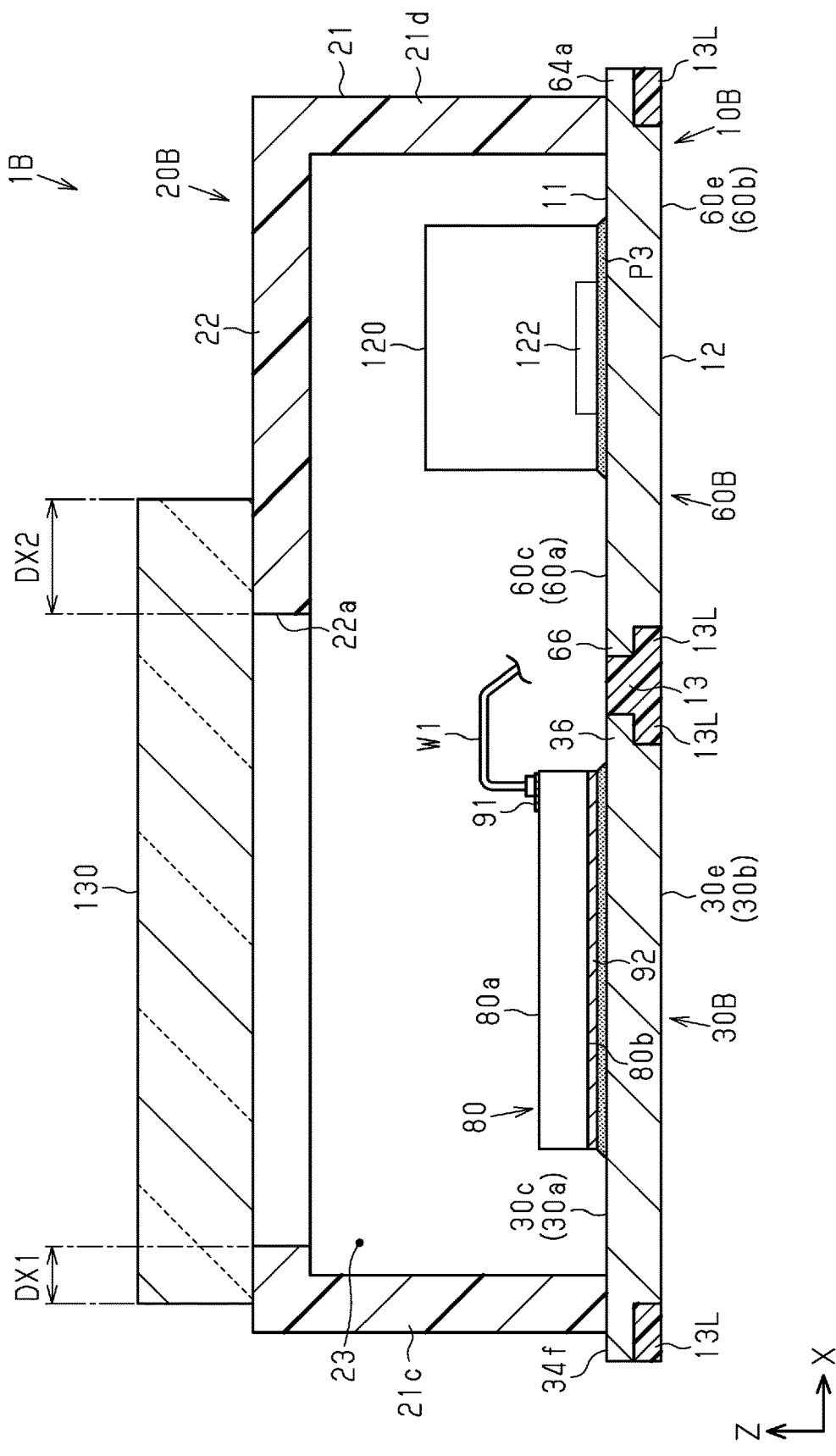
FIG. 17 is a cross-sectional view taken along line 17-17 in FIG. 12.
Figure 18:
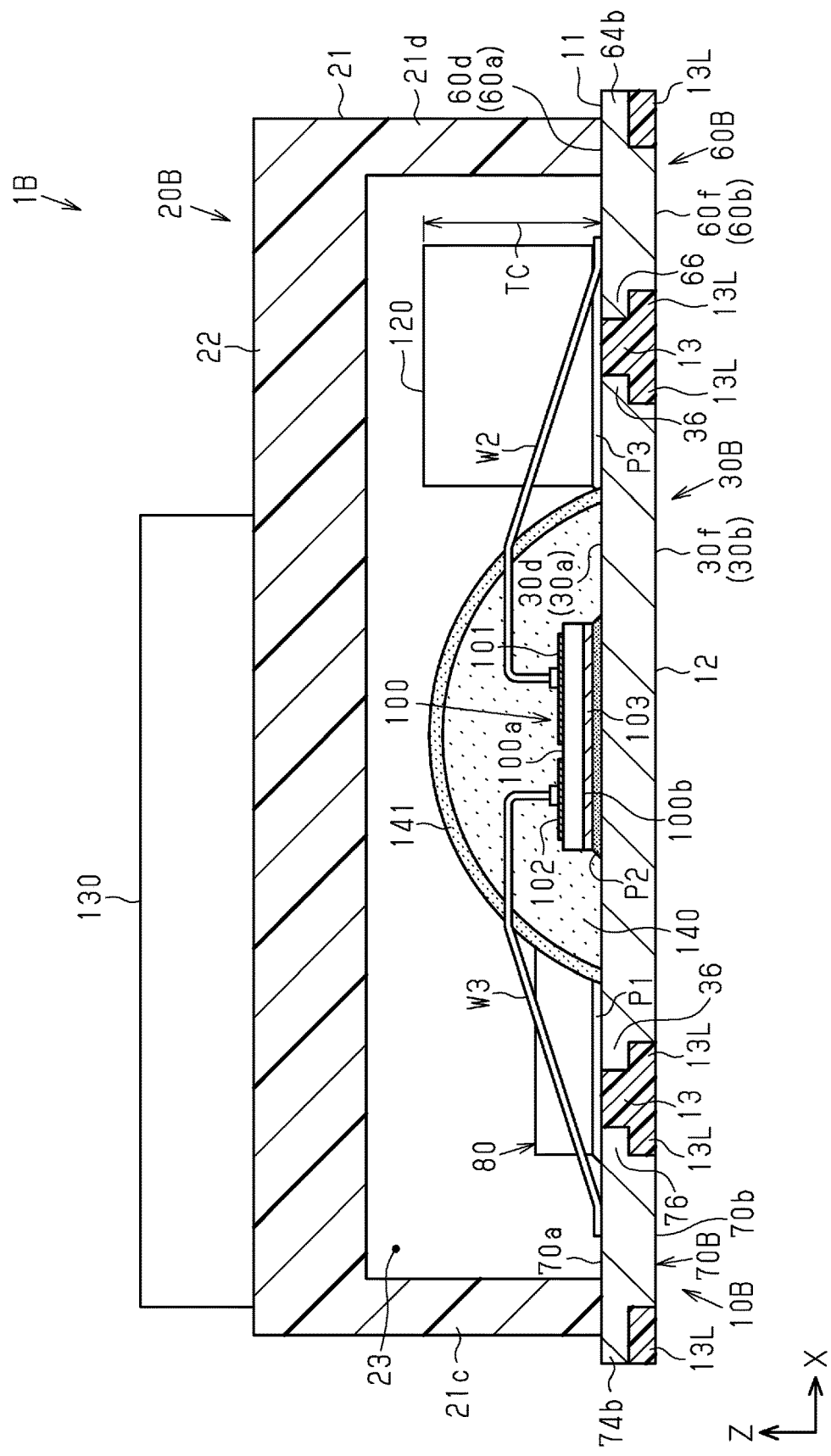
FIG. 18 is a cross-sectional view taken along line 18-18 in FIG. 12.
Figure 19:
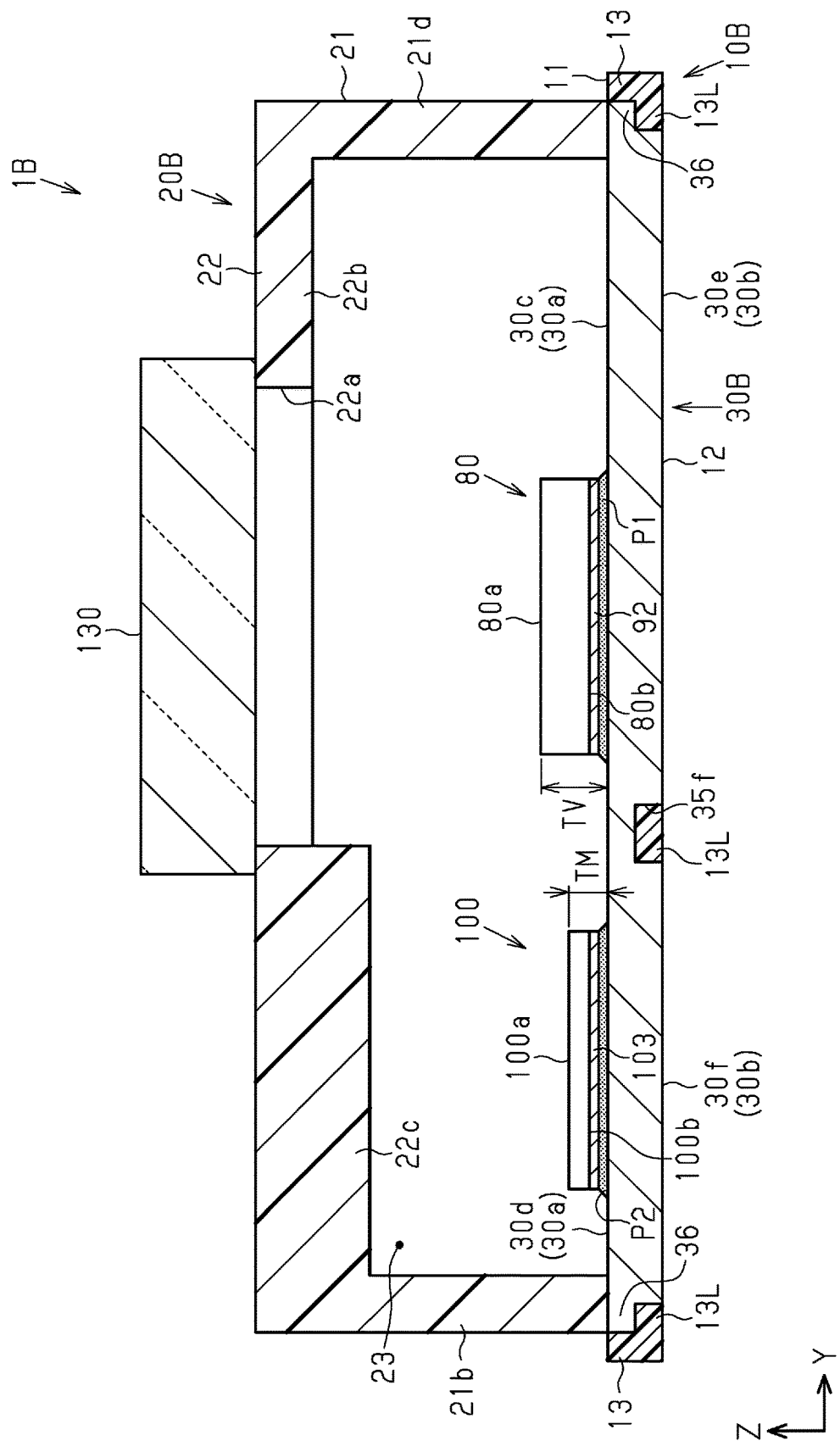
FIG. 19 is a cross-sectional view taken along line 19-19 in FIG. 12.

As shown in FIGS. 17 to 19, the case 20B accommodates the semiconductor light emitting element 80, the electronic component 100, and the capacitor 120. In the same manner as the first embodiment, the case 20B is attached to the substrate 10B. The case 20B is, for example, hollow. However, alternatively, the case 20B may be filled with another member.

The case 20B is box-shaped and has an open side in the Z-direction. In the present embodiment, the case 20B includes the frame 21 and the cover 22 that are integrally formed as a single-piece component. The case 20B is, for example, formed from a light-blocking material such as a colored resin. The case 20B blocks light from the semiconductor light emitting element 80. The frame 21 has the shape of a square that is slightly smaller than the substrate 10B. The cover 22 is shaped to have the same size as the outer edges of the frame 21.

As shown in FIG. 12, the cover 22 includes an opening 22a through which light is transmitted from the semiconductor light emitting element 80. The opening 22a is configured to expose at least the light emitting regions 90 of the semiconductor light emitting element 80 in the Z-direction. In the present embodiment, the opening 22a is configured to expose the entire element upper surface 80a of the semiconductor light emitting element 80 in the Z-direction. Therefore, in plan view, the opening 22a is larger than the element upper surface 80a. In plan view, the opening 22a is rectangular so that the long sides extend in the X-direction and the short sides extend in the Y-direction. As viewed in the Z-direction, the opening 22a is located in the cover 22 at a position toward the third side wall 21c in the X-direction and toward the first side wall 21a in the Y-direction.

As shown in FIGS. 12 and 13, a plate-shaped light diffusion plate 130 is attached to the cover 22 so as to cover the opening 22a from a side opposite to the substrate 10B in the Z-direction. In plan view, the light diffusion plate 130 is rectangular so that the long sides extend in the Y-direction and the short sides extend in the X-direction. For example, a light-transmissive resin material such as polycarbonate, polyester, or acrylic is selected for the light diffusion plate 130. The size of the light diffusion plate 130 may be changed in any range capable of covering the entire opening 22a in the Z-direction. In the present embodiment, as viewed in the Z-direction, the light diffusion plate 130 projects from the opening 22a toward the third side wall 21c in the X-direction by a projection distance DX1 and projects from the opening 22a toward the fourth side wall 21d in the X-direction by a projection distance DX2. The projection distance DX1 is less than the projection distance DX2. The light diffusion plate 130 projects from the opening 22a toward the first side wall 21a in the Y-direction by a projection distance DY1 and projects from the opening 22a toward the second side wall 21b in the Y-direction by a projection distance DY2. The projection distance DX1 is greater than the projection distance DY2. The projection distances DX1 and DX2 may be changed in any manner. In an example, the projection distance DX1 may be greater than or equal to the projection distance DX2. At least one of the projection distances DX1 and DX2 may be less than or equal to the projection distances DY1 and DY2. The light diffusion plate 130 may be sized to cover the entire cover 22 in the Z-direction.

Figure 16:
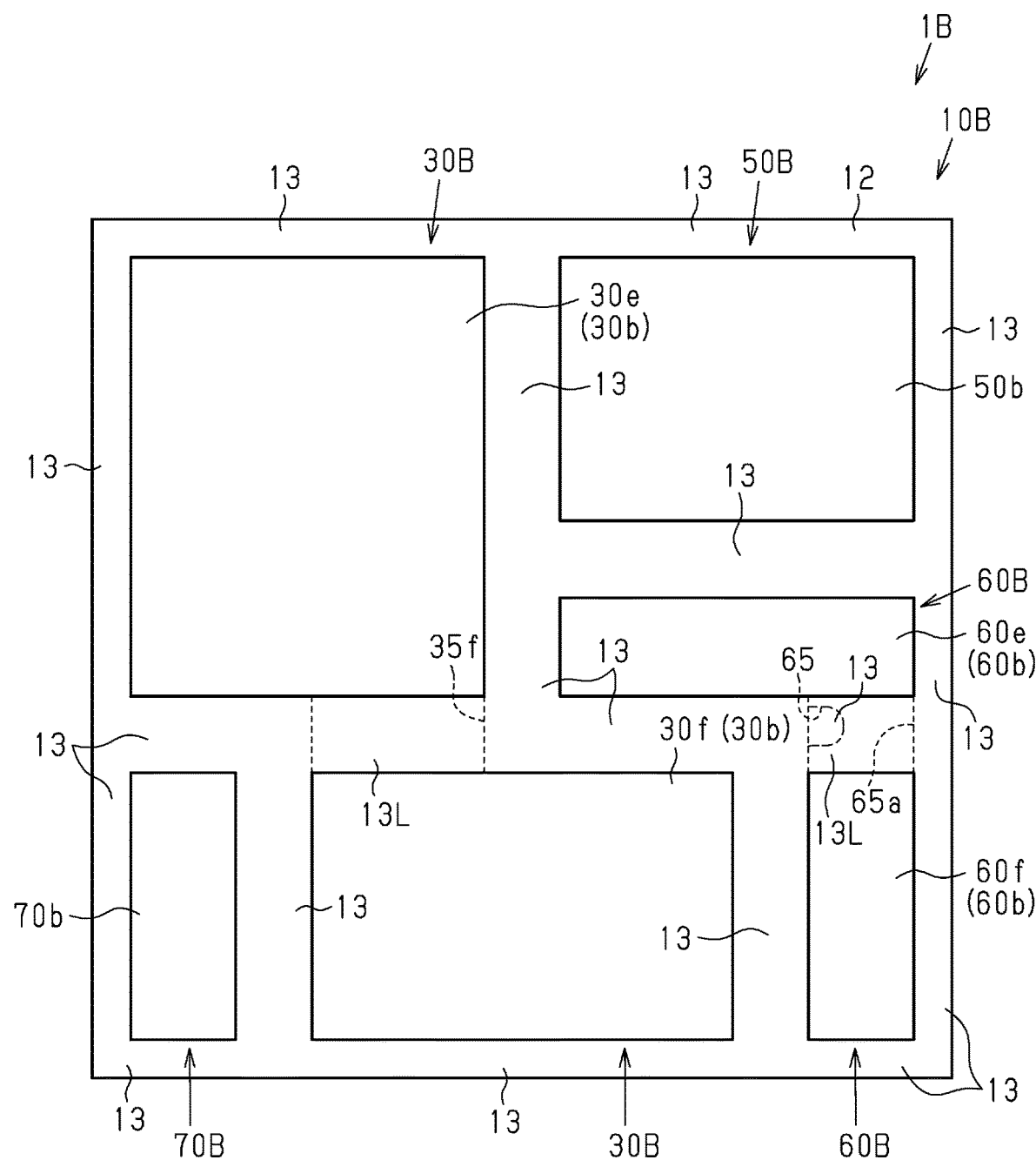
FIG. 16 is a perspective view showing a bottom side of the semiconductor light emitting device.

As shown in FIGS. 14 and 15, the substrate 10B of the present embodiment is formed from a conductive material and is, for example, formed of a metal plate formed from Cu. In other words, the substrate 10B is a lead frame. The substrate 10B includes insulation portions 13 defining the conductive portions 30B, 50B, 60B, and 70B that are insulated from each other. The common conductive portion 30B, the element conductive portion 50B, the drive conductive portion 60B, and the control conductive portion 70B may be referred to as portions of the substrate 10B that are insulated and separated from each other by the insulation portions 13. The insulation portions 13 are formed from, for example, an epoxy resin. As shown in FIGS. 14 to 16, the conductive portions 30B, 50B, 60B, and 70B are exposed in both the substrate front surface 11 and the substrate back surface 12 of the substrate 10B.

A general structure of the conductive portions 30B, 50B, 60B, and 70B will now be described.

As shown in FIGS. 14 to 16, the common conductive portion 30B includes the common contact front surface 30a and the common contact back surface 30b facing in opposite directions in the Z-direction. In the present embodiment, the common contact front surface 30a is part of the substrate front surface 11. The common contact back surface 30b is part of the substrate back surface 12.

As shown in FIG. 14, the common contact front surface 30a is located closer to the central part of the substrate front surface 11 in the X-direction than the third side wall 21c and the fourth side wall 21d. The common contact front surface 30a is formed from the upper side to the lower side of the substrate front surface 11.

The layout of the conductive portions 50B, 60B, and 70B on the common contact front surface 30a is the same as that of the first embodiment. That is, the control conductive portion 70B is located at one side of the common contact front surface 30a in the X-direction. The element conductive portion 50B and the drive conductive portion 60B are located at the other side of the common contact front surface 30a in the X-direction. The element conductive portion 50B and the drive conductive portion 60B are separated in the Y-direction.

As shown in FIGS. 14 to 16, the element conductive portion 50B includes the element contact front surface 50a and the element contact back surface 50b facing in opposite directions in the Z-direction. In the present embodiment, the element contact front surface 50a is part of the substrate front surface 11. The element contact back surface 50b is part of the substrate back surface 12.

The drive conductive portion 60B includes the drive contact front surface 60a and the drive contact back surface 60b facing in opposite directions in the Z-direction. In the present embodiment, the drive contact front surface 60a is part of the substrate front surface 11. The drive contact back surface 60b is part of the substrate back surface 12.

The control conductive portion 70B includes the control contact front surface 70a and the control contact back surface 70b facing in opposite directions in the Z-direction. In the present embodiment, the control contact front surface 70a is part of the substrate front surface 11. The control contact back surface 70b is part of the substrate back surface 12.

The shapes of the conductive portions 30B, 50B, 60B, and 70B will now be described in detail with reference to FIGS. 14 to 22.

As shown in FIGS. 14 and 15, the common contact front surface 30a is generally crank-shaped in plan view. As shown in FIG. 15, the insulation portions 13 are arranged around the common contact front surface 30a. The common contact front surface 30a includes a first common contact front surface portion 30c on which the semiconductor light emitting element 80 is mounted and a second common contact front surface portion 30d on which the electronic component 100 is mounted. The first common contact front surface portion 30c and the second common contact front surface portion 30d are integrally formed. The common contact front surface portion 30c and the second common contact front surface portion 30d are arranged in the Y-direction. As shown in FIG. 14, the first common contact front surface portion 30c extends from the second common contact front surface portion 30d toward the first side wall 21a in the Y-direction. The first common contact front surface portion 30c is located closer to the first side wall 21a than the second common contact front surface portion 30d in the Y-direction. In other words, the second common contact front surface portion 30d is located closer to the second side wall 21b than the first common contact front surface portion 30c in the Y-direction.

The first common contact front surface portion 30c and the second common contact front surface portion 30d are located at different positions in the X-direction. The first common contact front surface portion 30c is located closer to the third side wall 21c than the second common contact front surface portion 30d in the X-direction. In other words, the second common contact front surface portion 30d is located closer to the fourth side wall 21d than the first common contact front surface portion 30c in the X-direction. Thus, the first common contact front surface portion 30c extends from the second common contact front surface portion 30d toward the third side wall 21c in the X-direction. More specifically, the first common contact front surface portion 30c includes a portion projecting in the X-direction toward the third side wall 21c from the end 31a of the second common contact front surface portion 30d located toward the third side wall 21c. The second common contact front surface portion 30d extends from the first common contact front surface portion 30c toward the fourth side wall 21d in the X-direction. More specifically, the second common contact front surface portion 30d includes a portion projecting in the X-direction toward the fourth side wall 21d from an end 31f of the first common contact front surface portion 30c located toward the fourth side wall 21d.

In plan view, the first common contact front surface portion 30c is rectangular so that the long sides extend in the Y-direction and the short sides extend in the X-direction. In plan view, the second common contact front surface portion 30d is rectangular so that the long sides extend in the X-direction and the short sides extend in the Y-direction. The dimension of the first common contact front surface portion 30c in the X-direction is less than the dimensions of the second common contact front surface portion 30d in the X-direction and the Y-direction. The dimension of the first common contact front surface portion 30c in the Y-direction is greater than the dimensions of the second common contact front surface portion 30d in the X-direction and the Y-direction. The difference between the dimension of the first common contact front surface portion 30c in the Y-direction and the dimension of the second common contact front surface portion 30d in the Y-direction is greater than the difference between the dimension of the first common contact front surface portion 30c in the X-direction and the dimension of the second common contact front surface portion 30d in the X-direction. Therefore, the first common contact front surface portion 30c is larger than the second common contact front surface portion 30d.

As shown in FIG. 14, the common contact front surface 30a extends in the Y-direction to a position that overlaps the frame 21. As viewed in the Z-direction, opposite ends of the common contact front surface 30a in the Y-direction include portions projecting beyond the outer surface of the first side wall 21a and the outer surfaces of the second side wall 21b and the third side wall 21c.

More specifically, the end of the first common contact front surface portion 30c located toward the first side wall 21a in the Y-direction includes two projections 34a and 34b, and the end of the second common contact front surface portion 30d located toward the second side wall 21b includes two projections 34c and 34d. In addition, the end of the first common contact front surface portion 30c located toward the third side wall 21c in the X-direction includes two projections 34e and 34f.

As viewed in the Z-direction, the projections 34a and 34b project from the outer surface of the first side wall 21a. The projections 34a and 34b are separate from each other in the X-direction. The projection 34a is located closer to the element conductive portion 50B (fourth side wall 21d) than the projection 34b in the X-direction. As viewed in the Z-direction, the projections 34c and 34d project from the outer surface of the second side wall 21b. The projections 34c and 34d are separate from each other in the X-direction. The projection 34c is located closer to the drive conductive portion 60B (fourth side wall 21d) than the projection 34d in the X-direction. As viewed in the Z-direction, the projections 34e and 34f project from the outer surface of the third side wall 21c. The projections 34e and 34f are separate from each other in the Y-direction. The projection 34e is located closer to the first side wall 21a than the projection 34f in the Y-direction.

In the present embodiment, when a support lead supporting the common conductive portion 30B is cut, residual portions of the lead frame are the projections 34a to 34f. The projections 34a to 34f are exposed from the side surface of the substrate 10B. The projections 34a to 34f are also exposed from the substrate front surface 11. The number of projections may be changed to any number. As viewed from above, connection portions between the common contact front surface 30a and the projections 34a to 34f each have a curved surface (refer to FIG. 15). The number of projections may be changed to any number.

As shown in FIGS. 14 and 15, the common conductive portion 30B includes recesses that restrict movement of the common conductive portion 30B. In the present embodiment, the common contact front surface 30a includes the recesses. In the illustrated example, the common contact front surface 30a includes a recess 35a, two recesses 35b, two recesses 35c, a recess 35d, and a recess 35e. The number of recesses may be changed to any number.

Figure 20:
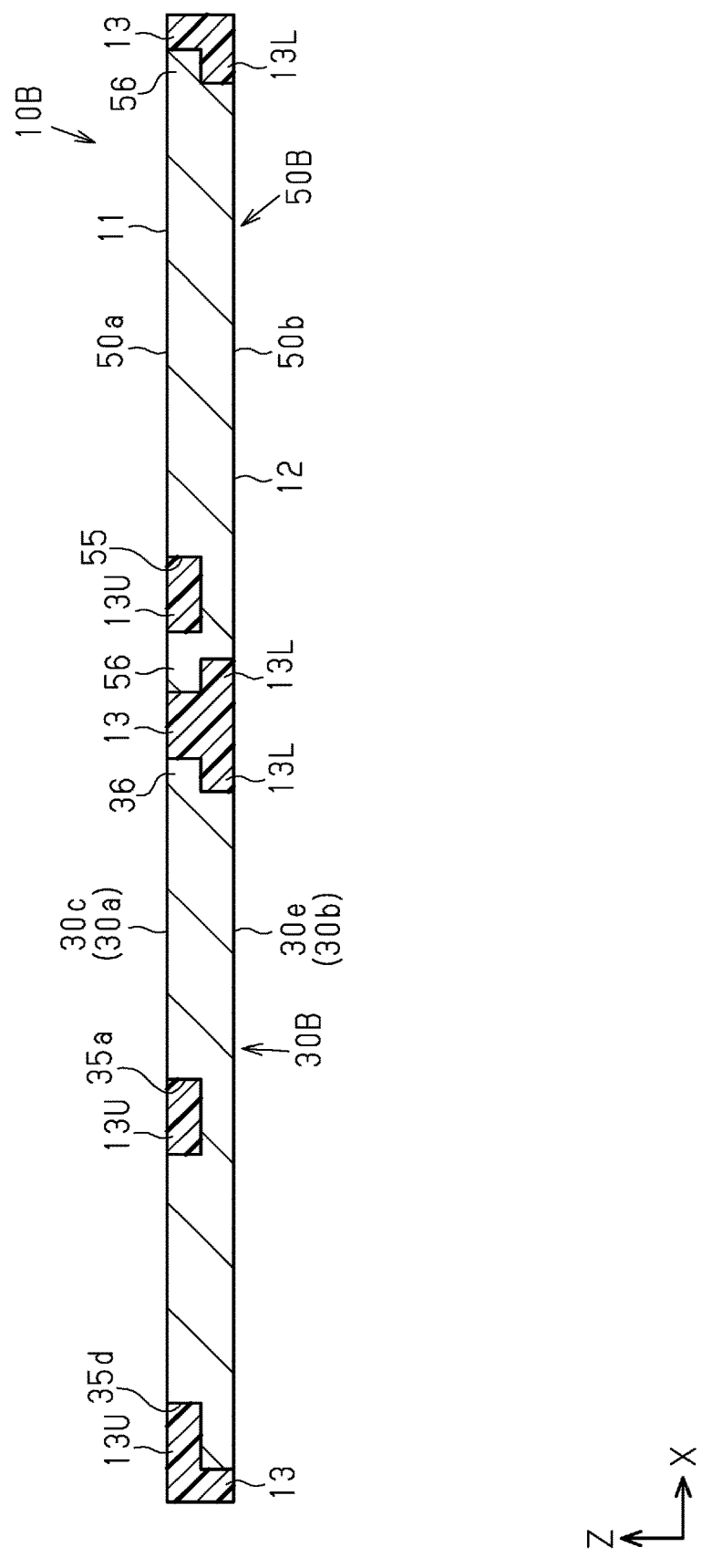
FIG. 20 is a cross-sectional view taken along line 20-20 in FIG. 15.

As shown in FIG. 14, the first common contact front surface portion 30c includes an end 31b located toward the first side wall 21a. The recess 35a is recessed from the end 31b toward the second side wall 21b in the Y-direction. The bottom of the recess 35a is defined by a curved surface. In the present embodiment, in plan view, the recess 35a is concave and has a width that decreases toward the bottom. In the present embodiment, the recess 35a extends to the inner surface of the first side wall 21a as viewed in the Z-direction. As shown in FIG. 20, the recess 35a is recessed in the Z-direction from the first common contact front surface portion 30c in a front layer part of the common conductive portion 30B in the Z-direction. The recess 35a accommodates an insulation portion 13. The insulation portion 13 accommodated in the recess 35a includes a front-half insulation portion 13U that does not extend through the substrate 10B in the Z-direction. The front-half insulation portion 13U in the recess 35a is the portion surrounded by the recess 35a and the broken line shown in FIG. 15. Part of the insulation portion 13 located above the front-half insulation portion 13U of the recess 35a extends through the substrate 10B in the Z-direction. The dimensions of the recess 35a in the X-direction and the Y-direction may be changed in any manner. In an example, as viewed in the Z-direction, the inner edge of the recess 35a may be located at an inner side of the inner surface of the first side wall 21a or at an outer side of the inner surface of the first side wall 21a.

As shown in FIG. 14, the second common contact front surface portion 30d includes an end 31c located toward the fourth side wall 21d in the X-direction. The two recesses 35b are recessed from the end 31c in the X-direction. The bottom of each recess 35b is defined by a curved surface. In the present embodiment, in plan view, the recess 35b is concave and has a width that decreases toward the bottom. Although not illustrated, the two recesses 35b are recessed in the Z-direction from the second common contact front surface portion 30d in a front layer part of the common conductive portion 30B in the Z-direction. The two recesses 35b accommodate an insulation portion 13. The insulation portion 13 accommodated in the two recesses 35b includes front-half insulation portions 13U that do not extend through the substrate 10B in the Z-direction. The front-half insulation portion 13U in each recess 35b is the portion shown in FIG. 15 surrounded by the recess 35b and the broken line and located at an inner side of a flange 36 (refer to FIG. 17), which will be described later. Part of the insulation portion 13 located closer to the drive conductive portion 60B than the front-half insulation portion 13U in the recess 35b in the X-direction extends through the substrate 10B in the Z-direction.

The two recesses 35c are recessed from the end 31a of the second common contact front surface portion 30d in the X-direction. The bottom of each recess 35c is defined by a curved surface. In the present embodiment, in plan view, the recess 35c is concave and has a width that decreases toward the bottom. Although not illustrated, in the same manner as the two recesses 35b, the two recesses 35c are recessed in the Z-direction from the second common contact front surface portion 30d in the front layer part of the common conductive portion 30B in the Z-direction. The two recesses 35c accommodate an insulation portion 13. The shape of the two recesses 35c in plan view is symmetric to the shape of the two recesses 35b in plan view.

The dimensions of the two recesses 35b and 35c in the X-direction and the Y-direction may be changed in any manner. In an example, at least one of the dimensions of the two recesses 35b in the X-direction and the Y-direction may differ from that of the recesses 35c.

As shown in FIG. 14, the first common contact front surface portion 30c includes an end 31d located toward the third side wall 21c. The recess 35d is recessed from the end 31d toward the fourth side wall 21d in the Y-direction. The bottom of the recess 35d is defined by a curved surface. In the present embodiment, in plan view, the recess 35d is concave and has a width that decreases toward the bottom. In the present embodiment, the recess 35d extends to the inner surface of the third side wall 21c as viewed in the Z-direction. As shown in FIG. 20, the recess 35d is recessed in the Z-direction from the first common contact front surface portion 30c in a front layer part of the common conductive portion 30B in the Z-direction. The recess 35d accommodates an insulation portion 13. The insulation portion 13 accommodated in the recess 35d includes a front-half insulation portion 13U that does not extend through the substrate 10B in the Z-direction. The front-half insulation portion 13U in the recess 35d is the portion shown in FIG. 15 surrounded by the recess 35d and the broken line and located at the inner side of the flange 36 (refer to FIG. 17). Part of the insulation portion 13 located at the left of the front-half insulation portion 13U of the recess 35a extends through the substrate 10B in the Z-direction. The dimensions of the recess 35d in the X-direction and the Y-direction may be changed in any manner. In an example, as viewed in the Z-direction, the inner edge of the recess 35d may be located at an inner side of the inner surface of the third side wall 21c or at an outer side of the inner surface of the third side wall 21c.

Figure 21:
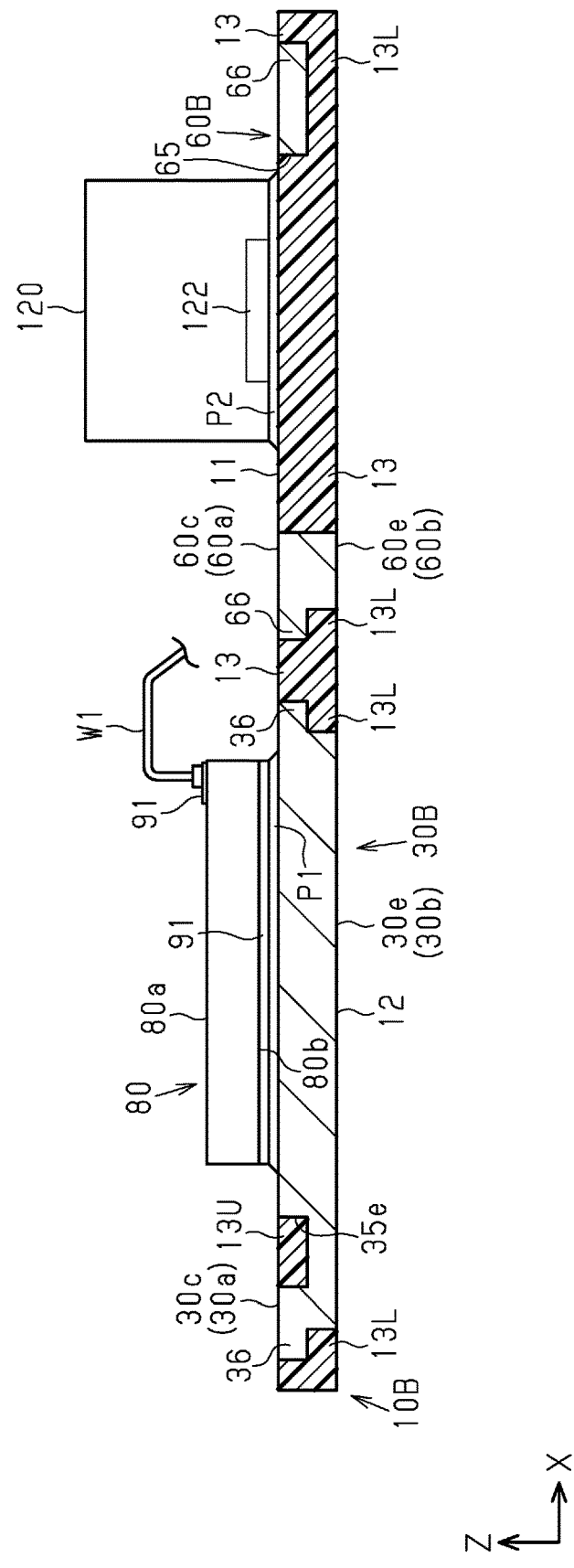
FIG. 21 is a cross-sectional view taken along line 21-21 in FIG. 15.

As shown in FIG. 14, the first common contact front surface portion 30c includes an end 31e located toward the second side wall 21b. The recess 35e is recessed from the end 31e in the Y-direction. The bottom of the recess 35e is defined by a curved surface. In the present embodiment, in plan view, the recess 35e is concave and has a width that decreases toward the bottom. As shown in FIG. 21, the recess 35e is recessed in the Z-direction from the first common contact front surface portion 30c in a front layer part of the common conductive portion 30B in the Z-direction. The recess 35e accommodates an insulation portion 13. The insulation portion 13 accommodated in the recess 35e includes a front-half insulation portion 13U that does not extend through the substrate 10B in the Z-direction. The front-half insulation portion 13U in the recess 35e is the portion shown in FIG. 15 surrounded by the recess 35e and the broken line and located at the inner side of a flange 36 (refer to FIG. 19). Part of the insulation portion 13 located below the front-half insulation portion 13U of the recess 35e extends through the substrate 10B in the Z-direction. The dimensions of the recess 35e in the X-direction and the Y-direction may be changed in any manner. In an example, as viewed in the Z-direction, the inner edge of the recess 35e may be located at an inner side of the inner surface of the third side wall 21c or at an outer side of the inner surface of the third side wall 21c.

In plan view, the shape of the recesses 35a to 35e may be changed in any manner. In an example, in plan view, the recesses 35a to 35e are rectangular. In plan view, the recesses 35a to 35e may have different depths.

Figure 22:
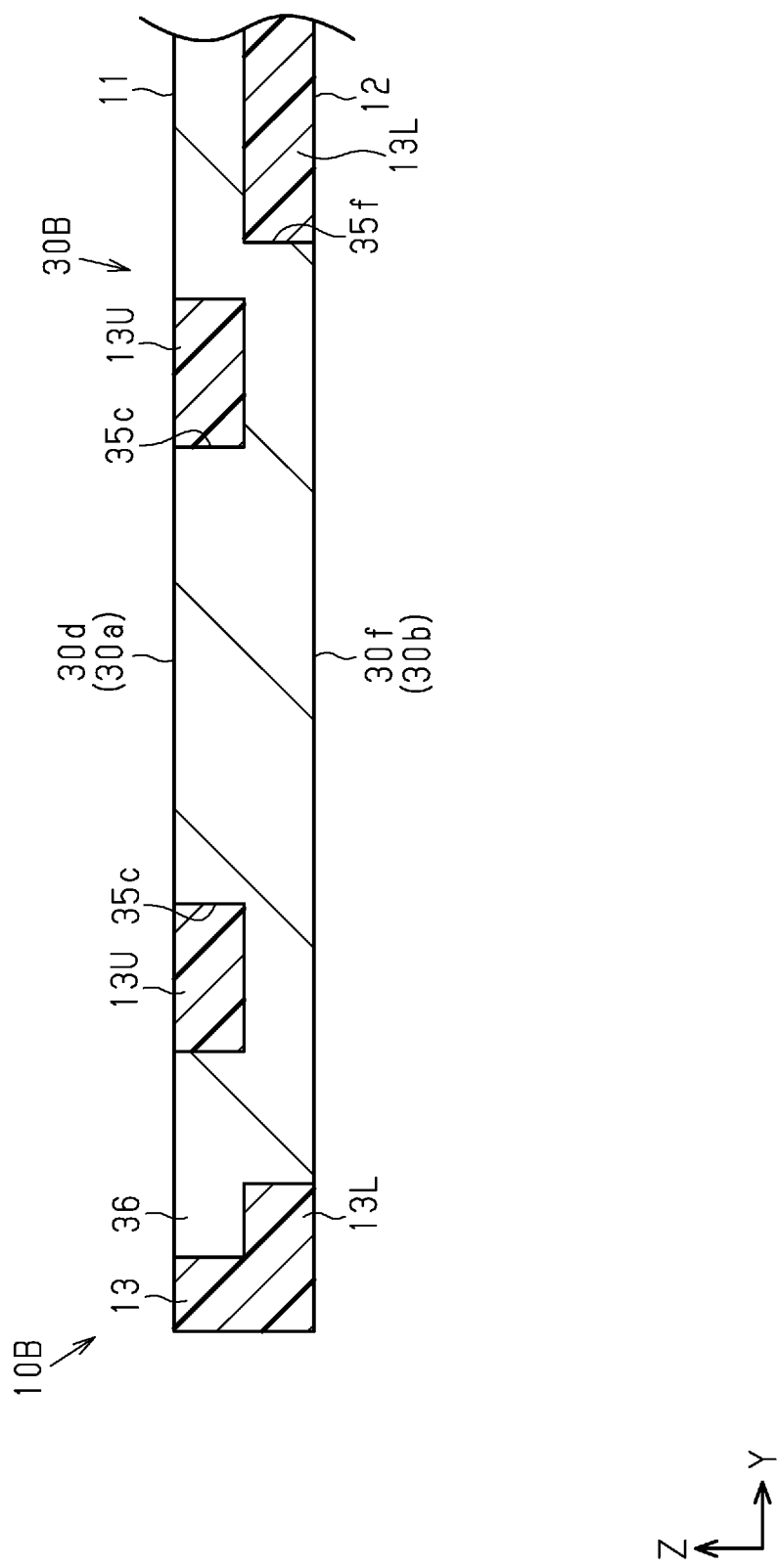
FIG. 22 is a cross-sectional view taken along line 22-22 in FIG. 15.

As shown in FIGS. 20 to 22, in a cross-sectional view of the common conductive portion 30B cut along a plane extending in the Z-direction, the flange 36 is formed in a peripheral edge of the common contact front surface 30a. In other words, the common conductive portion 30B includes a back layer part including the common contact back surface 30b and located closer to the common contact back surface 30b than the front layer part including the common contact front surface 30a. The back layer part is recessed toward the front layer part in a direction orthogonal to the Z-direction. The recessed part includes an insulation portion 13. The insulation portion 13 accommodated between the flange 36 and the common contact back surface 30b includes a back-half insulation portion 13L that does not extend through the substrate 10B in the Z-direction. The part of the insulation portion 13 located at an outer side of the flange 36 extends through the substrate 10B in the Z-direction and is continuous with the back-half insulation portions 13L of the flange 36.

The peripheral edge of the common contact front surface 30a includes the projections 34a to 34f (refer to FIGS. 14 and 15). The projections 34a to 34f extend from the flange 36 and have the same thickness as the flange 36. That is, the insulation portion 13 is accommodated between the projections 34a to 34f and the common contact back surface 30b, so that the projections 34a to 34f are not exposed from the substrate back surface 12. The insulation portion 13 accommodated between the projections 34a to 34f and the common contact back surface 30b includes a back-half insulation portion 13L that does not extend through the substrate 10B in the Z-direction. As viewed in the Z-direction, the insulation portion 13 extends through the substrate 10B and is continuous with the back-half insulation portions 13L of the projections 34a to 34f at opposite sides of the projections 34a to 34f in a direction orthogonal to the direction in which the projections 34a to 34f extend. The common contact back surface 30b is exposed from the substrate back surface 12 as a part located at an inner side of the flange 36 of the common contact front surface 30a. Although not illustrated, the recesses 35a to 35e extend to an inner side of the common contact front surface 30a beyond the peripheral edge of the common contact front surface 30a (flange 36). That is, the recesses 35a to 35e partially overlap the common contact back surface 30b as viewed in the Z-direction. Thus, the front-half insulation portions 13U in the recesses 35a to 35e partially overlap the common contact back surface 30b as viewed in the Z-direction.

As shown in FIGS. 14 and 15, the element contact front surface 50a is located at a corner of the substrate 10B located toward the first side wall 21a and the fourth side wall 21d. The element contact front surface 50a is separate from the first common contact front surface portion 30c in the X-direction. The insulation portion 13 is arranged around the element contact front surface 50a.

As shown in FIG. 14, as viewed in the Y-direction, a portion of the element contact front surface 50a located toward the third side wall 21c overlaps a portion of the second common contact front surface portion 30d located toward the fourth side wall 21d. The element contact front surface 50a is located in a recessed region formed by displacing the first common contact front surface portion 30c from the second common contact front surface portion 30d in the X-direction. The element contact front surface 50a faces the first common contact front surface portion 30c in the X-direction.

As shown in FIG. 15, in plan view, the element contact front surface 50a is rectangular so that the long sides extend in the X-direction and the short sides extend in the Y-direction. The dimension of the element contact front surface 50*a* in the Y-direction is less than the dimension of the first common contact front surface portion 30*c* in the Y-direction. The dimension of the element contact front surface 50*a* in the X-direction is greater than the dimension of the first common contact front surface portion 30*c* in the X-direction.

As shown in FIG. 14, as viewed in the Z-direction, an end of the element contact front surface 50*a* located toward the first side wall 21*a* extends to a position overlapping the first side wall 21*a* and includes portions projecting beyond the outer surface of the first side wall 21*a*. As viewed in the Z-direction, an end of the element contact front surface 50*a* located toward the fourth side wall 21*d* extends to a position overlapping the fourth side wall 21*d* and includes a portion projecting beyond the outer surface of the fourth side wall 21*d*.

More specifically, an end of the element contact front surface 50*a* in the Y-direction located toward the first side wall 21*a* includes projections 54*a* and 54*b*, and an end of the element contact front surface 50*a* in the X-direction located toward the fourth side wall 21*d* includes a projection 54*c*. As viewed in the Z-direction, the projections 54*a* and 54*b* project from the outer surface of the first side wall 21*a*. The projections 54*a* and 54*b* are separate from each other in the X-direction. The projection 54*a* is located closer to the fourth side wall 21*d* than the projection 54*b*. As viewed in the Z-direction, the projection 54*c* projects from the outer surface of the fourth side wall 21*d*. The projection 54*c* is formed on the central part of the element contact front surface 50*a* in the Y-direction. In the present embodiment, when a support lead supporting the element conductive portion 50B is cut, residual portions of the lead frame are the projections 54*a* to 54*c*. The number of projections may be changed to any number. As viewed in the Z-direction, connection portions between the element contact front surface 50*a* and the projections 54*a* to 54*c* each have a curved surface (refer to FIG. 15).

The element conductive portion 50B includes a recess 55 that restricts movement of the element conductive portion 50B. In the present embodiment, the recess 55 is formed in the element contact front surface 50*a*. The number of recesses may be changed in any manner.

As shown in FIG. 14, the recess 55 is formed in the element contact front surface 50*a* at an end located toward the first side wall 21*a* and the third side wall 21*c*. The element contact front surface 50*a* has an end 51*a* located toward the first side wall 21*a*. The recess 55 is recessed from the end 51*a* toward the second side wall 21*b* in the Y-direction. The dimension of the recess 55 in the Y-direction (depth of the recess 55*a* in plan view) is greater (deeper) than the dimension of the recesses 35*a*, 35*d*, and 35*e* in the Y-direction and the dimension of the recesses 35*b* and 35*c* in the X-direction (depth of the recesses 35*a* to 35*e* in plan view). The bottom of the recess 55 is defined by a curved surface. In the present embodiment, in plan view, the recess 55 partially extends in the Y-direction with a fixed width and has a curved surface that reduces the width toward the bottom. In the present embodiment, as viewed in the Z-direction, the recess 55 extends inward beyond the inner surface of the first side wall 21*a*. The recess 55 is used as a mark of the position where the second bonding portions of the wires W1 are formed.

As shown in FIG. 20, the recess 55 is recessed in the Z-direction from the element contact front surface 50*a* in a front layer part of the element conductive portion 50B in the Z-direction. The recess 55 accommodates in an insulation portion 13. The insulation portion 13 accommodated in the recess 55 includes a front-half insulation portion 13U that does not extend through the substrate 10B in the Z-direction. The front-half insulation portion 13U in the recess 55 is the portion shown in FIG. 15 surrounded by the recess 55 and the broken line, and located at an inner side of a flange 56 (refer to FIG. 20), which will be described later. Part of the insulation portion 13 located above the front-half insulation portion 13U of the recess 55 extends through the substrate 10B in the Z-direction. In the present embodiment, the depth of the recess 55 in the Z-direction is equal to the depth of the recesses 35*a* to 35*e* in the Z-direction (refer to FIG. 15). For example, when the difference between the depth of the recess 55 in the Z-direction and the depth of the recesses 35*a* to 35*e* in the Z-direction is within 5% of the depth of the recesses 35*a* to 35*e* in the Z-direction, the depth of the recess 55 in the Z-direction is considered to be equal to the depth of the recesses 35*a* to 35*e* in the Z-direction.

The dimensions of the recess 55 in the X-direction and the Y-direction, which are shown in FIG. 14, may be changed in any manner. In an example, as viewed in the Z-direction, the inner edge of the recess 55 may be located at the same position as the inner surface of the first side wall 21*a* or at an outer side of the inner surface of the first side wall 21*a*. The direction of the recess 55 may be changed in any manner. In an example, the recess 55 may be recessed in the Y-direction toward the fourth side wall 21*d* from an end 51*b* of the element contact front surface 50*a* that is located toward the third side wall 21*c*.

As shown in FIG. 20, in a cross-sectional view of the element conductive portion 50B cut along a plane extending in the Z-direction, the flange 56 is formed in the peripheral edge of the element contact front surface 50*a*. In other words, the element conductive portion 50B includes a back layer part including the element contact back surface 50*b* and located closer to the element contact back surface 50*b* than the element contact front surface 50*a* including the front layer part. The back layer part is recessed toward the front layer part in a direction orthogonal to the Z-direction. The recessed part accommodates an insulation portion 13. The insulation portion 13 accommodated between the flange 56 and the element contact back surface 50*b* includes a back-half insulation portion 13L that does not extend through the substrate 10B in the Z-direction. The part of the insulation portion 13 located at an outer side of the flange 56 extends through the substrate 10B in the Z-direction and is continuous with the back-half insulation portion 13L of the flange 56.

The peripheral edge of the element contact front surface 50*a* includes the projections 54*a* to 54*c* (refer to FIGS. 14 and 15). The projections 54*a* to 54*c* are exposed in the substrate front surface 11 and side surfaces of the substrate 10B. The projections 54*a* to 54*c* extend from the flange 56 and have the same thickness as the flange 56. That is, the insulation portion 13 is accommodated between the projections 54*a* to 54*c* and the element contact back surface 50*b*, so that the projections 54*a* to 54*c* are not exposed from the substrate back surface 12. The insulation portion 13 accommodated between the projections 54*a* to 54*c* and the element contact back surface 50*b* includes a back-half insulation portion 13L that does not extend through the substrate 10B in the Z-direction. As viewed in the Z-direction, the insulation portion 13 extends through the substrate 10B and is continuous with the back-half insulation portions 13L of the projections 54*a* to 54*c* at opposite sides of the projections 54*a* to 54*c* in a direction orthogonal to the direction in which the projections 54a to 54c extend. The element contact back surface 50b is exposed from the substrate back surface 12 as a part located at an inner side of the flange 56 of the element contact front surface 50a. Although not illustrated, the recess 55 extends to an inner side of the element contact front surface 50a beyond the peripheral edge of the element contact front surface 50a (flange 56). That is, the recess 55 partially overlaps the element contact back surface 50b as viewed in the Z-direction. Thus, the front-half insulation portion 13U in the recess 55 partially overlaps the element contact back surface 50b as viewed in the Z-direction.

As shown in FIGS. 14 and 15, the drive contact front surface 60a is aligned with the element contact front surface 50a in the X-direction and is separate from the element contact front surface 50a in the Y-direction. As shown in FIG. 14, the drive contact front surface 60a surrounds the second common contact front surface portion 30d from the fourth side wall 21d in the X-direction and the first side wall 21a in the Y-direction. In plan view, the drive contact front surface 60a is generally L-shaped. As shown in FIG. 15, the insulation portion 13 is arranged around the drive contact front surface 60a.

The drive contact front surface 60a includes a first drive contact front surface portion 60c and a second drive contact front surface portion 60d. The first drive contact front surface portion 60c and the second drive contact front surface portion 60d are integrally formed. The first drive contact front surface portion 60c and the second drive contact front surface portion 60d are arranged in the Y-direction. As shown in FIG. 14, the first drive contact front surface portion 60c is located closer to the first side wall 21a than the second drive contact front surface portion 60d in the Y-direction. In other words, the second drive contact front surface portion 60d is located closer to the second side wall 21b than the first drive contact front surface portion 60c in the Y-direction. That is, the first drive contact front surface portion 60c is located between the element contact front surface 50a and the second drive contact front surface portion 60d in the Y-direction. As viewed in the X-direction, the first drive contact front surface portion 60c overlaps the first common contact front surface portion 30c. The first drive contact front surface portion 60c is located closer to the first side wall 21a than the second common contact front surface portion 30d. As viewed in the X-direction, the second drive contact front surface portion 60d overlaps the second common contact front surface portion 30d.

As shown in FIG. 15, the first drive contact front surface portion 60c extends in the X-direction, and the second drive contact front surface portion 60d extends in the Y-direction. In plan view, the first drive contact front surface portion 60c is rectangular so that the long sides extend in the X-direction and the short sides extend in the Y-direction. In plan view, the second drive contact front surface portion 60d is rectangular so that the long sides extend in the Y-direction and the short sides extend in the X-direction. As shown in FIG. 14, the second drive contact front surface portion 60d extends toward the second side wall 21b from an end of the first drive contact front surface portion 60c that is located toward the fourth side wall 21d. Thus, the second drive contact front surface portion 60d is recessed from the first drive contact front surface portion 60c so as to have a smaller dimension than the first drive contact front surface portion 60c in the X-direction. More specifically, the drive contact front surface 60a includes a recessed region 60r defined by the first drive contact front surface portion 60c and the second drive contact front surface portion 60d. The recessed region 60r accommodates the second common contact front surface portion 30d. The second common contact front surface portion 30d faces the second drive contact front surface portion 60d in the X-direction. The part of the second common contact front surface portion 30d received in the recessed region 60r overlaps the first drive contact front surface portion 60c as viewed in the Y-direction.

The first drive contact front surface portion 60c faces the first common contact front surface portion 30c in the X-direction and faces the element contact front surface 50a in the Y-direction. The dimension of the first drive contact front surface portion 60c in the X-direction is equal to the dimension of the element contact front surface 50a in the X-direction. For example, when the difference between the dimension of the first drive contact front surface portion 60c in the X-direction and the dimension of the element contact front surface 50a in the X-direction is within 5% of the dimension of the element contact front surface 50a in the X-direction, the dimension of the first drive contact front surface portion 60c in the X-direction is considered to be equal to the dimension of the element contact front surface 50a in the X-direction.

As shown in FIG. 14, as viewed in the Z-direction, an end of the drive contact front surface 60a located toward the fourth side wall 21d extends to a position overlapping the fourth side wall 21d and includes portions projecting beyond the outer surface of the fourth side wall 21d. As viewed in the Z-direction, an end of the drive contact front surface 60a located toward the second side wall 21b extends to a position overlapping the second side wall 21b and includes a portion projecting beyond the outer surface of the second side wall 21b.

More specifically, an end of the drive contact front surface 60a located toward the fourth side wall 21d in the X-direction includes projections 64a and 64b, and an end of the drive contact front surface 60a located toward the second side wall 21b in the Y-direction includes a projection 64c. As viewed in the Z-direction, the projections 64a and 64b project from the outer surface of the fourth side wall 21d. The projections 64a and 64b are separate from each other in the Y-direction. The projection 64a is located closer to the element contact front surface 50a than the projection 64b. In the present embodiment, the projection 64a is formed on the first drive contact front surface portion 60c, and the projection 64b is formed on the second drive contact front surface portion 60d. As viewed in the Z-direction, the projection 64c projects from the outer surface of the second side wall 21b. The projection 64c is formed on the second drive contact front surface portion 60d. The projection 64c is formed on an end of the second drive contact front surface portion 60d located toward the second common contact front surface portion 30d in the X-direction. In the present embodiment, when a support lead supporting the drive conductive portion 60B is cut, residual portions of the lead frame are the projections 64a to 64c. The first drive contact front surface portion 60c includes the projection 64a. The second drive contact front surface portion 60d includes the projections 64b and 64c. The number of projections may be changed to any number. As viewed in the Z-direction, connection portions between the drive contact front surface 60a and the projections 64a to 64c each have a curved surface (refer to FIG. 15).

The drive conductive portion 60B includes a recess 65 that restricts movement of the drive conductive portion 60B. In the present embodiment, the recess 65 is formed in the drive contact front surface 60a. The number of recesses may be changed in any manner.

The recess 65 is formed in an end of the second drive contact front surface portion 60d located toward the first drive contact front surface portion 60c in the Y-direction. The second drive contact front surface portion 60d includes an end 61a located toward the third side wall 21c. The recess 65 is recessed from the end 61a toward the fourth side wall 21d. The recess 65 is located adjacent to the first drive contact front surface portion 60c in the Y-direction. More specifically, the first drive contact front surface portion 60c includes an end 61b located toward the second side wall 21b, and the recess 65 is partially defined by the end 61b. In the present embodiment, the maximum width of the recess 65 is equal to a gap between the first drive contact front surface portion 60c and the second common contact front surface portion 30d in the Y-direction. For example, when the difference between the maximum width of the recess 65 and the gap is within 5% of the gap, the maximum width of the recess 65 is considered to be equal to the gap between the first drive contact front surface portion 60c and the second common contact front surface portion 30d in the Y-direction.

The recess 65 extends through the drive conductive portion 60B in the Z-direction. The recess 65 accommodates an insulation portion 13. In other words, the insulation portion 13 accommodated in the recess 65 extends through the substrate 10B in the Z-direction, which is different from the recesses 35a to 35e and 55.

As shown in FIG. 21, in a cross-sectional view of the drive conductive portion 60B cut along a plane extending in the Z-direction, a flange 66 is formed in the peripheral edge of the drive contact front surface 60a. In other words, the drive conductive portion 60B includes a back layer part including the drive contact back surface 60b and located closer to the drive contact back surface 60b than a front layer part including the drive contact front surface 60a. The back layer part is recessed toward the front layer part in a direction orthogonal to the Z-direction. The recessed part accommodates an insulation portion 13. The insulation portion 13 accommodated between the flange 66 and the drive contact back surface 60b includes a back-half insulation portion 13L that does not extend through the substrate 10B in the Z-direction. The part of the insulation portion 13 located at an outer side of the flange 66 extends through the substrate 10B in the Z-direction. The peripheral edge of the drive contact front surface 60a includes the projections 64a to 64c (refer to FIGS. 14 and 15). The projections 64a to 64c extend from the flange 66 and have the same thickness as the flange 66. That is, the insulation portion 13 is accommodated between the projections 64a to 64c and the drive contact back surface 60b, so that the projections 64a to 64c are not exposed from the substrate back surface 12. The insulation portion 13 accommodated between the projections 64a to 64c and the drive contact back surface 60b includes a back-half insulation portion 13L that does not extend through the substrate 10B in the Z-direction. As viewed in the Z-direction, the insulation portion 13 extends through the substrate 10B and is continuous with the back-half insulation portion 13L of the projections 64a to 64c at opposite sides of the projections 64a to 64c in a direction orthogonal to the direction in which the projections 64a to 64c extend. The drive contact back surface 60b is exposed from the substrate back surface 12 as a part located at an inner side of the flange 66 of the drive contact front surface 60a. Although not illustrated, the recess 65 extends to an inner side of the drive contact front surface 60a beyond the peripheral edge of the drive contact front surface 60a (flange 66).

As shown in FIGS. 14 and 15, the control contact front surface 70a is located at a corner of the substrate 10B located toward the second side wall 21b and the third side wall 21c. The control contact front surface 70a is separate from the second common contact front surface portion 30d in the X-direction. The control contact front surface 70a is separate from the first common contact front surface portion 30c in the Y-direction. As viewed in the X-direction, the control contact front surface 70a overlaps the second common contact front surface portion 30d. That is, the control contact front surface 70a faces the second common contact front surface portion 30d in the X-direction. As viewed in the Y-direction, the control contact front surface 70a overlaps the first common contact front surface portion 30c. More specifically, in the Y-direction, the control contact front surface 70a faces the part of the first common contact front surface portion 30c projecting from the second common contact front surface portion 30d toward the third side wall 21c. Thus, the control contact front surface 70a is formed in a region surrounded by the first common contact front surface portion 30c and the second common contact front surface portion 30d. In other words, the control contact front surface 70a is located in a recessed region formed by displacing the first common contact front surface portion 30c from the second common contact front surface portion 30d in the X-direction.

As shown in FIGS. 14 and 15, the second common contact front surface portion 30d is located between the drive conductive portion 60B and the control conductive portion 70B in the X-direction. In other words, the second common contact front surface portion 30d is located between the second drive contact front surface portion 60d and the control contact front surface 70a in the X-direction.

As shown in FIG. 15, in plan view, the control contact front surface 70a is rectangular so that the long sides extend in the Y-direction and the short sides extend in the X-direction. The dimension of the control contact front surface 70a in the Y-direction is less than the dimension of the first common contact front surface portion 30c in the Y-direction. The dimension of the control contact front surface 70a in the X-direction is less than the dimension of the first common contact front surface portion 30c in the X-direction.

As viewed in the Z-direction, an end of the control contact front surface 70a located toward the second side wall 21b extends to a position overlapping the second side wall 21b and includes a portion projecting beyond the outer surface of the second side wall 21b. As viewed in the Z-direction, an end of the control contact front surface 70a located toward the third side wall 21c extends to a position overlapping the third side wall 21c and includes a portion projecting beyond the outer surface of the third side wall 21c.

More specifically, an end of the control contact front surface 70a located toward the second side wall 21b in the Y-direction includes a projection 74a, and an end of the control contact front surface 70a located toward the third side wall 21c in the X-direction includes a projection 74b. As viewed in the Z-direction, the projection 74a projects from the outer surface of the second side wall 21b. The projection 74a is formed on the central part of the control contact front surface 70a in the Y-direction. As viewed in the Z-direction, the projection 74b projects from the outer surface of the third side wall 21c. The projection 74b is formed on an end of the control contact front surface 70a located toward the second common contact front surface portion 30d in the X-direction. In the present embodiment, when a support lead supporting the control conductive portion 70B is cut, residual portions of the lead frame are the projections 74*a* and 74*b*. The number of projections may be changed to any number. As viewed in the Z-direction, connection portions between the control contact front surface 70*a* and the projections 74*a* and 74*b* each have a curved surface (refer to FIG. 15).

In a cross-sectional view of the control conductive portion 70B cut along a plane extending in the Z-direction, a flange 76 (refer to FIG. 18) is formed in the peripheral edge of the control contact front surface 70*a*. In other words, the control conductive portion 70B includes a back layer part including the control contact back surface 70*b* and located closer to the control contact back surface 70*b* than a front layer part including the control contact front surface 70*a*, the back layer part is recessed toward the front layer part in the X-direction and the Y-direction. The recessed part accommodates an insulation portion 13. The insulation portion 13 accommodated between the flange 76 of the control contact front surface 70*a* and the control contact back surface 70*b* includes a back-half insulation portion 13L that does not extend through the substrate 10B in the Z-direction. The part of the insulation portion 13 located at an outer side of the flange 76 extends through the substrate 10B in the Z-direction. The peripheral edge of the control contact front surface 70*a* includes the projections 74*a* and 74*b*. The projections 74*a* and 74*b* extend from the flange 76 and have the same thickness as the flange 76. That is, the insulation portion 13 is accommodated between the projections 74*a* and 74*b* and the control contact back surface 70*b*, so that the projections 74*a* and 74*b* are not exposed from the substrate back surface 12. The insulation portion 13 accommodated between the projections 74*a* and 74*b* and the control contact back surface 70*b* includes a back-half insulation portion 13L that does not extend through the substrate 10B in the Z-direction. As viewed in the Z-direction, the insulation portion 13 extends through the substrate 10B and is continuous with the back-half insulation portion 13L of the projections 74*a* and 74*b* at opposite sides of the projections 74*a* and 74*b* in a direction orthogonal to the direction in which the projections 74*a* and 74*b* extend. The control contact back surface 70*b* is exposed from the substrate back surface 12 as a part located at an inner side of the flange 76.

As shown in FIG. 15, in the present embodiment, the common contact front surface 30*a* is larger than the other contact front surfaces 50*a*, 60*a*, and 70*a*. The first common contact front surface portion 30*c* is larger than the other contact front surfaces 50*a*, 60*a*, and 70*a*. The second common contact front surface portion 30*d* is larger than the control contact front surface 70*a*. The element contact front surface 50*a* is larger than the control contact front surface 70*a*. The drive contact front surface 60*a* is larger than the control contact front surface 70*a*.

The layout of the conductive portions 30B, 50B, 60B, and 70B at the side of the substrate back surface 12 will now be described.

As shown in FIG. 16, the common contact back surface 30*b* includes a first common contact back surface portion 30*e* and a second common contact back surface portion 30*f*. The first common contact back surface portion 30*e* is separate from the second common contact back surface portion 30*f* in the Y-direction. The insulation portion 13 is disposed between the first common contact back surface portion 30*e* and the second common contact back surface portion 30*f*.

More specifically, as shown in FIG. 16, in the Y-direction, a part (indicated by broken lines) between the first common contact back surface portion 30*e* and the second common contact back surface portion 30*f* includes a recess 35*f* that is recessed from the substrate back surface 12 toward the substrate front surface 11. The recess 35*f* accommodates an insulation portion 13. The insulation portion 13 accommodated in the recess 35*f* includes a back-half insulation portion 13L that does not extend through the substrate 10B in the Z-direction. In other words, the back-half insulation portion 13L separates the first common contact back surface portion 30*e* and the second common contact back surface portion 30*f*. The back-half insulation portion 13L extends through the common contact back surface 30*b* in the X-direction.

As shown in FIG. 16, the insulation portions 13 arranged around the common conductive portion 30B extend through the substrate 10B. The back-half insulation portion 13L arranged in the recess 35*f* is continuous with the insulation portions 13 located at left and right sides of the common conductive portion 30B. More specifically, the back-half insulation portion 13L arranged in the recess 65*a* connects the insulation portion 13 extending through the substrate 10B and located at the left side of the second common contact back surface portion 30*f* and at the lower side of the part of the first common contact back surface portion 30*e* projecting leftward from the second common contact back surface portion 30*f* to the insulation portion 13 extending through the substrate 10B and arranged at the right side of the first common contact back surface portion 30*e* and the upper side of the second common contact back surface portion 30*f*.

The first common contact back surface portion 30*e* is formed on the substrate back surface 12 at a position opposite to the first common contact front surface portion 30*c*. The first common contact back surface portion 30*e* is formed on an upper left portion as viewed from the substrate back surface 12. In the same manner as the first common contact front surface portion 30*c*, the first common contact back surface portion 30*e* is rectangular so that the short sides extend in the X-direction and the long sides extend in the Y-direction. As viewed in the Z-direction, the first common contact back surface portion 30*e* is smaller than the first common contact front surface portion 30*c*.

The second common contact back surface portion 30*f* is formed on the substrate back surface 12 at a location opposite to the second common contact front surface portion 30*d*. The second common contact back surface portion 30*f* is formed on a central part of the substrate back surface 12 in the X-direction and a lower part of the substrate back surface 12 in the Y-direction. In the same manner as the second common contact front surface portion 30*d*, the second common contact back surface portion 30*f* is rectangular so that the long sides extend in the X-direction and the short sides extend in the Y-direction. As viewed in the Z-direction, the second common contact back surface portion 30*f* is smaller than the second common contact front surface portion 30*d*.

The element contact back surface 50*b* and the drive contact back surface 60*b* are located at the right side of the first common contact back surface portion 30*e*.

The element contact back surface 50*b* is formed on the substrate back surface 12 at a position opposite to the element contact front surface 50*a*. The element contact back surface 50*b* is formed on a left upper portion of the substrate back surface 12. The element contact back surface 50*b* is separate from the common contact back surface 30*b* and is not continuous with the common contact back surface 30*b*. That is, the insulation portion 13 is disposed between the element contact back surface 50*b* and the common contact back surface 30*b*. The insulation portion 13 extends in the Y-direction.

The element contact back surface 50*b* is rectangular so that the long sides extend in the X-direction and the short sides extend in the Y-direction. As viewed in the Z-direction, the element contact back surface 50*b* is smaller than the element contact front surface 50*a*. The dimension of the element contact back surface 50*b* in the X-direction is equal to the dimension of the first common contact back surface portion 30*e* in the X-direction. When the difference between the dimension of the element contact back surface 50*b* in the X-direction and the dimension of the first common contact back surface portion 30*e* in the X-direction is within 5% of the dimension of the first common contact back surface portion 30*e* in the X-direction, the dimension of the element contact back surface 50*b* in the X-direction is equal to the dimension of the first common contact back surface portion 30*e* in the X-direction.

The drive contact back surface 60*b* includes a first drive contact back surface portion 60*e* and a second drive contact back surface portion 60*f*. The first drive contact back surface portion 60*e* is separate from the second drive contact back surface portion 60*f* in the Y-direction. The insulation portion 13 is disposed between the first drive contact back surface portion 60*e* and the second drive contact back surface portion 60*f*.

More specifically, as shown in FIG. 16, the recess 65*a* is arranged in the drive conductive portion 60B between the first drive contact back surface portion 60*e* and the second drive contact back surface portion 60*f* and is recessed from the substrate back surface 12 toward the substrate front surface 11. The recess 65*a* does not extend through the substrate 10B. The recess 65*a* accommodates a back-half insulation portion 13L that does not extend through the substrate 10B in the Z-direction. The back-half insulation portion 13L extends through the drive contact back surface 60*b* in the X-direction. The recess 65 is continuous with the recess 65*a* in the Z-direction.

As shown in FIG. 16, the insulation portions 13 arranged around the drive conductive portion 60B extend through the substrate 10B. The back-half insulation portion 13L arranged in the recess 65*a* is continuous with the insulation portion 13 arranged at left and right sides of the drive conductive portion 60B. More specifically, the back-half insulation portion 13L arranged in the recess 65*a* connects the insulation portion 13 extending through the substrate 10B and arranged at the left side of the second drive contact back surface portion 60*f* and at a lower side of the portion of the first drive contact back surface portion 60*e* projecting leftward from the second drive contact back surface portion 60*f* to the insulation portion 13 extending through the substrate 10B and arranged at the right side of the first drive contact back surface portion 60*e* and the second drive contact back surface portion 60*f*.

The first drive contact back surface portion 60*e* is formed on the substrate back surface 12 at a position opposite to the first drive contact front surface portion 60*c*. The first drive contact back surface portion 60*e* is formed on a right central part of the substrate back surface 12. The first drive contact back surface portion 60*e* is aligned with the element contact back surface 50*b* in the X-direction and is separate from the element contact back surface 50*b* in the Y-direction. The insulation portion 13 is disposed between the first drive contact back surface portion 60*e* and the element contact back surface 50*b*. The insulation portion 13 extends in the X-direction and is continuous with the insulation portion 13 that is disposed between the element contact back surface 50*b* and the common contact back surface 30*b*.

In the same manner as the first drive contact front surface portion 60*c*, the first drive contact back surface portion 60*e* is rectangular so that the long sides extend in the X-direction and the short sides extend in the Y-direction. As viewed in the Z-direction, the first drive contact back surface portion 60*e* is smaller than the first drive contact front surface portion 60*c*. The dimension of the first drive contact back surface portion 60*e* in the X-direction is equal to the dimension of the element contact back surface 50*b* in the X-direction.

The lower edge of the first drive contact back surface portion 60*e* is aligned with the lower edge of the first common contact back surface portion 30*e* in the Y-direction. Thus, the distance from the upper edge of the element contact back surface 50*b* to the lower edge of the first drive contact back surface portion 60*e* is equal to the dimension of the first common contact back surface portion 30*e* in the X-direction. When the difference between the distance from the upper edge of the element contact back surface 50*b* to the lower edge of the first drive contact back surface portion 60*e* and the dimension of the first common contact back surface portion 30*e* in the X-direction is within 5% of the dimension of the first common contact back surface portion 30*e* in the X-direction, the distance from the upper edge of the element contact back surface 50*b* to the lower edge of the first drive contact back surface portion 60*e* is considered to be equal to the dimension of the first common contact back surface portion 30*e* in the X-direction.

The second drive contact back surface portion 60*f* is formed on the substrate back surface 12 at a position opposite to the second drive contact front surface portion 60*d*. In the same manner as the second drive contact front surface portion 60*d*, the second drive contact back surface portion 60*f* is rectangular so that the short sides extend in the X-direction and the long sides extend in the Y-direction. The second drive contact back surface portion 60*f* is formed on a right lower portion of the substrate back surface 12.

The dimension of the second drive contact back surface portion 60*f* in the Y-direction is equal to the dimension of the second common contact back surface portion 30*f* in the Y-direction. The dimension of the second drive contact back surface portion 60*f* in the X-direction is slightly greater than the dimension of the first drive contact back surface portion 60*e* in the Y-direction. For example, when the difference between the dimension of the second drive contact back surface portion 60*f* in the Y-direction and the dimension of the second common contact back surface portion 30*f* in the Y-direction is within 5% of the dimension of the second common contact back surface portion 30*f* in the Y-direction, the dimension of the second drive contact back surface portion 60*f* in the Y-direction is considered to be equal to the dimension of the second common contact back surface portion 30*f* in the Y-direction.

As shown in FIG. 16, the right edge of the element contact back surface 50*b*, the right edge of the first drive contact back surface portion 60*e*, and the right edge of the second drive contact back surface portion 60*f* are aligned with each other.

The control contact back surface 70*b* is formed on a left lower portion of the substrate back surface 12. The control contact back surface 70*b* is formed on the substrate back surface 12 at a position opposite to the control contact front surface 70*a*. In the present embodiment, the arrangement direction of the element conductive portion 50B and the drive conductive portion 60B, that is, the Y-direction, may be referred to as a third direction. The X-direction, which is orthogonal to the Y-direction as viewed in the Z-direction, may be referred to as a fourth direction. In this case, the second drive contact back surface portion 60f and the control contact back surface 70b are separately disposed at opposite sides of the second common contact back surface portion 30f in the fourth direction.

In the same manner as the control contact front surface 70a, the control contact back surface 70b is rectangular so that the short sides extend in the X-direction and the long sides extend in the Y-direction. The dimension of the control contact back surface 70b in the Y-direction is equal to the dimension of the second common contact back surface portion 30f in the Y-direction. The dimension of the control contact back surface 70b in the X-direction is equal to the dimension of the second drive contact back surface portion 60f in the X-direction. That is, the control contact back surface 70b is identical in shame to the second drive contact back surface portion 60f.

As shown in FIG. 16, the second common contact back surface portion 30f, the second drive contact back surface portion 60f, and the control contact back surface 70b are aligned in the Y-direction and separate from each other in the X-direction. The lower edge of the second drive contact back surface portion 60f, the lower edge of the second common contact back surface portion 30f, and the lower edge of the control contact back surface 70b are aligned with each other. The upper edge of the second drive contact back surface portion 60f, the upper edge of the second common contact back surface portion 30f, and the upper edge of the control contact back surface 70b are aligned with each other. Thus, the second drive contact back surface portion 60f and the control contact back surface 70b are symmetrical about the second common contact back surface portion 30f at the left and right sides.

As shown in FIG. 16, each insulation portion 13 has a constant width between ones of the contact back surfaces 30b, 50b, 60b, and 70b that are adjacent in the X-direction or the Y-direction. In addition, the dimension of the insulation portion 13 in the X-direction disposed between the first common contact back surface portion 30e and the element contact back surface 50b and the first drive contact back surface portion 60e in the X-direction is equal to the dimension of the insulation portion 13 in the Y-direction disposed between the element contact back surface 50b and the first drive contact back surface portion 60e in the Y-direction. In addition, the dimension of the insulation portion 13 in the X-direction disposed between the second common contact back surface portion 30f and the second drive contact back surface portion 60f in the X-direction is equal to the dimension of the insulation portion 13 in the X-direction disposed between the second common contact back surface portion 30f and the control contact back surface 70b in the X-direction.

For example, when the difference between the width of a predetermined insulation portion 13 and the width of another insulation portion 13 is within 10% of the width of the predetermined insulation portion 13, the widths of the two insulation portions 13 are considered to be equal.

The positional relationship among the conductive portions 30B, 50B, 60B, and 70B, the semiconductor light emitting element 80, and the electronic component 100 will be described below in detail.

As shown in FIG. 14, in the same manner as the first embodiment, the semiconductor light emitting element 80 and the electronic component 100 are mounted on the common conductive portion 30B and electrically connected by the common conductive portion 30B. In the present embodiment, as viewed in the Z-direction, the semiconductor light emitting element 80 is larger than the electronic component 100. More specifically, as viewed in the Z-direction, the semiconductor light emitting element 80 is rectangular and arranged so that the long sides extend in the X-direction and the short sides extend in the Y-direction. As viewed in the Z-direction, the electronic component 100 is rectangular and arranged so that the long sides extend in the Y-direction and the short sides extend in the X-direction. The dimension of the semiconductor light emitting element 80 in the X-direction is greater than the dimension of the electronic component 100 in the X-direction. The dimension of the semiconductor light emitting element 80 in the Y-direction is greater than the dimension of the electronic component 100 in the Y-direction.

In the present embodiment, the semiconductor light emitting element 80 and the electronic component 100 are disposed on the common contact front surface 30a. More specifically, the semiconductor light emitting element 80 is disposed on the first common contact front surface portion 30c, and the electronic component 100 is disposed on the second common contact front surface portion 30d. Thus, the semiconductor light emitting element 80, which is larger than the electronic component 100, is disposed on the first common contact front surface portion 30c, which is larger than the second common contact front surface portion 30d. This ensures the space for each of the semiconductor light emitting element 80 and the electronic component 100. In addition, the dimension of the first common contact front surface portion 30c in the X-direction is greater than the dimension of the semiconductor light emitting element 80 in the X-direction. This allows for the arrangement of the semiconductor light emitting element 80 even when the semiconductor light emitting element 80 is increased in size from the illustrated one. The versatility for the semiconductor light emitting device 1B is increased.

In addition, in the present embodiment, the semiconductor light emitting element 80 and the electronic component 100 are displaced from each other in the X-direction and separated from each other in the Y-direction on the common contact front surface 30a, which differs from the first embodiment.

In the present embodiment, the semiconductor light emitting element 80 is located closer to the third side wall 21c than the electronic component 100. The electronic component 100 is located closer to the fourth side wall 21d than the semiconductor light emitting element 80. In other words, when the electronic component 100 is located closer to the fourth side wall 21d than the semiconductor light emitting element 80 in the X-direction, the electronic component 100 and the semiconductor light emitting element 80 are arranged in the Y-direction. The semiconductor light emitting element 80 is displaced from the central part of the substrate front surface 11 in the X-direction and is, for example, located closer to the third side wall 21c than the central part. The electronic component 100 is located on the central part of the substrate front surface 11 in the X-direction. In the present embodiment, as viewed in the Y-direction, the semiconductor light emitting element 80 overlaps the electronic component 100.

The semiconductor light emitting element 80 is located closer to the third side wall 21c than the first common contact front surface portion 30c in the X-direction. In the illustrated example, the semiconductor light emitting element 80 is located closer to the fourth side wall 21d than the recess 35e of the first common contact front surface portion 30c. As viewed in the Y-direction, the end of the semiconductor light emitting element 80 located toward the third side wall 21c overlaps the end of the control contact front surface 70a located toward the fourth side wall 21d. As viewed in the Z-direction, the semiconductor light emitting element 80 is arranged so as not to overlap the recess 35f of the common conductive portion 30B (refer to FIG. 19). In the present embodiment, as shown in FIG. 19, the semiconductor light emitting element 80 and the electronic component 100 are located at opposite sides of the recess 35f. This structure limits decreases in the heat dissipation efficiency of the semiconductor light emitting element 80.

As viewed in the Y-direction, the electronic component 100 partially overlaps the first common contact front surface portion 30c. As viewed in the Y-direction, the electronic component 100 partially overlaps the first drive contact front surface portion 60c. As viewed in the Z-direction, the electronic component 100 is arranged not to overlap the recess 35f. In the present embodiment, as shown in FIG. 19, the electronic component 100 and the semiconductor light emitting element 80 are located at opposite sides of the recess 35f. This structure limits decreases in the heat dissipation efficiency of the electronic component 100.

The semiconductor light emitting element 80 is disposed on the first common contact front surface portion 30c, and the electronic component 100 is disposed on the second common contact front surface portion 30d. Thus, the semiconductor light emitting element 80 is located closer to the first side wall 21a than the electronic component 100, and the electronic component 100 is located closer to the second side wall 21b than the semiconductor light emitting element 80. The semiconductor light emitting element 80 and the electronic component 100 are displaced from the central part of the substrate front surface 11 in the Y-direction. In the illustrated example, the semiconductor light emitting element 80 is disposed on the first common contact front surface portion 30c between the central part of the substrate front surface 11 and the first side wall 21a. In the present example, the semiconductor light emitting element 80 is located closer to the central part of the substrate front surface 11 than the first side wall 21a in the Y-direction. In other words, the semiconductor light emitting element 80 is located at a position of the first common contact front surface portion 30c located toward the second common contact front surface portion 30d in the Y-direction. The phrase "position of the first common contact front surface portion 30c located toward the second common contact front surface portion 30d in the Y-direction" refers to a position toward one of the opposite ends of the first common contact front surface portion 30c in the Y-direction located toward the second common contact front surface portion 30d. The electronic component 100 is disposed on the second common contact front surface portion 30d between the central part of the substrate front surface 11 and the second side wall 21b. In the present example, the electronic component 100 is located closer to the central part of the substrate front surface 11 than the second side wall 21b in the Y-direction. In other words, the electronic component 100 is located at a position of the second common contact front surface portion 30d located toward the first common contact front surface portion 30c in the Y-direction. Thus, the semiconductor light emitting element 80 and the electronic component 100 are located at opposite sides of the central part of the substrate front surface 11 in the Y-direction and separated by a short distance in the Y-direction.

At least a portion of the semiconductor light emitting element 80 is disposed on the first common contact front surface portion 30c at a position closer to the electronic component 100 than the element contact front surface 50a. In the present embodiment, the semiconductor light emitting element 80 is located closer to the second side wall 21b than the element contact front surface 50a in the Y-direction. More specifically, the semiconductor light emitting element 80 is located closer to the second side wall 21b than the central part of the element contact front surface 50a in the Y-direction. A portion of the semiconductor light emitting element 80 is located closer to the second side wall 21b than the element contact front surface 50a in the Y-direction. As viewed in the X-direction, the semiconductor light emitting element 80 overlaps the element contact front surface 50a and the first drive contact front surface portion 60c. More specifically, in the present embodiment, the central part of the semiconductor light emitting element 80 in the Y-direction is located closer to the first drive contact front surface portion 60c than the insulation portion 13 that is disposed between the element contact front surface 50a and the first drive contact front surface portion 60c.

As shown in FIG. 17, in the same manner as the first embodiment, the element lower surface electrode 92 of the semiconductor light emitting element 80 is die-bonded to the first common contact front surface portion 30c by the conductive bonding material P1. Thus, the element lower surface electrode 92 is bonded to the common conductive portion 30B.

As shown in FIG. 18, in the same manner as the first embodiment, the second drive electrode 103 of the electronic component 100 is die-bonded to the second common contact front surface portion 30d by the conductive bonding material P2. Thus, the second drive electrode 103 is bonded to the common conductive portion 30B. The common conductive portion 30B electrically connects the element lower surface electrode 92 and the second drive electrode 103. In the present embodiment, the conductive bonding material P2 is formed from an Ag paste containing a large amount of Ag. This improves the efficiency of heat dissipation from the electronic component 100 to the common conductive portion 30B.

As shown in FIG. 15, in the same manner as the first embodiment, the element upper surface electrode 91 of the semiconductor light emitting element 80 is connected to the element contact front surface 50a by the wires W1. In other words, each of the wires W1 is connected to the element upper surface electrode 91 and the element contact front surface 50a through wire bonding. Thus, the element upper surface electrode 91 is electrically connected to the element conductive portion 50B. The number of wires W1 is not particularly limited. In the illustrated example, five wires W1 are arranged. In the illustrated example, the wire W1 has a first bonding portion disposed on the element upper surface electrode 91 and a second bonding portion disposed on the element contact front surface 50a. The first bonding portions of the five wires W1 are arranged on the element upper surface electrode 91 and separated from each other in the Y-direction. The second bonding portions of the five wires W1 are arranged on the element contact front surface 50a and separated from each other in the Y-direction. The second bonding portions are arranged on one of the opposite ends of the element contact front surface 50a in the X-direction located toward the third side wall 21c. The second bonding portions are disposed closer to the second side wall 21b than the recess 55 of the element contact front surface 50a in the Y-direction so as not to be disposed closer to the fourth side wall 21d than the recess 55 in the X-direction. In the illustrated example, the second bonding portions are disposed closer to the third side wall 21*c* than the central part of the recess 55 in the X-direction and overlap the recess 55 as viewed in the Y-direction.

As shown in FIGS. 14 and 15, the first bonding portions and the second bonding portions of the five wires W1 are located at different positions in the Y-direction and separate from each other in the X-direction. In the illustrated example, as viewed in the X-direction, one of the five first bonding portions located closest to the first side wall 21*a* overlaps one of the five second bonding portions located closest to the second side wall 21*b*. Thus, in plan view, the wires W1 diagonally extend from the element upper surface electrode 91 toward the element contact front surface 50*a* so as to extend away from the electronic component 100. In other words, in plan view, the wires W1 diagonally extend toward the first side wall 21*a* from the first bonding portions toward the second bonding portions. In plan view, the wires W1 extend parallel to each other.

In the illustrated example, the element upper surface electrode 91 is formed on one of the opposite ends of the element upper surface 80*a* in the X-direction that is located closer to the element conductive portion 50B. Thus, the wires W1 are shortened.

In the same manner as the first embodiment, the first drive electrode 101 of the electronic component 100 is connected to the drive contact front surface 60*a* by the wires W2. In other words, each of the wires W2 is connected to the first drive electrode 101 and the drive contact front surface 60*a* through wire bonding. Thus, the first drive electrode 101 is electrically connected to the drive conductive portion 60B. The number of wires W2 is not particularly limited. In the illustrated example, six wires W2 are arranged. In the illustrated example, the wire W2 has a first bonding portion disposed on the first drive electrode 101 and a second bonding portion disposed on the drive contact front surface 60*a*. The second bonding portions of the six wires W2 are separate from each other in the Y-direction.

The wires W2 are connected to the second drive contact front surface portion 60*d*. In other words, the second bonding portions are disposed on the second drive contact front surface portion 60*d*. More specifically, the second bonding portions are located closer to the second side wall 21*b* than the recess 65 of the drive contact front surface 60*a* in the Y-direction. The second bonding portions are also located closer to the second common contact front surface portion 30*d* (third side wall 21*c*) than the central part of the second drive contact front surface portion 60*d* in the X-direction.

Among the wires W2, the farthest two wires W2, that is, the two wires W2 located at opposite ends in the Y-direction, are connected to the first drive electrode 101 and the second drive contact front surface portion 60*d* so that the two wires W2 are separated from each other more at the second drive contact front surface portion 60*d* than at the first drive electrode 101 in plan view. In other words, the distance in the Y-direction between the two of the wires W2 located at opposite ends in the Y-direction is larger at the second drive contact front surface portion 60*d* than at the first drive electrode 101. In the present embodiment, the wires W2 are arranged so that the gap between adjacent ones of the wires W2 gradually increases from the first bonding portions toward the second bonding portions in plan view. In an example, the distance between the second bonding portions of the two of the wires W2 located at opposite ends in the Y-direction is greater than the dimension of the electronic component 100 in the Y-direction.

In the illustrated example, the wires W2 are longer than the wires W1. The wires W2 have a larger diameter than the wires W1. The number of wires W2 is greater than the number of wires W1. This structure improves the heat dissipation efficiency of the electronic component 100. However, alternatively, the diameter of the wires W2 may be less than or equal to the diameter of the wires W1. The number of wires W2 may be equal to the number of wires W1. The number of wires W2 may be less than the number of wires W1.

In the same manner as the first embodiment, the control electrode 102 of the electronic component 100 is connected to the control contact front surface 70*a* by the wire W3. In other words, the wire W3 is connected to the control electrode 102 and the control contact front surface 70*a* through wire bonding. The number of wires W3 is not particularly limited. In the illustrated example, the number of wires W3 is one. In the illustrated example, the wire W3 has a first bonding portion disposed on the control electrode 102 and a second bonding portion disposed on the control contact front surface 70*a*. In the present embodiment, the control electrode 102 is formed on one of the opposite ends of the upper surface 100*a* in the X-direction that is located closer to the control contact front surface 70*a*. Thus, the wire W3 is shortened.

The electronic component 100 is covered by an encapsulation resin 140. The encapsulation resin 140 is covered by a coating agent 141 that inhibits sulfidation of the first drive electrode 101 and the second drive electrode 103 of the electronic component 100. The encapsulation resin 140 and the coating agent 141 cover the first bonding portions of the wires W2 connected to the first drive electrode 101 and the first bonding portion of the wire W3 connected to the control electrode 102. The encapsulation resin 140 is, for example, formed from a light-blocking resin material. In the present embodiment, an epoxy resin is used. Thus, the encapsulation resin 140 is a light-blocking resin (light-blocking member) that shields the electronic component 100 from external light. The coating agent 141 is, for example, formed from a fluoropolymer and glass.

As shown in FIGS. 14 and 15, the coating agent 141 (encapsulation resin 140) extends over the second common contact front surface portion 30*d*. A portion of the coating agent 141 (encapsulation resin 140) covers the first common contact front surface portion 30*c* and the first drive contact front surface portion 60*c*. The coating agent 141 (encapsulation resin 140) is arranged separately from the semiconductor light emitting element 80. The electronic component 100 may be covered by the coating agent 141, and the coating agent 141 may be covered by the encapsulation resin 140.

In the present embodiment, the capacitor 120 is disposed so as to span between the element contact front surface 50*a* and the first drive contact front surface portion 60*c*. In an example, the capacitor 120 is a tantalum capacitor. Alternatively, the capacitor 120 may be a multilayer ceramic capacitor. The capacitor 120 is located closer to the fourth side wall 21*d* than the recess 55 of the element contact front surface 50*a* in the X-direction. Since the recess 55 is the mark for the second bonding portions of the wires W1, that is, the connection end of the element contact front surface 50*a*, the capacitor 120 is located closer to the fourth side wall 21*d* than the second bonding portions. The capacitor 120 is arranged so as not to extend toward the fourth side wall 21*d* beyond the recess 65 of the drive contact front surface 60*a* in the X-direction. The capacitor 120 includes a first electrode 121 and a second electrode 122 arranged in the Y-direction. In other words, as shown in FIGS. 14 and 15, the capacitor 120 is arranged so that the long sides extend in the Y-direction and the short sides extend in the X-direction. In the present embodiment, the first electrode 121 is connected to the element contact front surface 50a, and the second electrode 122 is connected to the first drive contact front surface portion 60c. That is, the second bonding portions of the wires W2, which are connected to the second drive contact front surface portion 60d, are separated from the second electrode 122 by the recess 65.

As shown in FIGS. 14 and 15, the second electrode 122 of the capacitor 120 is die-bonded to the first drive contact front surface portion 60cb y a conductive bonding material P3 such as solder or a paste containing metal, for example Ag. In the same manner, the first electrode 121 of the capacitor 120 is die-bonded to the element contact front surface 50a by the conductive bonding material P3. As described above, the second bonding portions of the wires W2 are separated from the second electrode 122 by the recess 65. This limits spreading of the conductive bonding material P3 that bonds the second electrode 122 and the first drive contact front surface portion 60c, thereby limiting collection of the conductive bonding material P3 on the second bonding portions of the wires W2. The conductive bonding material P3 that bonds the element contact front surface 50a and the first electrode 121 has an extension extending from the first electrode 121. The extension is disposed between the recess 55 and the capacitor 120 in the X-direction. That is, the recess 55 defines a range of the conductive bonding material P3 extending from the first electrode 121. This allows for the manufacturing of the semiconductor light emitting device 1B in which the conductive bonding material P3 are not in contact with the second bonding portions of the wires W1.

As shown in FIG. 19, a height TM from the substrate front surface 11 to the upper surface 100a of the electronic component 100 is less than a height TV from the substrate front surface 11 to the element upper surface 80a of the semiconductor light emitting element 80. In other words, the upper surface 100a of the electronic component 100 is located at a lower position (closer to the substrate front surface 11) than the element upper surface 80a of the semiconductor light emitting element 80. FIG. 19 does not show the encapsulation resin 140 and the coating agent 141, which will be described later, for the sake of convenience. As shown in FIG. 18, a height TC from the substrate front surface 11 to the upper surface of the capacitor 120 is greater than the height TV (refer to FIG. 19) from the substrate front surface 11 to the element upper surface 80a of the semiconductor light emitting element 80. The height TC is greater than the height TM (refer to FIG. 19) from the substrate front surface 11 to the upper surface 100a of the electronic component 100.

Figure 23:
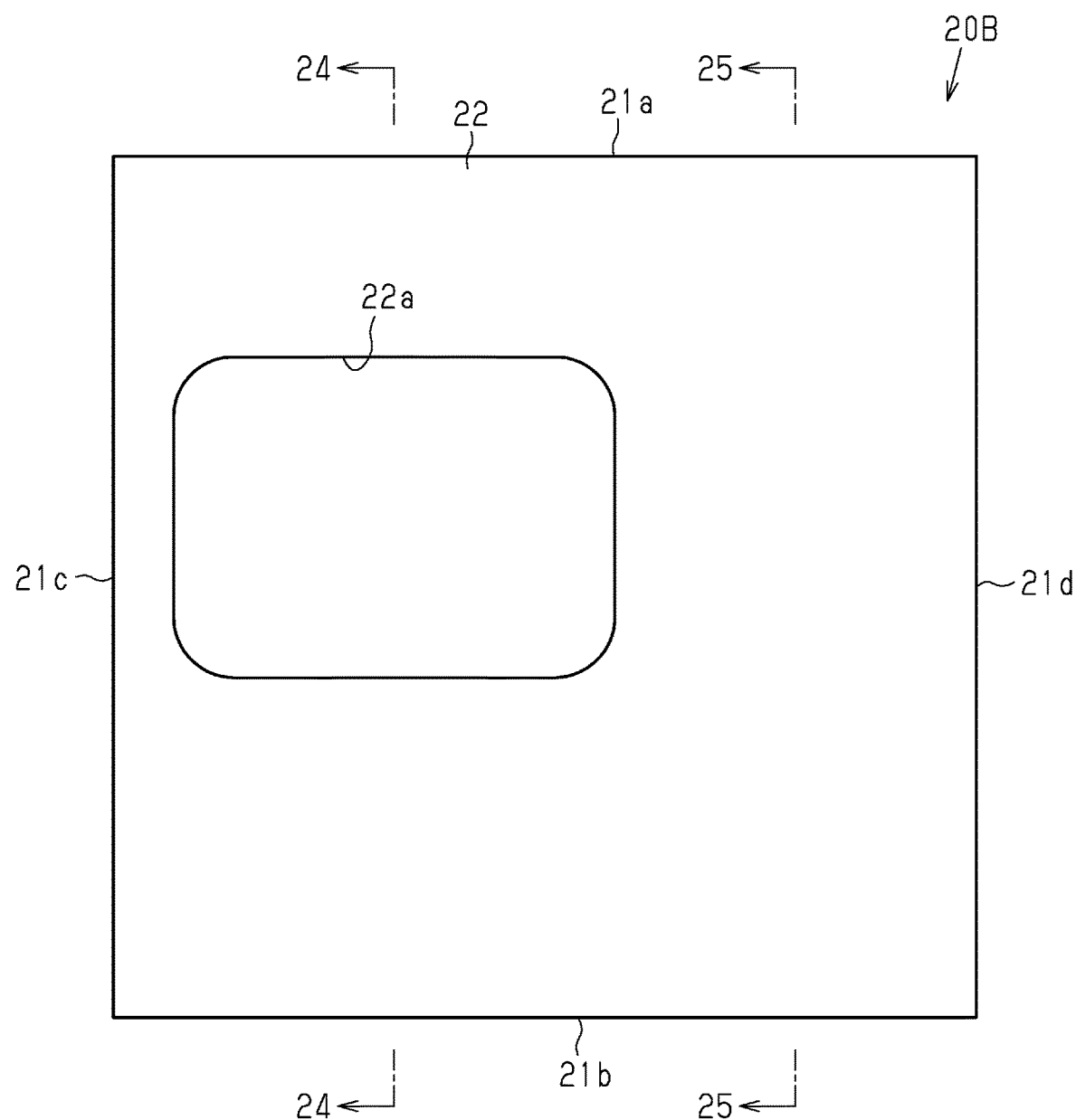
FIG. 23 is a front view of the case.
Figure 24:
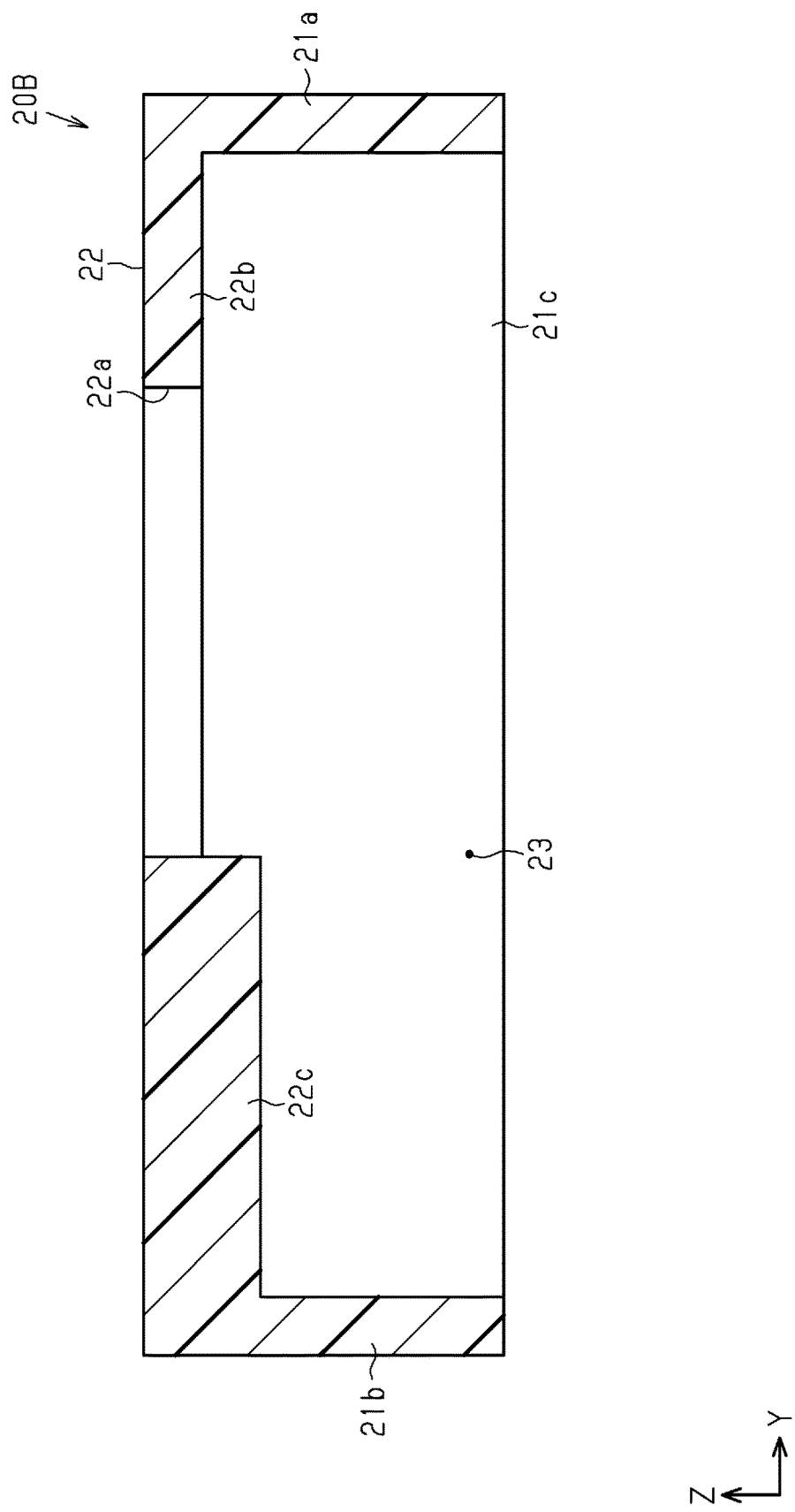
FIG. 24 is a cross-sectional view taken along line 24-24 in FIG. 23.
Figure 25:
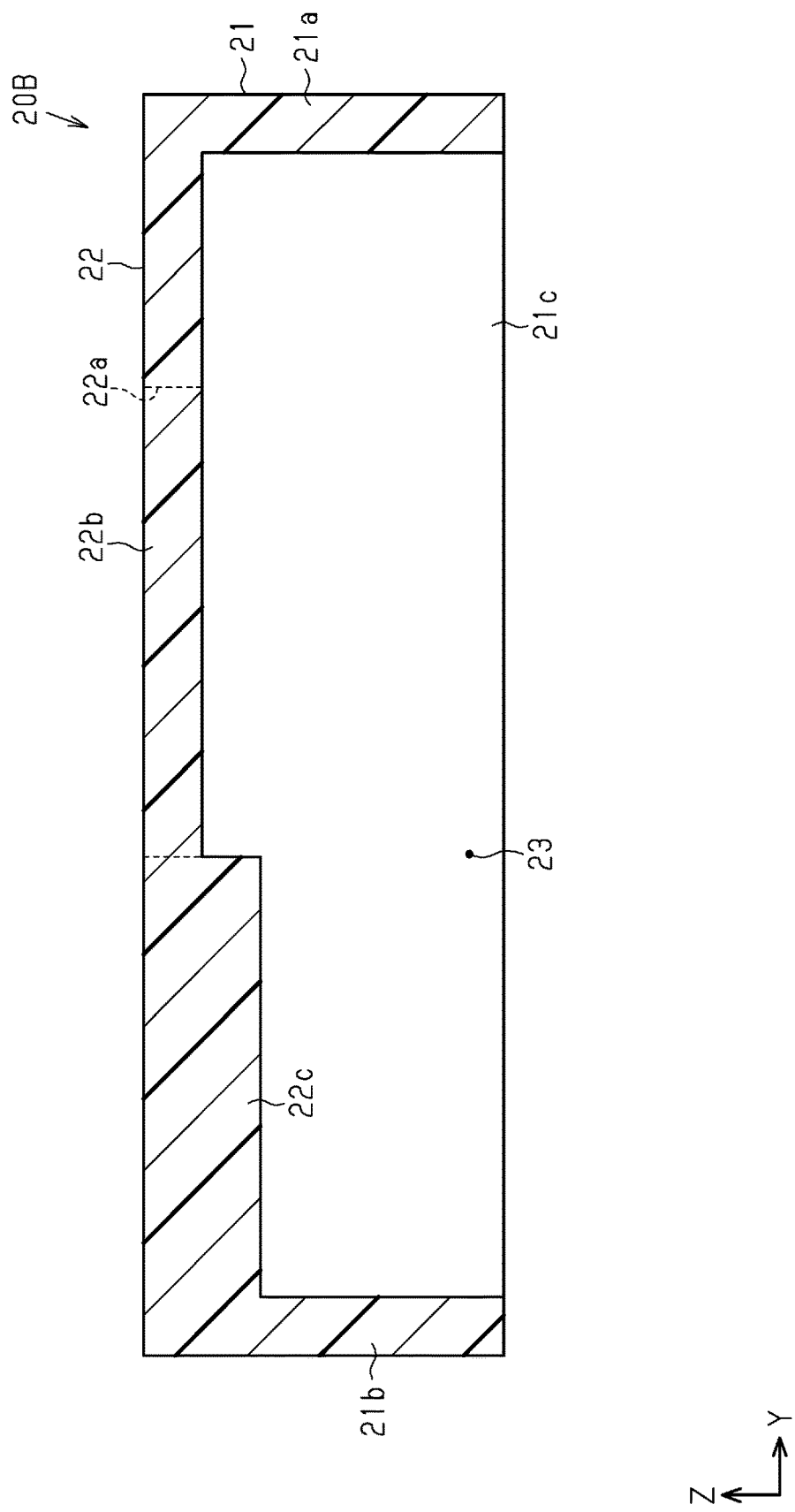
FIG. 25 is a cross-sectional view taken along line 25-25 in FIG. 23.
Figure 26:
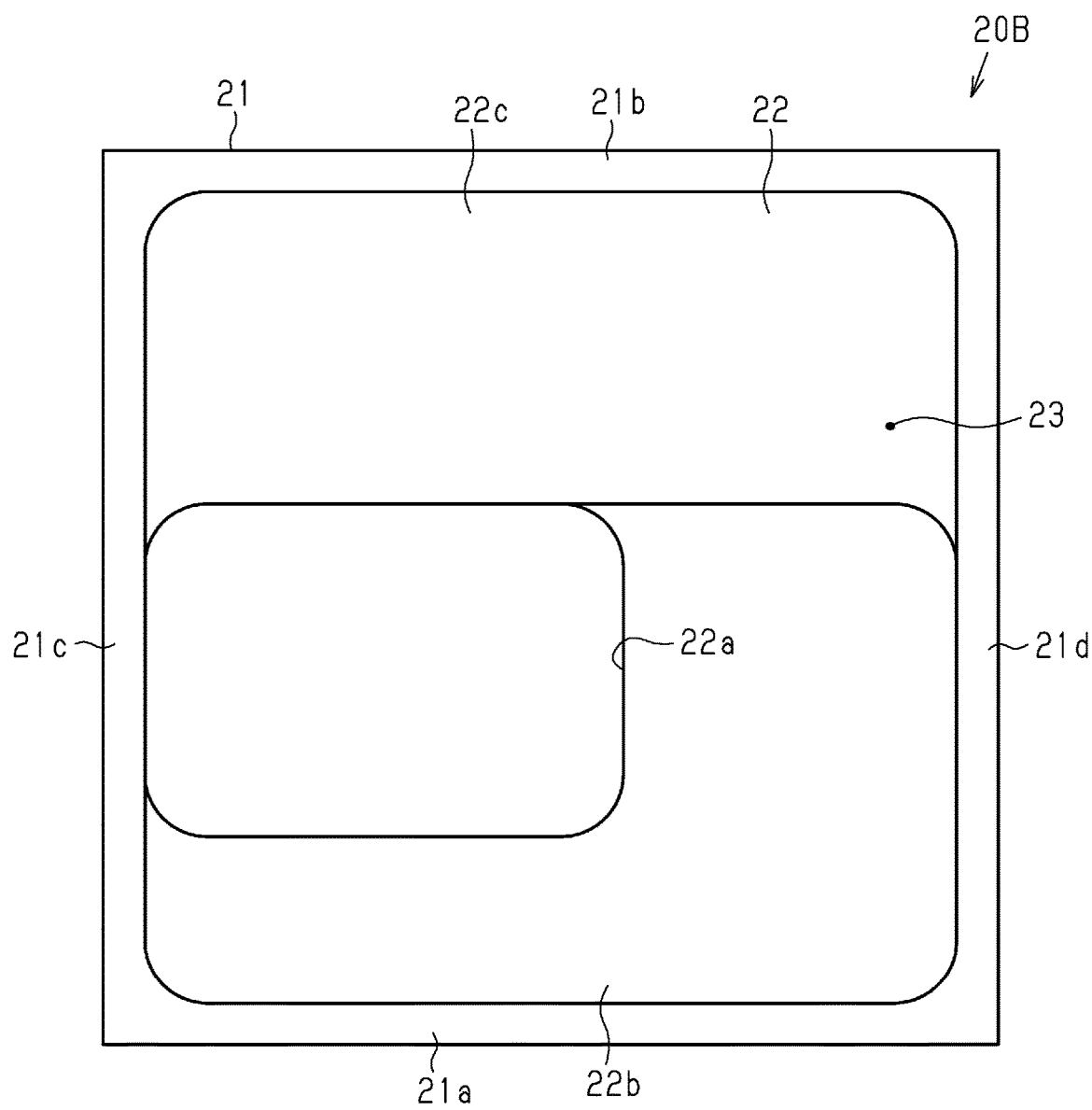
FIG. 26 is a bottom view of the case.

As shown in FIGS. 24 to 26, the case 20B includes an accommodation space 23 that accommodates the semiconductor light emitting element 80, the electronic component 100, and the capacitor 120. The opening 22a connects the accommodation space 23 to the outside of the case 20B. As shown in FIG. 23, the opening 22a is located closer to the third side wall 21c than the central part of the cover 22 in the X-direction. Also, the opening 22a is located closer to the first side wall 21a than the central part of the cover 22 in the Y-direction. As shown in FIGS. 24 and 25, the cover 22 has a thickness that varies in the Y-direction. More specifically, the cover 22 includes a first part 22b located at the same position as the opening 22a in the Y-direction and located closer to the first side wall 21a than the opening 22a. The cover 22 includes a second part 22c located closer to the second side wall 21b than the opening 22a. The thickness of the first part 22b is less than the thickness of the second part 22c. In other words, in the cover 22, the thickness of the second part 22c is greater than the thickness of the first part 22b. As shown in FIG. 26, in plan view, the accommodation space 23 defined by the inner surfaces of the side walls 21a to 21d is generally square. The opening 22a is located adjacent to the third side wall 21c.

As shown in FIG. 19, the semiconductor light emitting element 80 is disposed at a position corresponding to the first part 22b of the cover 22. The electronic component 100 is disposed at a position corresponding to the second part 22c of the cover 22. The second part 22c of the cover 22 extends downward from an edge of the opening 22a located toward the second side wall 21b. Thus, when light from the semiconductor light emitting element 80 is reflected by the light diffusion plate 130, irradiation of the electronic component 100 with the reflected light is limited.

Manufacturing Method

A method for manufacturing the semiconductor light emitting device 1B will now be described with reference to FIGS. 27 to 36. In FIGS. 28, 30, and 32, a tetragon of double-dashed lines indicates the outline of each substrate 10B.

Figure 27:
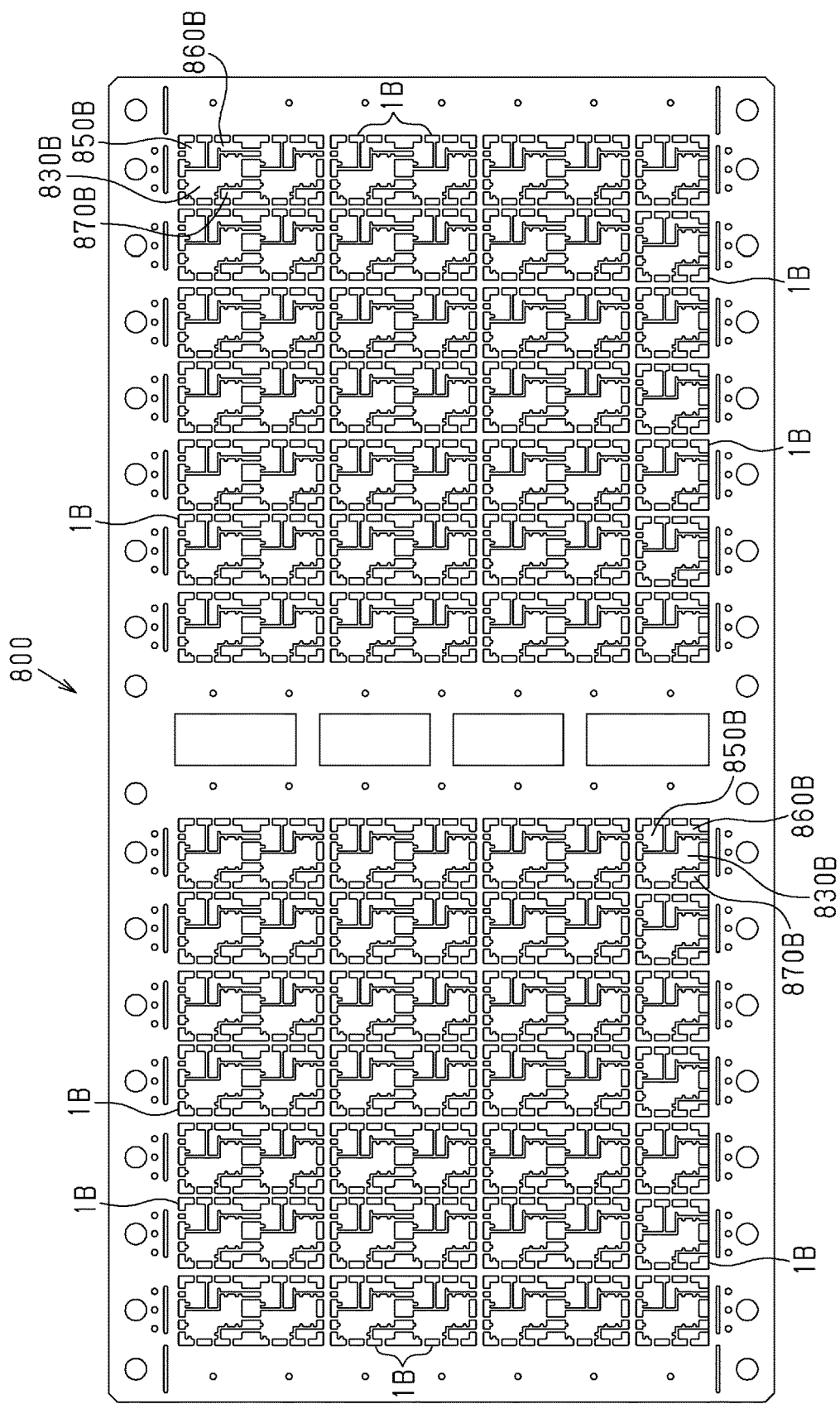
FIG. 27 is a diagram showing an example of a step in a manufacturing method of the semiconductor light emitting device of the second embodiment.
Figure 28:
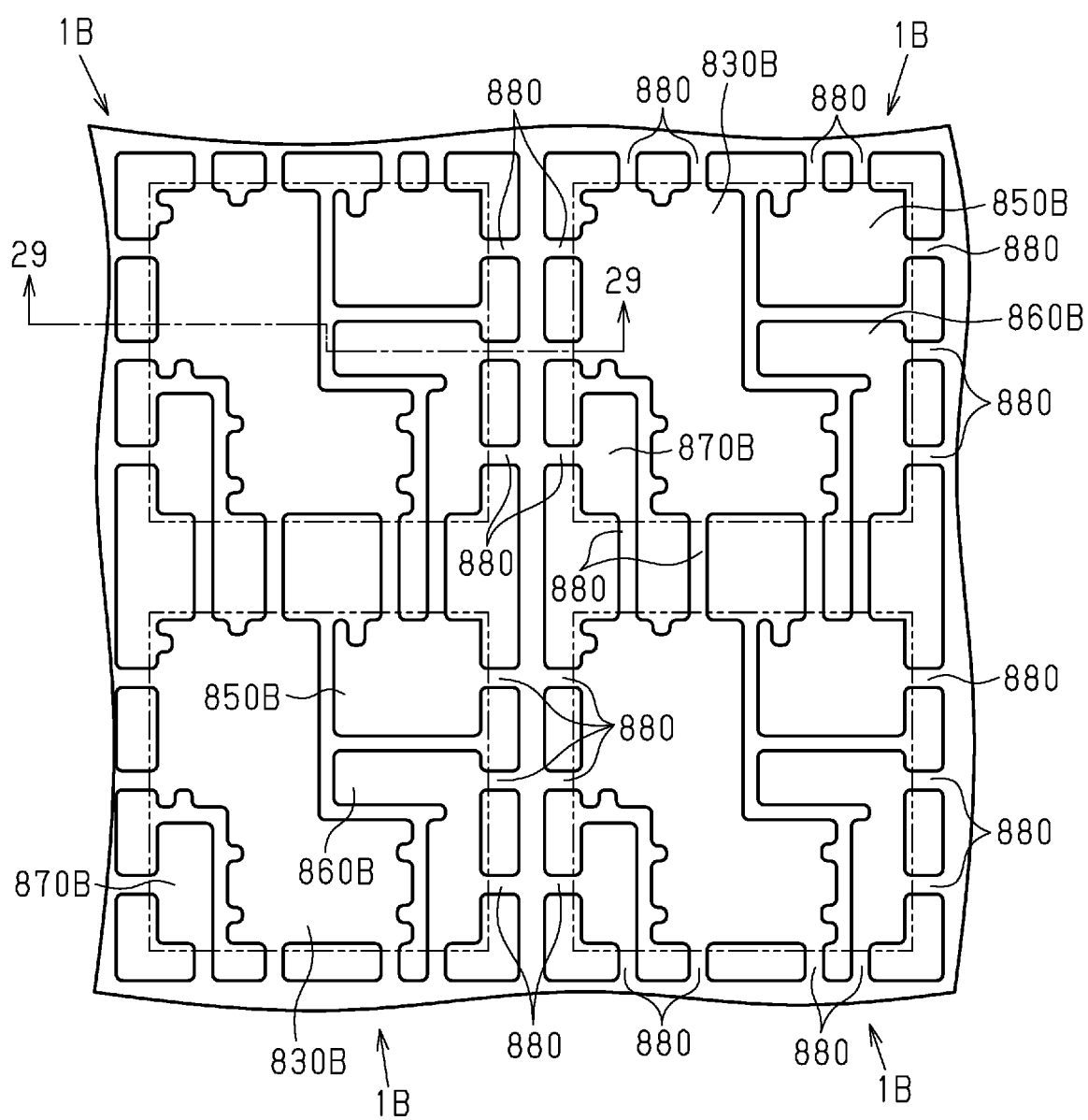
FIG. 28 is a partial enlarged view of FIG. 27.
Figure 29:
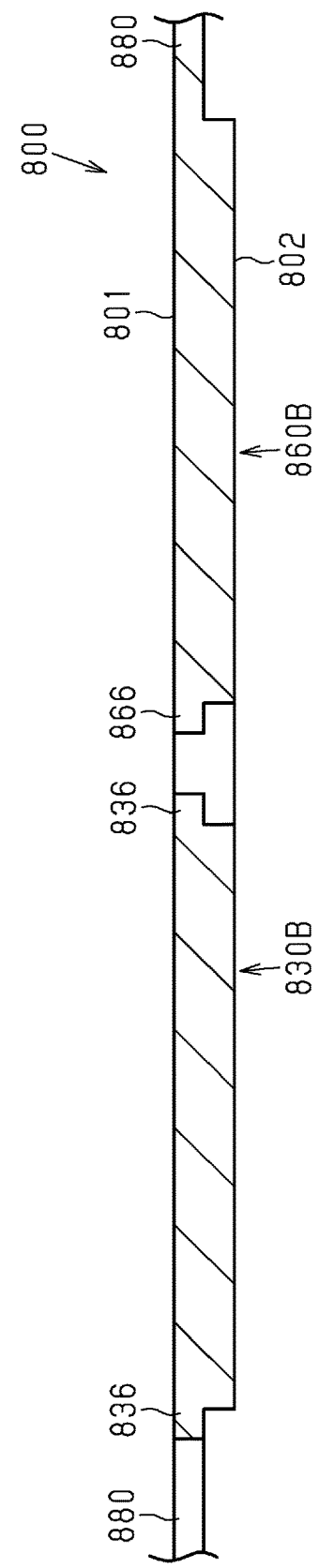
FIG. 29 is a cross-sectional view taken along line 29-29 in FIG. 28.
Figure 30:
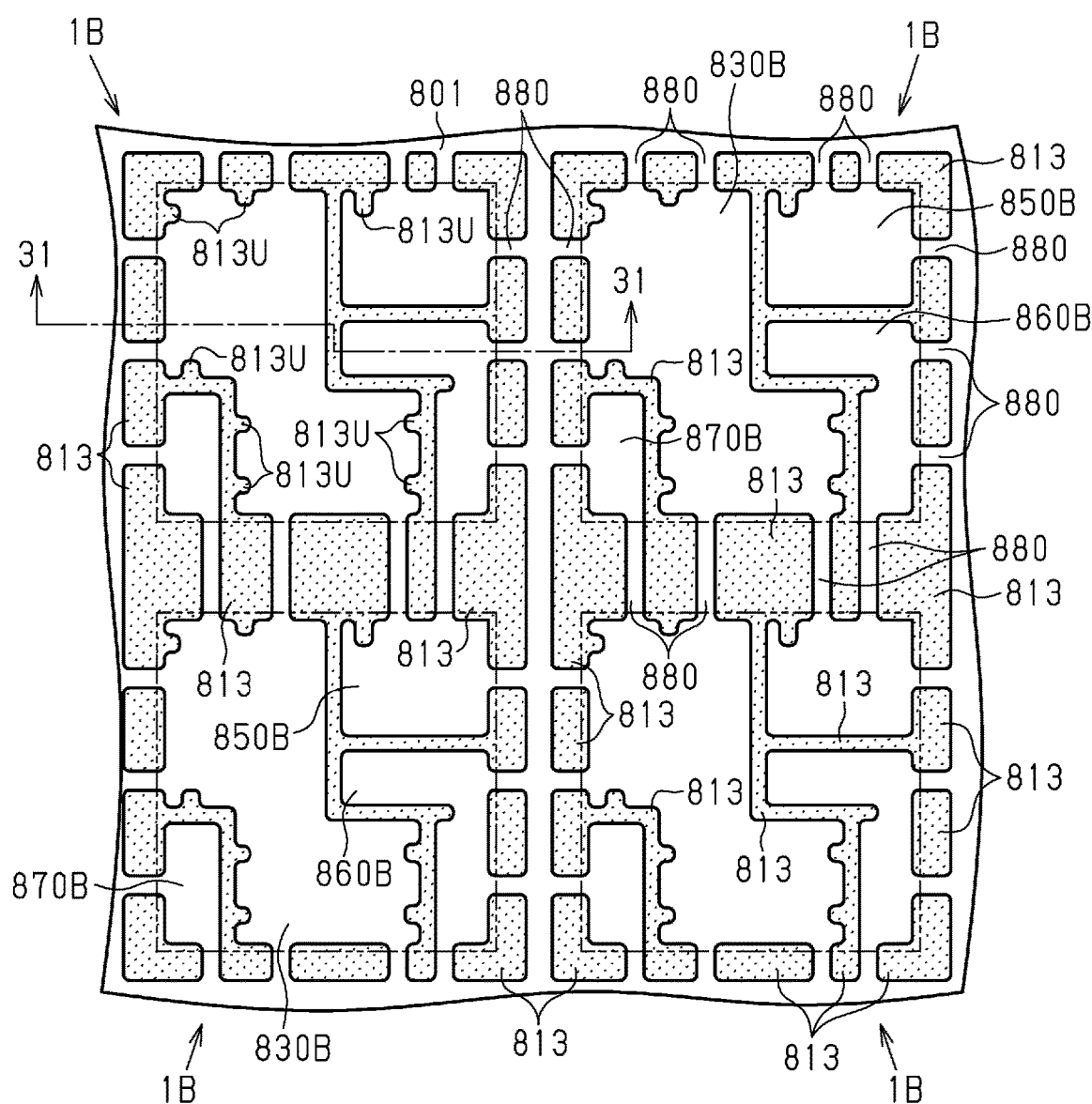
FIG. 30 is a diagram showing an example of a step in the manufacturing method of the semiconductor light emitting device.

The method for manufacturing the semiconductor light emitting device 1B includes a step of preparing a lead frame 800 as shown in FIGS. 27 to 29. The lead frame 800 is a metal plate formed from Cu. The lead frame 800 is formed, for example, by etching the Cu plate. The lead frame 800 includes conductive portions 830B, 850B, 860B, and 870B corresponding to the semiconductor light emitting devices 1B. FIG. 28 shows the conductive portions 830B, 850B, 860B, and 870B corresponding to four semiconductor light emitting devices 1B. The conductive portions 830B, 850B, 860B, and 870B are supported by support leads 880 of the lead frame 800. The shape of the conductive portions 830B, 850B, 860B, and 870B conforms to the shape of the conductive portions 30B, 50B, 60B, and 70B shown in FIG. 14 except that the support leads 880 have not been cut. That is, a common conductive portion 830B corresponds to the common conductive portion 30B, an element conductive portion 850B corresponds to the element conductive portion 50B, a drive conductive portion 860B corresponds to the drive conductive portion 60B, and a control conductive portion 870B corresponds to the control conductive portion 70B. For example, in a cross-sectional view taken in the Z-direction, flanges are formed on the conductive portions 830B, 850B, 860B, and 870B, for example, by etching. In an example, as shown in FIG. 29, the common conductive portion 830B includes a flange 836, and the drive conductive portion 860B includes a flange 866. As shown in FIG. 29, the support lead 880 extends from the flange 866 and has the same thickness as the flange 866.

Figure 31:
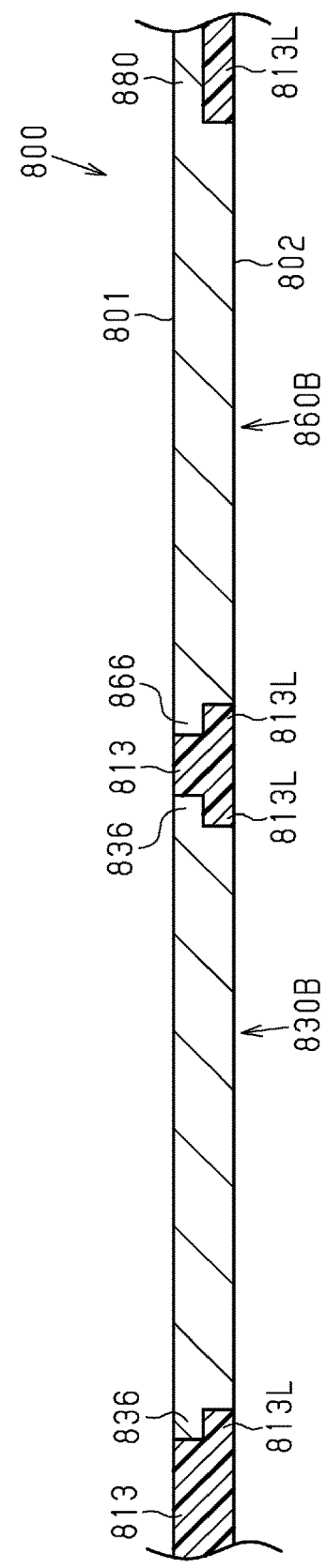
FIG. 31 is a cross-sectional view taken along line 31-31 in FIG. 30.
Figure 32:
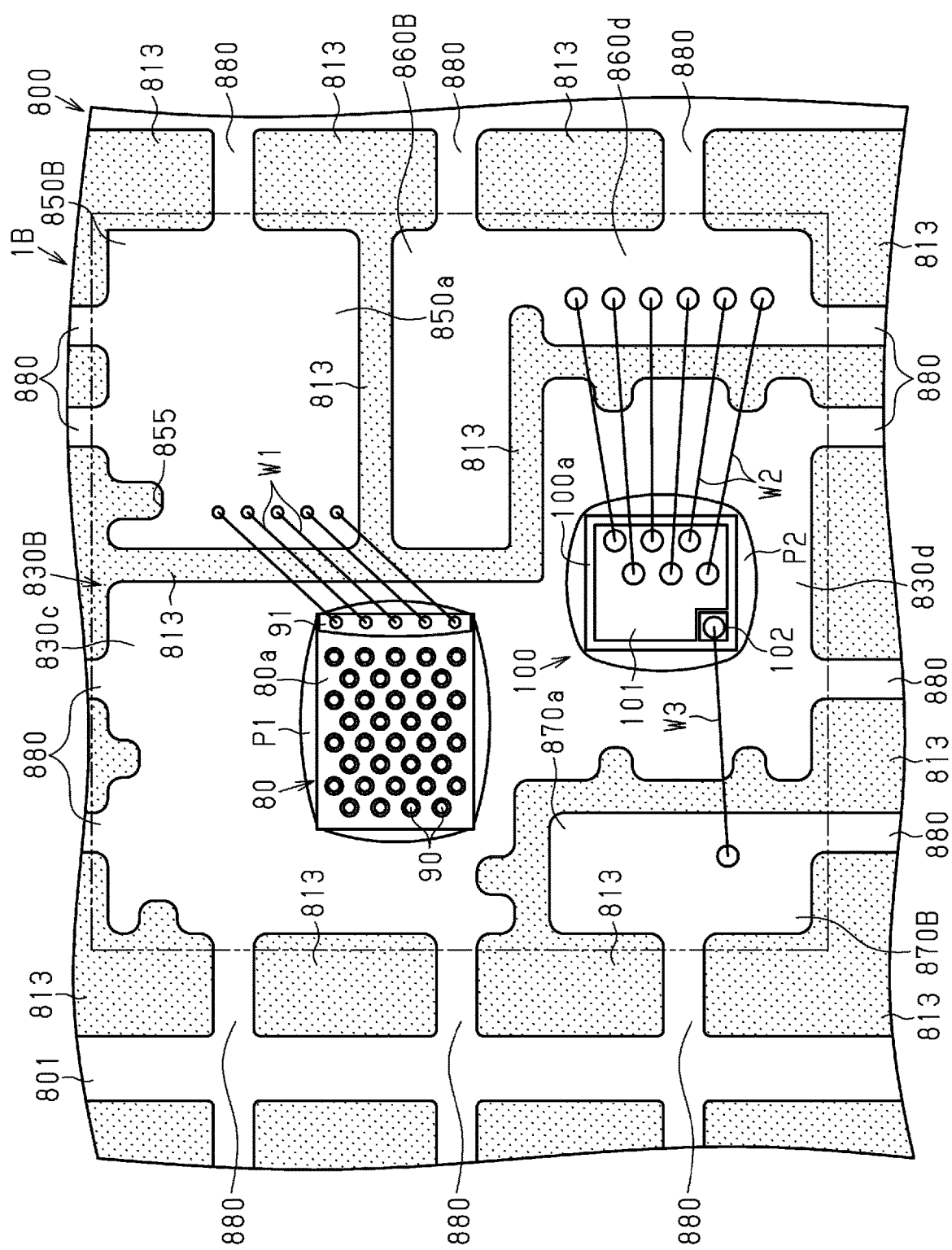
FIG. 32 is a diagram showing an example of a step in the manufacturing method of the semiconductor light emitting device.

As shown in FIGS. 30 and 31, the method for manufacturing the semiconductor light emitting device 1B includes a step of molding the lead frame 800 with an insulation portion 813. The insulation portion 813 is formed from an electrically insulative resin material. In the present embodiment, an epoxy resin is used to form the insulation portion 813. As indicated by the shading in FIG. 30, the insulation portion 813 is formed to fill through holes formed in the lead frame 800. As shown in FIG. 30, the insulation portion 813 surrounds each of the conductive portions 830B, 850B, 860B, and 870B. Thus, in the part excluding the support leads 880, the insulation portion 813 separates the conductive portions 830B, 850B, 860B, and 870B from each other. As shown in FIG. 31, the insulation portion 813 is accommodated in the back side of the flange 866 and the support lead 880 to form a back-half insulation portion 813L. In addition, the insulation portion 813 is accommodated in recesses of the conductive portions 830B, 850B, 860B, and 870B to form a front-half insulation portion 813U. The recesses in the conductive portions 830B, 850B, 860B, and 870B correspond to the recesses 35a to 35e, 55, and 65 (refer to FIG. 14) of the conductive portions 30B, 50B, 60B, and 70B. The front-half insulation portion 813U corresponds to the front-half insulation portion 13U (refer to FIG. 14) of the substrate 10B.

As shown in FIG. 32, the method for manufacturing the semiconductor light emitting device 1B includes a step of mounting the semiconductor light emitting element 80 on the lead frame 800 and a step of mounting the electronic component 100 on the lead frame 800. More specifically, the semiconductor light emitting element 80 is die-bonded to the common conductive portion 830B by the conductive bonding material P1, and the electronic component 100 is die-bonded to the common conductive portion 830B by the conductive bonding material P2. More specifically, the conductive bonding material P1 is applied to a first common contact front surface portion 830c of the common conductive portion 830B, and the conductive bonding material P2 is applied to a second common contact front surface portion 830d of the common conductive portion 830B. An Ag paste is used as the conductive bonding materials P1 and P2. Then, the semiconductor light emitting element 80 is mounted on the conductive bonding material P1, and the electronic component 100 is mounted on the conductive bonding material P2. At this time, the element lower surface electrode 92 (refer to FIG. 17) of the semiconductor light emitting element 80 is in contact with the conductive bonding material P1, and the first drive electrode 101 (refer to FIG. 18) of the electronic component 100 is in contact with the conductive bonding material P2. The semiconductor light emitting element 80 is bonded to the first common contact front surface portion 830cb y the conductive bonding material P1, and the electronic component 100 is bonded to the second common contact front surface portion 830d by the conductive bonding material P2, for example, through a reflow process.

As shown in FIG. 32, the method for manufacturing the semiconductor light emitting device 1B includes a step of forming the wires W1 to W3. In the present embodiment, a wire bonding machine is used to form the wires W1 to W3. More specifically, the wire bonding machine forms first bonding portions on the element upper surface electrode 91 of the semiconductor light emitting element 80 and then moves to the element conductive portion 850B to form second bonding portions on an element contact front surface 850a. As a result, the wires W1 are formed. The second bonding portions of the wires W1 are formed so as to be located at substantially the same position as a recess 855 formed in the element conductive portion 850B in the X-direction. That is, the recess 855 is used as the mark of the position where the second bonding portions of the wires W1 are formed. The wire bonding machine forms first bonding portions on the first drive electrode 101 of the electronic component 100 and then moves to the drive conductive portion 860B to form second bonding portions on a second drive contact front surface portion 860d. As a result, the wires W2 are formed. The wire bonding machine forms a first bonding portion on the control electrode 102 of the electronic component 100 and then moves to the control conductive portion 870B to form a second bonding portion on a control contact front surface 870a. As a result, the wire W3 is formed. The wires W1 to W3 may be formed in any order. The element contact front surface 850a corresponds to the element contact front surface 50a (refer to FIG. 14) of the substrate 10B. The second drive contact front surface portion 860d corresponds to the second drive contact front surface portion 60d (refer to FIG. 14) of the substrate 10B. The control contact front surface 870a corresponds to the control contact front surface 70a (refer to FIG. 14) of the substrate 10B.

Figure 33:
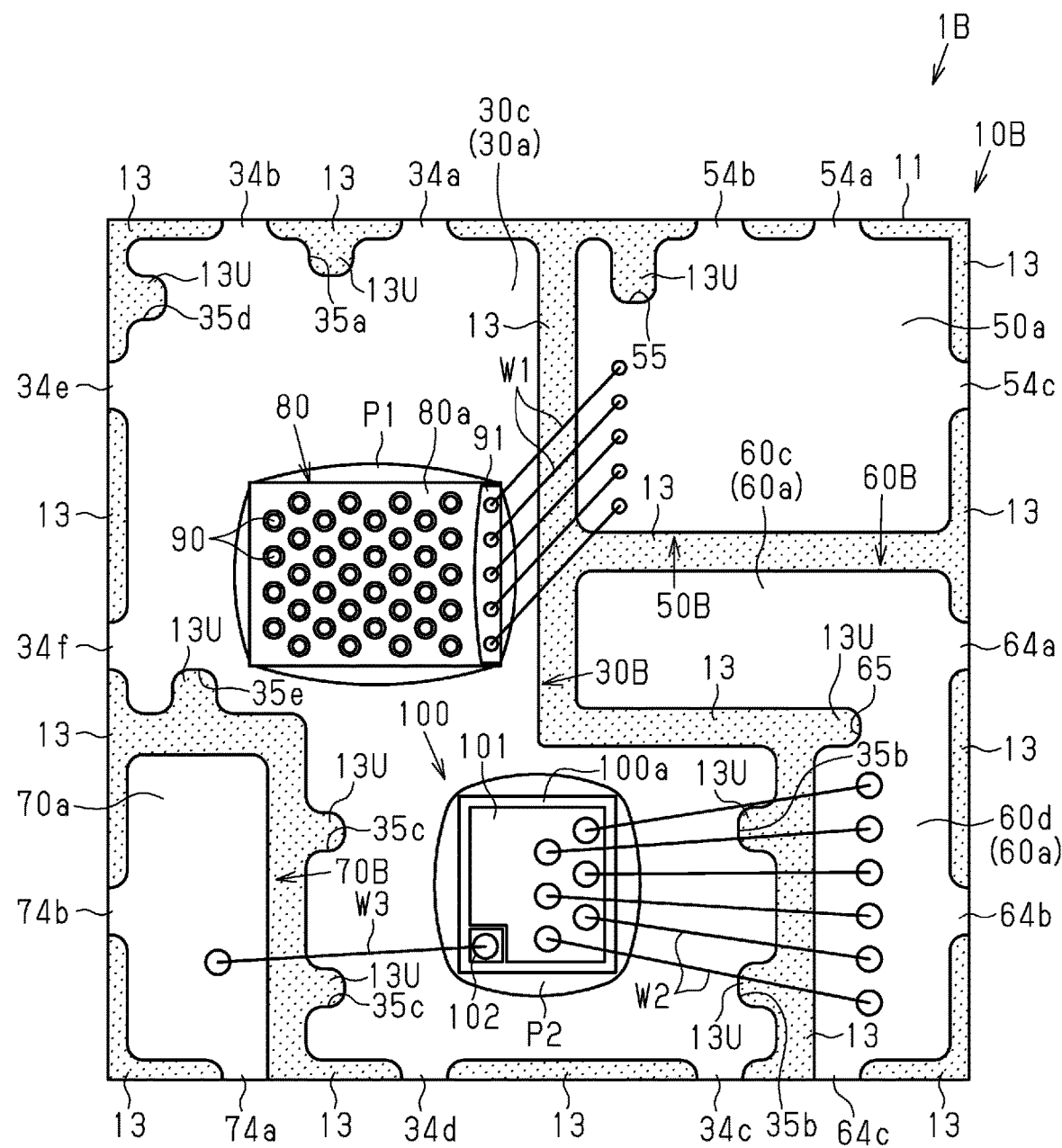
FIG. 33 is a diagram showing an example of a step in the manufacturing method of the semiconductor light emitting device.

As shown in FIG. 33, the method for manufacturing the semiconductor light emitting device 1B includes a step of forming the substrate 10B. More specifically, for example, a dicing blade is used to cut the insulation portion 813 and the support lead 880 of the lead frame 800 along the double-dashed lines shown in FIG. 32. In the present embodiment, the dicing blade cuts the lead frame 800 from a front surface 801 toward a back surface 802 (refer to FIG. 31). Accordingly, the projections 34a to 34f, 54a to 54c, 64a to 64c, 74a, and 74b are formed. At this time, since the support lead 880 is located closer to the front surface 801 than the back surface 802 and the insulation portion 813 is disposed at the side of the support lead 880 located toward the back surface 802, even when a burr is produced on the support lead 880 when cut by the dicing blade, protrusion of the burr toward the back surface 802 is limited.

Figure 34:
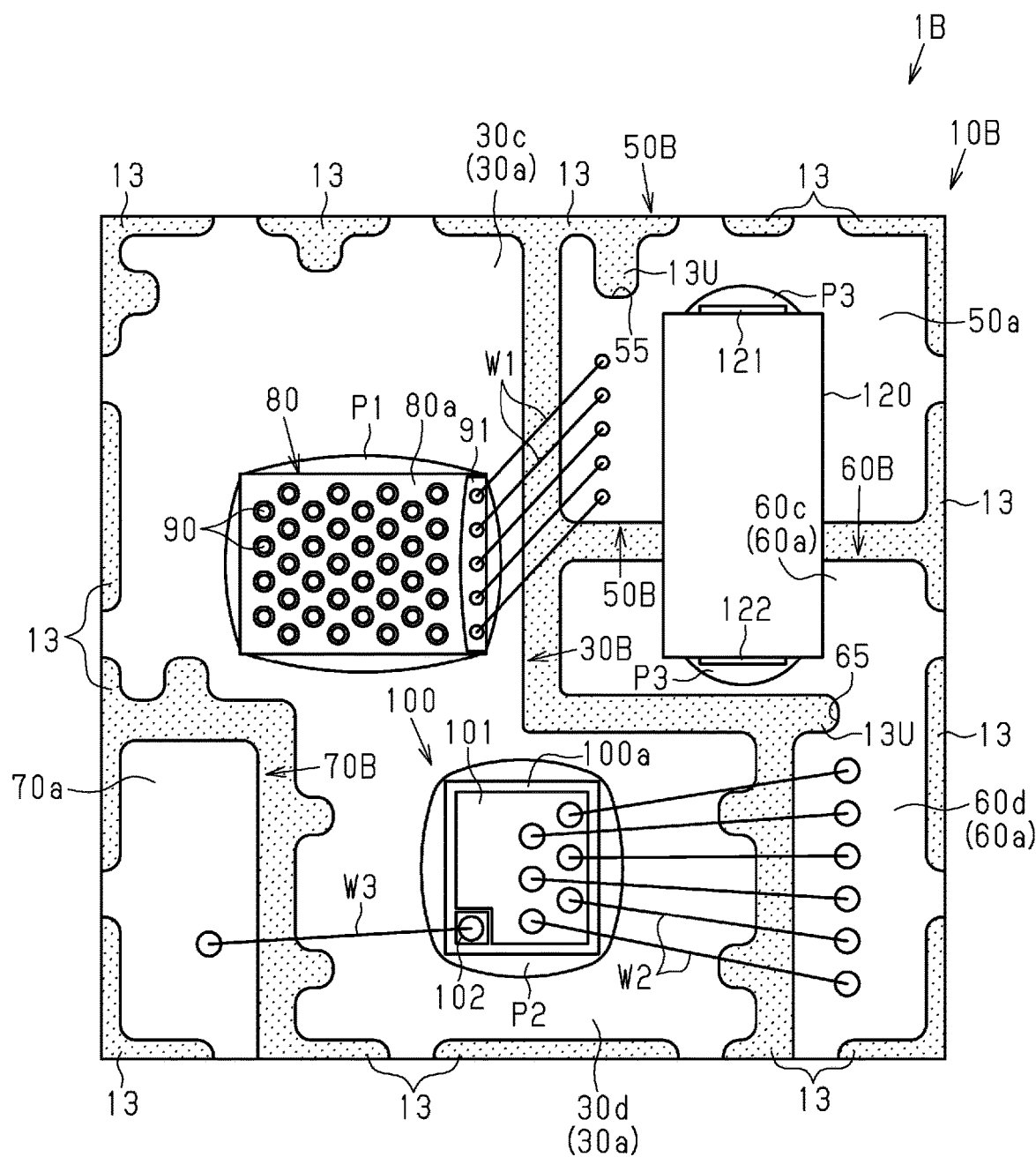
FIG. 34 is a diagram showing an example of a step in the manufacturing method of the semiconductor light emitting device.

As shown in FIG. 34, the method for manufacturing the semiconductor light emitting device 1B includes a step of mounting the capacitor 120. More specifically, the capacitor 120 is disposed across the element conductive portion 50B and the drive conductive portion 60B and die-bonded to the element conductive portion 50B and the drive conductive portion 60B by the conductive bonding material P3. More specifically, the conductive bonding material P3 is applied to the element contact front surface 50a of the element conductive portion 50B and the first drive contact front surface portion 60c of the drive conductive portion 60B. For example, an Ag paste is used as the conductive bonding material P3. Then, the capacitor 120 is mounted on the conductive bonding material P3. At this time, the first electrode 121 of the capacitor 120 is in contact with the conductive bonding material P3 that is applied to the element conductive portion 50B. The second electrode 122 is in contact with the conductive bonding material P3 that is applied to the drive conductive portion 60B. The capacitor 120 is bonded to the element contact front surface 50a and the first drive contact front surface portion 60cb y the conductive bonding material P3m for example, through a reflow process. In this step, the application of the conductive bonding material P3 and the mounting of the capacitor 120 are performed so that an extension of the conductive bonding material P3 extending from the first electrode 121 is located between the recess 55 and the first electrode 121.

Figure 35:
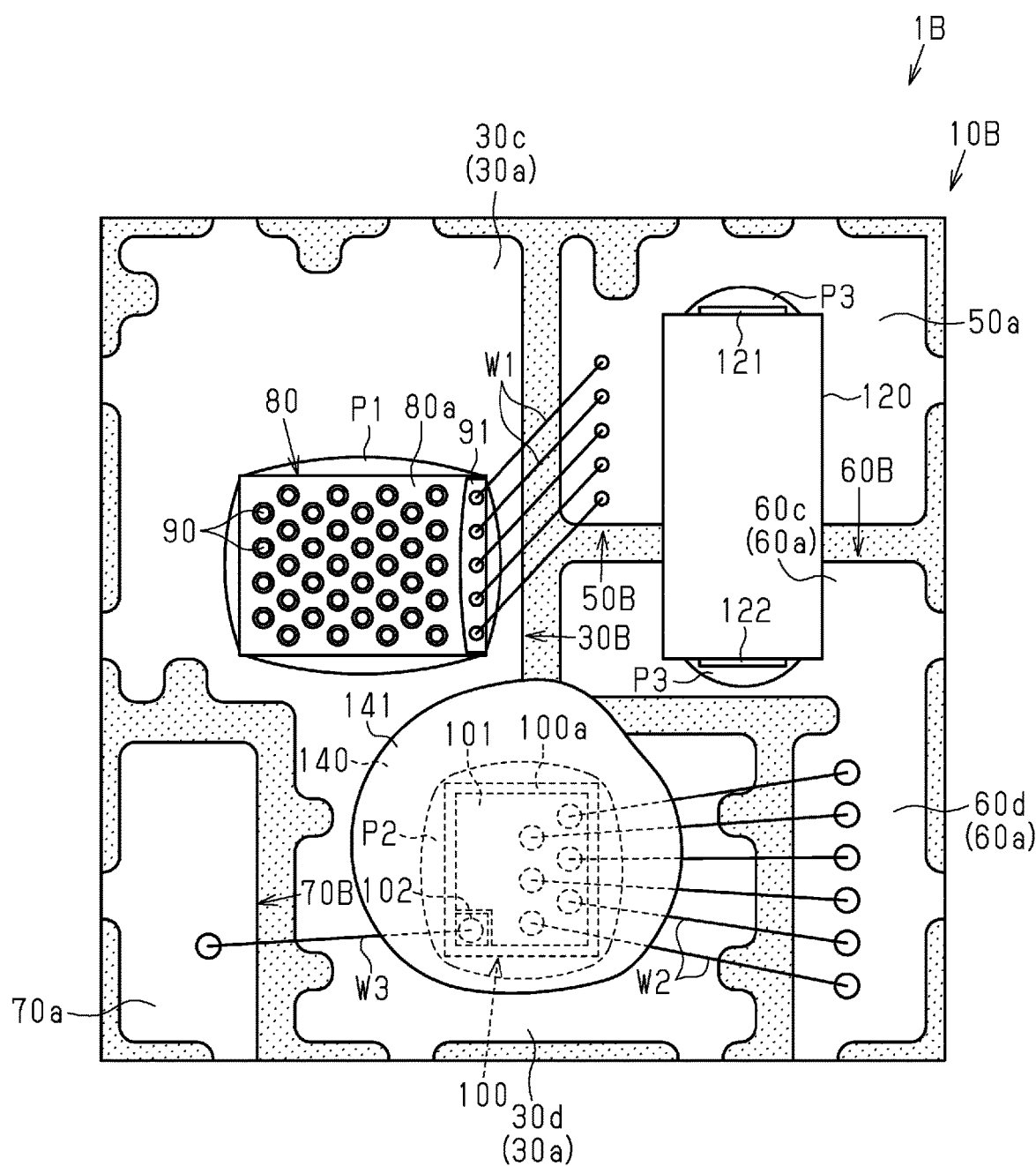
FIG. 35 is a diagram showing an example of a step in the manufacturing method of the semiconductor light emitting device.

As shown in FIG. 35, the method for manufacturing the semiconductor light emitting device 1B includes a step of covering the electronic component 100 with the encapsulation resin 140 and the coating agent 141. In the present embodiment, the encapsulation resin 140 is applied to cover the electronic component 100 and the first bonding portions of the wires W2 and W3, and then the encapsulation resin 140 is cured by application of heat or ultraviolet irradiation. Then, the coating agent 141 is applied to cover the encapsulation resin 140. A light-blocking resin material is used as the encapsulation resin 140. In the present embodiment, an epoxy resin is used. The coating agent 141 is formed from a fluoropolymer and glass.

Figure 36:
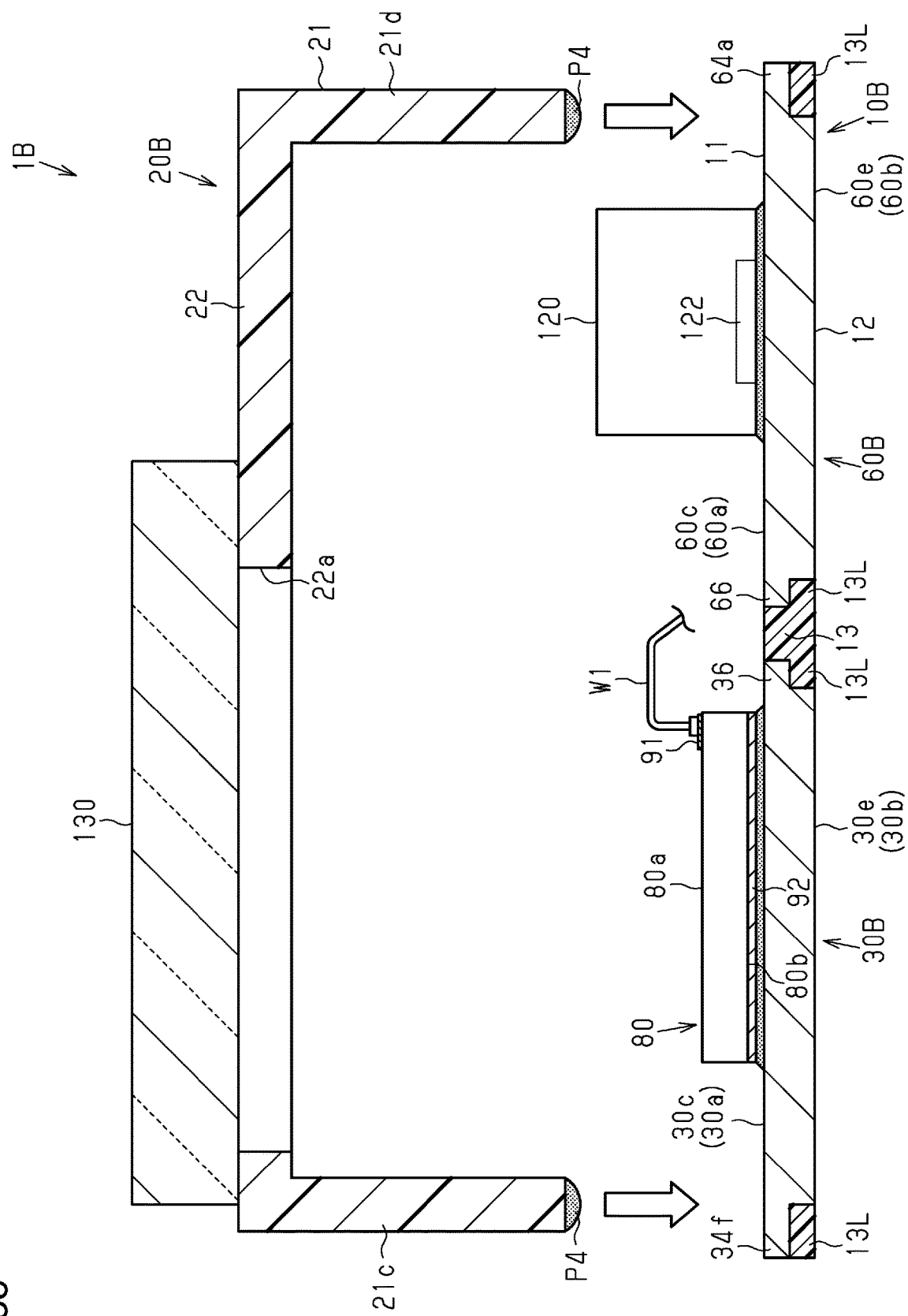
FIG. 36 is a diagram showing an example of a step in the manufacturing method of the semiconductor light emitting device.

As shown in FIG. 36, the method for manufacturing the semiconductor light emitting device 1B includes a step of attaching the case 20B provided with the light diffusion plate 130 to the substrate 10B. In the present embodiment, a light-blocking adhesive agent P4 is applied to end surfaces of the side walls 21a to 21d of the case 20B, and the case 20B is attached to the substrate front surface 11 of the substrate 10B. An electrically insulative material is used as the adhesive agent P4. In the present embodiment, an adhesive containing a black epoxy resin as a main component is used as the adhesive agent P4 Through the steps described above, the semiconductor light emitting device 1B is manufactured.

Electronic Apparatus Using Semiconductor Light Emitting Device

Figure 37:
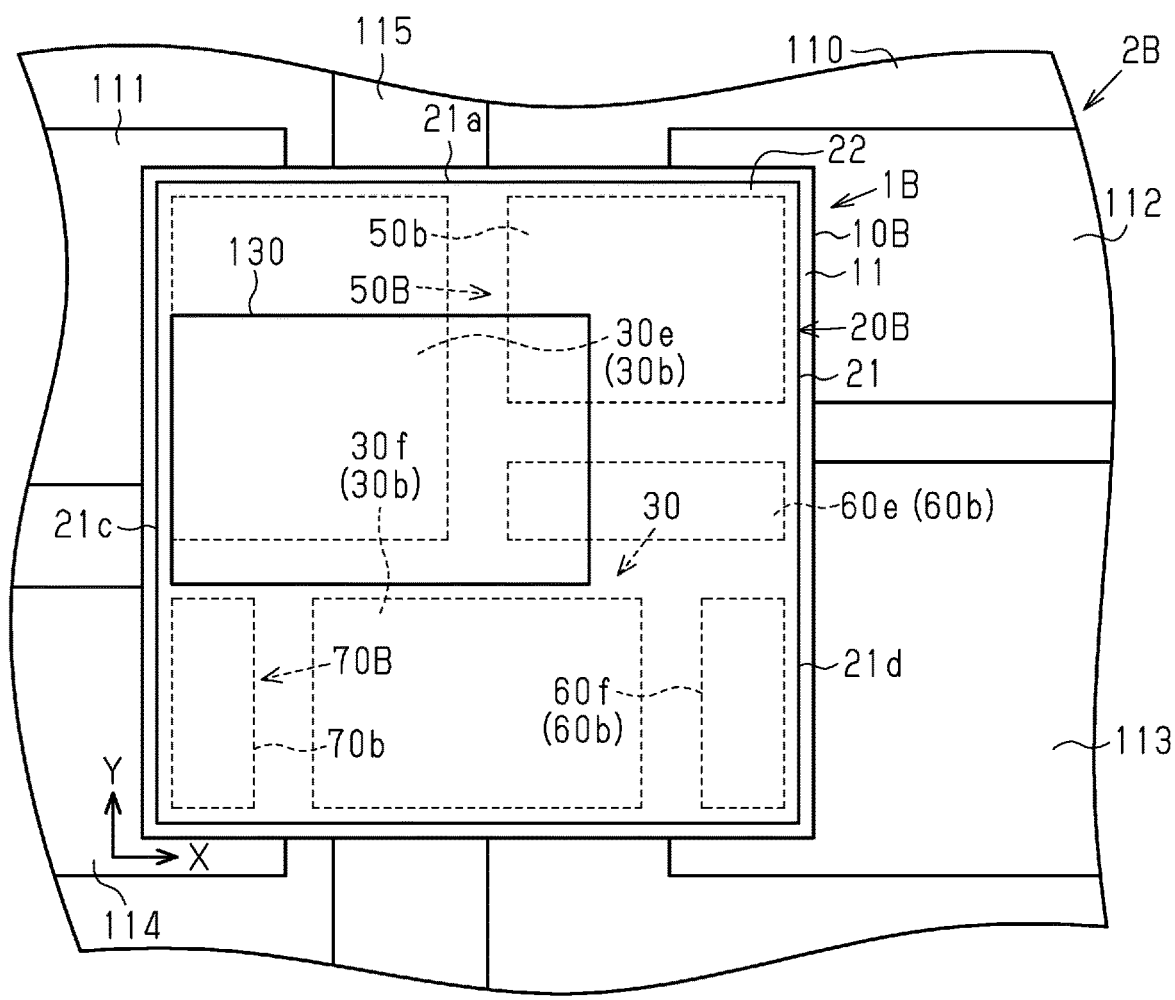
FIG. 37 is a front view showing part of an electronic apparatus in the second embodiment.
Figure 38:
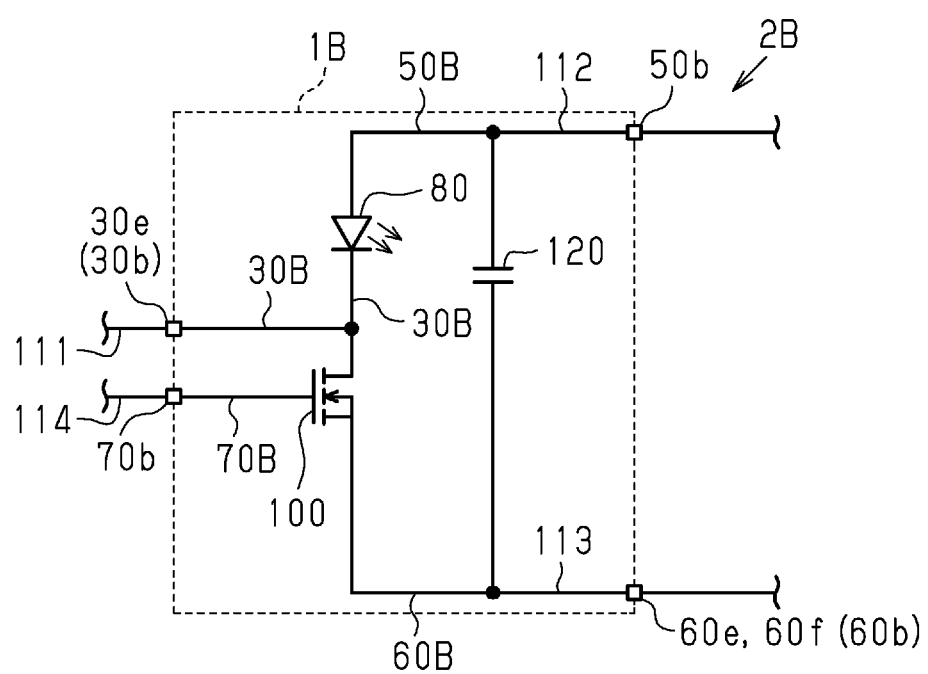
FIG. 38 is a circuit diagram showing part of the electronic apparatus in the second embodiment.
Figure 39:
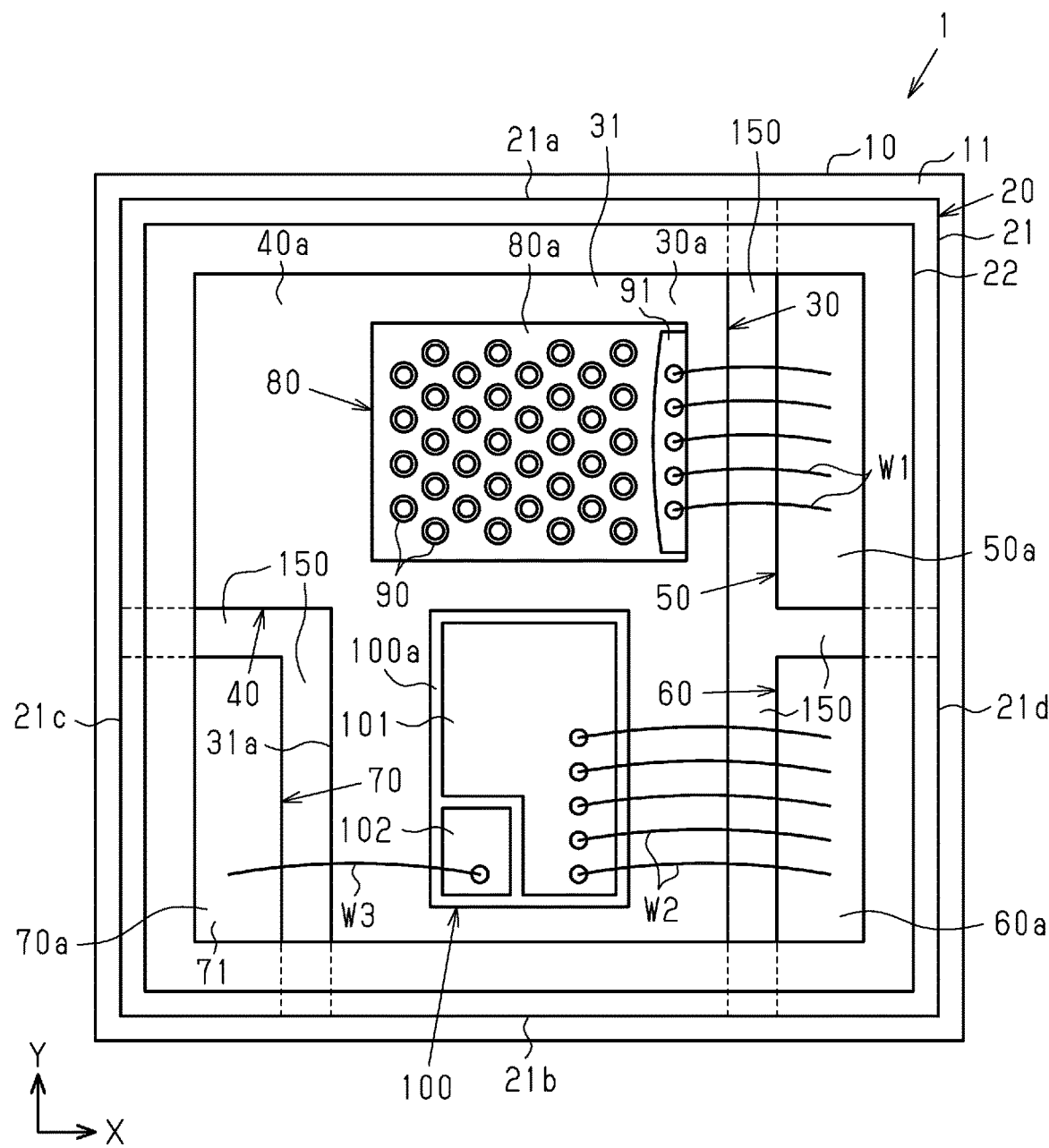
FIG. 39 is a front view showing a semiconductor light emitting device in a modified example.

FIGS. 37 and 38 are respectively a plan view and a circuit diagram showing an example of an electronic apparatus 2B that uses the semiconductor light emitting device 1B. The electronic apparatus 2B is, for example, a sensor for measuring distance.

The electronic apparatus 2B includes the semiconductor light emitting device 1B, a circuit substrate 110 on which the semiconductor light emitting device 1B is mounted, and wiring patterns 111 to 114 formed on the circuit substrate 110. The layout of the wiring patterns 111 to 114 is the same as the layout of the wiring patterns 111 to 114 (refer to FIGS. 9 and 10) of the first embodiment.

The common conductive portion 30B partially overlaps the first wiring pattern 111. The first common contact back surface portion 30e and the first wiring pattern 111 are bonded by solder or the like. Thus, the first wiring pattern 111 is electrically connected to the element lower surface electrode 92, that is, the cathode electrode of the semiconductor light emitting element 80, and the second drive electrode 103, that is, the drain electrode of the electronic component 100.

The element conductive portion 50B overlaps the second wiring pattern 112. The second wiring pattern 112 of the present embodiment has a smaller width than the second wiring pattern 112 of the first embodiment. The element contact back surface 50b and the second wiring pattern 112 are bonded by solder or the like. Thus, the second wiring pattern 112 is electrically connected to the element upper surface electrode 91, that is, the anode electrode of the semiconductor light emitting element 80, and the first electrode 121 of the capacitor 120.

The drive conductive portion 60B overlaps the third wiring pattern 113. The third wiring pattern 113 of the present embodiment has a larger width than the third wiring pattern 113 of the first embodiment. The first drive contact back surface portion 60e and the second drive contact back surface portion 60f are bonded to the third wiring pattern 113 by solder or the like. Thus, the third wiring pattern 113 is electrically connected to the first drive electrode 101, that is, the source electrode of the electronic component 100, and the second electrode 122 of the capacitor 120. The width of the third wiring pattern 113 may be the same as the width of the third wiring pattern 113 of the first embodiment. In this case, the third wiring pattern 113 is bonded to the second drive contact back surface portion 60f by solder or the like. The third wiring pattern 113 may be bonded to the first drive contact back surface portion 60e instead of the second drive contact back surface portion 60f by solder or the like.

The control conductive portion 70B overlaps the fourth wiring pattern 114. The control contact back surface 70b and the fourth wiring pattern 114 are bonded by solder or the like. Thus, the fourth wiring pattern 114 is electrically connected to the control electrode 102 of the electronic component 100.

As described above, in the present embodiment, the contact back surfaces 30b, 50b, 60b, and 70b form external terminals of the semiconductor light emitting device 1B.

In the illustrated example, part of the first common contact back surface portion 30e and the second common contact back surface portion 30f are mounted via solder or the like on the heat dissipation pattern 115 formed on the circuit substrate 110. The heat dissipation pattern 115 of the present embodiment has a smaller width than the heat dissipation pattern 115 of the first embodiment. The heat dissipation pattern 115 is not bonded to the element contact back surface 50b and the first drive contact back surface portion 60e. Therefore, heat of the semiconductor light emitting element 80 and the electronic component 100 is transmitted from the common contact back surface portions 30e and 30f to the circuit substrate 110. This improves the heat dissipation efficiency of the semiconductor light emitting device 1B.

In the present embodiment, the semiconductor light emitting device 1B incorporates the capacitor 120. As described above, the capacitor 120 is electrically connected to the third wiring pattern 113 and the fourth wiring pattern 114. As shown in FIG. 38, the capacitor 120 is connected in parallel to the semiconductor light emitting element 80 and the electronic component 100, which are connected in series.

The semiconductor light emitting device 1B of the present embodiment has the following advantages in addition to the advantages of (1-1) to (1-11) and (1-13) of the first embodiment.

(2-1) The common conductive portion 30B, the element conductive portion 50B, the drive conductive portion 60B, and the control conductive portion 70B are formed of a lead frame and are exposed in the substrate front surface 11 and the substrate back surface 12. In this structure, each of the common conductive portion 30B, the element conductive portion 50B, the drive conductive portion 60B, and the control conductive portion 70B has a large volume, so that the heat dissipation efficiency of each of the common conductive portion 30B, the element conductive portion 50B, the drive conductive portion 60B, and the control conductive portion 70B is improved.

(2-2) The common contact front surface 30a includes the first common contact front surface portion 30c and the second common contact front surface portion 30d. The second common contact front surface portion 30d is disposed between the drive conductive portion 60B and the control conductive portion 70B and extends toward the fourth side wall 21d beyond the first common contact front surface portion 30c in the X-direction. The first common contact front surface portion 30c extends from the second common contact front surface portion 30d in the Y-direction. The semiconductor light emitting element 80 is located at a position of the first common contact front surface portion 30c located toward the second common contact front surface portion 30d. This structure shortens the conductive path between the semiconductor light emitting element 80 and the electronic component 100. As a result, parasitic capacitance caused by the conductive path between the semiconductor light emitting element 80 and the electronic component 100 is reduced.

(2-3) The electronic component 100 is located at a position of the second common contact front surface portion 30d located toward the first common contact front surface portion 30c. This structure further shortens the conductive path between the semiconductor light emitting element 80 and the electronic component 100. As a result, parasitic capacitance caused by the conductive path between the semiconductor light emitting element 80 and the electronic component 100 is further reduced.

(2-4) The common contact front surface 30*a* is larger than the drive contact front surface 60*a* and the control contact front surface 70*a*. This structure improves the heat dissipation efficiency of the common conductive portion 30B.

(2-5) As viewed in the X-direction, a portion of the semiconductor light emitting element 80 is disposed on the first common contact front surface portion 30*c* at a position closer to the electronic component 100 than the element contact front surface 50*a*. The element upper surface electrode 91 of the semiconductor light emitting element 80 is connected to the element contact front surface 50*a* by multiple wires W1. The wires W1 diagonally extend from the element upper surface electrode 91 toward the element contact front surface 50*a* so as to extend away from the electronic component 100. With this structure, even when the semiconductor light emitting element 80 and the element contact front surface 50*a* are located at different positions in the Y-direction, the multiple wires W1 allow the element upper surface electrode 91 to be readily electrically connected to the element conductive portion 50B.

(2-6) The drive contact front surface 60*a* includes the first drive contact front surface portion 60*c* and the second drive contact front surface portion 60*d*. The first drive contact front surface portion 60*c* extends in the X-direction. The second drive contact front surface portion 60*d* extends in the Y-direction. In this structure, the second electrode 122 of the capacitor 120 is readily connected to the first drive contact front surface portion 60*c*, and the wires W2 are readily connected to the second drive contact front surface portion 60*d*.

In addition, the drive contact front surface 60*a* includes the recessed region 60*r* that is recessed from the first drive contact front surface portion 60*c* so that the second drive contact front surface portion 60*d* has a smaller dimension in the X-direction than the first drive contact front surface portion 60*c*. The second common contact front surface portion 30*d* is accommodated in the recessed region 60*r*. In this structure, the dimension of the second common contact front surface portion 30*d* in the X-direction is increased, thereby improving the heat dissipation efficiency of the electronic component 100.

(2-7) In plan view, the wires W2 are arranged in the Y-direction. In this structure, the second drive contact front surface portion 60*d* extends in the Y-direction to ensure a space for forming the second bonding portion of each wire W2. Thus, the second bonding portion of each wire W2 is readily formed.

(2-8) Inductance between the first drive electrode 101 and the second drive contact front surface portion 60*d* is reduced in accordance with an increase in the distance between the two wires W2 that are configured to be the combination of the furthermost ones of the wires W2. In this regard, in the semiconductor light emitting device 1B, in plan view, the distance between the furthermost ones of the wires W2 in the Y-direction increases from the first drive electrode 101 of the electronic component 100 toward the second drive contact front surface portion 60*d*. Thus, the two wires W2 that are configured to be the combination of the furthermost ones of the wires W2 are separated by a great distance, so that the inductance between the first drive electrode 101 and the second drive contact front surface portion 60*d* is reduced.

(2-9) The first common contact back surface portion 30*e* is larger than the element contact back surface 50*b*, the drive contact back surface 60*b*, and the control contact back surface 70*b*. This structure improves the heat dissipation efficiency of the semiconductor light emitting element 80.

(2-10) The first common contact back surface portion 30*e* is larger than the second common contact back surface portion 30*f*. This structure improves the heat dissipation efficiency of the semiconductor light emitting element 80.

(2-11) The first common contact front surface portion 30*c* extends from the second common contact front surface portion 30*d* toward the third side wall 21*c* in the X-direction. In this structure, the dimension of the first common contact front surface portion 30*c* in the X-direction is increased, thereby improving the heat dissipation efficiency of the semiconductor light emitting element 80.

(2-12) The common conductive portion 30B includes the recess 35*a*, the two recesses 35*b*, the two recesses 35*c*, the recess 35*d*, and the recess 35*e*. Each of the recesses 35*a* to 35*e* accommodates the insulation portion 13. This structure resists separation of the insulation portion 13 from the common conductive portion 30B. In addition, the recesses 35*a* to 35*e* are arranged in the common contact front surface 30*a* and accommodate the front-half insulation portions 13U, which do not extend through in the Z-direction. In this structure, as viewed in the Z-direction, the front-half insulation portions 13U accommodated in the recesses 35*a* to 35*e* overlaps the common contact back surface 30*b*, thereby restricting movement of the common conductive portion 30B toward the case 20B from the insulation portion 13 in the Z-direction.

(2-13) The element conductive portion 50B includes the recess 55. The recess 55 accommodates the insulation portion 13. This structure resists separation of the insulation portion 13 from the element conductive portion 50B. In addition, the recess 55 is arranged in the element contact front surface 50*a* and accommodates the front-half insulation portion 13U, which does not extend through in the Z-direction. In this structure, as viewed in the Z-direction, the front-half insulation portion 13U accommodated in the recess 55 overlaps the element contact back surface 50*b*, thereby restricting movement of the element conductive portion 50B toward the case 20B from the insulation portion 13 in the Z-direction.

(2-14) The drive conductive portion 60B includes the recess 65. The recess 65 accommodates the insulation portion 13. This structure resists separation of the insulation portion 13 from the drive conductive portion 60B. In addition, the recess 65 is arranged in the drive contact front surface 60*a* and accommodates the front-half insulation portion 13U, which does not extend through in the Z-direction. In this structure, as viewed in the Z-direction, the front-half insulation portion 13U accommodated in the recess 65 overlaps the drive contact back surface 60*b*, thereby restricting movement of the drive conductive portion 60B toward the case 20B from the insulation portion 13 in the Z-direction.

(2-15) The recess 65 is disposed between the first drive contact front surface portion 60*c* and the second drive contact front surface portion 60*d*. This structure limits entrance of the conductive bonding material P3, which is used to connect the capacitor 120 to the first drive contact front surface portion 60*c*, into the second drive contact front surface portion 60*d*. Thus, contact of the conductive bonding material P3 with the second bonding portions of the wires W2 is hindered.

(2-16) The recess 35*f* is disposed between the first common contact back surface portion 30*e* and the second common contact back surface portion 30*f*. The recess 35*f* accommodates the back-half insulation portion 13L. The back-half insulation portion 13L accommodated in the recess 35f extends through the common contact back surface 30b in the X-direction and is continuous with the insulation portions 13 that are located at opposite sides of the common contact back surface 30b and extend through the substrate 10B. In this structure, the back-half insulation portion 13L in the recess 35f integrates the insulation portions 13 located at opposite sides of the common contact back surface 30b. This improves the strength of the insulation portions 13 located around the common conductive portion 30B. In addition, the back-half insulation portion 13L in the recess 35f supports the common conductive portion 30B in the Z-direction and increases the area of contact of the insulation portion 13 with the common conductive portion 30B. This restricts movement of the common conductive portion 30B toward the substrate back surface 12 in the Z-direction.

(2-17) The recess 65a is disposed between the first drive contact back surface portion 60e and the second drive contact back surface portion 60f. The recess 65a accommodates the back-half insulation portion 13L. The back-half insulation portion 13L accommodated in the recess 65a extends through the drive contact back surface 60b in the X-direction and is continuous with the insulation portions 13 that are located at opposite sides of the drive contact back surface 60b and extend through the substrate 10B. In this structure, the back-half insulation portion 13L in the recess 65a integrates the insulation portions 13 located at opposite sides of the drive contact back surface 60b. This improves the strength of the insulation portions 13 located around the drive conductive portion 60B. In addition, the back-half insulation portion 13L in the recess 65a supports the drive conductive portion 60B in the Z-direction and increases the area of contact of the insulation portion 13 with the drive conductive portion 60B. This restricts movement of the drive conductive portion 60B toward the substrate back surface 12 in the Z-direction.

(2-18) The common conductive portion 30B, the element conductive portion 50B, the drive conductive portion 60B, and the control conductive portion 70B include the flanges 36, 56, 66, and 76, respectively. The insulation portion 13 (back-half insulation portion 13L) is accommodated between the substrate back surface 12 and each of the flanges 36, 56, 66, and 76. This structure restricts movement of the common conductive portion 30B, the element conductive portion 50B, the drive conductive portion 60B, and the control conductive portion 70B toward a side of the insulation portion 13 opposite from the case 20B in the Z-direction.

(2-19) The electronic component 100 is covered by the light-blocking resin material (encapsulation resin 140). In this structure, when the light from the semiconductor light emitting element 80 is reflected and emitted toward the electronic component 100 by the light diffusion plate 130 and the like, the encapsulation resin 140 hinders the reflected light from reaching the electronic component 100. Thus, erroneous actuation of the electronic component 100 is limited.

(2-20) The conductive bonding material P2, which is an Ag paste connecting the electronic component 100 to the common conductive portion 30B, contains a large amount of Ag. This improves the efficiency of heat dissipation from the electronic component 100 to the common conductive portion 30B. However, the sulfidation resistance of the conductive bonding material P2 is decreased. In this regard, in the present embodiment, the encapsulation resin 140 is covered by the coating agent 141, which inhibits sulfidation. This structure inhibits sulfidation of the conductive bonding material P2, the second drive electrode 103, the control electrode 102, and the first drive electrode 101. Thus, the sulfidation resistance of the conductive bonding material P2, the second drive electrode 103, the control electrode 102, and the first drive electrode 101 is improved.

(2-21) The semiconductor light emitting device 1B includes the capacitor 120. This structure eliminates the need for arranging the capacitor 120 outside the semiconductor light emitting device 1B or reduces the number of capacitors 120 arranged outside the semiconductor light emitting device 1B, thereby saving the space in the electronic apparatus 2B.

(2-22) The semiconductor light emitting element 80 is located closer to the third side wall 21c than the electronic component 100 in the X-direction. The capacitor 120 is disposed at a side of the semiconductor light emitting element 80 toward the fourth side wall 21d in the X-direction. The electronic component 100 is disposed on the central part of the substrate 10B in the X-direction. The capacitor 120 is located closer to the first side wall 21a than the electronic component 100 in the Y-direction. This structure ensures the space for the capacitor 120 in the accommodation space 23 defined by the case 20B and the substrate 10B without immoderate extension of one of the wires W2 and W3 relative to the other wires W2 and W3.

(2-23) The cover 22 of the case 20B formed from a light-blocking material includes the opening 22a in the part facing the semiconductor light emitting element 80 in the Z-direction. The light diffusion plate 130 is attached to the cover 22 so as to cover the opening 22a. In this structure, excluding the part of the cover 22 facing the semiconductor light emitting element 80 in the Z-direction, the cover 22 is shielded from light, so that irradiation of the electronic component 100 with light is limited. Thus, erroneous actuation of the electronic component 100 caused by light irradiation is limited.

(2-24) The common conductive portion 30B includes the projections 34a to 34f. This structure increases the volume of the common conductive portion 30B, thereby improving the heat dissipation efficiency of the semiconductor light emitting element 80 and the electronic component 100.

(2-25) The element conductive portion 50B includes the projections 54a to 54c. This structure increases the volume of the element conductive portion 50B, thereby improving the heat dissipation efficiency of the semiconductor light emitting device 1B. The drive conductive portion 60B includes the projections 64a to 64c. This structure increases the volume of the drive conductive portion 60B, thereby improving the heat dissipation efficiency of the semiconductor light emitting device 1B. The control conductive portion 70B includes the projections 74a and 74b. This structure increases the volume of the control conductive portion 70B, thereby improving the heat dissipation efficiency of the semiconductor light emitting device 1B.

(2-26) The height TM of the electronic component 100 from the substrate front surface 11 is less than the height TV of the semiconductor light emitting element 80 from the substrate front surface 11. In this structure, when light from the semiconductor light emitting element 80 is reflected by the light diffusion plate 130 or the like, irradiation of the electronic component 100 with the light is limited. Thus, erroneous actuation of the electronic component 100 cause by irradiation of the electronic component 100 with light is limited.

Modified Examples

The embodiments exemplify, without any intention to limit, applicable forms of a semiconductor light emitting device according to the present disclosure. The semiconductor light emitting device according to the present disclosure may be applicable to forms differing from the above embodiments. In an example of such a form, a portion of the configurations of the above embodiments is replaced, changed, or omitted, or a further configuration is added to the above embodiments. The modified examples described below may be combined with one another as long as there is no technical inconsistency. In the following modified examples, the same reference characters are given to those parts that are the same as the corresponding parts of the above embodiments. Such parts will not be described in detail.

In the first embodiment, as shown in FIGS. 39 to 42, the substrate 10 may be formed of a conductive material such as Cu. In this form, the substrate 10 includes insulation portions 150 that separate the substrate 10 into the conductive portions 30, 50, 60, and 70. The insulation portions 150 are formed from an insulative material such as an epoxy resin. The insulation portions 150 have steps having, for example, a wide part and a narrow part. The conductive portions 30, 50, 60, and 70 are portions of the substrate 10 insulated and separated from each other by the insulation portions 150.

Figure 40:
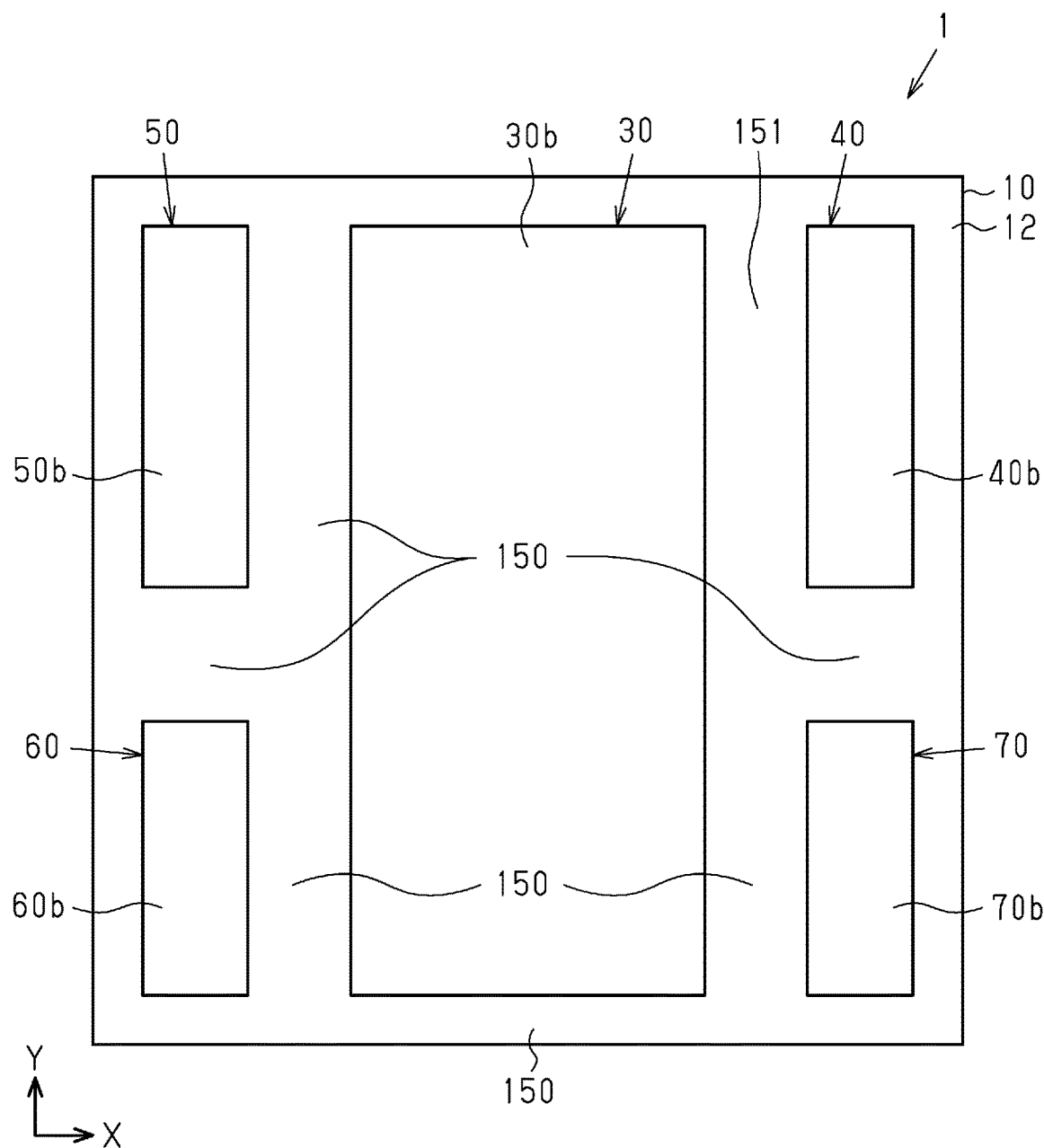
FIG. 40 is a bottom view showing the semiconductor light emitting device in the modified example.
Figure 41:
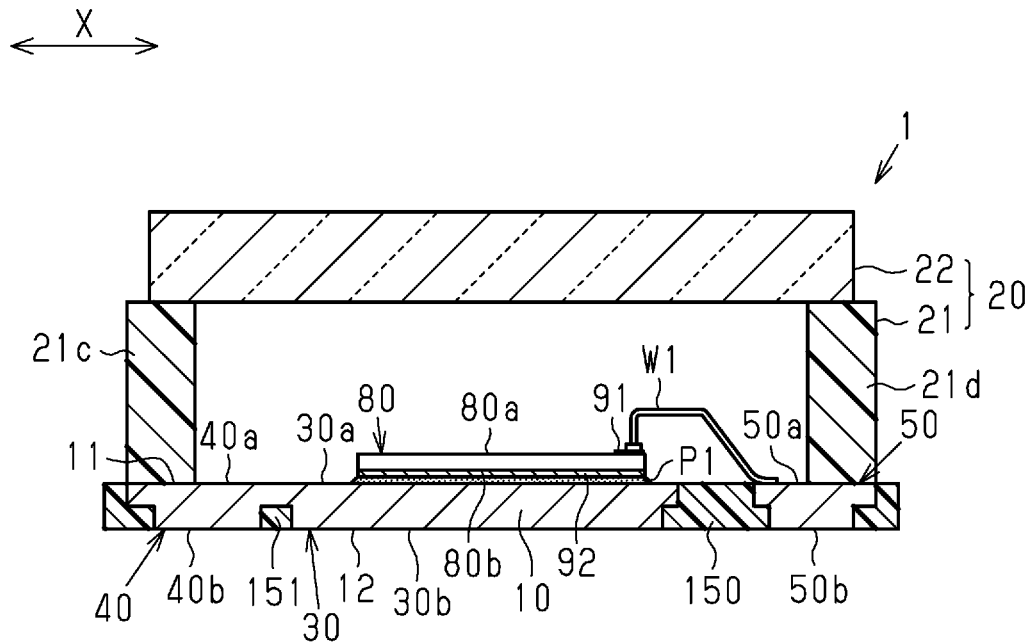
FIG. 41 is a cross-sectional view showing the semiconductor light emitting device in the modified example.
Figure 42:
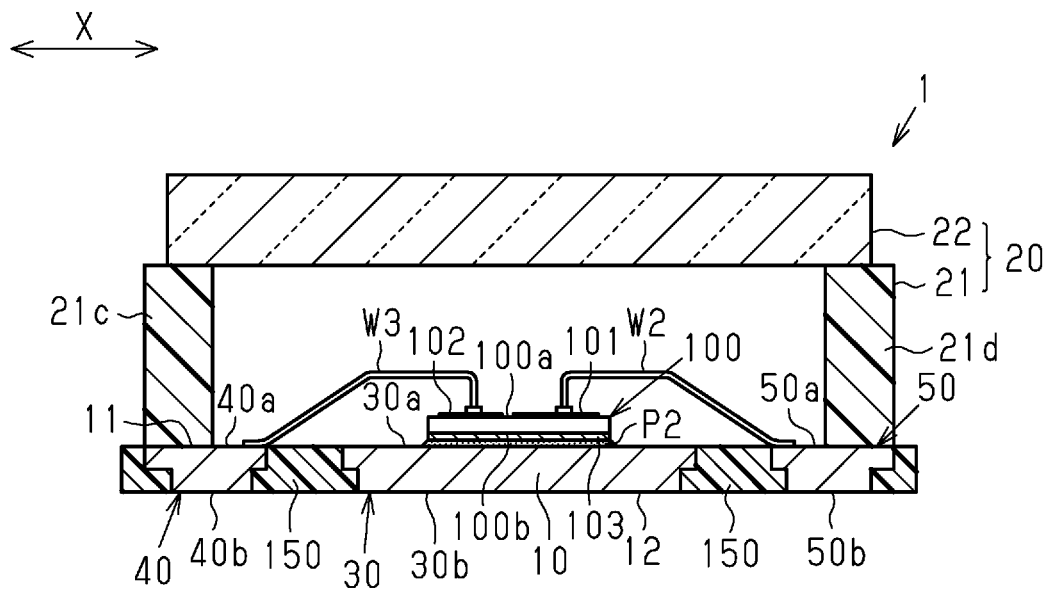
FIG. 42 is a cross-sectional view showing the semiconductor light emitting device in the modified example.

The connection conductive portion 40 is electrically connected to the common conductive portion 30 and is insulated from the other conductive portions 50, 60, and 70. More specifically, the insulation portion 150 is disposed between the connection conductive portion 40 and the other conductive portions 50, 60, and 70 and extends through the substrate 10 in the thickness-wise direction. In addition, as shown in FIGS. 40 and 41, a half insulation portion 151 that does not extend through the substrate 10 in the thickness-wise direction is disposed between the common conductive portion 30 and the connection conductive portion 40. The half insulation portion 151 is formed in the substrate back surface 12 and is not formed in the substrate front surface 11. This allows the common conductive portion 30 to be electrically connected to the connection conductive portion 40.

As described above, in a form in which the conductive portions 30, 40, 50, 60, and 70 are formed by portions of the substrate 10, the common contact front surface 30a, the connection contact front surface 40a, the element contact front surface 50a, the drive contact front surface 60a, and the control contact front surface 70a are formed in the substrate front surface 11. The common contact front surface 30a, the element contact front surface 50a, the drive contact front surface 60a, and the control contact front surface 70a are separated from each other by the insulation portions 150. The connection contact front surface 40a is separated from the element contact front surface 50a, the drive contact front surface 60a, and the control contact front surface 70a. However, since the half insulation portion 151 is not formed in the substrate front surface 11, the connection contact front surface 40a is continuous with the common contact front surface 30a.

In the same manner, the common contact back surface 30b, the connection contact back surface 40b, the element contact back surface 50b, the drive contact back surface 60b, and the control contact back surface 70b are formed in the substrate back surface 12. The common contact back surface 30b, the element contact back surface 50b, the drive contact back surface 60b, and the control contact back surface 70b are separated from each other by the insulation portions 150. The common contact back surface 30b, the connection contact back surface 40b, the element contact back surface 50b, the drive contact back surface 60b, and the control contact back surface 70b are separated from each other by the insulation portions 150 and the half insulation portion 151.

In the modified example of the first embodiment shown in FIGS. 39 to 42, the conductive portions 30, 40, 50, 60, and 70 may include projections and recesses in the same manner as the conductive portions 30B, 50B, 60B, and 70B of the second embodiment.

Figure 43:
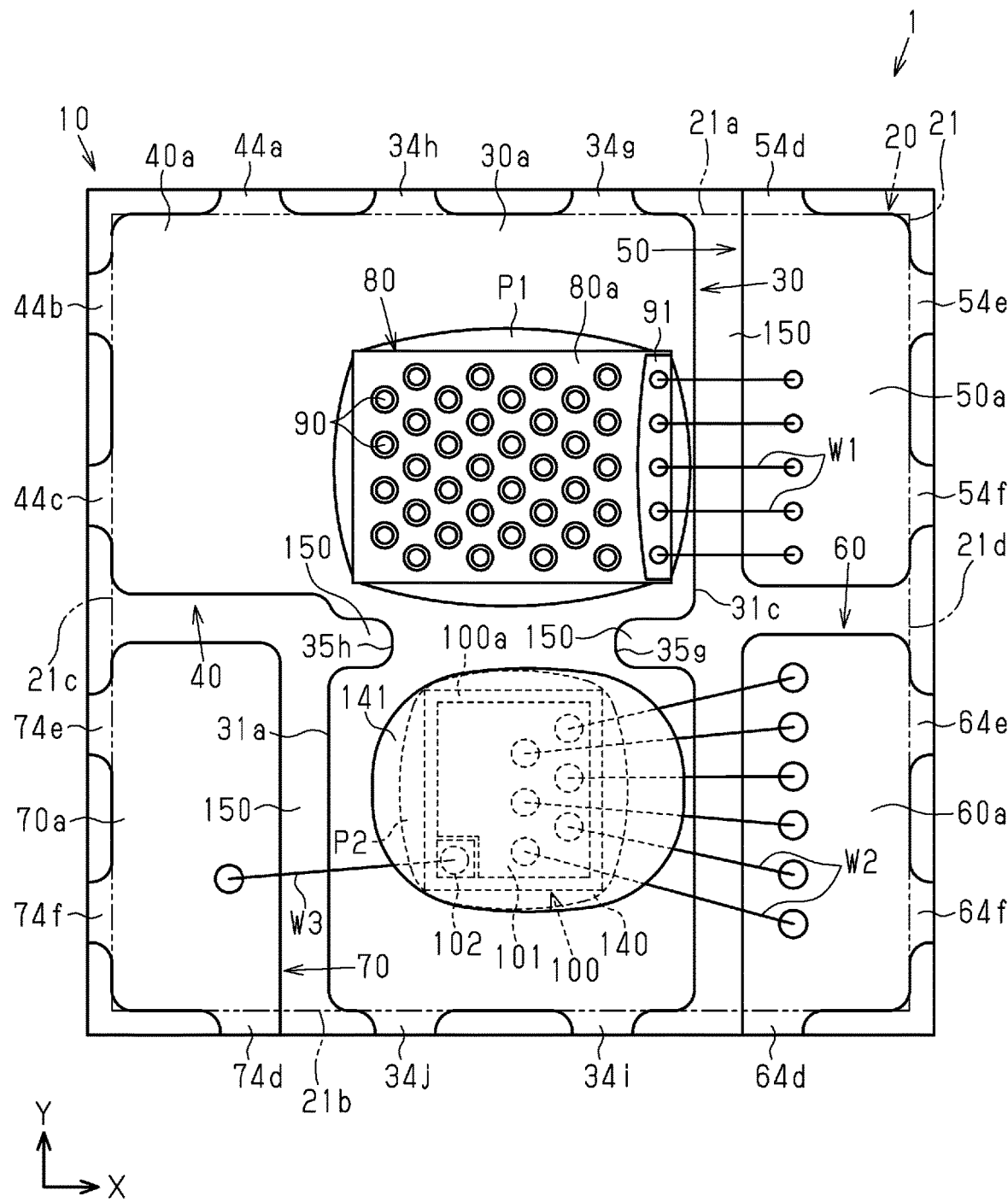
FIG. 43 is a front view showing a semiconductor light emitting device in a modified example.

FIG. 43 shows an example of a structure of the conductive portions 30, 40, 50, 60, and 70 that include projections and recesses. In FIG. 43, for the sake of convenience, the outer surface of the frame 21 of the case 20 is indicated by double-dashed lines.

As shown in FIG. 43, the projections 34g to 34j are formed on the common contact front surface 30a of the common conductive portion 30. The projections 34g and 34h are formed on an end of the common contact front surface 30a located toward the first side wall 21a. The projections 34g and 34h are separate from each other in the X-direction. The projection 34g is located closer to the element conductive portion 50 than the projection 34h. The projections 34g and 34h project from the outer surface of the first side wall 21a as viewed in the Z-direction. The projections 34i and 34j are formed on an end of the common contact front surface 30a located toward the second side wall 21b. The projections 34i and 34j are separate from each other in the X-direction. The projection 34i is located closer to the drive conductive portion 60 than the projection 34j. The projections 34i and 34j project from the outer surface of the second side wall 21b as viewed in the Z-direction. When a support lead supporting the common conductive portion 30 is cut, residual portions of the lead frame are the projections 34g to 34j. The number of projections may be changed to any number. As viewed in the Z-direction, connection portions between the common contact front surface 30a and the projections 34g to 34j each have a curved surface.

In addition, the common contact front surface 30a includes recesses 35g and 35h. In the Y-direction, the recesses 35g and 35h are formed between the semiconductor light emitting element 80 and the electronic component 100. The recess 35g is formed in an end of the common contact front surface 30a located toward the fourth side wall 21d. The recess 35h is formed in an end of the common contact front surface 30a located toward the third side wall 21c. The recess 35g is recessed toward the third side wall 21c from the end 31c of the common contact front surface 30a located toward the fourth side wall 21d in the X-direction. The bottom of the recess 35g is defined by a curved surface. In the illustrated example, in plan view, the recess 35g partially extends in the X-direction with a fixed width and has a curved surface that reduces the width toward the bottom. The recess 35h is recessed toward the fourth side wall 21d from the end 31a of the common contact front surface 30a located toward the third side wall 21c in the X-direction. In the illustrated example, the shape of the recess 35h in plan view is symmetric to the shape of the recess 35g in plan view. The recesses 35g and 35h accommodate the insulation portions 150.

The connection contact front surface 40a of the connection conductive portion 40 includes projections 44a to 44c. The projection 44a is formed in an end of the connection contact front surface 40a located toward the first side wall 21a. The projections 44b and 44c are formed in an end of the connection contact front surface 40a located toward the third side wall 21c. The projections 44b and 44c are separate from each other in the Y-direction. The projection 44b is located closer to the first side wall 21a than the projection 44c. The projection 44*a* projects from the outer surface of the first side wall 21*a* as viewed in the Z-direction. The projections 44*b* and 44*c* project from the outer surface of the third side wall 21*c* as viewed in the Z-direction. When a support lead supporting the connection conductive portion 40 is cut, residual portions of the lead frame are the projections 44*a* to 44*c*. The number of projections may be changed to any number. As viewed in the Z-direction, connection portions between the connection contact front surface 40*a* and the projections 44*a* to 44*c* each have a curved surface.

The element contact front surface 50*a* of the element conductive portion 50 includes projections 54*d* to 54*f.* The projection 54*d* is formed in an end of the element contact front surface 50*a* located toward the first side wall 21*a*. The projections 54*e* and 54*f* are formed in an end of the element contact front surface 50*a* located toward the fourth side wall 21*d*. The projections 54*e* and 54*f* are separate from each other in the Y-direction. The projection 54*e* is located closer to the first side wall 21*a* than the projection 54*f.* The projection 54*d* projects from the outer surface of the first side wall 21*a* as viewed in the Z-direction. As viewed in the Z-direction, the projections 54*e* and 54*f* project from the outer surface of the fourth side wall 21*d*. When a support lead supporting the element conductive portion 50 is cut, residual portions of the lead frame are the projections 54*d* to 54*f.* The number of projections may be changed to any number. As viewed in the Z-direction, connection portions between the element contact front surface 50*a* and the projections 54*d* to 54*f* each have a curved surface.

The drive contact front surface 60*a* of the drive conductive portion 60 includes projections 64*d* to 64*f.* The projection 64*d* is formed in an end of the drive contact front surface 60*a* located toward the second side wall 21*b*. The projections 64*e* and 64*f* are formed in an end of the drive contact front surface 60*a* located toward the fourth side wall 21*d*. The projections 64*e* and 64*f* are separate from each other in the Y-direction. The projection 64*e* is located closer to the first side wall 21*a* than the projection 64*f.* As viewed in the Z-direction, the projection 64*d* projects from the outer surface of the second side wall 21*b*. As viewed in the Z-direction, the projections 64*e* and 64*f* project from the outer surface of the fourth side wall 21*d*. When a supporting lead supporting the drive conductive portion 60 is cut, residual portions of the lead frame are the projections 64*d* to 64*f.* The number of projections may be changed to any number. As viewed in the Z-direction, connection portions between the drive contact front surface 60*a* and the projections 64*d* to 64*f* each have a curved surface.

The control contact front surface 70*a* of the control conductive portion 70 includes projections 74*d* to 74*f.* The projection 74*d* is formed on an end of the control contact front surface 70*a* located toward the second side wall 21*b*. The projections 74*e* and 74*f* are formed on an end of the control contact front surface 70*a* located toward the third side wall 21*c*. The projections 74*e* and 74*f* are separate from each other in the Y-direction. The projection 74*e* is located closer to the first side wall 21*a* than the projection 74*f.* As viewed in the Z-direction, the projection 74*d* projects from the outer surface of the second side wall 21*b*. The projections 74*e* and 74*f* project from the outer surface of the third side wall 21*c* as viewed in the Z-direction. When a support lead supporting the control conductive portion 70 is cut, residual portions of the lead frame are the projections 74*d* to 74*f.* The number of projections may be changed to any number. As viewed in the Z-direction, connection portions between the control contact front surface 70*a* and the projections 74*d* to 74*f* each have a curved surface. When the projections and the recesses are arranged as described above, the structure of the conductive portions of the substrate back surface 12 is the same as the structure of the conductive portions shown in FIG. 40.

The structure described above increases the volume of each of the conductive portions 30, 40, 50, 60, and 70, thereby improving the heat dissipation efficiency of the semiconductor light emitting device 1.

The common conductive portion 30 includes the recesses 35*g* and 35*h*. The recesses 35*g* and 35*h* accommodate the insulation portions 150. This /resists/is resistant to/hinders/ separation of the insulation portions 150 from the common conductive portion 30. In addition, the common contact front surface 30*a* includes the recesses 35*g* and 35*h*. The recesses 35*g* and 35*h* accommodate the insulation portions 150 that do not extend through the Z-direction. This structure restricts movement of the common conductive portion 30 toward the case 20 from the insulation portions 150 in the Z-direction.

In the semiconductor light emitting device 1 shown in FIG. 43, the connection conductive portion 40, the element conductive portion 50, the drive conductive portion 60, and the control conductive portion 70 do not include a recess. However, at least one of the connection conductive portion 40, the element conductive portion 50, the drive conductive portion 60, and the control conductive portion 70 may include a recess. The recess has the same structure as the recesses 35*g* and 35*h* of the common conductive portion 30. Although not illustrated, at least one of the conductive portions 30, 40, 50, 60, and 70 may include a flange in the same manner as the flanges 36, 56, 66, and 76 of the conductive portions 30B, 50B, 60B, and 70B in the second embodiment.

Figure 44:
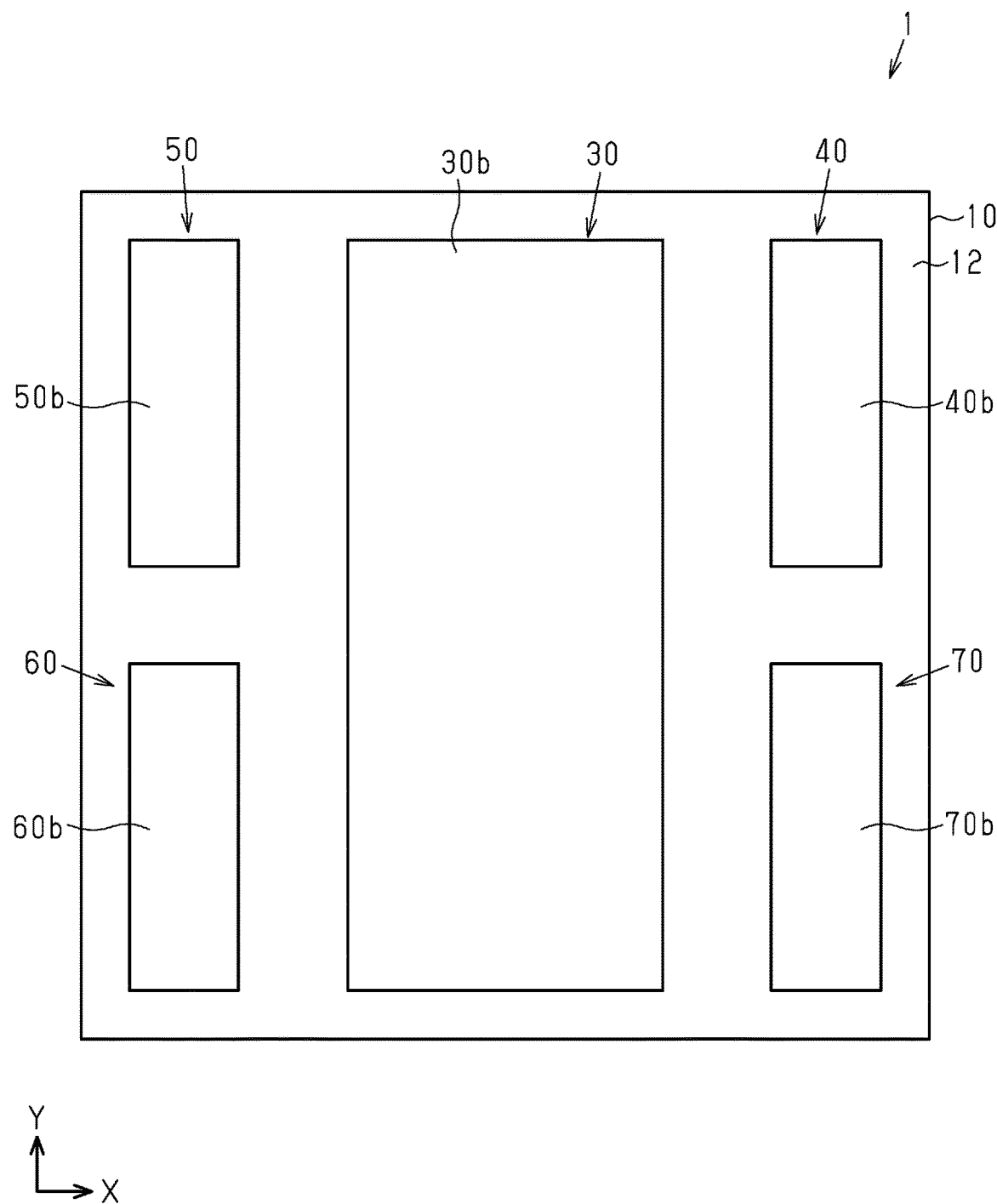
FIG. 44 is a bottom view showing the semiconductor light emitting device in a modified example.

In the first embodiment, the size of each of the connection contact back surface 40*b*, the element contact back surface 50*b*, the drive contact back surface 60*b*, and the control contact back surface 70*b* may be changed in any manner. In an example, as shown in FIG. 44, the area of the connection contact back surface 40*b* may be equal to the area of the control contact back surface 70*b*. The area of the element contact back surface 50*b* may be equal to the area of the drive contact back surface 60*b*.

Figure 45:
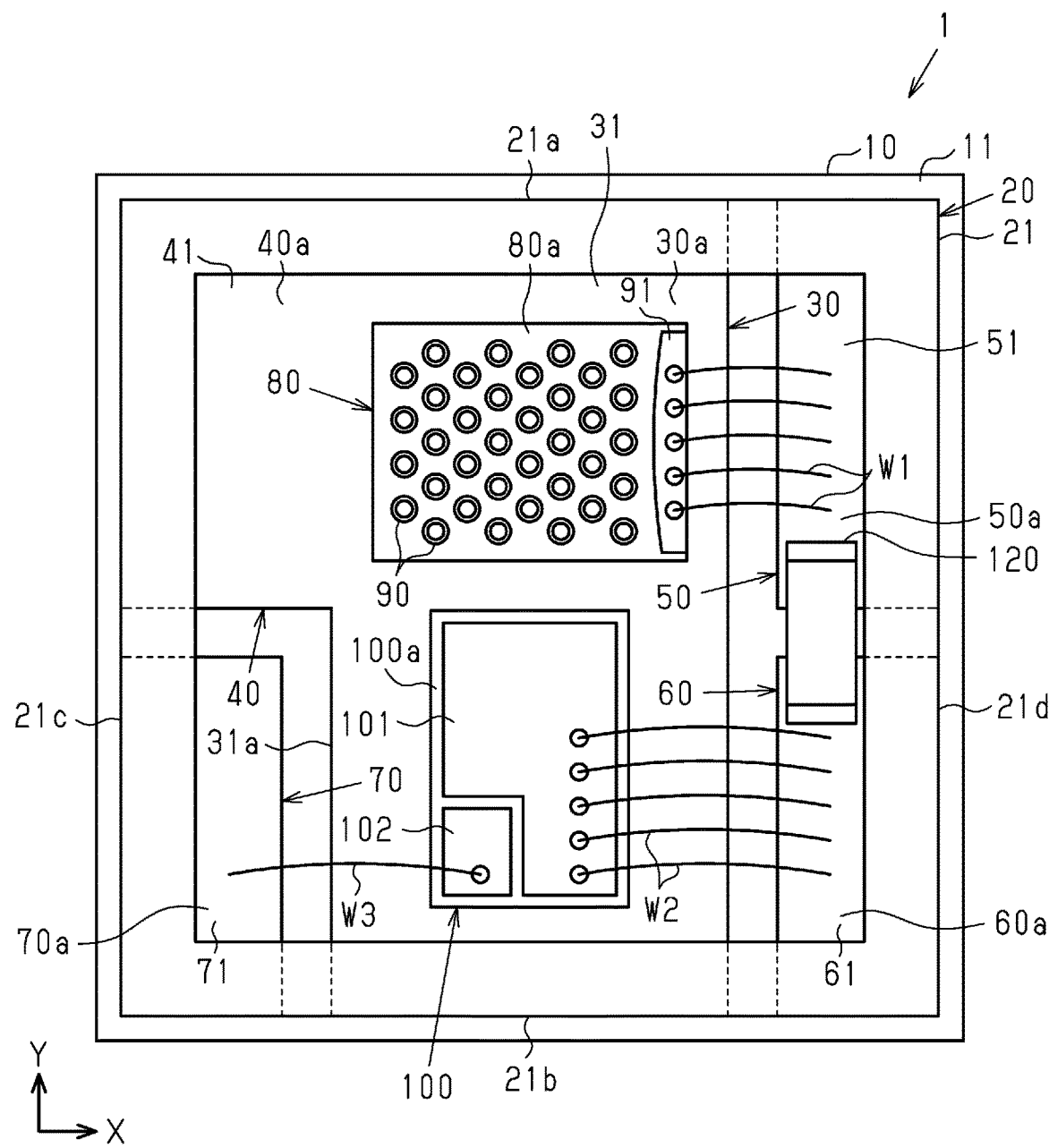
FIG. 45 is a front view showing a semiconductor light emitting device in a modified example.

In the first embodiment, as shown in FIG. 45, the capacitor 120 may be disposed in the case 20. The capacitor 120 is disposed so as to span between the element contact front surface 50*a* and the drive contact front surface 60*a*. This structure allows for further reduction in the space.

In the first embodiment, the semiconductor light emitting element 80 and the electronic component 100 are disposed in the central part in the X-direction. However, the semiconductor light emitting element 80 and the electronic component 100 may be disposed at one side in the X-direction. For example, the semiconductor light emitting element 80 and the electronic component 100 may be located toward the third side wall 21*c* from the central part. This structure allows for increase in the space for the capacitor 120.

In each embodiment, the electronic component 100 is not limited to a MOSFET and may be another switching element, such as a bipolar transistor. For example, when the electronic component 100 is a bipolar transistor, one of the first drive electrode 101 and the second drive electrode 103 corresponds to a collector electrode, the other one of the first drive electrode 101 and the second drive electrode 103 corresponds to an emitter electrode, and the control electrode 102 corresponds to a base electrode.

Alternatively, the electronic component 100 may be an integrated circuit (IC) instead of a switching element. Further, the electronic component 100 is not limited to an active element such as a switching element and may be a passive element such as a capacitor. The electronic component 100 does not have to be used to drive the semiconductor light emitting element 80.

In each element, the arrangement direction of the semiconductor light emitting element 80 and the electronic component 100 may be changed in any manner. For example, the semiconductor light emitting element 80 and the electronic component 100 may be arranged in the X-direction or in a direction that intersects the X-direction and the Y-direction. The common contact front surface 30*a* only needs to extend in the arrangement direction of the semiconductor light emitting element 80 and the electronic component 100 so that the semiconductor light emitting element 80 and the electronic component 100 are disposed on the common contact front surface 30*a*.

In the first embodiment, the layout of the conductive portions 30, 40, 50, 60, and 70 may be changed in any manner. For example, the drive conductive portion 60 and the control conductive portion 70 may be located at the same side of the common contact front surface 30*a* in the X-direction. At least one of the drive conductive portion 60 and the control conductive portion 70 may be separated from the common contact front surface 30*a* in the Y-direction. The same applies to the connection conductive portion 40 and the element conductive portion 50. The control conductive portion 70 and the element conductive portion 50 may be located at the same side.

In the second embodiment, the layout of the conductive portions 30B, 50B, 60B, and 70B may be changed in any manner. For example, the drive conductive portion 60B and the control conductive portion 70B may be located at the same side of the common contact front surface 30*a* in the X-direction. In this case, the first common contact front surface portion 30*c* may be aligned with the second common contact front surface portion 30*d* in the X-direction. At least one of the drive conductive portion 60B and the control conductive portion 70 may be separated from the common contact front surface 30*a* in the Y-direction. The same applies to the element conductive portion 50B. The control conductive portion 70B and the element conductive portion 50B may be located at the same side.

In the first embodiment, the shape of the contact front surfaces 30*a*, 40*a*, 50*a*, 60*a*, and 70*a* may be changed in any manner. For example, the contact front surfaces 30*a*, 40*a*, 50*a*, 60*a*, and 70*a* may have the same size or different sizes. At least one of the contact front surfaces 30*a*, 40*a*, 50*a*, 60*a*, and 70*a* may be elliptical or circular.

Figure 46:
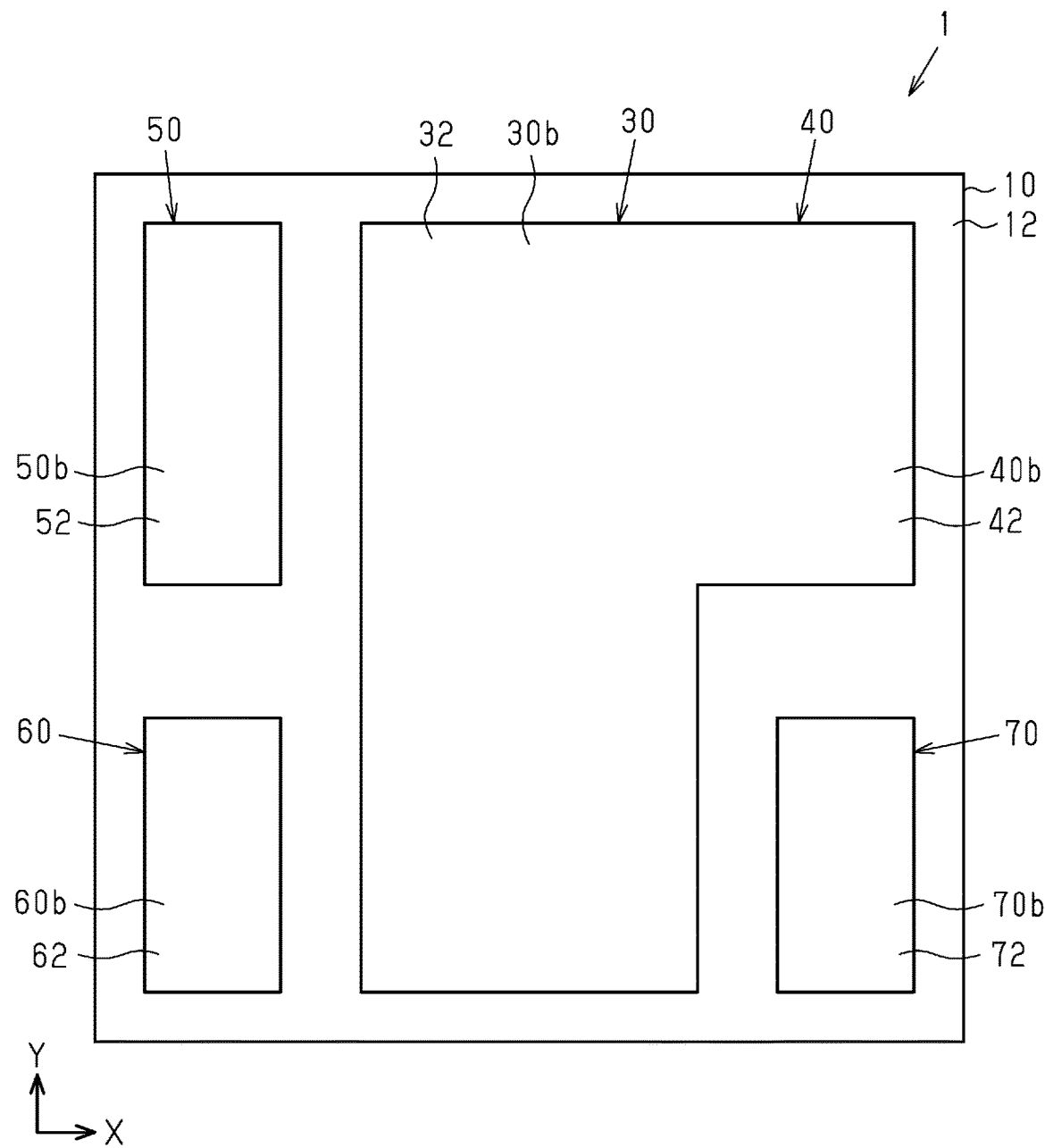
FIG. 46 is a bottom view showing the semiconductor light emitting device in a modified example.

In the first embodiment, as shown in FIG. 46, the common back surface conductive layer 32 may be continuous with the connection back surface conductive layer 42, and the common contact back surface 30*b* may be continuous with the connection contact back surface 40*b*.

In the first embodiment, the shape of the contact back surfaces 30*b*, 40*b*, 50*b*, 60*b*, and 70*b* may be changed in any manner. For example, the common contact back surface 30*b* may be smaller than one of the connection contact back surface 40*b* and the element contact back surface 50*b*. The drive contact back surface 60*b* and the control contact back surface 70*b* may be larger than the connection contact back surface 40*b* and the element contact back surface 50*b*. The contact back surfaces 30*b*, 40*b*, 50*b*, 60*b*, and 70*b* may have the same size or different sizes. At least one of the contact back surfaces 30*b*, 40*b*, 50*b*, 60*b*, and 70*b* may be elliptical or circular.

In the first embodiment, the connection conductive portion 40 may be omitted. Even in this case, the common contact back surface 30*b* may be used to ensure contact of the semiconductor light emitting device 1 with an external device.

In each embodiment, the common contact back surface 30*b* is not necessary. That is, the common back surface conductive layer 32 may be omitted.

Figure 47:
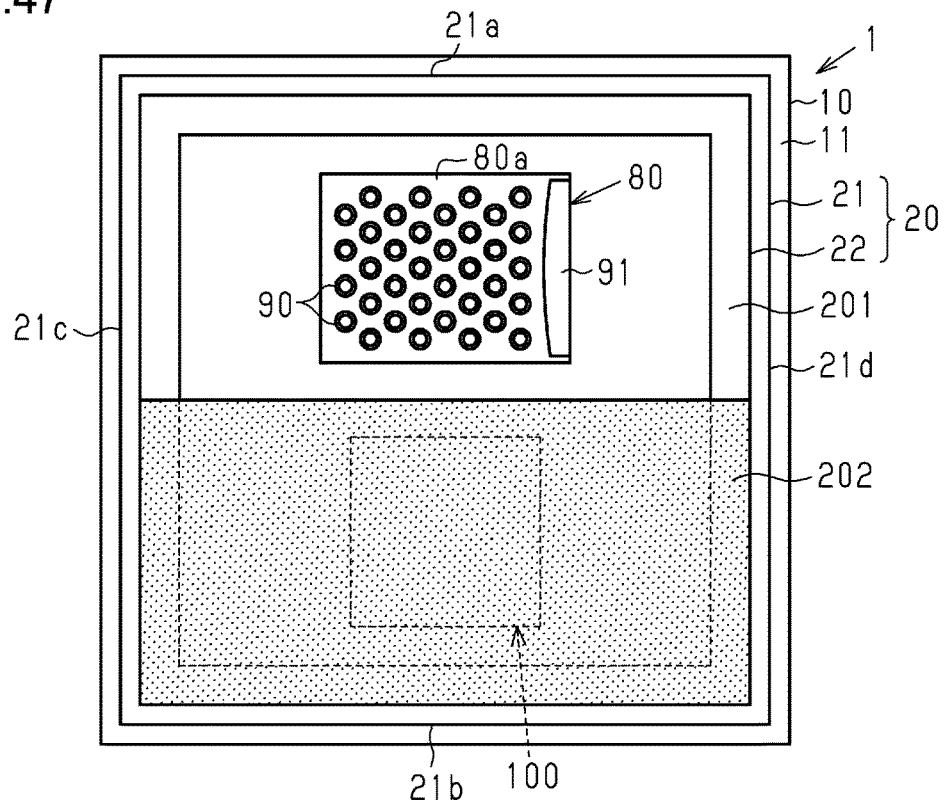
FIG. 47 is a front view showing a semiconductor light emitting device in a modified example.

In the first embodiment, as shown in FIG. 47, the cover 22 may include a transmissive portion 201 and a light-blocking portion 202. The transmissive portion 201 is disposed above the semiconductor light emitting element 80 and is transmissive to light from the semiconductor light emitting element 80. The light-blocking portion 202 is disposed above the electronic component 100 and blocks light. This structure limits irradiation of the electronic component 100 with light, thereby limiting erroneous actuation of the electronic component 100 caused by the light irradiation.

Figure 48:
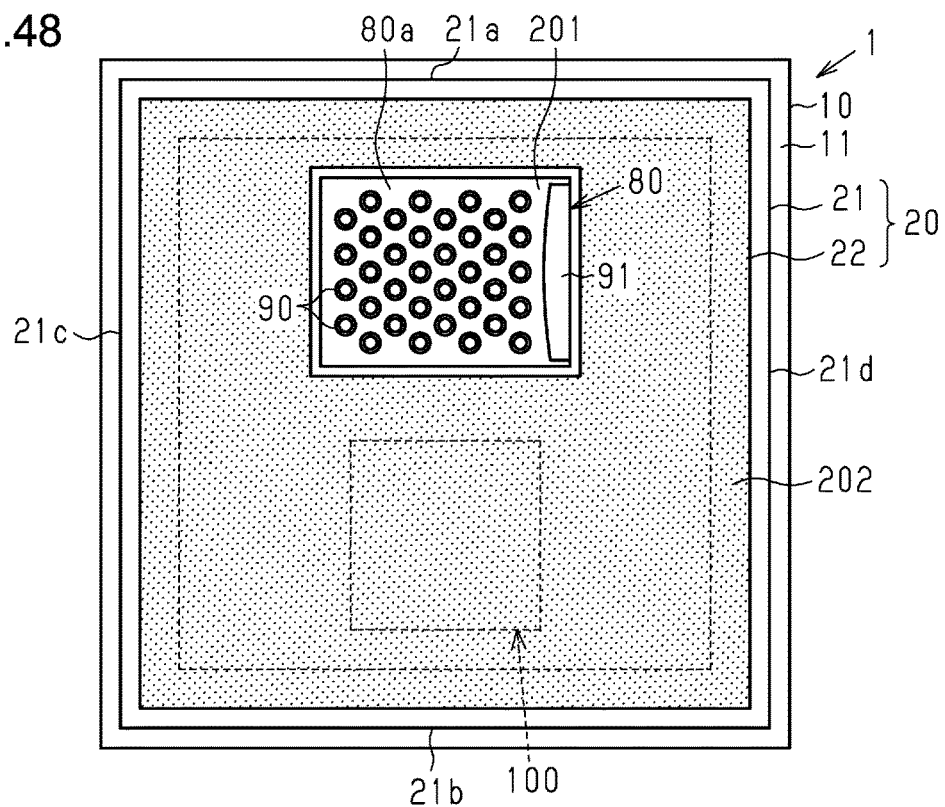
FIG. 48 is a front view showing a semiconductor light emitting device in a modified example.

The transmissive portion 201 and the light-blocking portion 202 may have any shape. For example, as shown in FIG. 48, the transmissive portion 201 may be formed at only a portion overlapping the semiconductor light emitting element 80, and the remaining portion may be the light-blocking portion 202.

In the first embodiment, the cover 22 may diffuse light from the semiconductor light emitting element 80.

In each embodiment, the cover 22 may be omitted, and only the frame 21 may be used.

Figure 49:
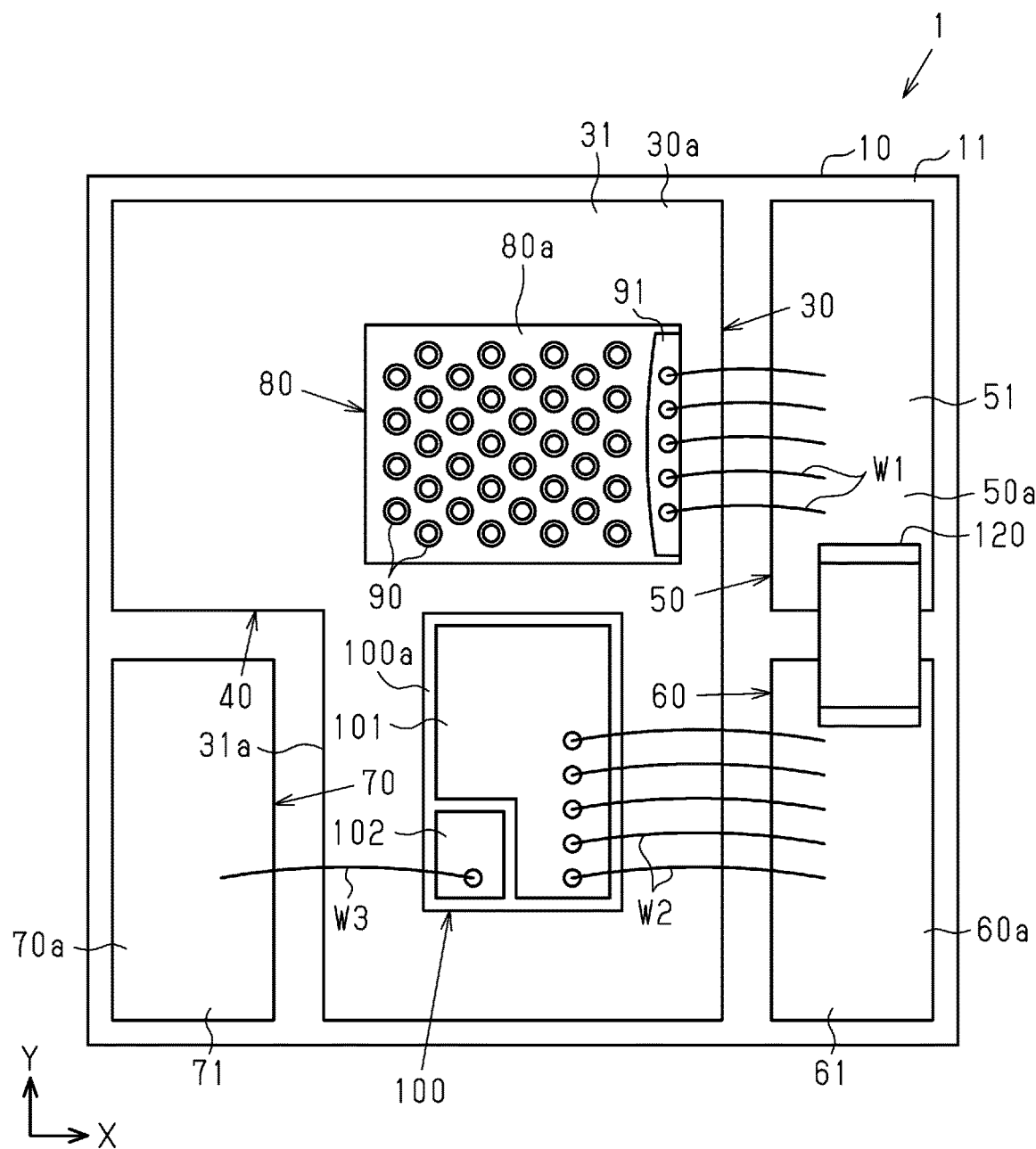
FIG. 49 is a front view showing a semiconductor light emitting device in a modified example.

In the first embodiment, as shown in FIG. 49, the case 20 may be omitted. In this case, the capacitor 120 may be disposed in the space used for the frame 21.

Figure 50:
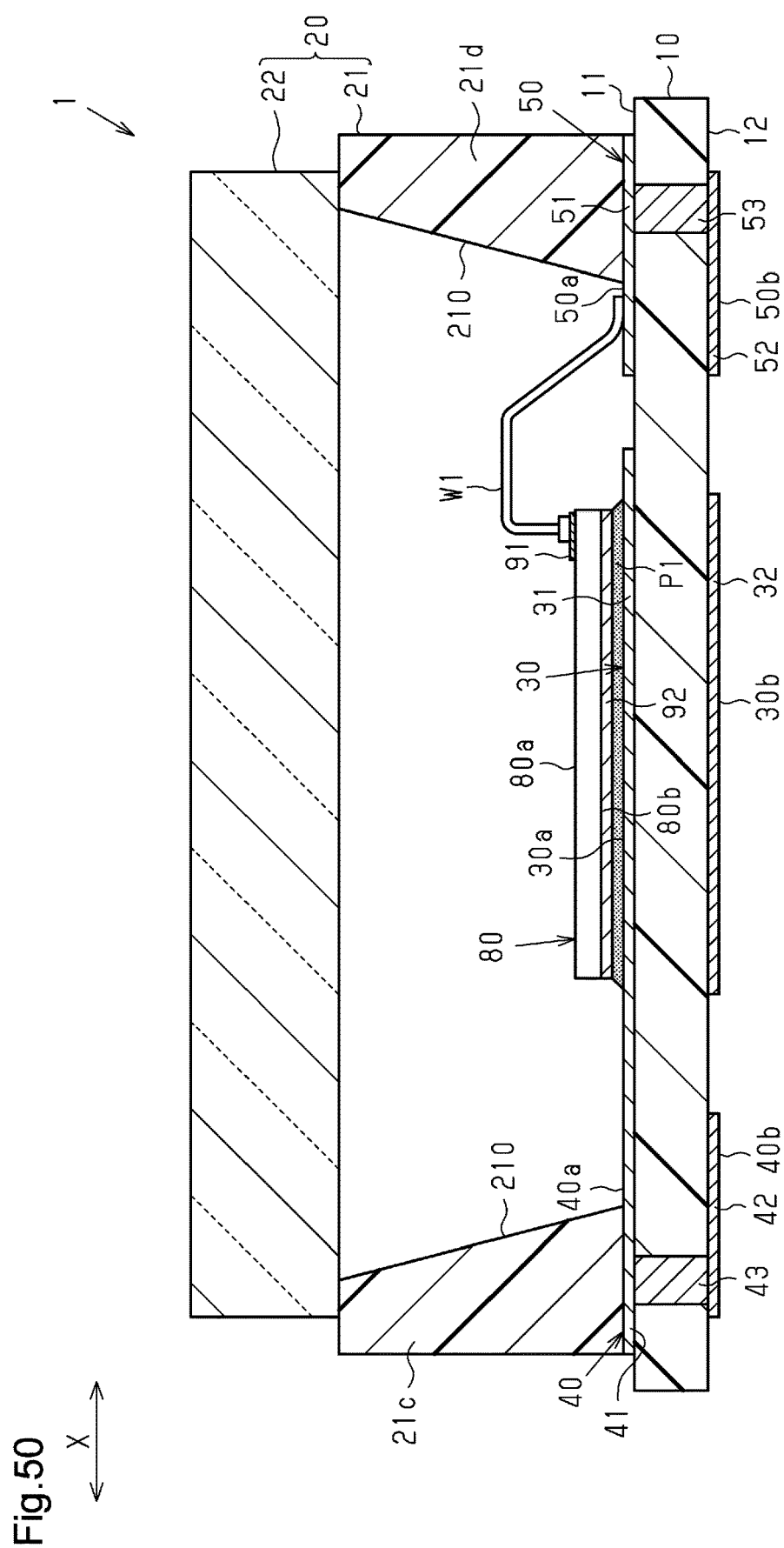
FIG. 50 is a cross-sectional view showing the semiconductor light emitting device in the modified example.

In the first embodiment, as shown in FIG. 50, the frame 21 may include inclined surfaces 210 that are inclined to have an opening that widens upward.

Figure 51:
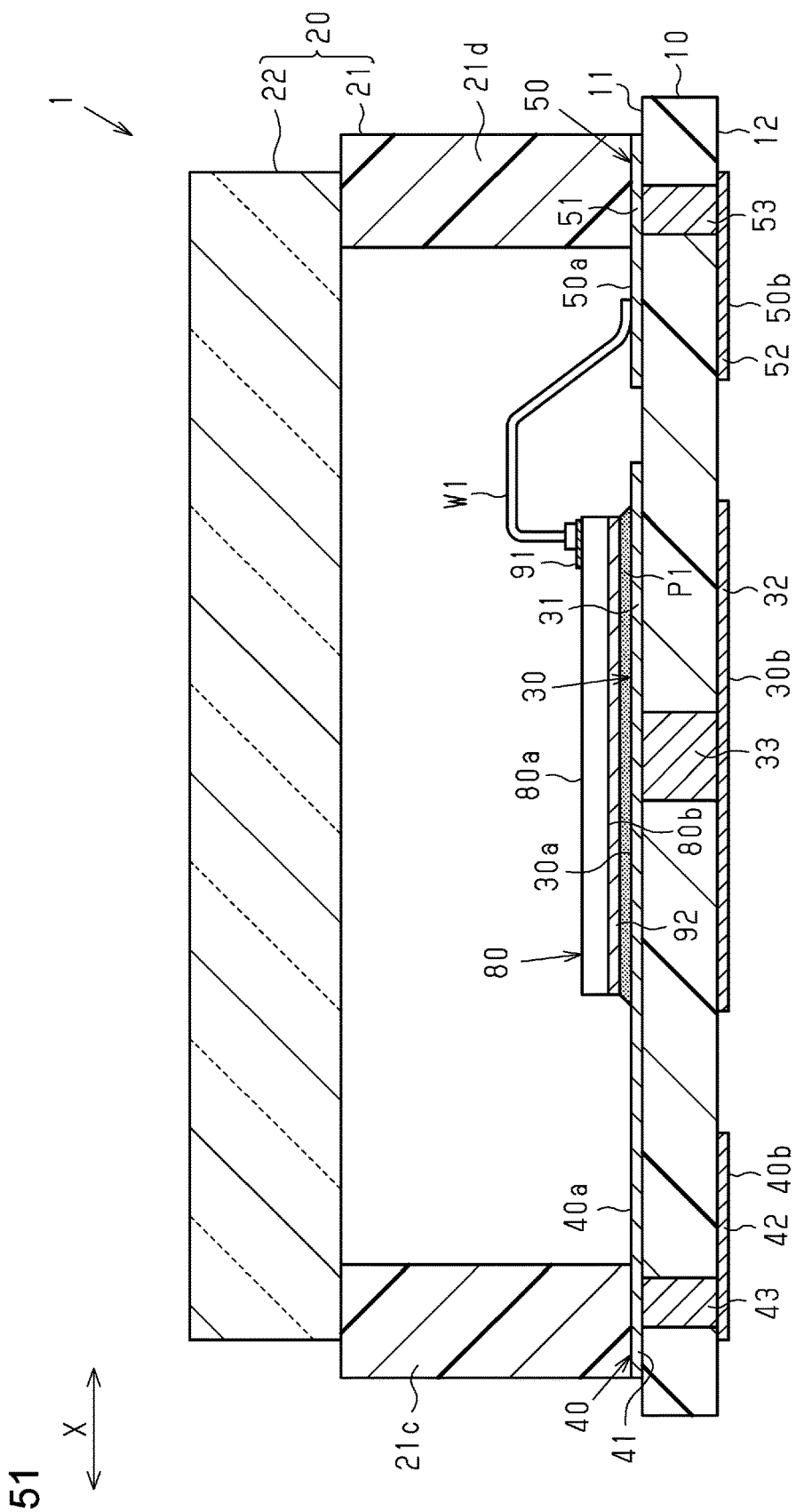
FIG. 51 is a cross-sectional view showing the semiconductor light emitting device in a modified example.
Figure 52:
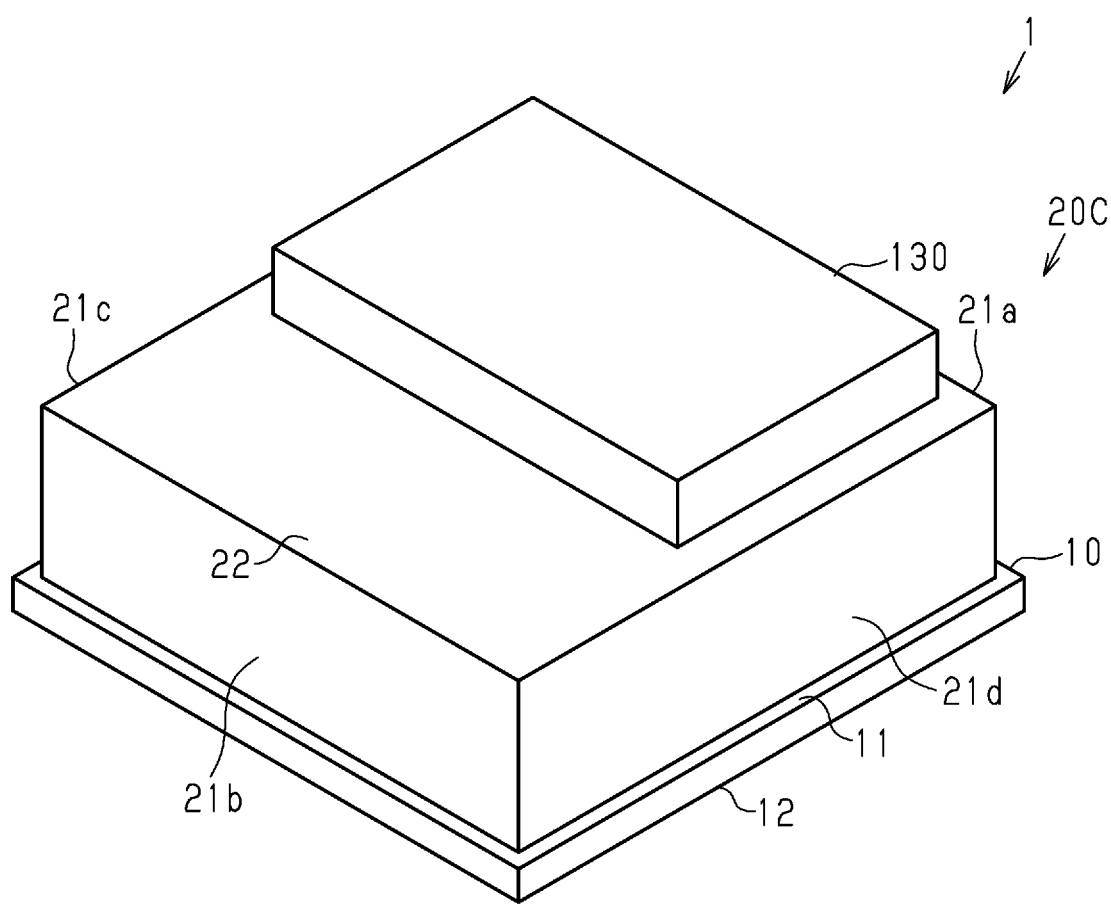
FIG. 52 is a perspective view showing the semiconductor light emitting device in a modified example.

In the first embodiment, as shown in FIG. 51, the common joint 33 may be formed at a position overlapping the semiconductor light emitting element 80. The common joint 33 may be formed at a position overlapping the electronic component 100.

Figure 53:
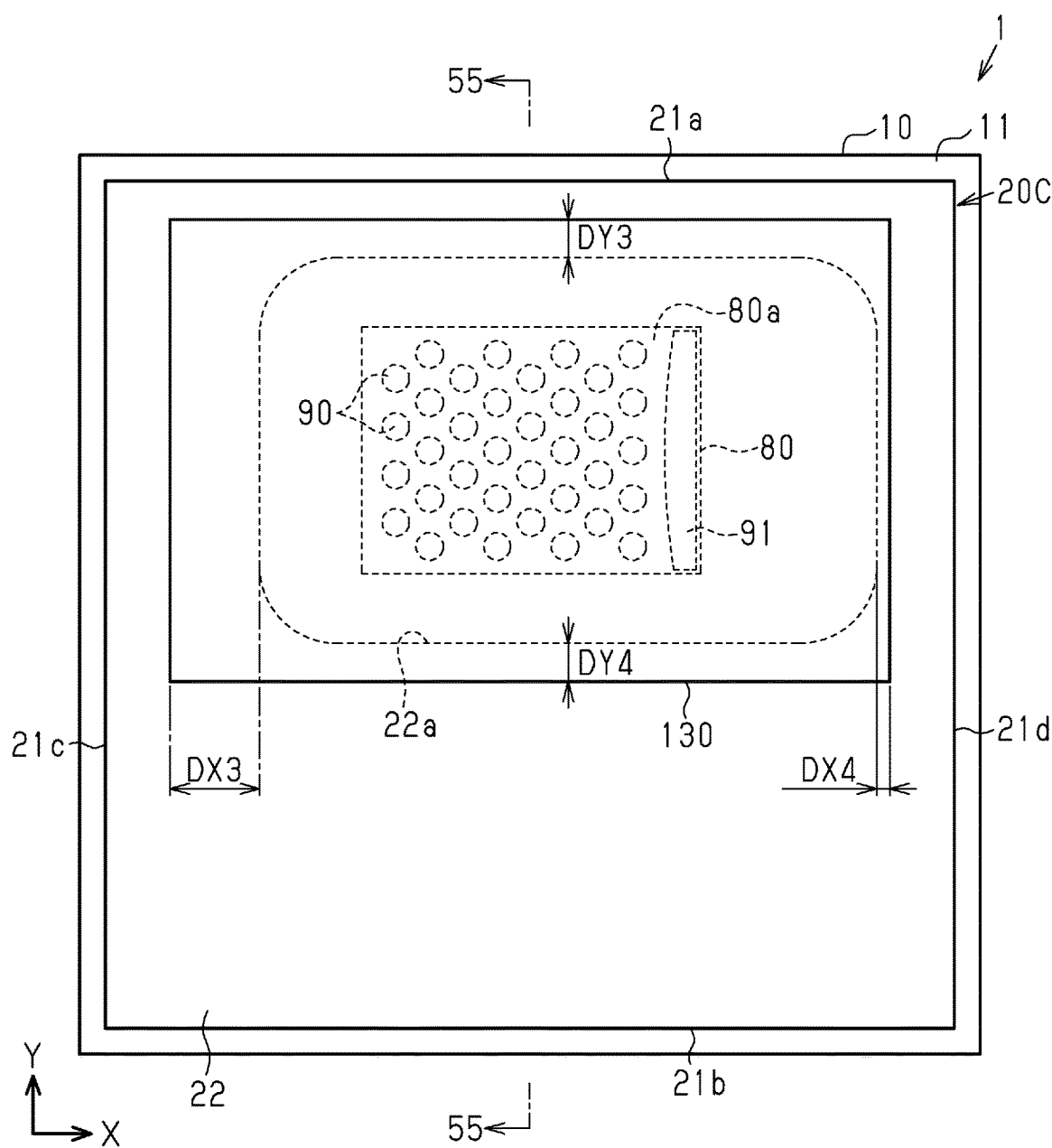
FIG. 53 is a front view showing a semiconductor light emitting device in the modified example.
Figure 54:
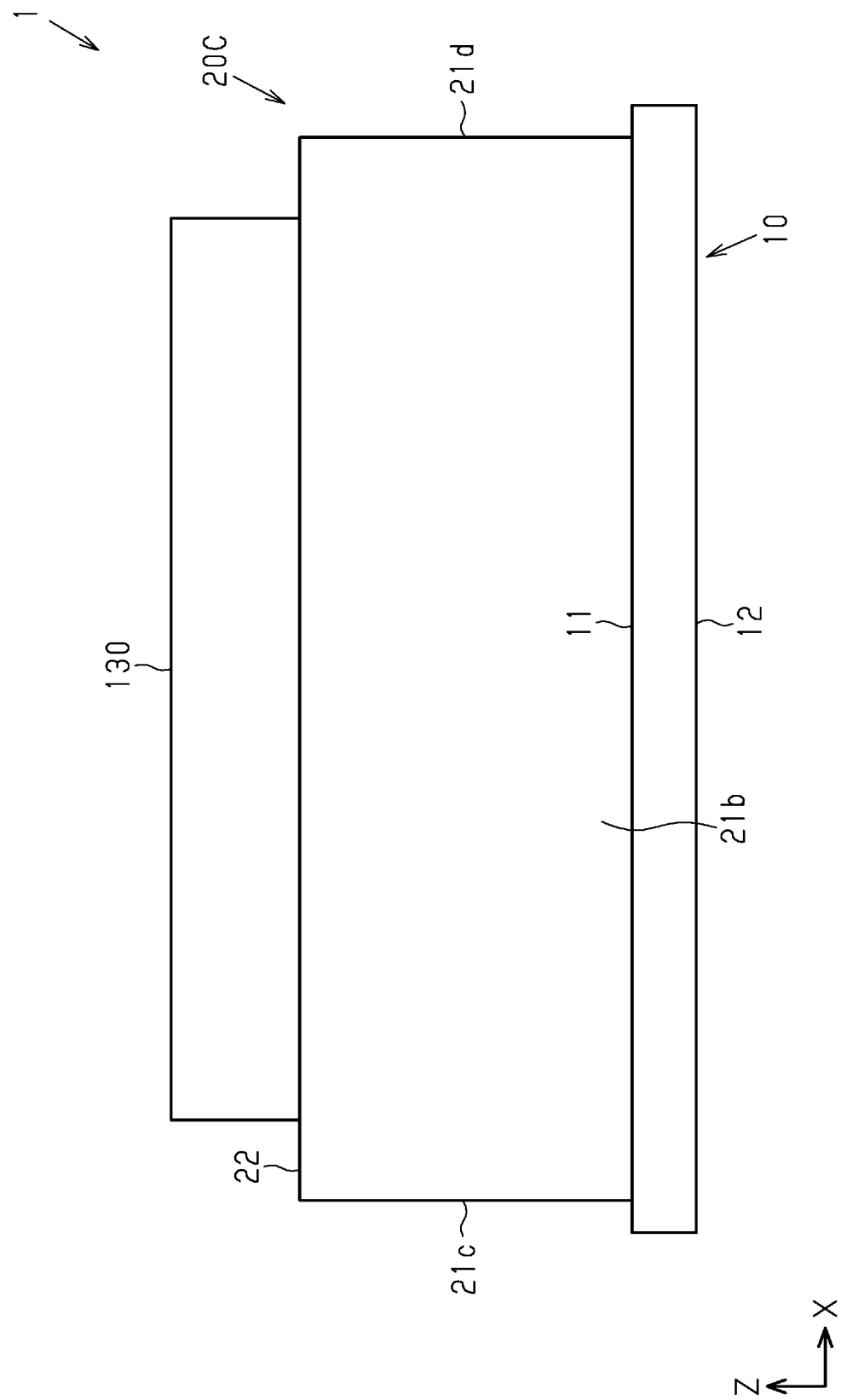
FIG. 54 is a side view showing a semiconductor light emitting device in the modified example.
Figure 56:
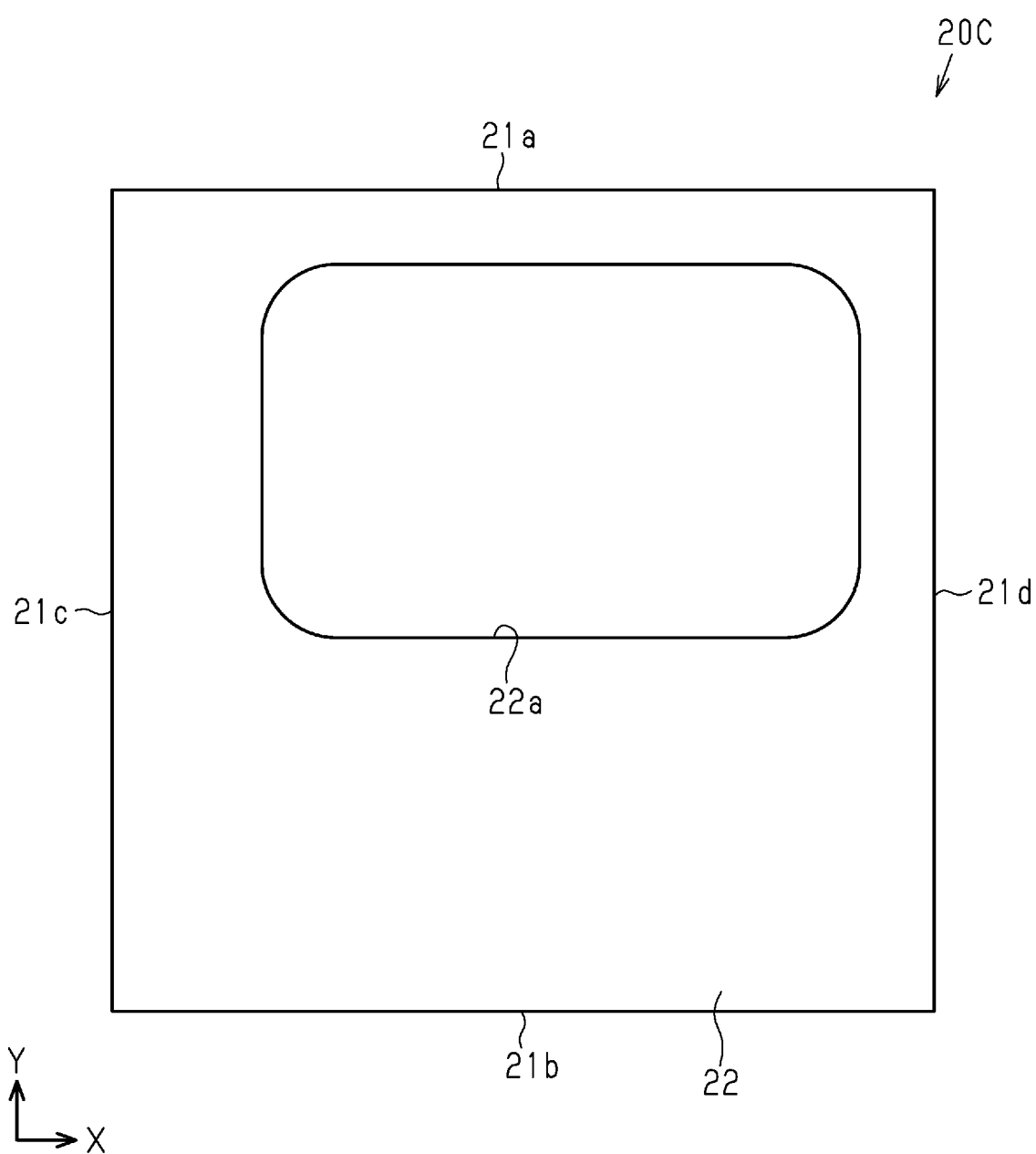
FIG. 56 is a front view showing a case of the semiconductor light emitting device shown in FIG. 52.
Figure 57:
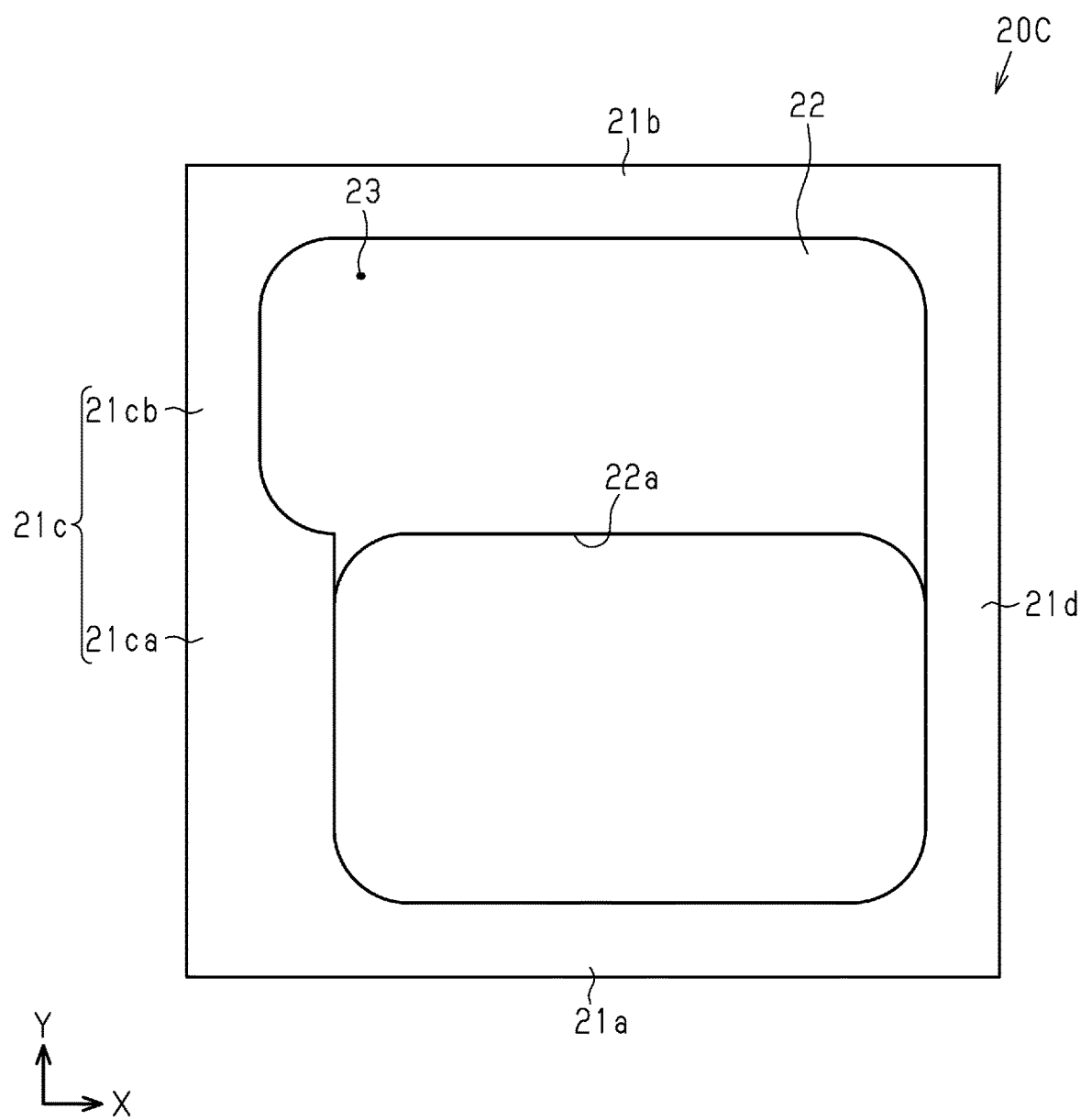
FIG. 57 is a bottom view of the case shown in FIG. 56.

In the first embodiment, as shown in FIGS. 52 to 55, the semiconductor light emitting device 1 may include a case 20C having the same structure as the case 20B of the second embodiment instead of the case 20. In this case, the semiconductor light emitting device 1 may further include the light diffusion plate 130. FIGS. 56 and 57 show only the case 20C. As shown in FIG. 53, the case 20C is smaller than the case 20B and includes the opening 22*a* formed in a position different from that of the case 20B. As shown in FIGS. 53 and 56, the opening 22*a* of the case 20C is formed in the cover 22 at a position toward the first side wall 21*a* and slightly toward the fourth side wall 21*d* from the central part in the X-direction. The opening 22*a* shown in FIGS. 53 and 56 has, for example, the same size as the opening 22*a* in the second embodiment. The dimension of the case 20C in the X-direction is less than the dimension of the case 20B in the X-direction. Therefore, the dimension of the opening 22*a* in the X-direction is greater than or equal to two-thirds of the dimension of the case 20C in the X-direction. In an example, in FIG. 56, the dimensions of the case 20C in the X-direction and the Y-direction are each approximately 3.3 mm. The dimension of the opening 22*a* in the X-direction is approximately 2.4 mm. In FIG. 54, the dimension of the case 20C in the Z-direction is, for example, equal to the dimension of the case 20B in the Z-direction. The light diffusion plate 130 shown in FIGS. 53 and 54 has the same size as the light diffusion plate 130 of the second embodiment. In this modified example, the size of the light diffusion plate 130 may be changed in a range capable of covering the entirety of the opening 22a. In an example, the light diffusion plate 130 may be sized to cover the entirety of the cover 22.

As shown in FIG. 53, the light diffusion plate 130 is located in the central part of the cover 22 of the case 20C in the X-direction. Therefore, the light diffusion plate 130 is not aligned with the opening 22a in the X-direction. More specifically, in this modified example, as viewed in the Z-direction, the light diffusion plate 130 projects from the opening 22a toward the third side wall 21c in the X-direction by a projection distance DX3 and projects from the opening 22a toward the fourth side wall 21d in the X-direction by a projection distance DX4. The projection distance DX3 is greater than the projection distance DX4. The light diffusion plate 130 projects from the opening 22a toward the first side wall 21a in the Y-direction by a projection distance DY3 and projects from the opening 22a toward the second side wall 21b in the Y-direction by a projection distance DY4. The projection distance DX3 is greater than the projection distance DY4. The projection distance DY3 is equal to the projection distance DY4. The projection distance DX4 is less than the projection distances DY3 and DY4. Therefore, the light diffusion plate 130 is located toward the third side wall 21c relative to the opening 22a.

As shown in FIG. 57, as viewed in the Z-direction, the shape of the accommodation space 23 defined by the inner surfaces of the side walls 21a to 21d is different from a square. In other words, the frame 21 has portions having different widths. More specifically, the third side wall 21c includes a first part 21ca corresponding to the opening 22a in the Y-direction and a second part 21cb located closer to the second side wall 21b than the first part 21ca. The width of the first part 21ca is greater than the width of the second part 21cb. The width of the second part 21cb is equal to each of the side walls 21a, 21b, 21d. The term "width" refers to a dimension of each of the side walls 21a to 21d in a direction orthogonal to the direction in which the side walls 21a to 21d extend as viewed in the Z-direction.

As viewed in the Z-direction, the dimension of the part of the accommodation space 23 located toward the second side wall 21b from the part having the opening 22a is greater in the X-direction than the dimension of the part of the accommodation space 23 having the opening 22a. As viewed in the Z-direction, the dimension of the part of the accommodation space 23 located toward the second side wall 21b from the part having the opening 22a in the X-direction is specified by the distance between the inner surface of the second part 21cb and the inner surface of the fourth side wall 21d in the X-direction. The dimension of the part of the accommodation space 23 having the opening 22a in the X-direction is specified by the distance between the inner surface of the first part 21ca and the inner surface of the fourth side wall 21d in the X-direction as viewed in the Z-direction.

Figure 55:
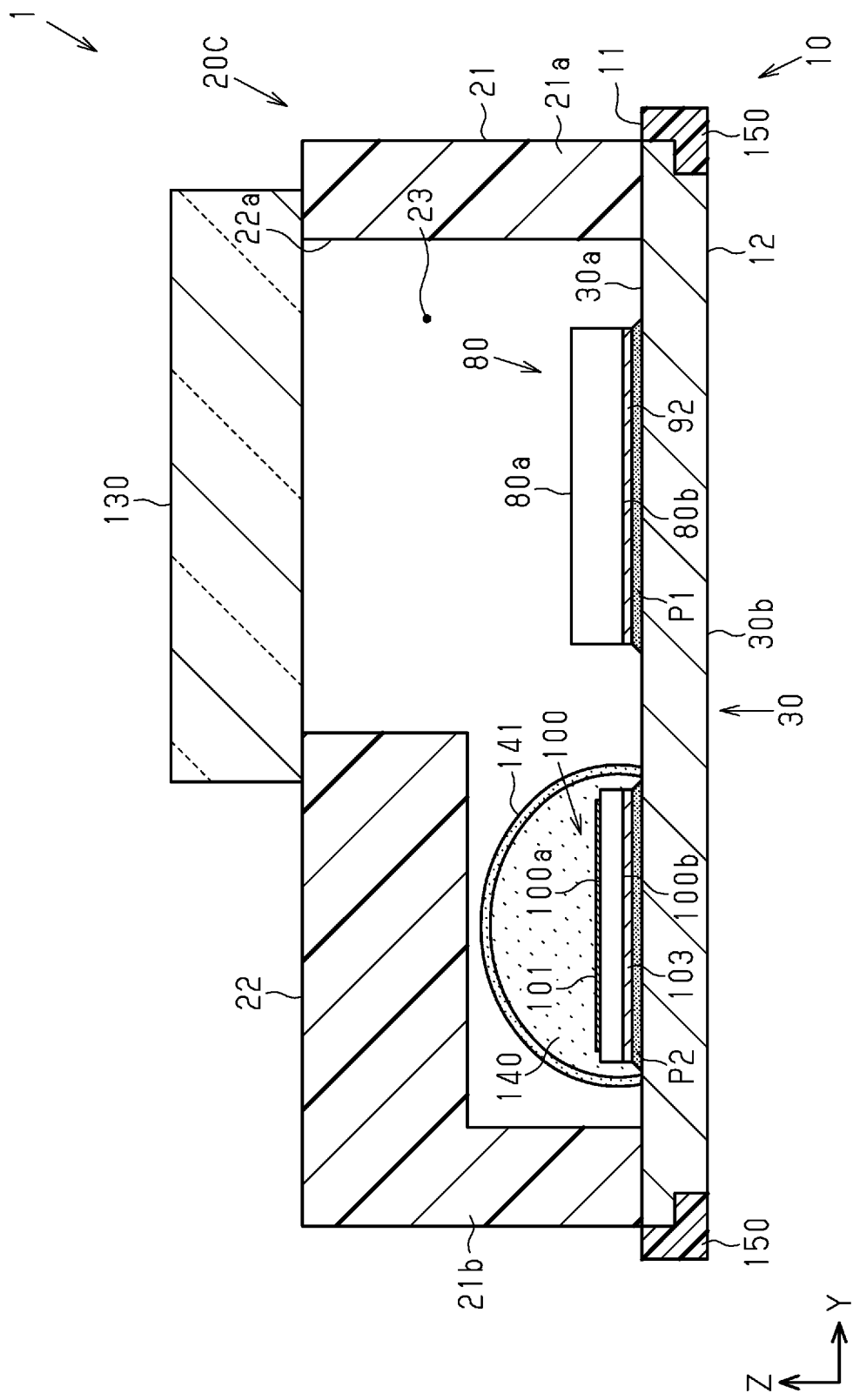
FIG. 55 is a cross-sectional view taken along line 55-55 in FIG. 53.

As shown in FIG. 55, the opening 22a is formed in a part of the cover 22 facing the semiconductor light emitting element 80. The electronic component 100 is located closer to the second side wall 21b than the opening 22a. That is, the electronic component 100 is located in the accommodation space 23 at a side having the larger dimension in the X-direction. This ensures the space for the wires W2 and W3 (for example, refer to FIG. 43).

In the modified examples of the first embodiment shown in FIGS. 52 to 57 and the second embodiment, the cases 20B and 20C only need to include a transmissive portion that is transmissive to light from the semiconductor light emitting element 80. Therefore, the cases 20B and 20C may include a light-transmissive material instead of the opening 22a. In an example, the cases 20B and 20C are formed by molding a light-transmissive resin material and a light-blocking resin material in two colors.

In the first embodiment, the contact front surfaces 30a, 40a, 50a, 60a, and 70a may be identical in shape to the contact back surfaces 30b, 40b, 50b, 60b, and 70b.

In the second embodiment, the contact front surfaces 30a, 50a, 60a, and 70a may be identical in shape to the contact back surfaces 30b, 50b, 60b, and 70b.

In the first embodiment, the arrangement positions of the joints 43, 53, 63, and 73 are not limited to positions overlapping the case 20 and may be changed in any manner.

In each embodiment, the shape of the element upper surface 80a and the element lower surface 80b may be changed in any manner. Also, the position and the shape of the light emitting regions 90 and the element upper surface electrode 91 may be changed in any manner.

In each embodiment, the shape of the upper surface 100a and the lower surface 100b is not limited to a rectangle and may be changed in any manner. Also, the position and the shape of the first drive electrode 101 and the control electrode 102 may be changed in any manner.

In each embodiment, the shape of the substrates 10 and 10B is not limited to a square and may be changed in any manner. For example, the substrates 10 and 10B may be a rectangle so that one side is longer than the other side.

In each embodiment, the element lower surface electrode 92 may be formed on part of the element lower surface 80b. Also, the second drive electrode 103 may be formed on part of the lower surface 100b.

In each embodiment, the electronic apparatuses 2 and 2B may have any specific structure. For example, the capacitor 120 may be omitted from the electronic apparatus 2. The capacitor 120 may be added to the electronic apparatus 2B. The electronic apparatuses 2 and 2B may include a light receiving element mounted on the circuit substrate 110.

In each embodiment, the wiring patterns 111 to 114 may have any specific layout. The heat dissipation pattern 115 may be omitted.

In each embodiment, the semiconductor light emitting devices 1 and 1B may further include a partition wall that separates the semiconductor light emitting element 80 from the electronic component 100.

Figure 58:
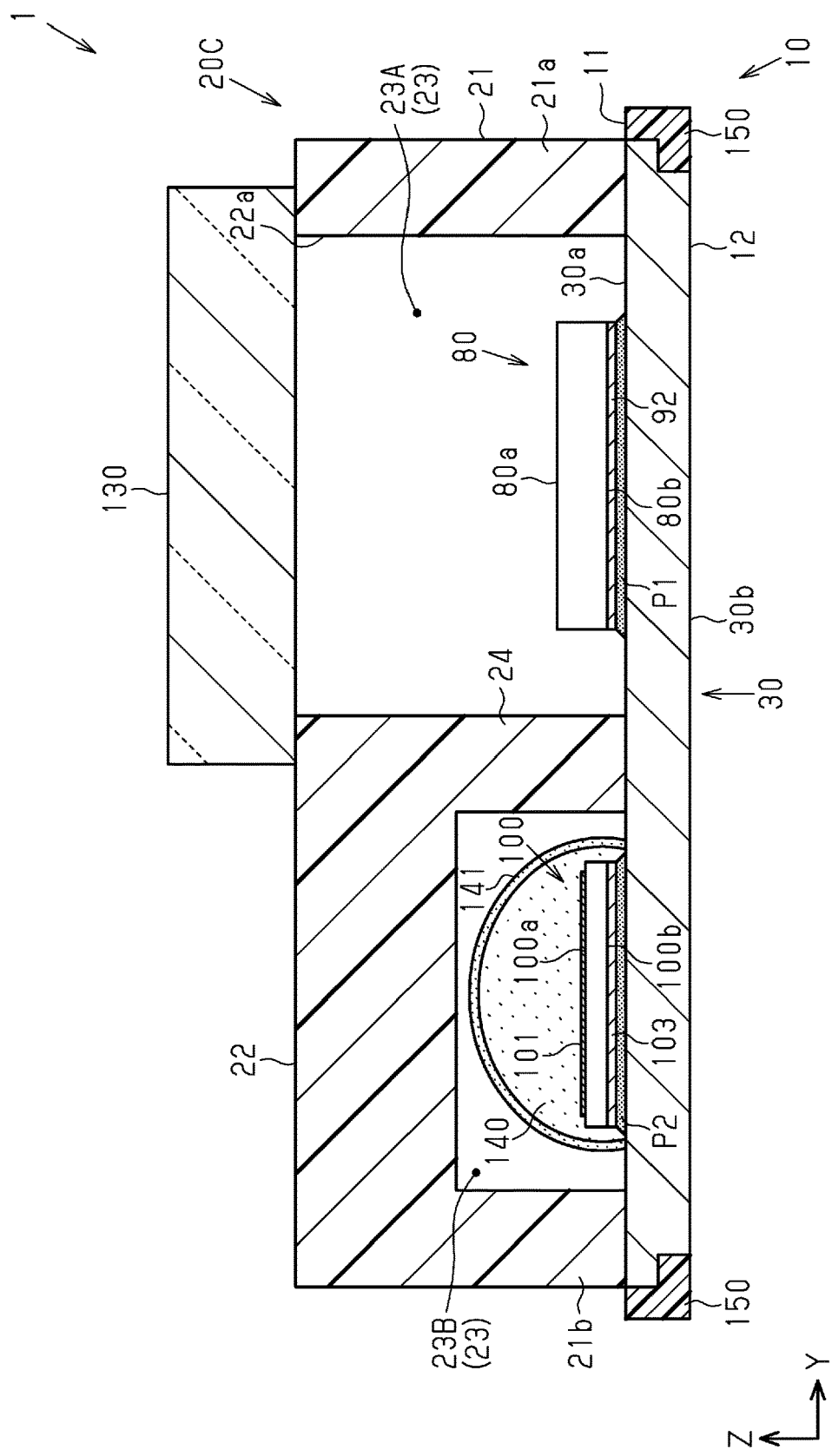
FIG. 58 is a cross-sectional view showing the semiconductor light emitting device in a modified example.
Figure 59:
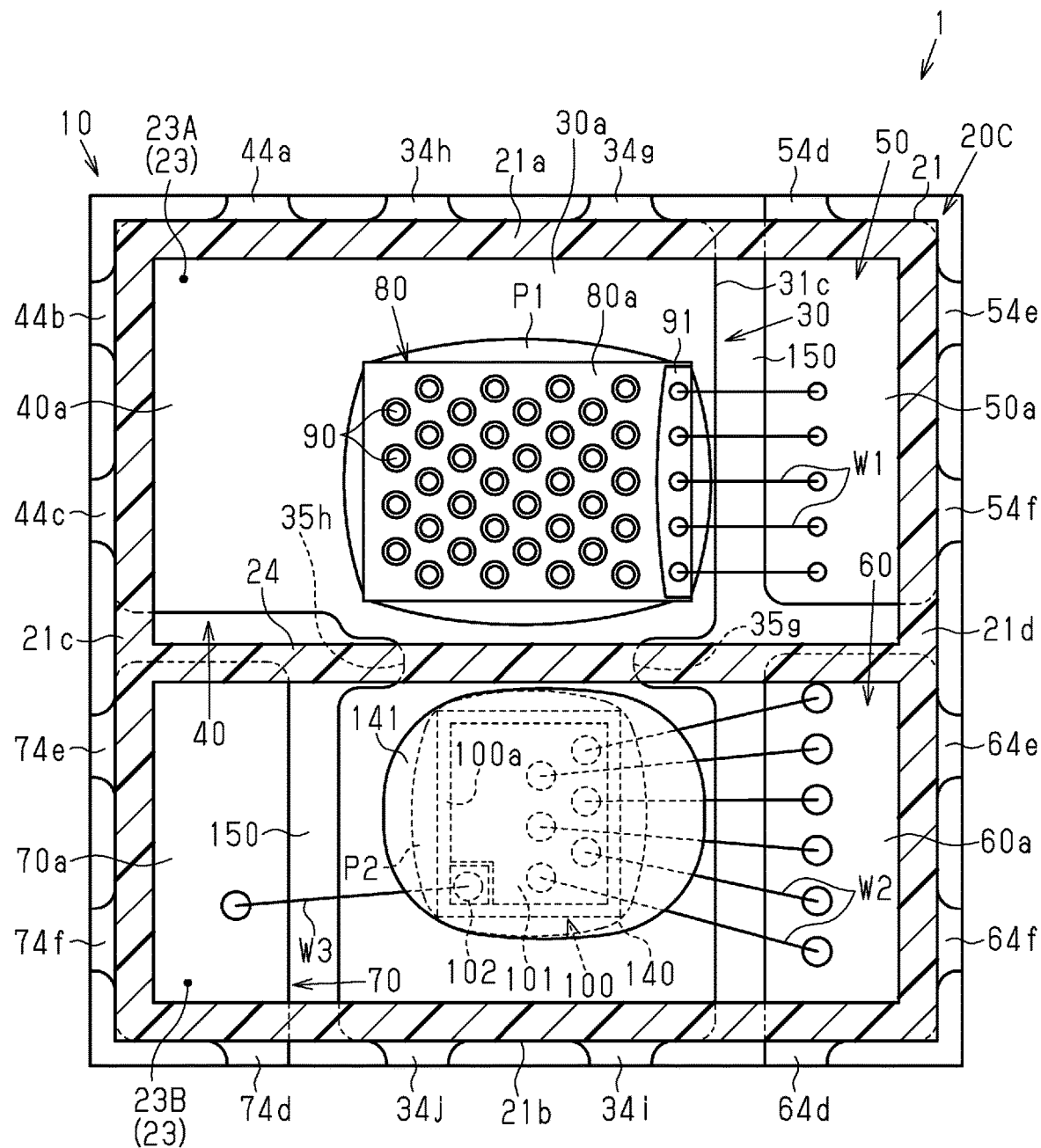
FIG. 59 is a front view showing a frame of the semiconductor light emitting device of the modified example that is cut along a plane orthogonal to the thickness-wise direction of the substrate.

In a first example, as shown in FIGS. 58 and 59, the semiconductor light emitting device 1 including the case 20C includes a partition wall 24. The partition wall 24 is formed from a light-blocking material. In an example, the partition wall 24 and the case 20B are integrally formed from the same resin material. The partition wall 24 extends downward from the cover 22 of the case 20B. In the illustrated example, the partition wall 24 is in contact with the substrate front surface 11. The partition wall 24 is disposed between the semiconductor light emitting element 80 and the electronic component 100 in the Y-direction and separates the accommodation space 23 into a first accommodation space 23A accommodating the semiconductor light emitting element 80 and a second accommodation space 23B accommodating the electronic component 100. As shown in FIG. 59, the partition wall 24 connects the third side wall 21c and the fourth side wall 21d. That is, the first accommodation space 23A is defined by the first side wall 21a, the third side wall 21c, the fourth side wall 21d, and the partition wall 24. The second accommodation space 23B is defined by the second side wall 21b, the third side wall 21c, the fourth side wall 21d, and the partition wall 24. In the illustrated example, the partition wall 24 extends in the X-direction in plan view. The partition wall 24 overlaps the recesses 35e and 35f in the common conductive portion 30 in the Z-direction.

Figure 60:
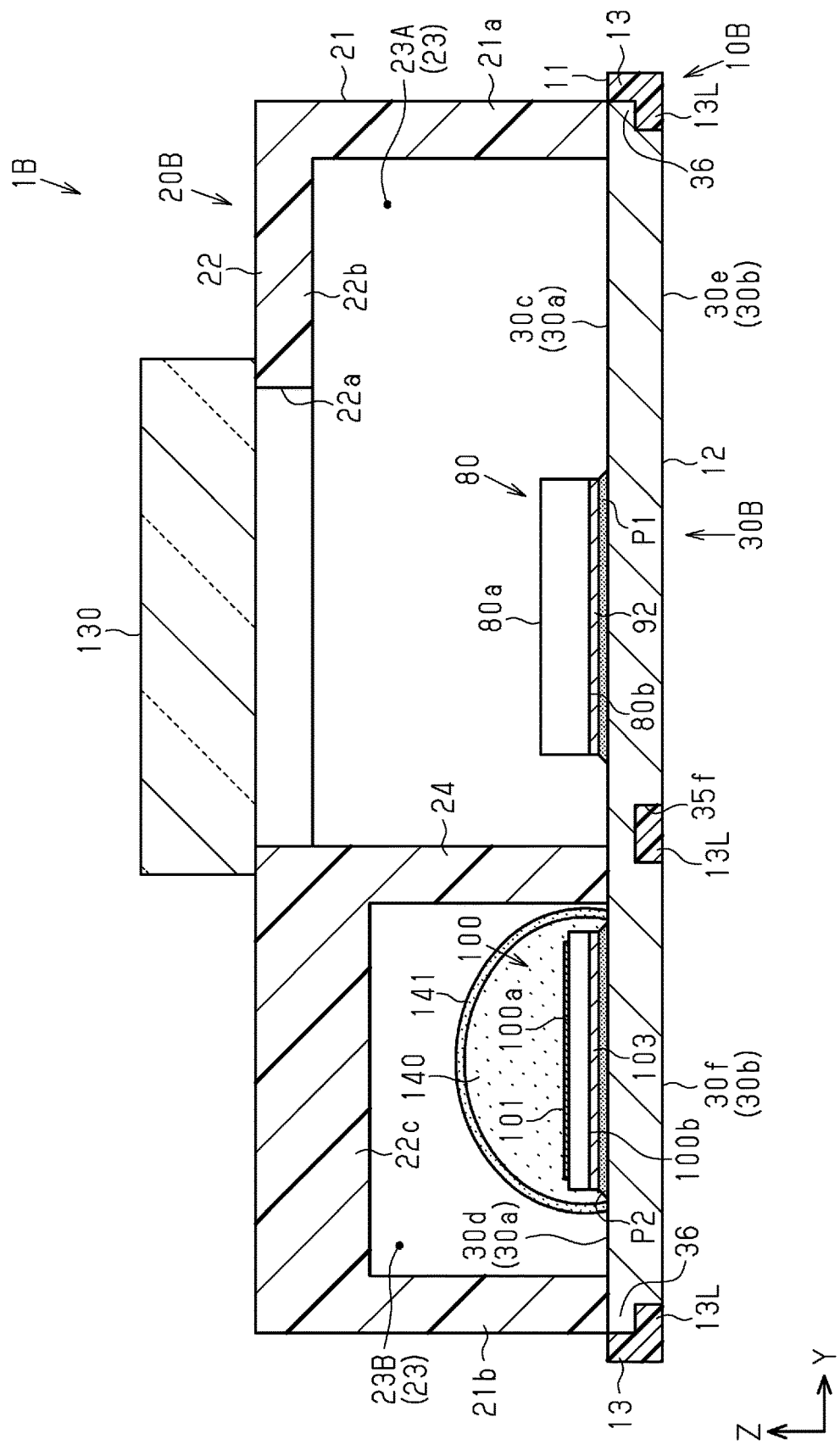
FIG. 60 is a cross-sectional view showing the semiconductor light emitting device in a modified example.
Figure 61:
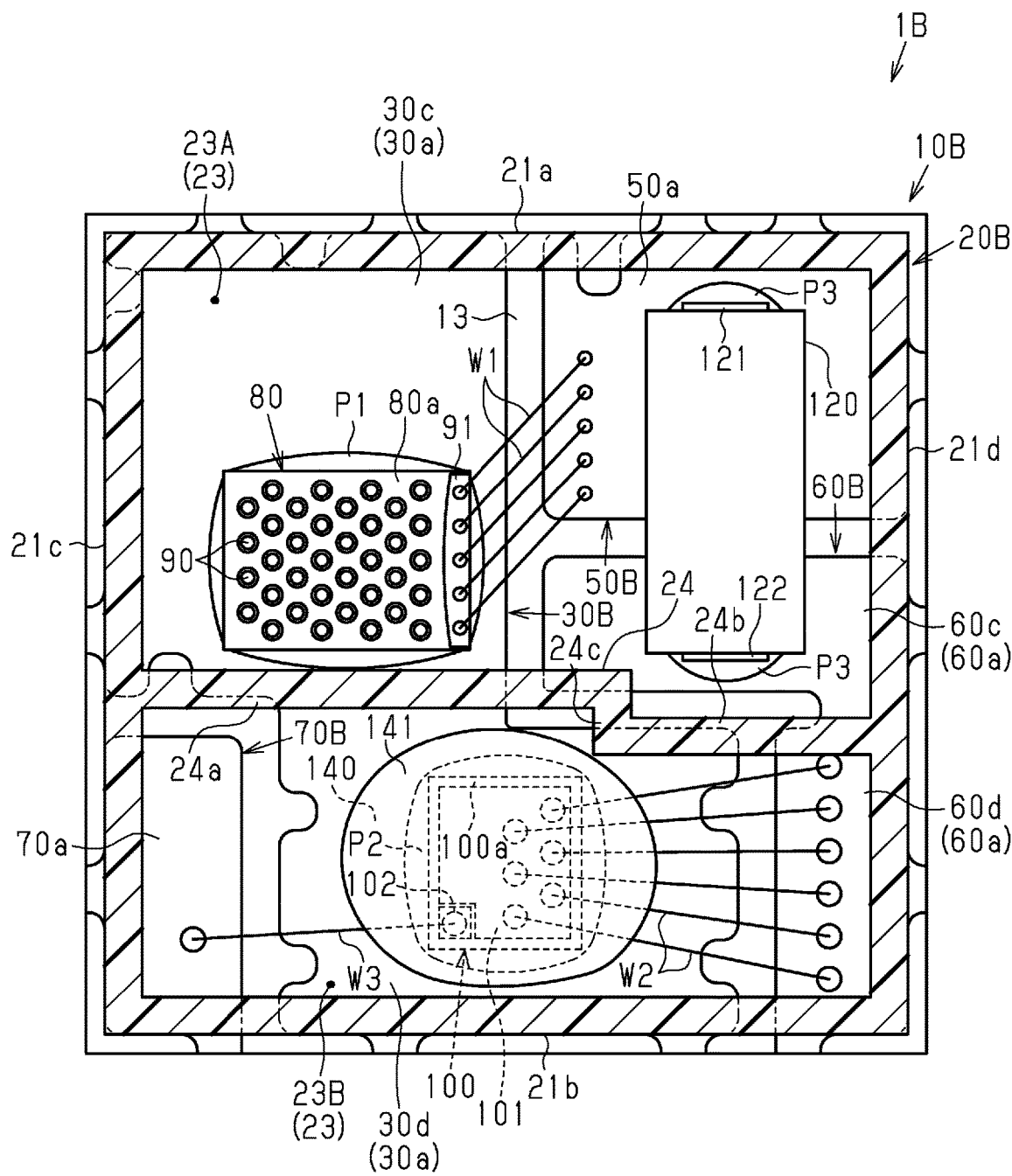
FIG. 61 is a front view showing a frame of the semiconductor light emitting device in the modified example that is cut along a plane orthogonal to the thickness-wise direction of the substrate.

In a second example, as shown in FIGS. 60 and 61, the semiconductor light emitting device 1B of the second embodiment includes a partition wall 24. The partition wall 24 extends downward from the cover 22 of the case 20B. In the illustrated example, the partition wall 24 is in contact with the substrate front surface 11. The partition wall 24 is disposed between the semiconductor light emitting element 80 and the electronic component 100 in the Y-direction and separates the accommodation space 23 into a first accommodation space 23A accommodating the semiconductor light emitting element 80 and the capacitor 120 and a second accommodation space 23B accommodating the electronic component 100. As shown in FIG. 61, the partition wall 24 connects the third side wall 21c and the fourth side wall 21d. That is, the first accommodation space 23A is defined by the first side wall 21a, the third side wall 21c, the fourth side wall 21d, and the partition wall 24. The second accommodation space 23B is defined by the second side wall 21b, the third side wall 21c, the fourth side wall 21d, and the partition wall 24.

As shown in FIG. 61, the partition wall 24 includes a first part 24a extending from the third side wall 21c in the X-direction, a second part 24b extending from the fourth side wall 21d in the X-direction, and a step 24c formed between the first part 24a and the second part 24b in the X-direction. That is, the first part 24a and the second part 24b are located at different positions in the Y-direction. In the illustrated example, the second part 24b is located closer to the second side wall 21b than the first part 24a.

The first part 24a separates the semiconductor light emitting element 80 and the electronic component 100. The second part 24b separates the capacitor 120 and the wires W2. The step 24c is located between the semiconductor light emitting element 80 and the capacitor 120 in the X-direction. That is, the step 24c and the second part 24b extends the dimension of the part of the first accommodation space 23A accommodating the capacitor 120 in the Y-direction. Thus, the capacitor 120 is accommodated in the first accommodation space 23A. The step 24c is located between the electronic component 100 and the capacitor 120 in the X-direction. This ensures the space for the encapsulation resin 140 and the coating agent 141 covering the electronic component 100. The shape of the step 24c in plan view may be changed in any manner. In an example, the step 24c may diagonally extend toward the second side wall 21b from the first part 24a to the fourth side wall 21d. This ensures the space for the encapsulation resin 140 and the coating agent 141 covering the electronic component 100.

Figure 62:
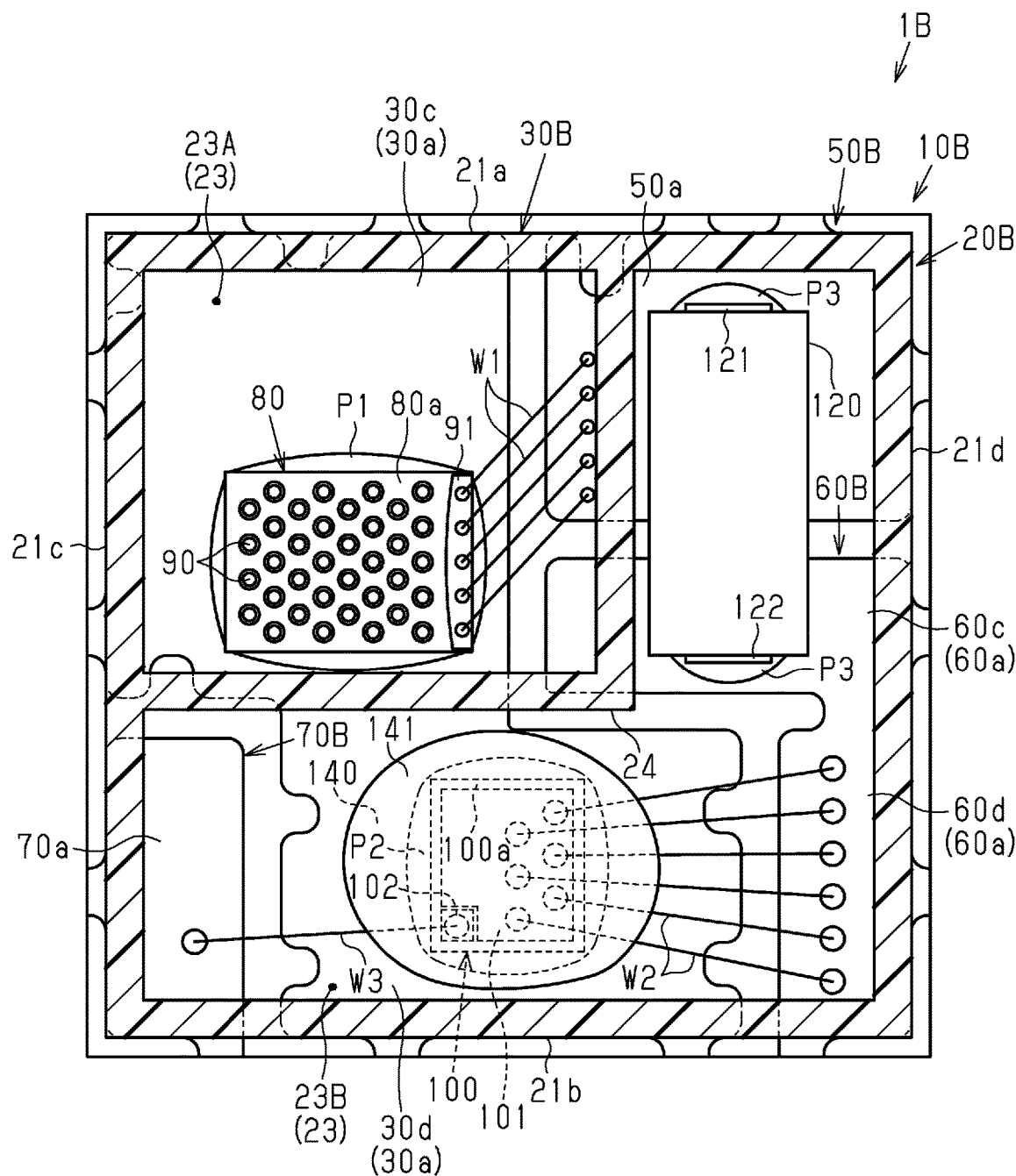
FIG. 62 is a front view showing a frame of the semiconductor light emitting device in a modified example that is cut along a plane orthogonal to the thickness-wise direction of the substrate.

In a third example, in the semiconductor light emitting device 1B of the second example, the shape of the partition wall 24 may be changed as shown in FIG. 62. More specifically, the partition wall 24 is formed so that the semiconductor light emitting element 80 is disposed in the first accommodation space 23A and that the electronic component 100 and the capacitor 120 are disposed in the second accommodation space 23B. That is, in plan view, the partition wall 24 is L-shaped and connects the third side wall 21c and the first side wall 21a. That is, the first accommodation space 23A is defined by the first side wall 21a, the third side wall 21c, and the partition wall 24. The second accommodation space 23B is L-shaped and defined by the first to fourth side walls 21a to 21d and the partition wall 24.

Figure 63:
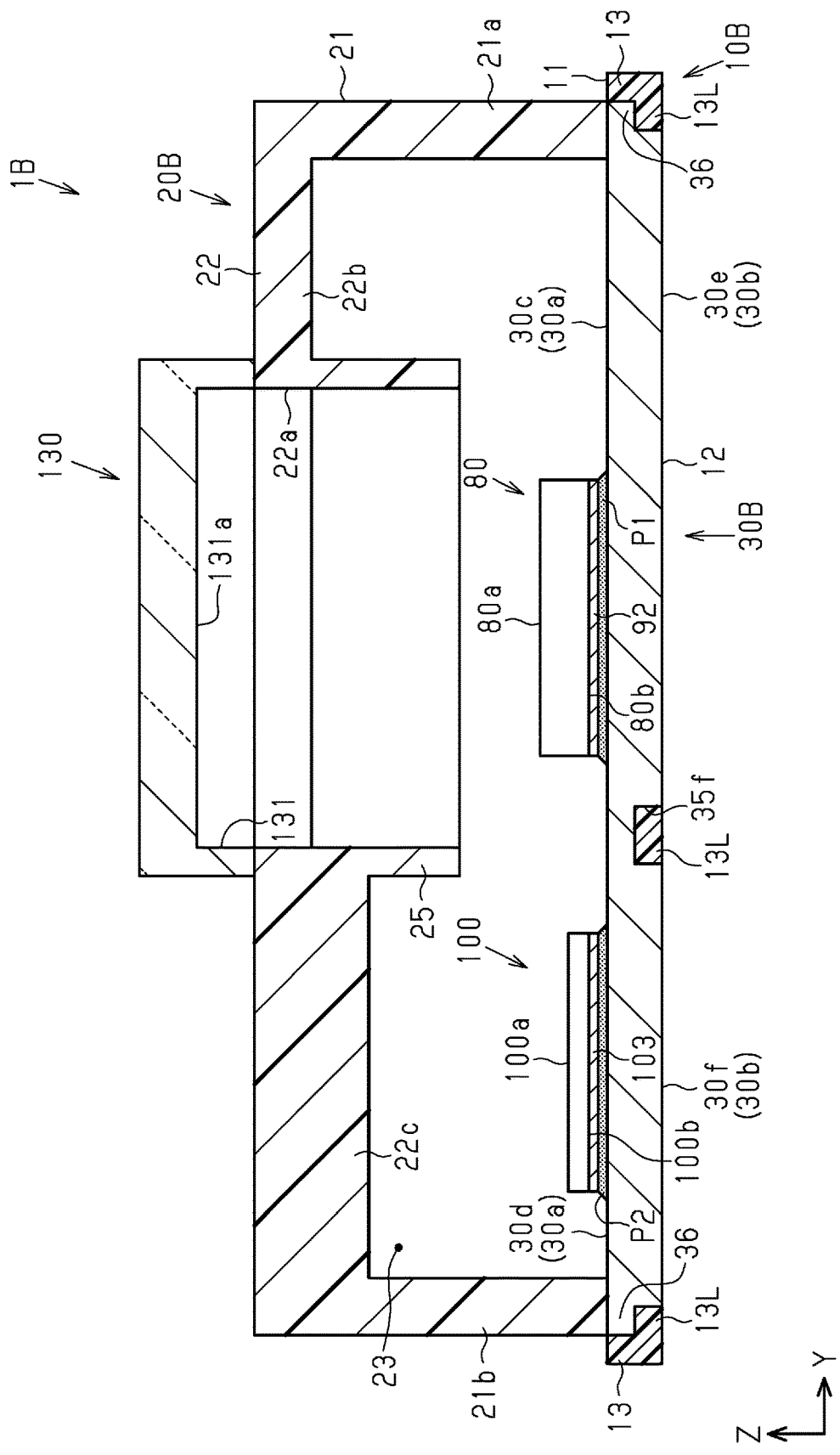
FIG. 63 is a cross-sectional view showing the semiconductor light emitting device in a modified example.

In the second embodiment, as shown in FIG. 63, a light-blocking wall 25 may extend downward from the edge of the opening 22a in the case 20B. In FIG. 63, the light-blocking wall 25 extends along the entire edge of the opening 22a. In this structure, when light from the semiconductor light emitting element 80 is reflected by the light diffusion plate 130, irradiation of the electronic component 100 with the reflected light is limited. Thus, erroneous actuation of the electronic component 100 caused by light of the semiconductor light emitting element 80 is limited. The dimension of the light-blocking wall 25 in the Z-direction may be changed in any range that limits irradiation of the electronic component 100 with the light reflected from the light diffusion plate 130. The light-blocking wall 25 is not limited to the structure in which the light-blocking wall 25 extends along the entire edge of the opening 22a and may be formed along a portion of the edge of the opening 22a. The light-blocking wall 25 may be formed along the opening 22a at least at a part between the semiconductor light emitting element 80 and the electronic component 100. In FIG. 63, the light diffusion plate 130 may be plate-shaped as shown in FIG. 19. Although the encapsulation resin 140 and the coating agent 141 are omitted from FIG. 63, the encapsulation resin 140 and the coating agent 141 may be added to cover the electronic component 100.

In the second embodiment, the shape of the light diffusion plate 130 is not limited to being plate-shaped and may be changed in any manner. In an example, as shown in FIG. 63, the light diffusion plate 130 includes a recess 131 that is rectangular in cross-sectional view. In the illustrated example, the recess 131 includes a flat surface orthogonal to the Z-direction, defining a bottom 131a. Since light from the semiconductor light emitting element 80 is reflected at the bottom of the recess 131 in the light diffusion plate 130, the inner surface defining the opening 22a is used as a light-blocking wall. This limits irradiation of the electronic component 100 with the reflected light from the light diffusion plate 130. As shown in FIG. 63, the case 20B may include the combination of the light diffusion plate 130 having the recess 131 and the light-blocking wall 25. In this case, the irradiation of the electronic component 100 with the reflected light from the light diffusion plate 130 is further limited.

Also, in the first embodiment, when the semiconductor light emitting device 1 includes the case 20C shown in FIG. 56, the case 20C may include at least one of the light-blocking wall 25 and the light diffusion plate 130 having the recess 131.

In each embodiment, a vent may be arranged between the substrate 10 (10B) and the case 20 (20B, 20C) to connect the accommodation space of the case 20 (20B, 20C) and the outside of the case 20 (20B, 20C). A vent 160 will be described using the case 20B of the semiconductor light emitting device 1B in the second embodiment.

Figure 64:
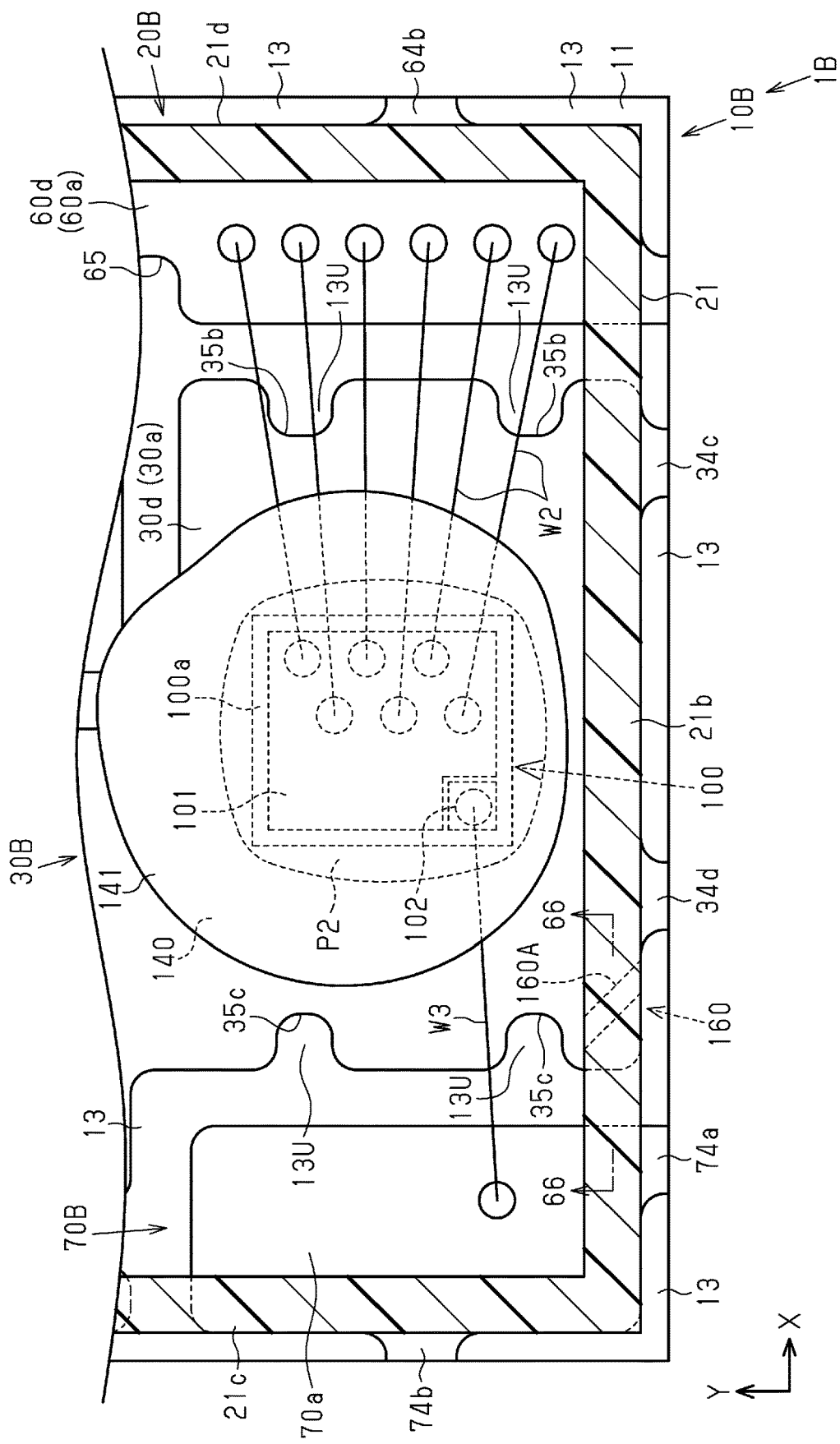
FIG. 64 is a partial enlarged front view showing a frame of the semiconductor light emitting device in a modified example that is cut along a plane orthogonal to the thickness-wise direction of the substrate.
Figure 65:
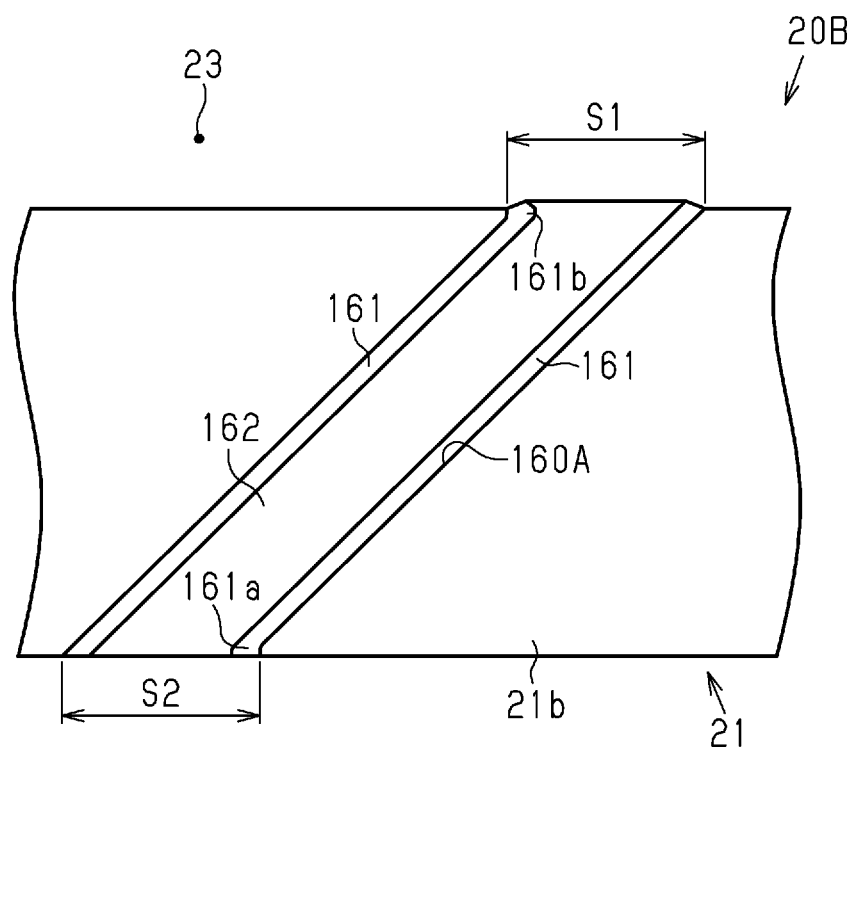
FIG. 65 is a partial bottom view of the frame of the case.

In an example, as shown in FIG. 64, the second side wall 21b of the frame 21 of the case 20B includes a side wall recess 160A. The side wall recess 160A extends from the inner surface to the outer surface of the second side wall 21b. The vent 160 is defined by the side wall recess 160A and the substrate front surface 11 of the substrate 10B. The vent 160 extends from the inner surface to the outer surface of the second side wall 21b in the Y-direction diagonally from the fourth side wall 21d toward the third side wall 21c in the X-direction. As shown in FIG. 65, the width of the vent 160 (side wall recess 160A) is constant. The vent 160 (side wall recess 160A) has a first opening region S1 at the accommodation space 23 and a second opening region S2 at the outside of the case 20B. The first opening region S1 and the second opening region S2 have the same width. The width of the vent 160 (side wall recess 160A) refers to a width of the vent 160 in a direction orthogonal to the direction in which the vent 160 extends in plan view. The first opening region S1 is also referred to as an inner opening region that is open in the inner surface of the side wall (second side wall 21*b*) of the case 20B. The second opening region S2 is also referred to as an outer opening region that is open in the outer surface of the side wall (second side wall 21*b*) of the case 20B.

Figure 66:
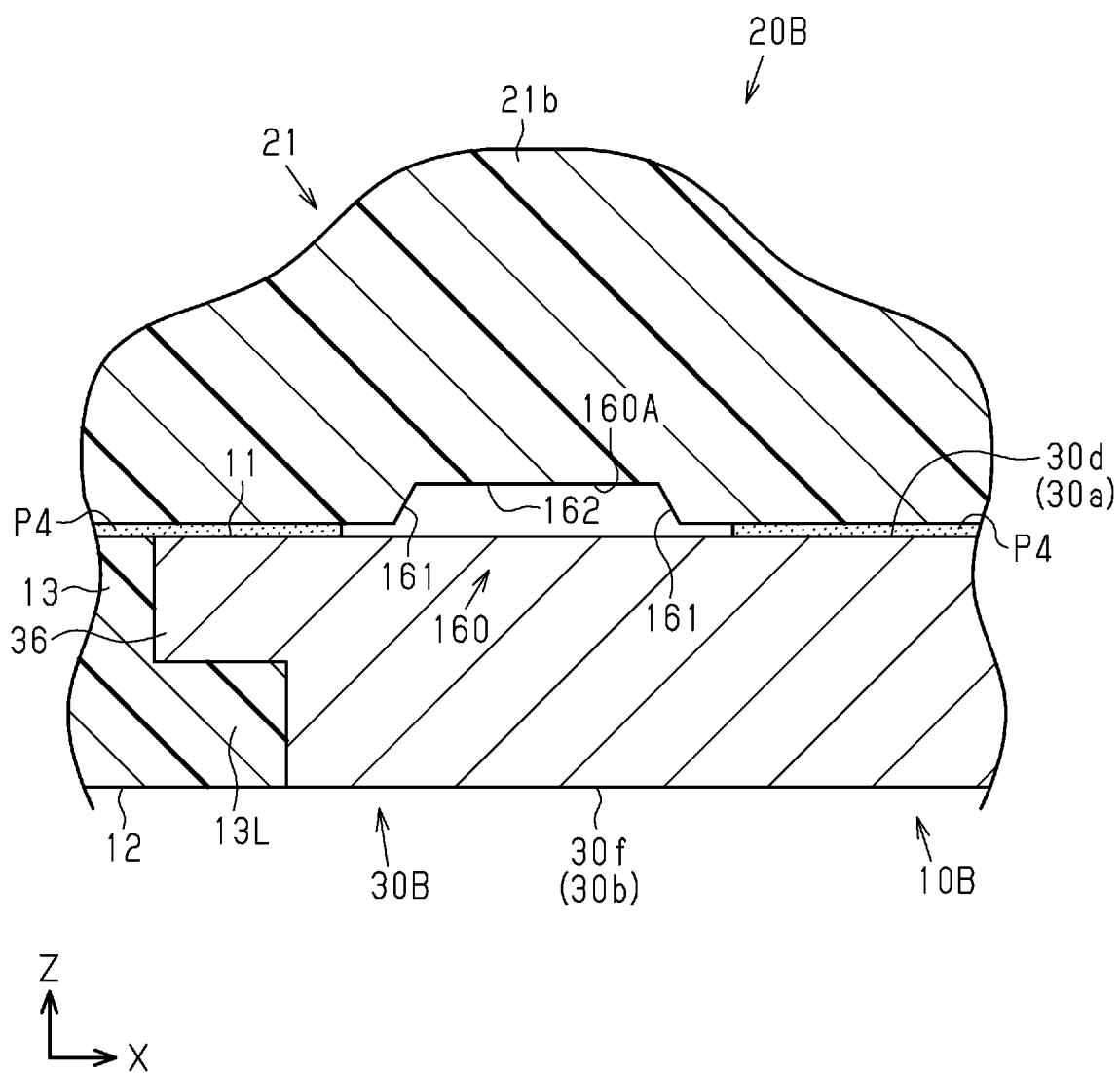
FIG. 66 is a cross-sectional view taken along line 66-66 in FIG. 64.

As shown in FIG. 66, the side wall recess 160A is formed by recessing in the Z-direction from an end surface of the second side wall 21*b* that faces the substrate front surface 11 in the Z-direction. As shown in FIGS. 65 and 65, the side wall recess 160A is defined by two side walls 161 separated from each other and a top wall 162 connecting the side walls 161. In the illustrated example, the side walls 161 include tapered inclined surfaces that become closer to each other toward the top wall 162. The top wall 162 includes a flat surface that is orthogonal to the Z-direction.

The side wall recess 160A further includes a first side end surface 161*a* and a second side end surface 161*b*. The first side end surface 161*a* is located between the outer surface of the second side wall 21*b* and one of the side walls 161 and includes a bulged surface as viewed in the Z-direction. Another bulged surface that is similar to the first side end surface 161*a* may be located between the outer surface of the second side wall 21*b* and the other one of the side walls 161. The second side end surface 16 lb is located between the inner surface of the second side wall 21*b* and the other one of the side walls 161 and includes a bulged surface as viewed in the Z-direction. Another bulged surface that is similar to the second side end surface 161*b* may be located between the inner surface of the second side wall 21*b* and the one of the side walls 161.

The periphery of the vent 160 is partially free of the adhesive agent P4, which fixes the case 20B to the substrate front surface 11. Avoidance of entrance of the adhesive agent P4 into the vent 160 maintains ventilation characteristics. The number of vents 160 may be changed in any manner. For example, the frame 21 may include a plurality of vents 160.

In a side view of the case 20B, the shape of the vent 160 (side wall recess 160A) may be changed in any manner.

Figure 67:
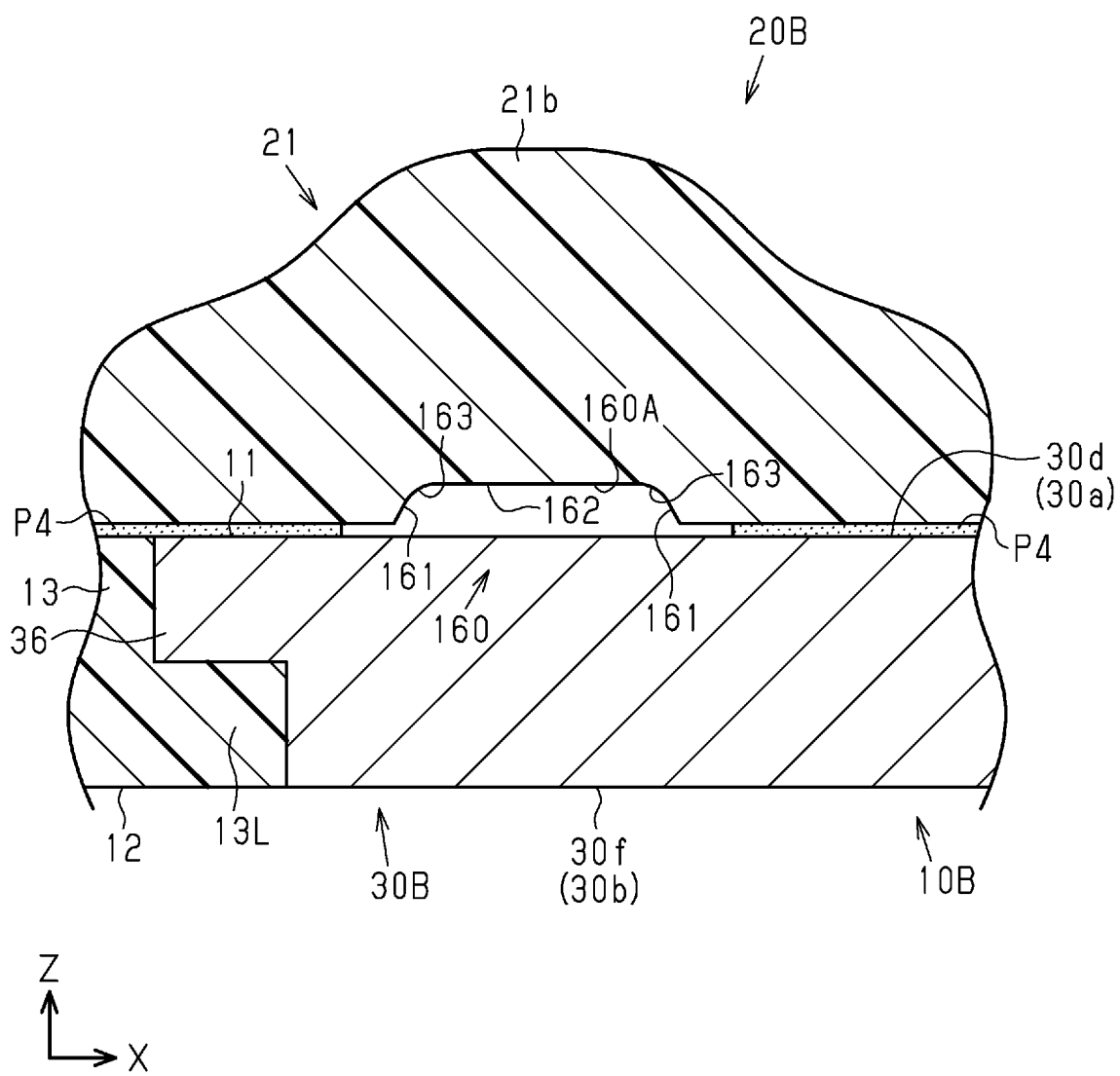
FIG. 67 is a cross-sectional view of a case and a substrate in a modified example of FIG. 66.

In a first example, as shown in FIG. 67, the side wall recess 160A further includes two curves 163 disposed between the top wall 162 and the side walls 161. The curves 163 connect the side walls 161 to the top wall 162. Alternatively, the side walls 161 of the vent 160 may be curved instead of the curves 163.

Figure 68:
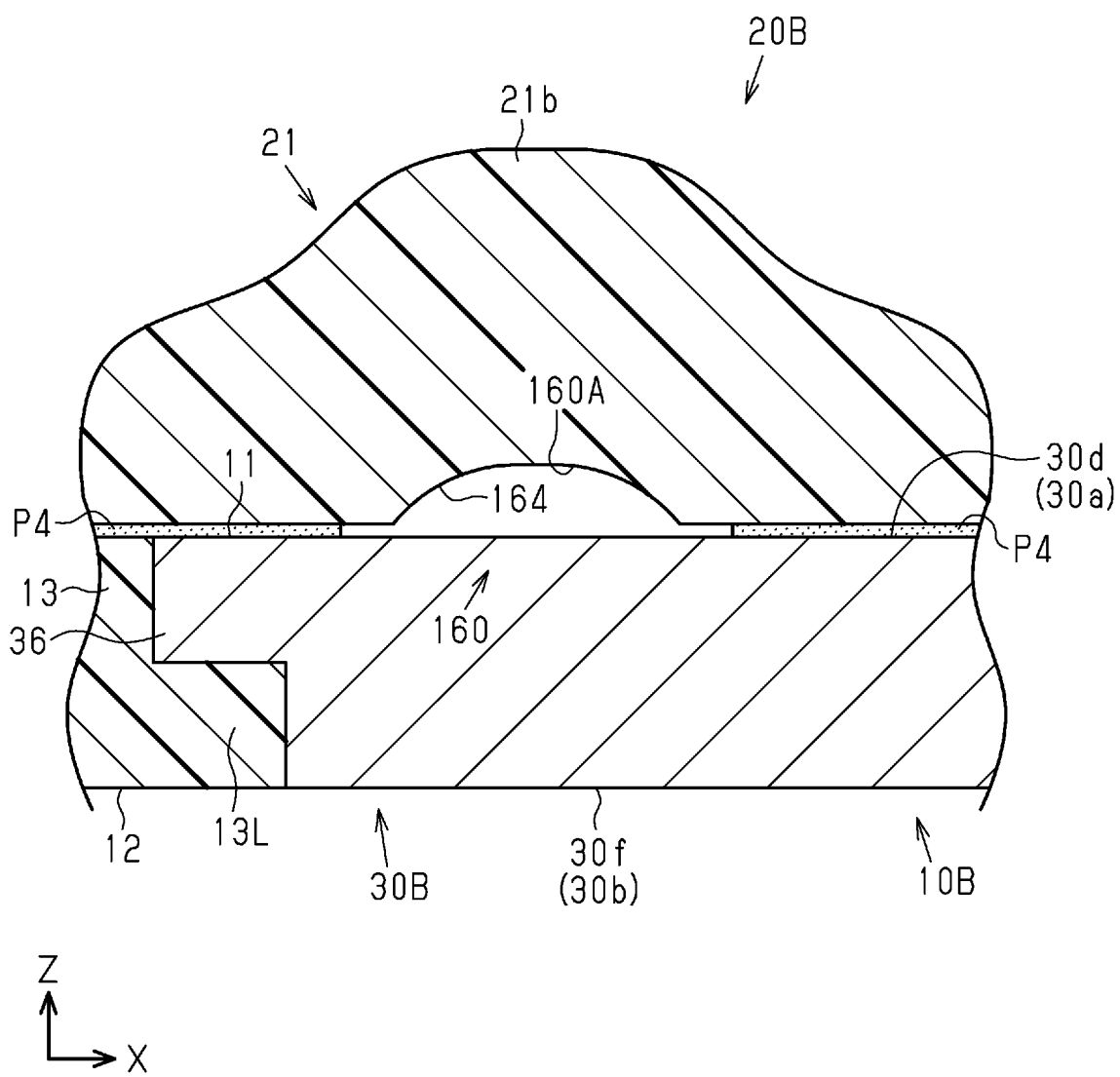
FIG. 68 is a cross-sectional view of a case and a substrate in a modified example of FIG. 66.

In a second example, as shown in FIG. 68, the side wall recess 160A includes a curved surface 164 instead of the side walls 161 and the top wall 162. The curved surface 164 is recessed to be further from the substrate front surface 11 as the curved surface 164 extends toward a width-wise central part of the vent 160.

Figure 69:
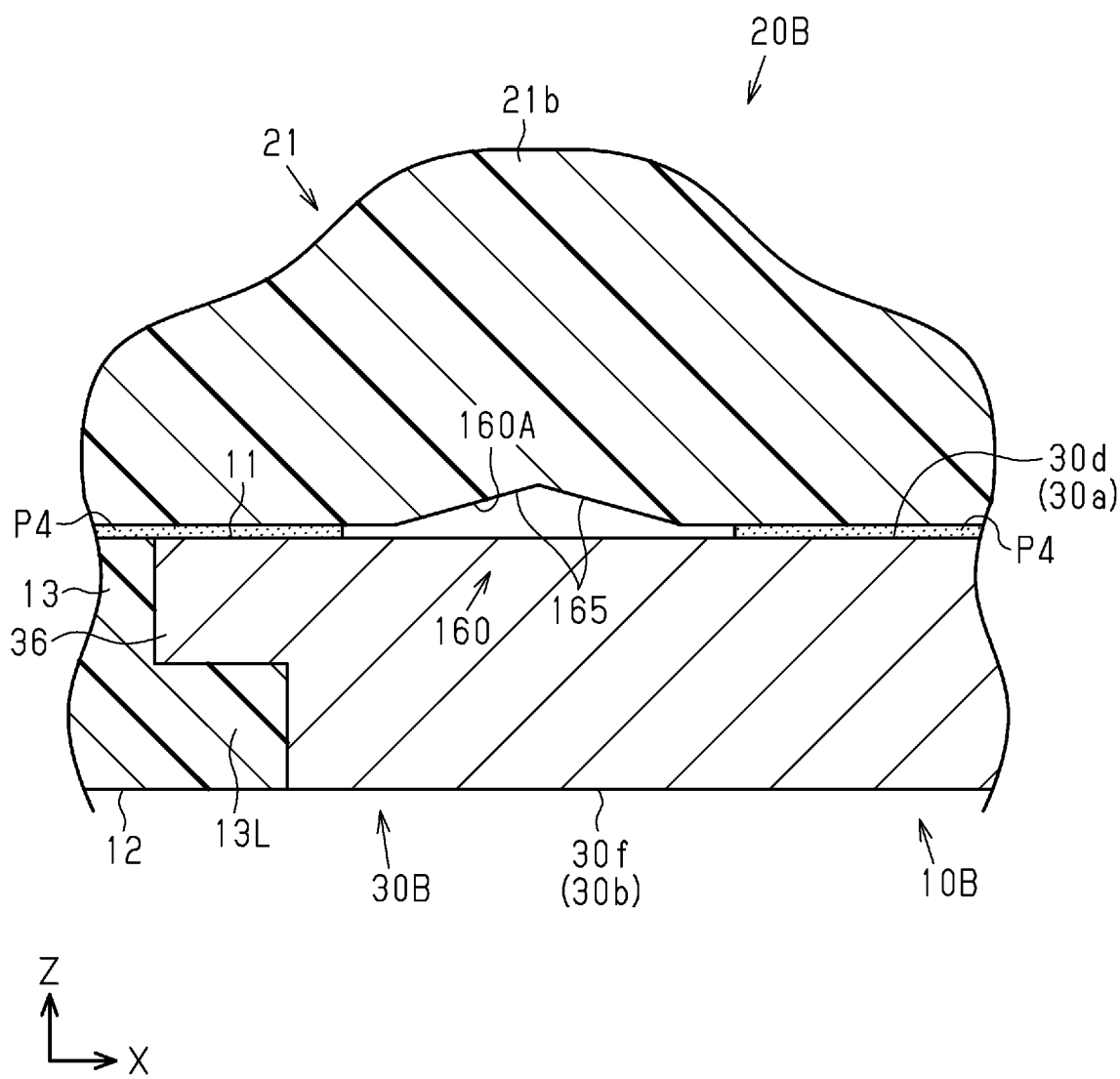
FIG. 69 is a cross-sectional view of a case and a substrate in a modified example of FIG. 66.

In a third example, as shown in FIG. 69, the side wall recess 160A is a V-shaped groove. More specifically, the vent 160 includes two inclined surfaces 165 that are inclined further from the substrate front surface 11 as the inclined surfaces 165 extend toward the width-wise central part of the vent 160. The inclined surfaces 165 are connected each other at the width-wise central part of the vent 160.

As viewed in the Z-direction, the shape of the vent 160 (side wall recess 160A) may be changed in any manner.

Figure 70:
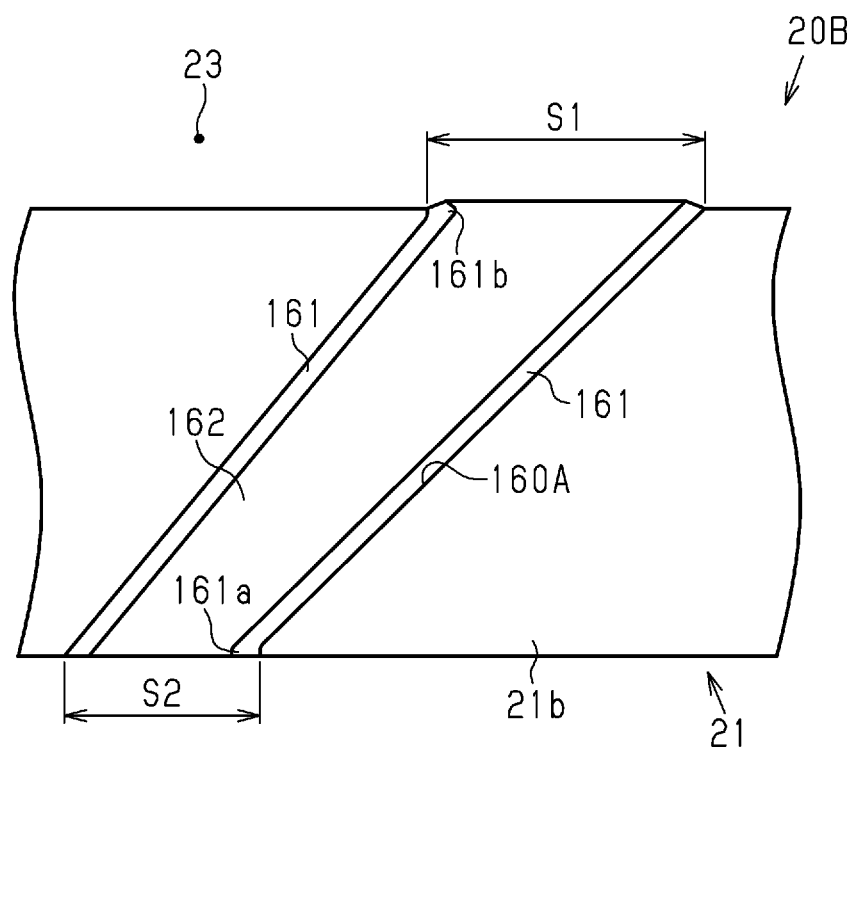
FIG. 70 is a partial bottom view of the frame of a modified example of FIG. 65.

In a first example, as shown in FIG. 70, the vent 160 (side wall recess 160A) has a structure in which the first opening region S1 has a greater width than the second opening region S2. In other words, the vent 160 (side wall recess 160A) has a structure in which the second opening region S2 has a greater width than the first opening region S1. In the illustrated example, the width of the vent 160 (side wall recess 160A) decreases from the first opening region S1 toward the second opening region S2. That is, as viewed in the Z-direction, the vent 160 (side wall recess 160A) is tapered to become smaller from the first opening region S1 toward the second opening region S2. In this structure, the width of the second opening region S2 is decreased to further hinder unintentional entrance of an object.

Figure 71:
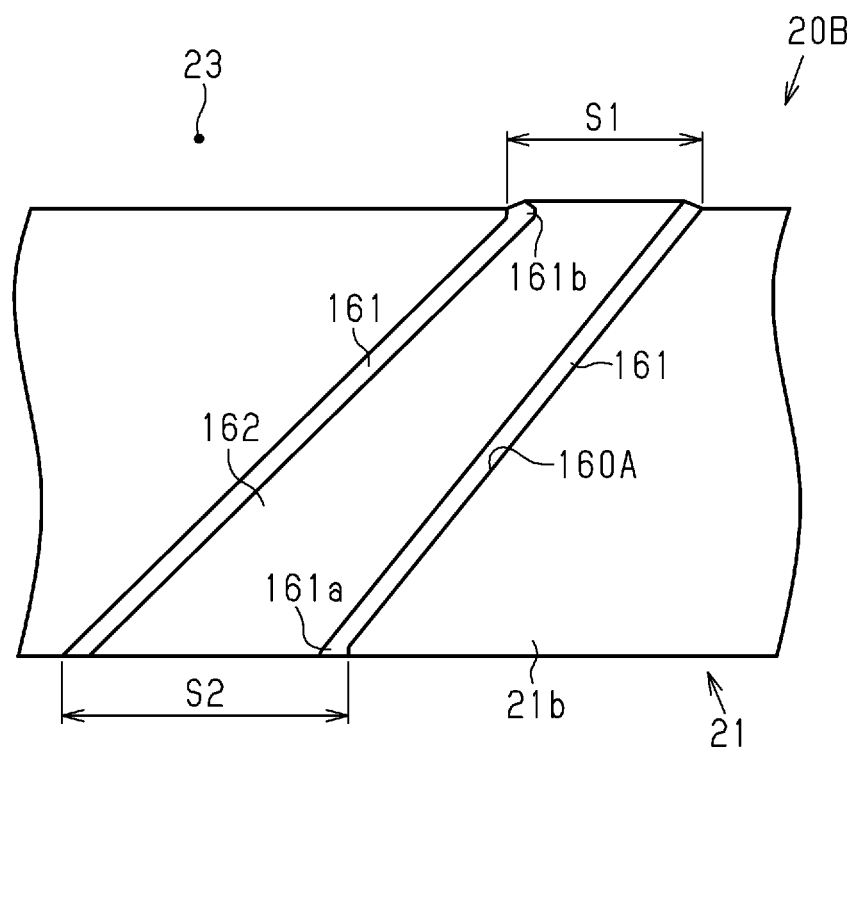
FIG. 71 is a partial bottom view of the frame of a modified example of FIG. 65.

In a second example, as shown in FIG. 71, the vent 160 (side wall recess 160A) has a structure in which the first opening region S1 has a smaller width than the second opening region S2. In the illustrated example, the width of the vent 160 (side wall recess 160A) decreases from the second opening region S2 toward the first opening region S1. That is, as viewed in the Z-direction, the vent 160 (side wall recess 160A) is tapered to become smaller from the second opening region S2 toward the first opening region S1. In this structure, the width of the first opening region S1 is decreased to further hinder unintentional entrance of an object.

Figure 72:
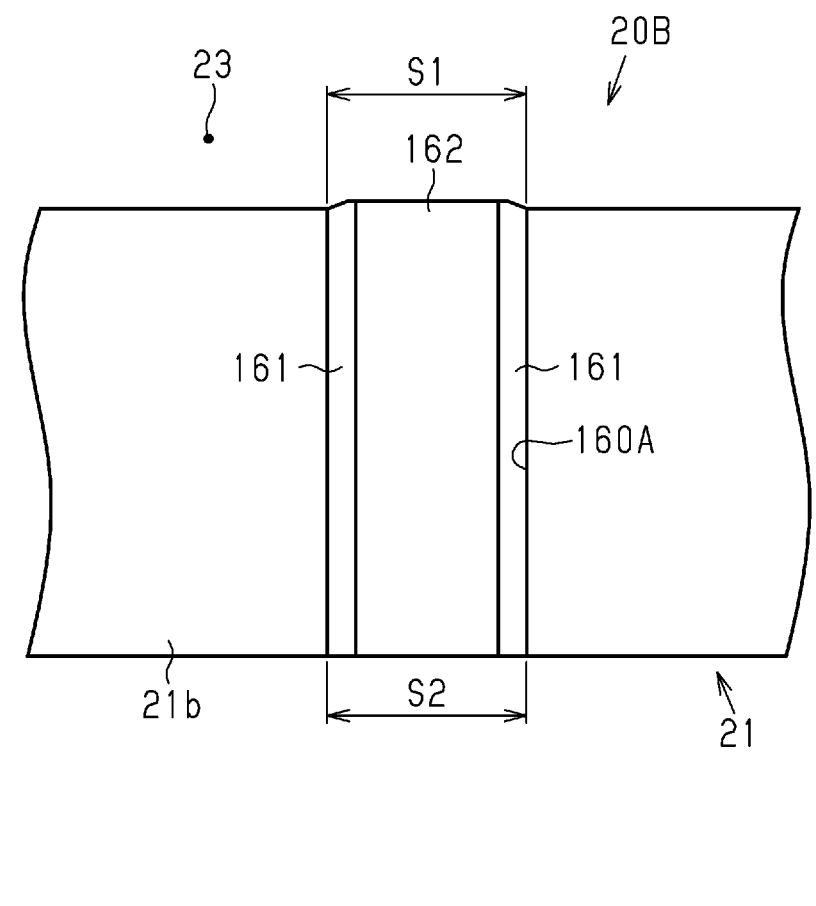
FIG. 72 is a partial bottom view of the frame of a modified example of FIG. 65.

In a third example, as shown in FIG. 72, the side wall recess 160A linearly extends in the Y-direction as viewed in the Z-direction. Thus, the vent 160 is linearly formed in the Y-direction. In the illustrated example, the width of the vent 160 (side wall recess 160A) is constant. The width of the first opening region S1 is equal to the width of the second opening region S2. In the side wall recess 160A shown in FIG. 72, the width of the vent 160 (side wall recess 160A) may be changed. In an example, the width of the vent 160 (side wall recess 160A) may decrease or increase from the first opening region S1 toward the second opening region S2.

Figure 73:
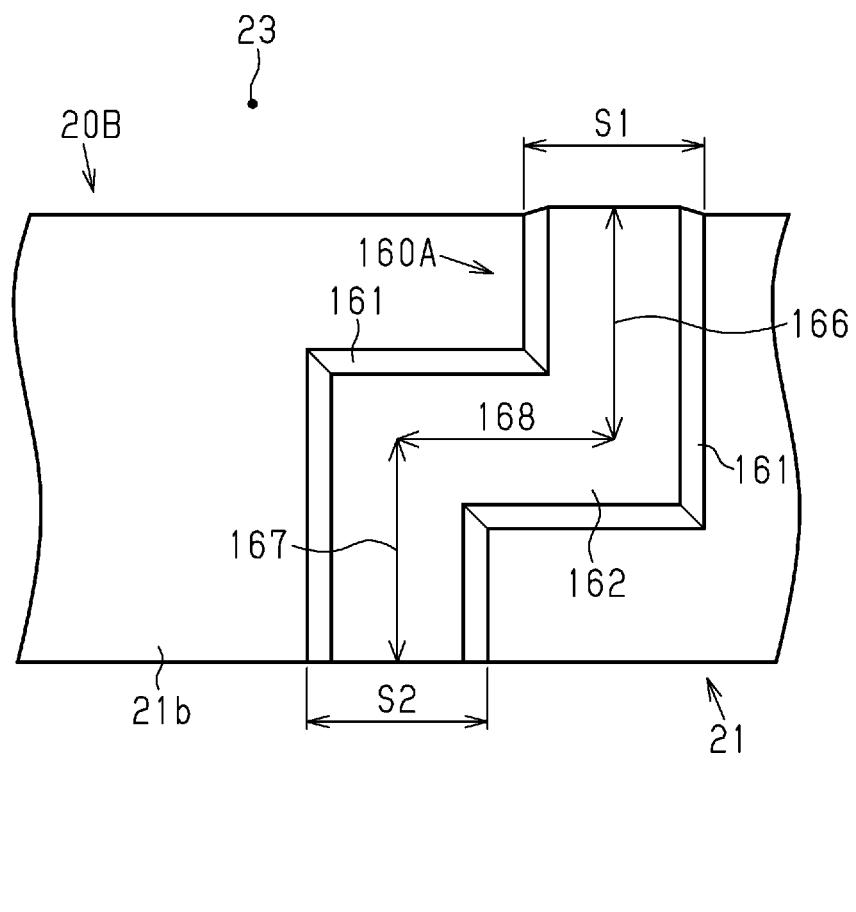
FIG. 73 is a partial bottom view of the frame of a modified example of FIG. 65.

In a fourth example, as shown in FIG. 73, as viewed in the Z-direction, the side wall recess 160A is labyrinth-shaped (crank-shaped). More specifically, the side wall recess 160A includes a first recess 166 including the first opening region S1, a second recess 167 including the second opening region S2, and a third recess 168 connecting the first recess 166 to the second recess 167. In the illustrated example, as viewed in the Z-direction, the first recess 166 and the second recess 167 each extend in the Y-direction. As viewed in the Z-direction, the first recess 166 and the second recess 167 are located at different positions in the X-direction. The third recess 168 extends in a direction intersecting the first recess 166 and the second recess 167. In the illustrated example, the third recess 168 extends in the X-direction. As described above, the vent 160 is labyrinth-shaped (crank-shaped). In other words, the vent 160 includes a first vent defined by the first recess 166 and the substrate front surface 11, a third vent defined by the second recess 167 and the substrate front surface 11, and a second vent defined by the third recess 168 and the substrate front surface 11. More specifically, as a labyrinth structure, the vent 160 includes the first vent extending from the inner surface toward the outer surface of the side wall (second side wall 21*b*) of the case 20B, the second vent connected to the first vent and extending in a direction that intersects the extension direction of the first vent, and the third vent connected to the second vent and extending from the inner surface toward the outer surface of the side wall (second side wall 21*b*). This structure further hinders unintentional entrance of an object.

In FIGS. 64 to 73, the vent 160 is defined by the side wall recess 160A in the case 20B and the substrate front surface 11. However, there is no limitation to such structures. For example, as in a first example and a second example described below, the structure of the vent 160 may be changed.

Figure 74:
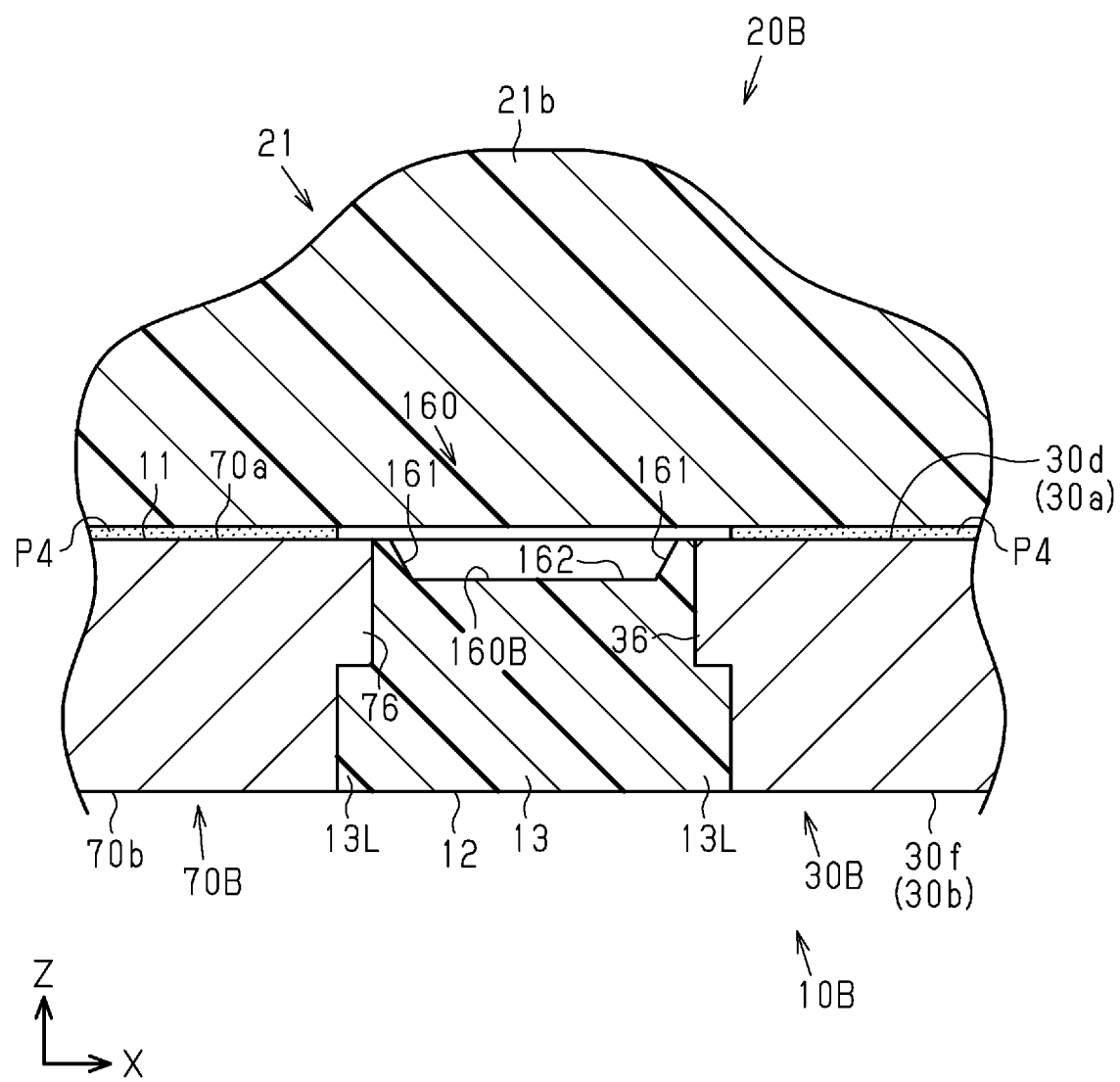
FIG. 74 is a cross-sectional view of a case and a substrate in a modified example of FIG. 66.

In the first example, as shown in FIG. 74, the substrate 10B includes a substrate recess 160B. The vent 160 is defined by the substrate recess 160B and an end surface of the frame 21. In the illustrated example, the vent 160 is defined by the substrate recess 160B and the end surface of the second side wall 21b.

The substrate recess 160B is recessed from the substrate front surface 11 toward the substrate back surface 12. In other words, the substrate recess 160B is recessed in the substrate front surface 11 to be separate from the frame 21 in the Z-direction. In the illustrated example, the substrate recess 160B is formed in the insulation portion 13. In the illustrated example, the shape of the substrate recess 160B is symmetric to the shape of the side wall recess 160A shown in FIG. 66. That is, the substrate recess 160B is defined by the side walls 161 separated from each other and the top wall 162 connecting the side walls 161. The side walls 161 include tapered inclined surfaces that become closer to each other toward the top wall 162. The shape of the substrate recess 160B is not limited to the above structure and may be changed to the side wall recesses 160A shown in FIGS. 67 to 73.

Figure 75:
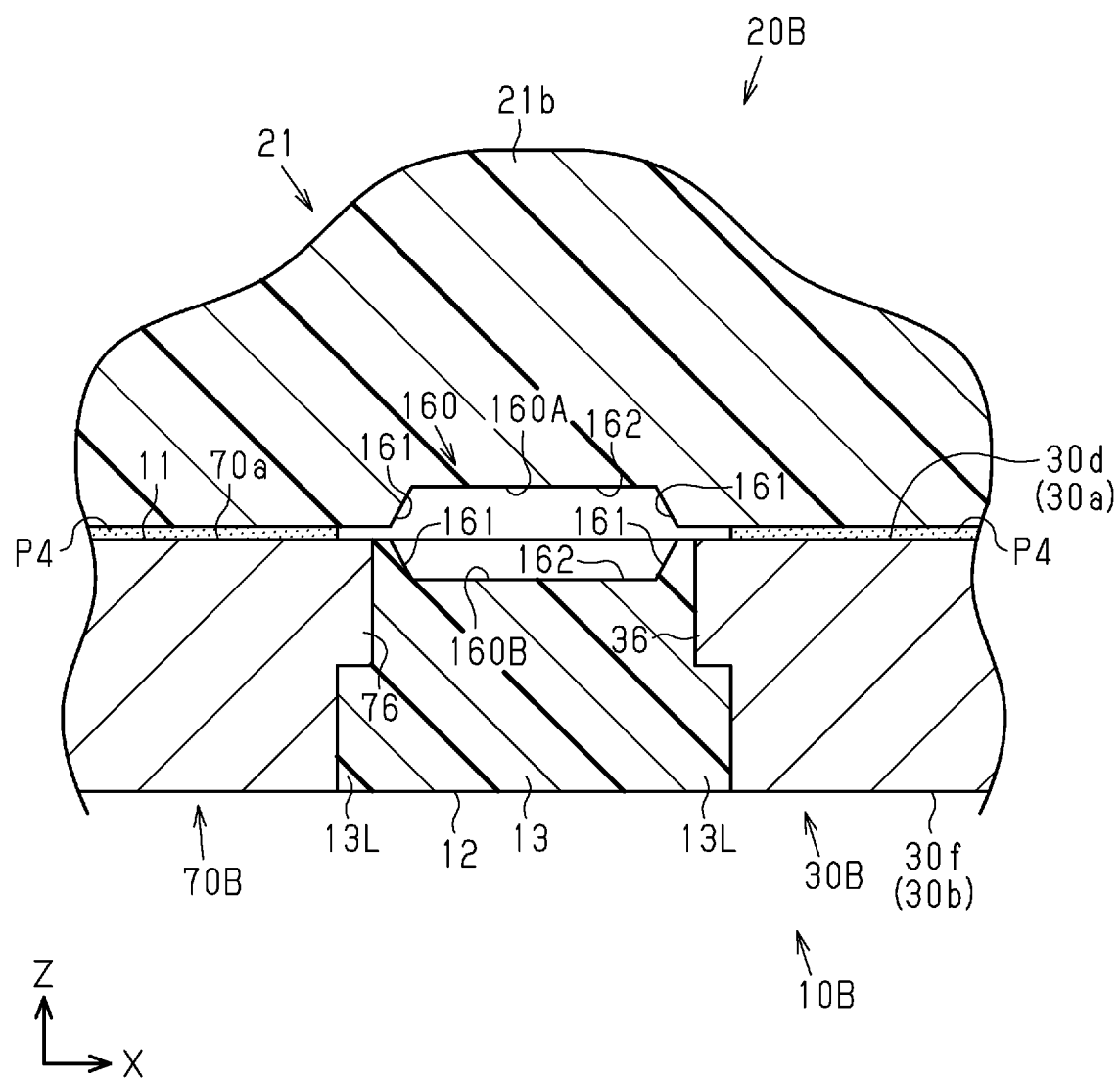
FIG. 75 is a cross-sectional view of a case and a substrate in a modified example of FIG. 66.

In a second example, as shown in FIG. 75, the case 20B includes the side wall recess 160A, and the substrate 10B includes the substrate recess 160B. The vent 160 is defined by the side wall recess 160A and the substrate recess 160B. The side wall recess 160A is symmetrical to the substrate recess 160B. The shape of the side wall recess 160A and the shape of the substrate recess 160B are not limited to those shown in FIG. 75 and may be changed to the shape of the side wall recesses 160A shown in FIGS. 67 to 73. In this case, in a side view of the case 20B, the side wall recess 160A does not have to be symmetrical to the substrate recess 160B.

Figure 76:
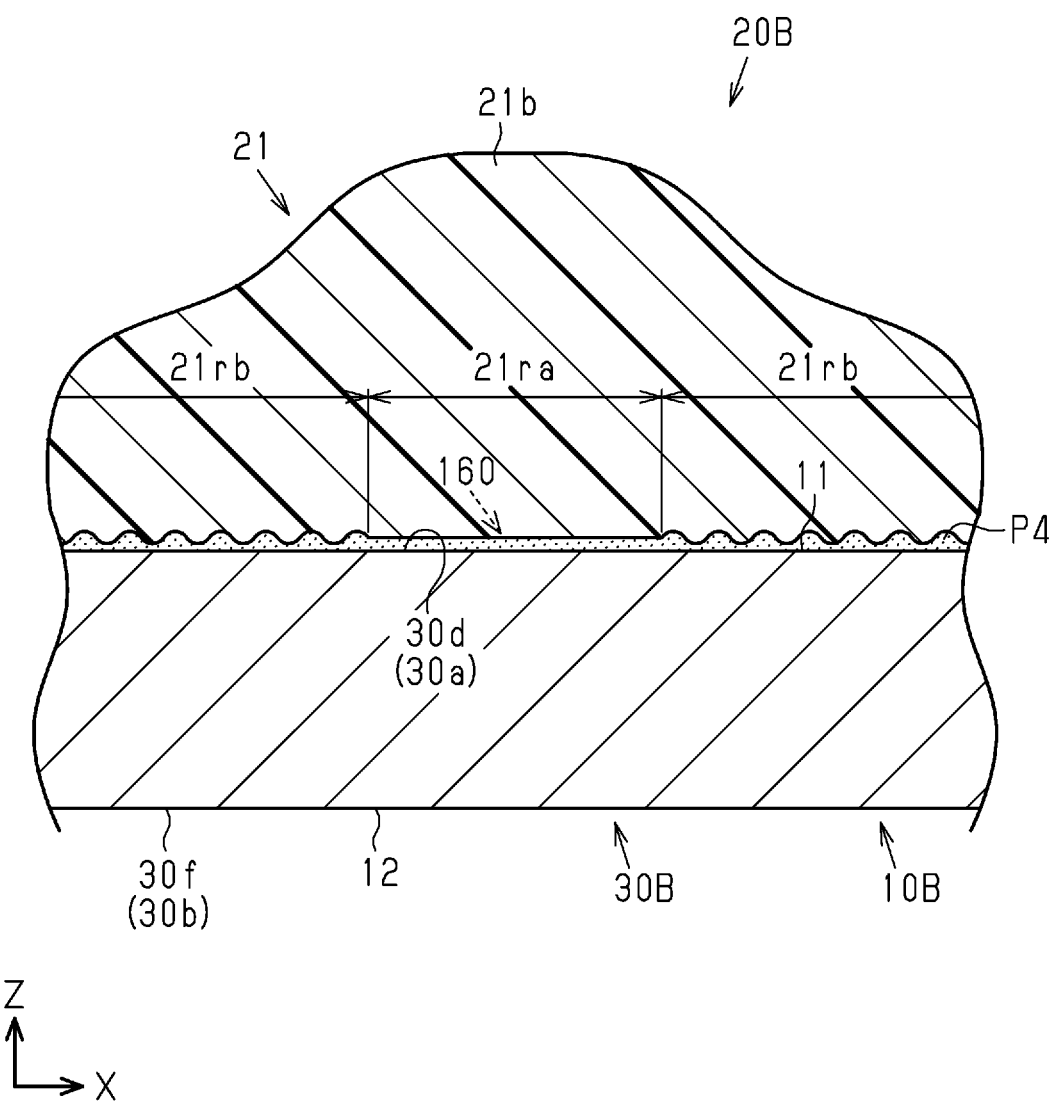
FIG. 76 is a cross-sectional view of a case and a substrate in a modified example of FIG. 66.
Figure 77:
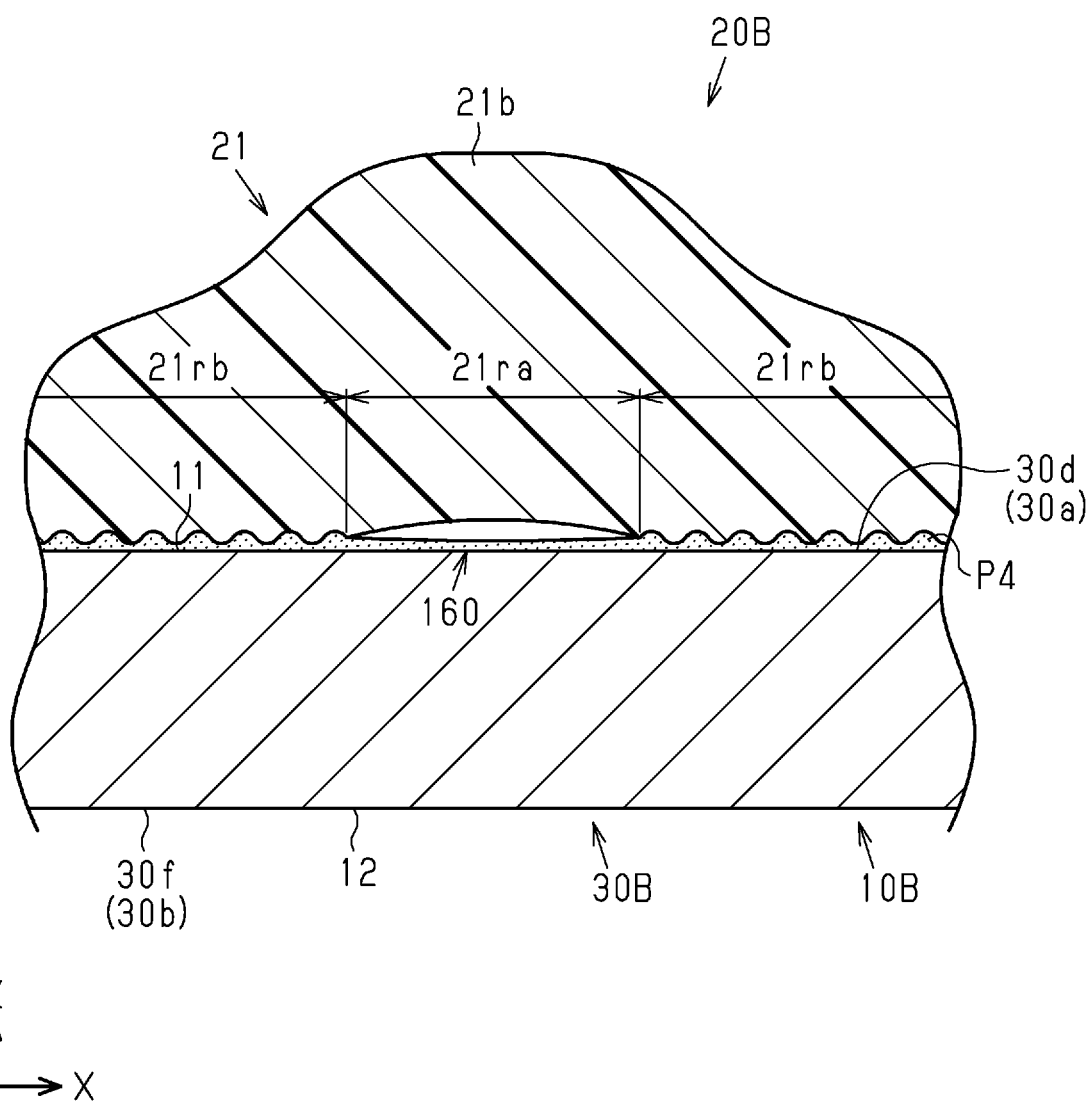
FIG. 77 is a cross-sectional view of the case and the substrate shown in FIG. 76 including a vent.

The structure of the vent 160 is not limited to those shown in FIGS. 64 to 75 and may be a structure obtained by using the difference in the adhesiveness of the case 20B to the substrate 10B. More specifically, as shown in FIGS. 76 and 77, the case 20B and the substrate 10B do not include the side wall recess 160A and the substrate recess 160B. The case 20B shown in FIGS. 76 and 77 has a structure such that an end surface of the frame 21 in the Z-direction is separated into a first region 21ra and a second region 21rb in a peripheral direction of the frame 21. The first region 21ra is substantially smaller than the second region 21rb. The surface roughness of the first region 21ra differs from the surface roughness of the second region 21rb, so that the first region 21ra and the second region 21rb differ from each other in bonding strength to the adhesive agent P4. For example, the surface roughness (Ra) of the first region 21ra is approximately greater than or equal to 0.01 µm and less than or equal to 0.1 µm, and the surface roughness (Ra) of the second region 21rb is approximately greater than or equal to 1.0 µm and less than or equal to 20 µm. The second region 21rb has a greater roughness than the first region 21ra. The thickness of the adhesive agent P4 is, for example, approximately greater than or equal to 15 µm and less than or equal to 40 µm. Examples of a process for forming the second region 21rb as described above include a mechanical process such as sandblasting and a chemical process such as one using a chemical solution. An example of such processes is a chemical process that applies a chemical such as a stripping agent to part of the end surface of the frame 21.

As shown in FIGS. 76 and 77, the vent 160 is the part defined between the adhesive agent P4 and the first region 21ra of the end surface of the frame 21 in the Z-direction. However, during general transportation, storage, and use of the semiconductor light emitting device 1B, the case 20B is bonded to the substrate 10B by the adhesive agent P4 in the first region 21ra. In this state, the vent 160 is not a clear hole that connects the accommodation space 23 to the outside.

FIG. 77 schematically shows that the internal pressure of the accommodation space 23 is increased in a process for mounting the semiconductor light emitting device 1B using, for example, a reflow oven. An increase in the internal pressure of the accommodation space 23 produces force that separates the case 20B from the adhesive agent P4. The force locally separates the bonded portion in the first region 21ra, which is set to have a relatively weak bonding force. As a result, the vent 160 has the form of a gap and connects the accommodation space 23 to the outside. To facilitate understanding, FIG. 77 shows a form in which the vent 160 is a clear gap. However, an actual vent 160 may be any vent that releases gas from the accommodation space 23 to the outside. When the first region 21ra is slightly separated from the adhesive agent P4, the gas is guided from the accommodation space 23 to the outside. When the internal pressure of the accommodation space 23 is decreased as a result of the ventilation, the first region 21ra is again in contact with the adhesive agent P4.

This structure increases the reliability of the semiconductor light emitting device 1B. In addition, the vent 160 including the first region 21ra is closed in general use. That is, the first region 21ra is in contact with the adhesive agent P4. This further ensures the hindrance of unintentional entrance of an object such as moisture. In addition, after the ventilation shown in FIG. 77 is performed, the vent 160 may be again closed. This hinders unintentional entrance of an object even in subsequent use.

The formation position of the vent 160 and the number of vents 160 may be changed in any manner.

When the vent 160 described above is applied to the first embodiment, the side wall recess 160A is arranged in the end surface of the frame 21 that faces the substrate front surface 11 in the Z-direction. The side wall recess 160A is formed from the inner surface to the outer surface of a side wall of the frame 21. The side wall may be at least one of the side walls 21a to 21d of the frame 21.

The vent 160 described above may be applied to the semiconductor light emitting devices 1 and 1B having the partition wall 24 in each embodiment. In this case, the vent 160 includes a first vent that connects the first accommodation space 23A to the outside of the cases 20 and 20B and a second vent that connects the second accommodation space 23B to the outside of the cases 20 and 20B. The first vent is, for example, arranged in one of the side walls 21a to 21d defining the first accommodation space 23A. The second vent is, for example, arranged in one of the side walls 21a to 21d defining the second accommodation space 23B.

Figure 78:
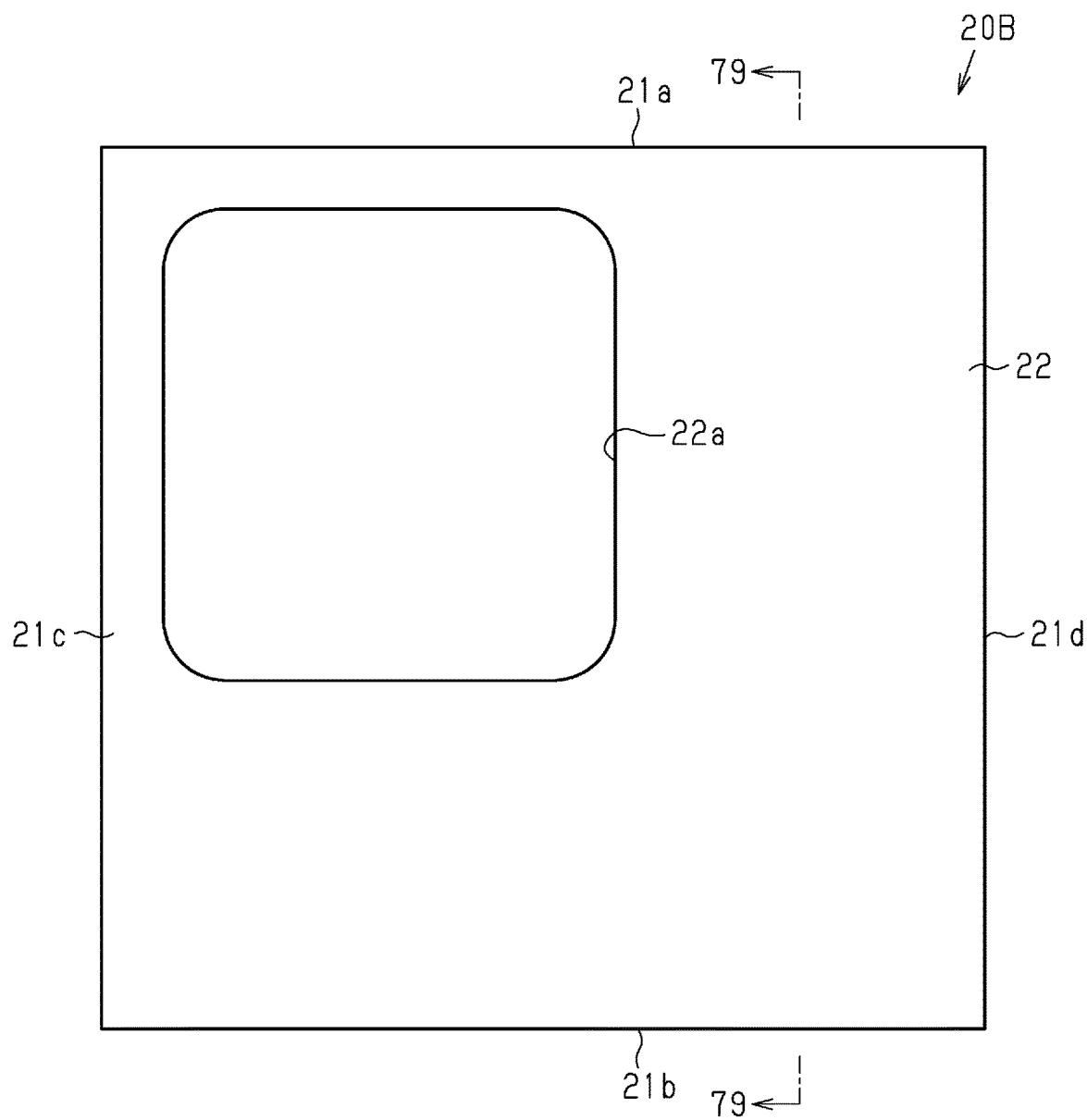
FIG. 78 is a front view of a case in a modified example.
Figure 79:
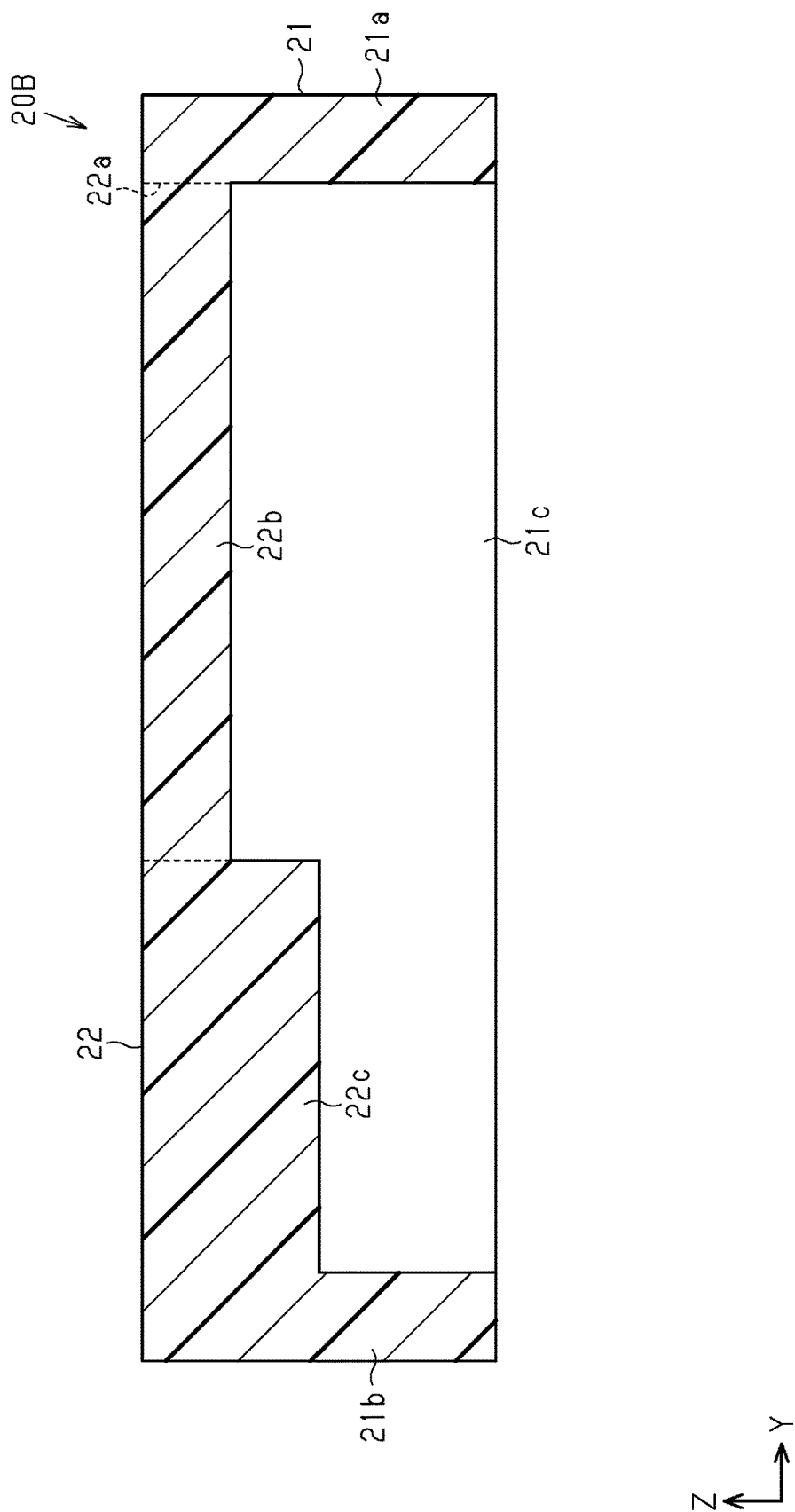
FIG. 79 is a cross-sectional view taken along line 79-79 in FIG. 78.
Figure 80:
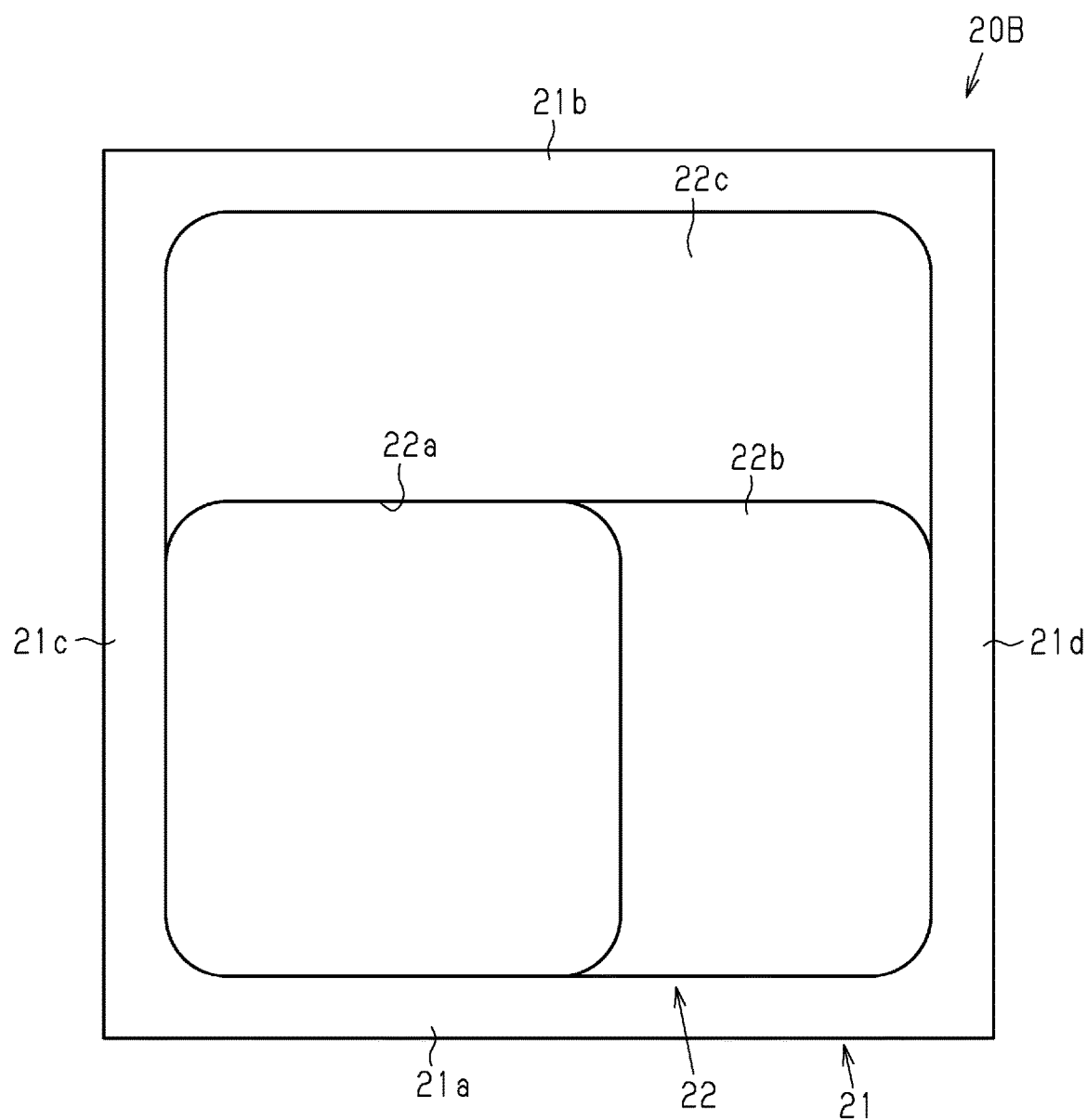
FIG. 80 is a bottom view of the case shown in FIG. 78.

In the second embodiment, the opening 22a in the case 20B may be changed in any manner. In an example, as shown in FIGS. 78 to 80, the shape of the opening 22a may be a square in plan view. In the illustrated example, the square opening 22a is obtained by extending the dimension of the opening 22a in the Y-direction in the second embodiment. In this case, as shown in FIGS. 79 and 80, in the accommodation space 23, the first part 22b, which is part of the cover 22 located at the same position as the opening 22a in the Y-direction, has a smaller thickness than the second part 22c, which is part of the cover 22 located closer to the second side wall 21b than the opening 22a. In other words, the second part 22c has a larger thickness than the first part 22b. As shown in FIG. 80, the first part 22b is located adjacent to the opening 22a in the X-direction and extends from the opening 22a to the fourth side wall 21d. The second part 22c extends from the third side wall 21c to the fourth side wall 21d in the X-direction. The shape of the opening 22a in plan view is not limited to an equiangular parallelogram such as a square or a rectangle and may be a circle, an ellipse, or an oval.

In each embodiment, the structure for accommodating the semiconductor light emitting element 80 and the electronic component 100 may be changed in any manner. In an example, in the semiconductor light emitting device 1, the semiconductor light emitting element 80 and the electronic component 100 may be encapsulated by an encapsulation resin instead of the case 20. In the semiconductor light emitting device 1B, the semiconductor light emitting element 80, the electronic component 100, and the capacitor 120 may be encapsulated by an encapsulation resin instead of the case 20B.

Figure 81:
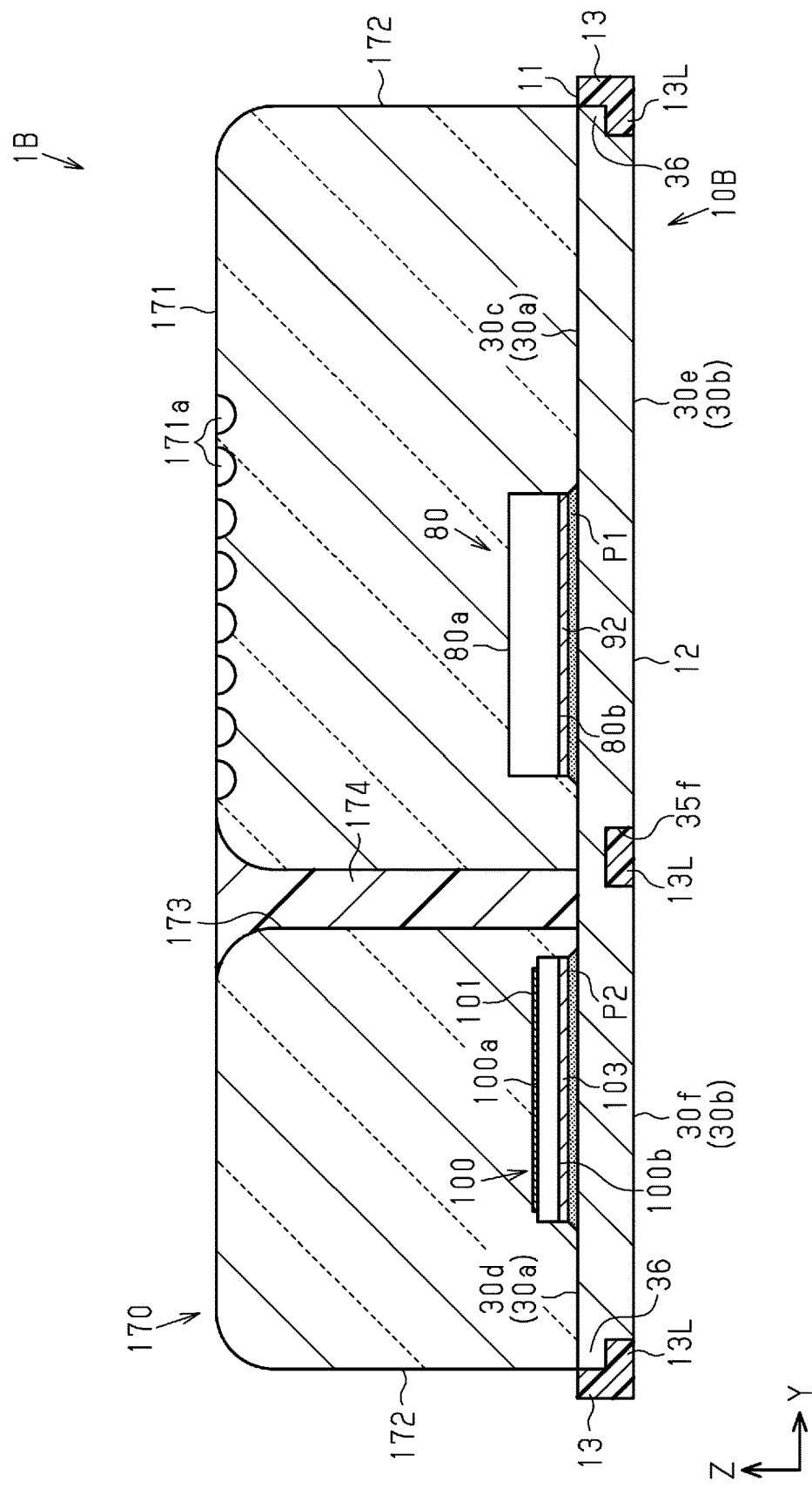
FIG. 81 is a cross-sectional view showing the semiconductor light emitting device in a modified example.

In a specific example, as shown in FIG. 81, the semiconductor light emitting device 1B includes a light-transmissive encapsulation resin 170 that encapsulates the semiconductor light emitting element 80, the electronic component 100, and the capacitor 120. The encapsulation resin 170 is rectangular-box-shaped. The encapsulation resin 170 is formed from an electrically insulative resin material. The encapsulation resin 170 includes an upper surface 171 and side surfaces 172. Recesses 171a are formed in part of the upper surface 171 facing the semiconductor light emitting element 80 in the Z-direction. The recesses 171a are, for example, separated from each other in the X-direction and the Y-direction. This allows for diffusion of light from the semiconductor light emitting element 80.

A cutaway portion 173 is formed in the encapsulation resin 170 between the semiconductor light emitting element 80 and the electronic component 100 in the Y-direction. The cutaway portion 173 includes a light-blocking wall 174. In an example, the light-blocking wall 174 is formed by filling the cutaway portion 173 with a light-blocking material. An example of the light-blocking material is a colored resin material. This structure limits irradiation of the electronic component 100 with light from the semiconductor light emitting element 80, thereby limiting erroneous actuation of the electronic component 100. As viewed in the Z-direction, the shape of each of the cutaway portion 173 and the light-blocking wall 174 is, for example, the same as the shape of the partition wall 24 shown in FIG. 61 or 62. Instead of forming the light-blocking wall 174 by filling the cutaway portion 173 with a light-blocking material, for example, the light-blocking wall 174 may be plate-shaped in advance and inserted into the cutaway portion 173.

Figure 82:
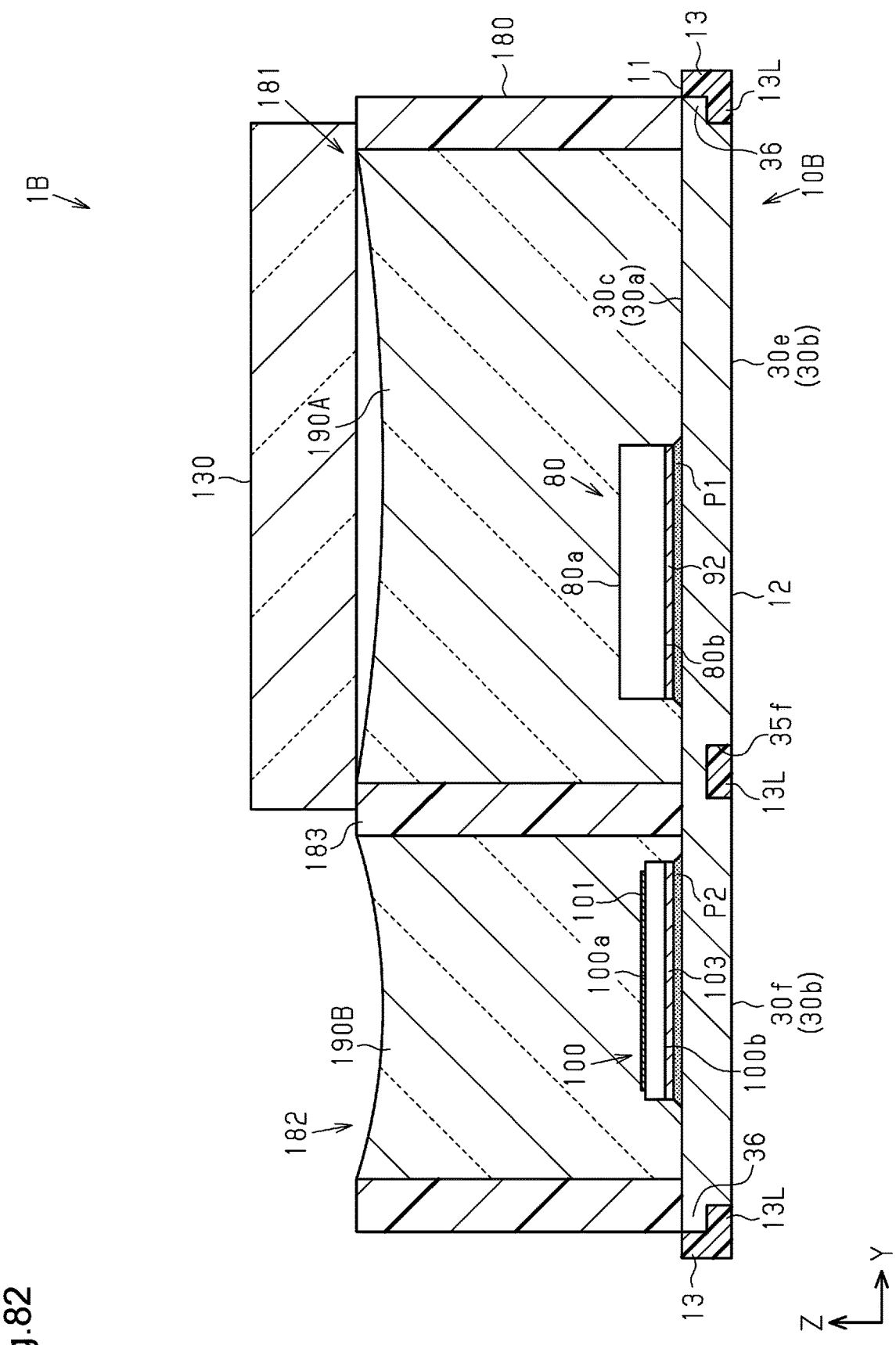
FIG. 82 is a cross-sectional view showing the semiconductor light emitting device in a modified example.

In another example, as shown in FIG. 82, the semiconductor light emitting device 1B includes a frame 180. The frame 180 separates the semiconductor light emitting element 80 and the electronic component 100. The frame 180 is, for example, formed from a light-blocking material. In an example, the frame 180 is formed from a colored resin material. The frame 180 includes a partition wall 183 that separates a first receptacle 181 accommodating the semiconductor light emitting element 80 and a second receptacle 182 accommodating the electronic component 100. In the illustrated example, the partition wall 183 and the frame 180 are integrally formed from the same material. The first receptacle 181 is filled with a first encapsulation resin 190A. The second receptacle 182 is filled with a second encapsulation resin 190B. In the illustrated example, the encapsulation resins 190A and 190B are both transmissive to light. The material of the first encapsulation resin 190A is the same as the material of the second encapsulation resin 190B. The material of the first encapsulation resin 190A may differ from the material of the second encapsulation resin 190B. In an example, the second encapsulation resin 190B may be filled with a light-blocking material. In an example, a light-blocking resin material is used as the second encapsulation resin 190B. As viewed in the Z-direction, the shape of the partition wall 183 is, for example, the same as the shape of the partition wall 24 shown in FIG. 61 or 62. The first encapsulation resin 190A may be omitted.

In the semiconductor light emitting device 1B, the light diffusion plate 130 is attached to the frame 180 to cover the first receptacle 181 in the Z-direction. The light diffusion plate 130 is supported by the partition wall 183 and part of the frame 180. In this structure, the partition wall 183 limits irradiation of the electronic component 100 with light from the semiconductor light emitting element 80, thereby limiting erroneous actuation of the electronic component 100.

In the second embodiment, at least one of the encapsulation resin 140 and the coating agent 141 that covers the electronic component 100 may be omitted (for example, refer to FIG. 63).

In the first embodiment, at least one of the encapsulation resin 140 and the coating agent 141 that covers the electronic component 100 may be added.

In the second embodiment, the coating agent 141 may be applied to only the portion of the conductive bonding material P2, which connects the electronic component 100 to the second common contact front surface portion 30d, extending from the electronic component 100. Thus, sulfidation of the conductive bonding material P2 is inhibited. Also, in the first embodiment, the coating agent 141 may be applied to only the portion of the conductive bonding material P2 extending from the electronic component 100.

In the second embodiment, one of the two recesses 35b may be omitted from the common conductive portion 30B. Also, one of the two recesses 35c may be omitted from the common conductive portion 30B. Also, at least one of the recess 35a, the two recesses 35b, the two recesses 35c, the recess 35d, and the recess 35e may be omitted from the common conductive portion 30B.

In the second embodiment, the control conductive portion 70B may include at least one recess. The recess has the same structure as, for example, the recess 35a.

In the second embodiment, the first common contact back surface portion 30e may be continuous with the second common contact back surface portion 30f. That is, the recess 35f may be omitted from the common conductive portion 30B. This structure increases the size of the common contact back surface 30b, thereby improving the heat dissipation efficiency of the semiconductor light emitting element 80 and the electronic component 100.

In the second embodiment, the common conductive portion 30B may include a groove arranged between the semiconductor light emitting element 80 and the electronic component 100 and recessed from the common contact front surface 30a toward the substrate back surface 12 in the Z-direction. In an example, the groove extends through the common conductive portion 30B in the X-direction. The groove is free of the insulation portion 13. In this case, the recess 35f may be omitted from the common conductive portion 30B. This structure hinders the encapsulation resin 140 and the coating agent 141 from entering the light emitting regions 90 of the semiconductor light emitting element 80. The groove does not have to extend through the common conductive portion 30B in the X-direction. The number of grooves may be changed. The common conductive portion 30B may include a plurality of grooves.

In the second embodiment, the first drive contact back surface portion 60e may be continuous with the second drive contact back surface portion 60f. That is, the recess 65a may be omitted from the drive conductive portion 60B.

In the second embodiment, the position of the semiconductor light emitting element 80 relative to the first common contact front surface portion 30c in the Y-direction may be changed in any manner. In an example, the semiconductor light emitting element 80 may be disposed on the central part of the first common contact front surface portion 30c in the Y-direction or a part of the first common contact front surface portion 30c located toward the first side wall 21a. The semiconductor light emitting element 80 may be disposed on the first common contact front surface portion 30c so as not to extend to the element contact front surface 50a in the Y-direction.

In the second embodiment, the position of the semiconductor light emitting element 80 relative to the first common contact front surface portion 30c in the X-direction may be changed in any manner. In an example, the semiconductor light emitting element 80 may be disposed on the central part of the first common contact front surface portion 30c in the X-direction or a part of the first common contact front surface portion 30c located toward the third side wall 21c.

In the second embodiment, the position of the electronic component 100 relative to the second common contact front surface portion 30d in the Y-direction may be changed in any manner. In an example, the electronic component 100 may be disposed on the central part of the second common contact front surface portion 30d in the Y-direction or a part of the second common contact front surface portion 30d located toward the second side wall 21b.

In the second embodiment, the position of the electronic component 100 relative to the second common contact front surface portion 30d in the X-direction may be changed in any manner. In an example, the electronic component 100 may be disposed on a part of the second common contact front surface portion 30d located toward the second drive contact front surface portion 60d or a part of the second common contact front surface portion 30d located toward the control contact front surface 70a.

In the second embodiment, the semiconductor light emitting element 80 and the electronic component 100 may be aligned with each other in the X-direction and separated from each other in the Y-direction.

In the second embodiment, as viewed in the X-direction, the capacitor 120 may overlap the electronic component 100.

In the second embodiment, the number of capacitors 120 incorporated in the semiconductor light emitting device 1B may be changed in any manner. For example, the semiconductor light emitting device 1B may include a plurality of capacitors 120.

In the second embodiment, the shape of the contact front surfaces 30a, 50a, 60a, and 70a may be changed in any manner. For example, the common contact front surface 30a may be smaller than the element contact front surface 50a. The drive contact front surface 60a and the control contact front surface 70a may be larger than the element contact front surface 50a. The contact front surfaces 30a, 50a, 60a, and 70a may all have the same size. Alternatively, some of the contact front surfaces 30a, 50a, 60a, and 70a may have the same size, while the remaining contact front surfaces differ from each other in size. At least one of the contact front surfaces 30a, 50a, 60a, and 70a may be elliptical or circular.

In the second embodiment, the size of the first common contact front surface portion 30c may be changed in any manner. In an example, the first common contact front surface portion 30c may be smaller than or equal to the drive contact front surface 60a. In another example, the first common contact front surface portion 30c may be smaller than or equal to at least one of the element contact front surface 50a and the control contact front surface 70a.

In the second embodiment, the size of the second common contact front surface portion 30d may be changed in any manner. In an example, the second common contact front surface portion 30d may be smaller than or equal to the drive contact front surface 60a. In another example, the second common contact front surface portion 30d may be smaller than or equal to at least one of the element contact front surface 50a and the control contact front surface 70a.

In the second embodiment, the size of the first drive contact front surface portion 60c may be changed in any manner. In an example, the first drive contact front surface portion 60c may be larger than or equal to the element contact front surface 50a. In another example, the first drive contact front surface portion 60c may be smaller than or equal to the control contact front surface 70a.

In the second embodiment, the size of the second drive contact front surface portion 60d may be changed in any manner. In an example, the second drive contact front surface portion 60d may be larger than or equal to the element contact front surface 50a. In another example, the second drive contact front surface portion 60d may be smaller than or equal to the control contact front surface 70a.

In the second embodiment, the shape of the contact back surfaces 30b, 50b, 60b, and 70b may be changed in any manner. For example, the common contact back surface 30b may be smaller than the element contact back surface 50b. The drive contact back surface 60b and the control contact back surface 70b may be larger than the element contact back surface 50b. The contact back surfaces 30b, 50b, 60b, and 70b may all have the same size. Alternatively, some of the contact back surfaces 30b, 50b, 60b, and 70b may have the same size while the remaining contact back surfaces differ from each other in size. At least one of the contact back surfaces 30b, 50b, 60b, and 70b may be elliptical or circular.

In the second embodiment, the size of the first common contact back surface portion 30e may be changed in any manner. In an example, the first common contact back surface portion 30e may be smaller than or equal to the drive contact back surface 60b. In another example, the first common contact back surface portion 30e may be smaller than or equal to at least one of the element contact back surface 50b and the control contact back surface 70b.

In the second embodiment, the size of the second common contact back surface portion 30f may be changed in any manner. In an example, the second common contact back surface portion 30f may be smaller than or equal to the drive contact back surface 60b. In another example, the second common contact back surface portion 30f may be smaller than or equal to at least one of the element contact back surface 50b and the control contact back surface 70b.

In the second embodiment, the size of the first drive contact back surface portion 60e may be changed in any manner. In an example, the first drive contact back surface portion 60e may be larger than or equal to the element contact back surface 50b. In another example, the first drive contact back surface portion 60e may be smaller than or equal to the control contact back surface 70b.

In the second embodiment, the size of the second drive contact back surface portion 60f may be changed in any manner. In an example, the second drive contact back surface portion 60f may be larger than or equal to the element contact back surface 50b. In another example, the second drive contact back surface portion 60f may be smaller than or equal to the control contact back surface 70b.

In the second embodiment, the flange 36 may be omitted from the common conductive portion 30B. The flange 56 may be omitted from the element conductive portion 50B. The flange 66 may be omitted from the drive conductive portion 60B. The flange 76 may be omitted from the control conductive portion 70B.

In the second embodiment, the light diffusion plate 130 may be omitted from the semiconductor light emitting device 1B.

In the second embodiment, the height of the semiconductor light emitting element 80 from the substrate front surface 11 and the height of the electronic component 100 from the substrate front surface 11 may be changed in any manner. In an example, the height of the electronic component 100 from the substrate front surface 11 may be greater than or equal to the height of the semiconductor light emitting element 80 from the substrate front surface 11.

In the second embodiment, the position of the flange 36 relative to the common conductive portion 30B in the Z-direction may be changed in any manner. In an example, the flange 36 may be formed toward the common contact back surface 30b rather than the common contact front surface 30a. The flange 36 may be flush with the common contact back surface 30b.

In the second embodiment, the position of the flange 56 relative to the element conductive portion 50B in the Z-direction may be changed in any manner. In an example, the flange 56 may be formed toward the element contact back surface 50b rather than the element contact front surface 50a. The flange 56 may be flush with the element contact back surface 50b.

In the second embodiment, the position of the flange 66 relative to the drive conductive portion 60B in the Z-direction may be changed in any manner. In an example, the flange 66 may be formed toward the drive contact back surface 60b rather than the drive contact front surface 60a. The flange 66 may be flush with the drive contact back surface 60b.

In the second embodiment, the number of capacitors 120 may be changed in any manner. In an example, the semiconductor light emitting device 1B includes two capacitors 120.

In the second embodiment, the position of the flange 76 relative to the control conductive portion 70B in the Z-direction may be changed in any manner. In an example, the flange 76 may be formed toward the control contact back surface 70b rather than the control contact front surface 70a. The flange 76 may be flush with the control contact back surface 70b.

In the second embodiment, the structure of the substrate 10B may be changed in any manner. In an example, the semiconductor light emitting device 1B may include a substrate formed from an insulative material like the substrate 10 of the first embodiment instead of a substrate formed of a lead frame. In this case, the substrate may be, for example, a ceramic such as alumina or aluminum nitride, a silicon substrate, or a glass epoxy. The substrate includes a common conductive portion 30B, an element conductive portion 50B, a drive conductive portion 60B, and a control conductive portion 70B that include, for example, a front surface conductive layers formed on the substrate front surface, back surface conductive layers formed on the substrate back surface, and joints electrically connecting the front surface conductive layers to the back surface conductive layers.

Figure 83:
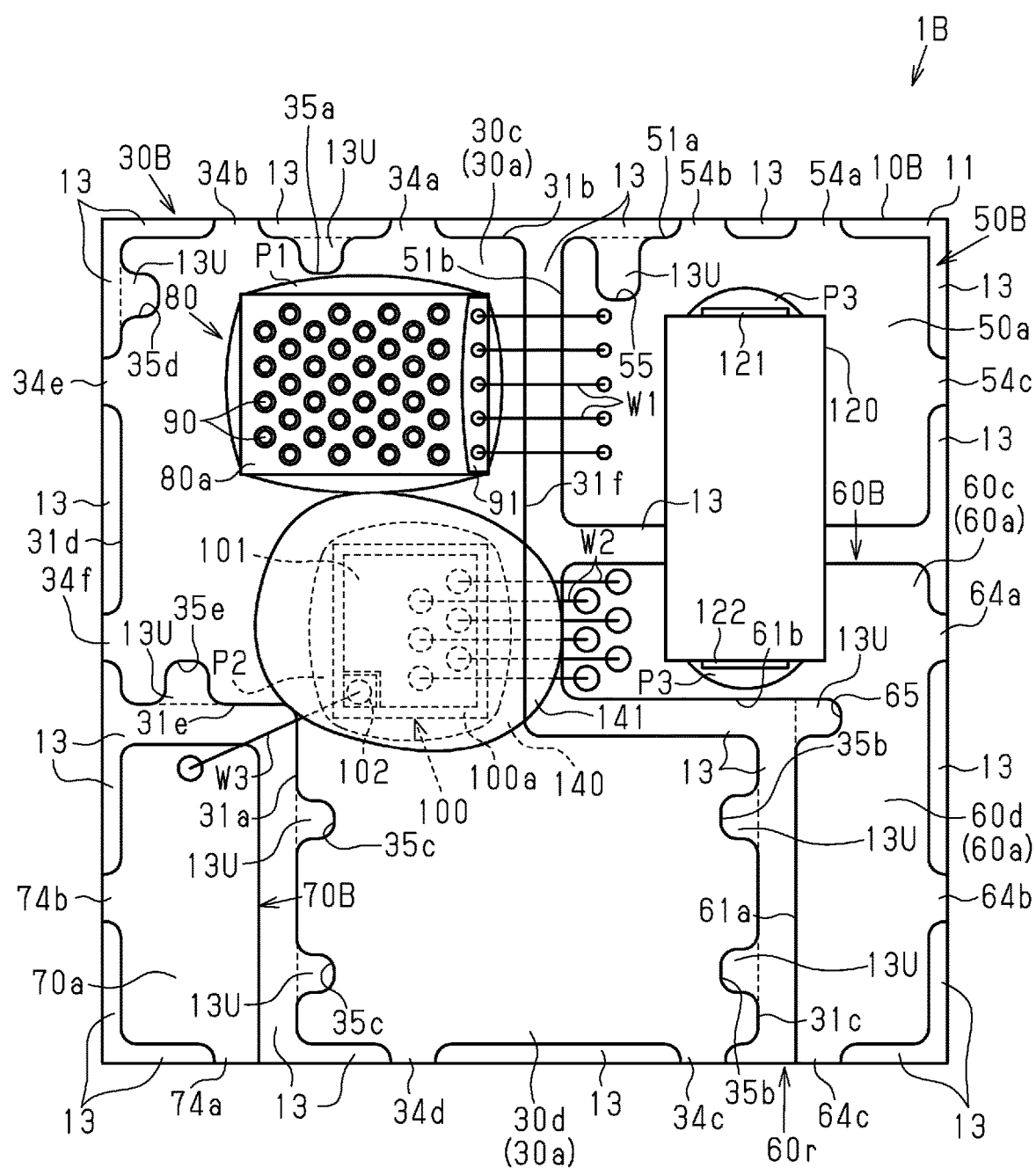
FIG. 83 is a front view showing a modified example of a semiconductor light emitting device with a case removed.

In each embodiment, the positions of the semiconductor light emitting element 80 and the electronic component 100 on the common contact front surface 30a of the common conductive portion 30B may be changed in any manner. In an example, as shown in FIG. 83, the semiconductor light emitting element 80 and the electronic component 100 may be disposed on the first common contact front surface portion 30c of the common conductive portion 30B. In the illustrated example, as viewed in the X-direction, the semiconductor light emitting element 80 and the electronic component 100 overlap with the capacitor 120.

The semiconductor light emitting element 80 is disposed on the first common contact front surface portion 30c close to the end 31b in the Y-direction. The semiconductor light emitting element 80 is disposed on a part of the first common contact front surface portion 30c opposed to the element conductive portion 50B in the X-direction. In the illustrated example, the semiconductor light emitting element 80 is disposed on the first common contact front surface portion 30c closer to the end 31b in the Y-direction than the insulation portion 13 that is located between the element conductive portion 50B and the drive conductive portion 60B. In this case, as viewed from above, the wires W1 extend in the X-direction. The semiconductor light emitting element 80 is also disposed on the first common contact front surface portion 30c toward the element conductive portion 50B in the X-direction.

The electronic component 100 is disposed on an end of the first common contact front surface portion 30c located close to the second common contact front surface portion 30d in the Y-direction. More specifically, the electronic component 100 is disposed on a part of the first common contact front surface portion 30c opposed to the first drive contact front surface portion 60c of the drive conductive portion 60B in the X-direction. In this case, the wires W2 are connected to the first drive contact front surface portion 60c. The electronic component 100 is also disposed on the first common contact front surface portion 30c toward the drive conductive portion 60B in the Y-direction. The wire W3 is connected to one of the opposite ends of the control conductive portion 70B in the Y-direction that is located closer to the first common contact front surface portion 30c.

As viewed in the X-direction, the semiconductor light emitting element 80 may partially extend closer to toward the end 31b of the common conductive portion 30B than the capacitor 120. The electronic component 100 may partially extend from the first common contact front surface portion 30c to the second common contact front surface portion 30d in the Y-direction.

The structure shown in FIG. 83 shortens the conductive path between the semiconductor light emitting element 80 and the electronic component 100 and the conductive path between the electronic component 100 and the capacitor 120. Accordingly, parasitic capacitance caused by the conductive path between the semiconductor light emitting element 80 and the electronic component 100 and parasitic capacitance caused by the conductive path between the electronic component 100 and the capacitor 120 are decreased.

Figure 84:
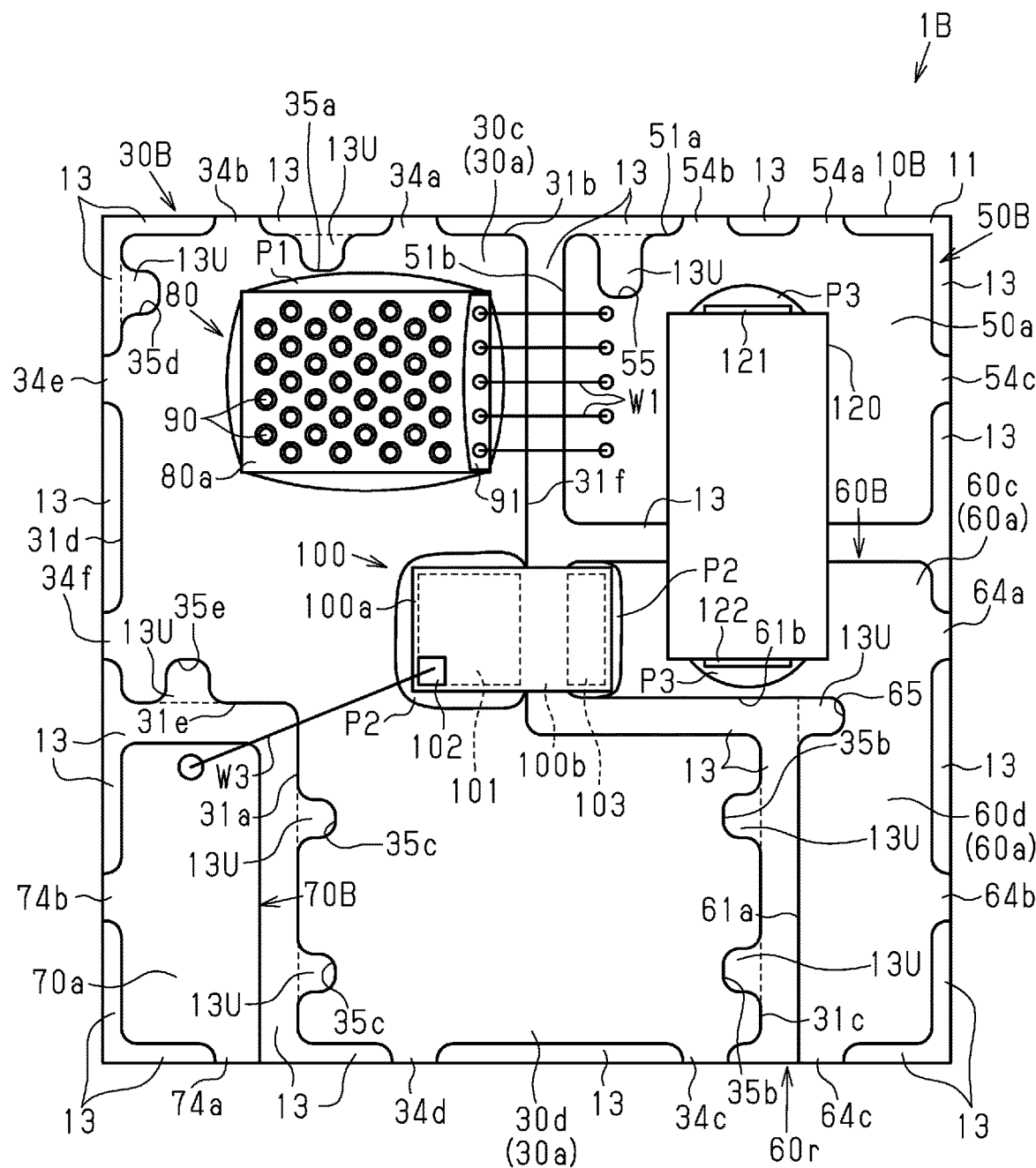
FIG. 84 is a front view showing a modified example of a semiconductor light emitting device with a case removed.

In each electronic component, the structure of the electronic component 100 may be changed in any manner. In an example, as shown in FIG. 84, the first drive electrode 101 and the second drive electrode 103 of the electronic component 100 are formed on the lower surface 100b of the electronic component 100. The control electrode 102 is formed on the upper surface 100a of the electronic component 100. The first drive electrode 101 and the second drive electrode 103 of the electronic component 100 are aligned with each other in the Y-direction and separated from each other in the X-direction. FIG. 84 does not show the encapsulation resin 140 and the coating agent 141 for the sake of convenience.

As shown in FIG. 84, the electronic component 100 may be flip-chip-mounted on the common contact front surface 30a of the common conductive portion 30B and the drive contact front surface 60a of the drive conductive portion 60B. In this case, the electronic component 100 extends over the insulation portion 13 located between the common conductive portion 30B and the drive conductive portion 60B. The first drive electrode 101 faces the first common contact front surface 30c of the common conductive portion 30B in the Z-direction. The second drive electrode 103 faces the first drive contact front surface 60c of the drive conductive portion 60B in the Z-direction.

More specifically, in the Z-direction, the first drive electrode 101 is bonded to part of the first common contact front surface portion 30c opposed to the first drive contact front surface portion 60c of the drive conductive portion 60B in the X-direction. The second drive electrode 103 is bonded to one of the opposite ends of the first drive contact front surface portion 60c in the X-direction located closer to the first common contact front surface portion 30c.

When the electronic component 100 is disposed in this manner, the semiconductor light emitting element 80 is located on the common contact front surface 30a close to the end 31b in the Y-direction. More specifically, the semiconductor light emitting element 80 is disposed on a part of the first common contact front surface portion 30c opposed to the element conductive portion 50B in the X-direction.

The structure shown in FIG. 84 shortens the conductive path between the semiconductor light emitting element 80 and the electronic component 100 and the conductive path between the electronic component 100 and the capacitor 120. Accordingly, parasitic capacitance caused by the conductive path between the semiconductor light emitting element 80 and the electronic component 100 and parasitic capacitance caused by the conductive path between the electronic component 100 and the capacitor 120 are decreased. In addition, when the electronic component 100 is flip-chip-mounted on the common contact front surface 30a and the drive contact front surface 60a, parasitic capacitance between the electronic component 100 and the drive contact front surface 60a is decreased as compared to when the first drive electrode 101 is connected to the drive contact front surface 60a by the wires W2.

Figure 85:
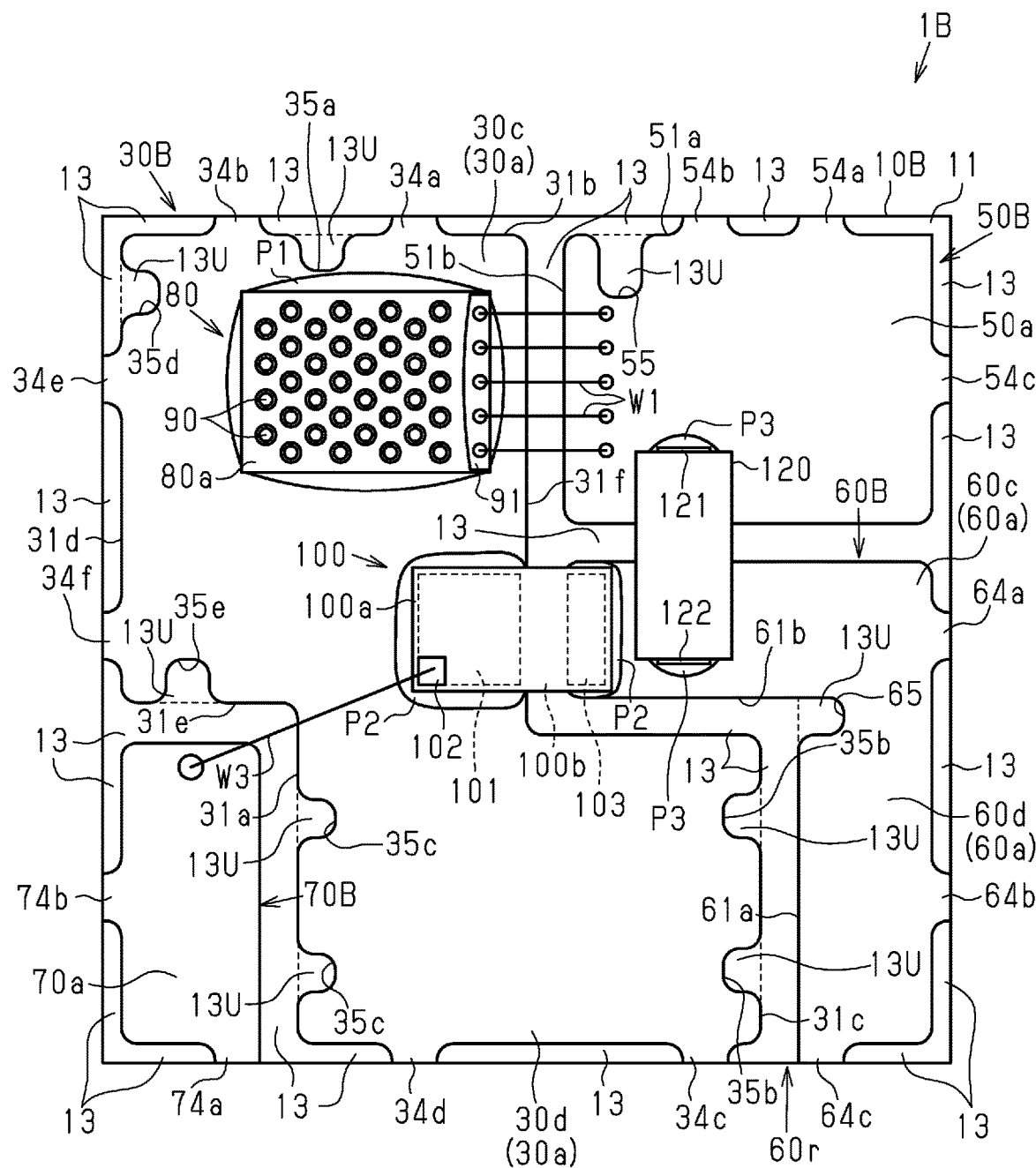
FIG. 85 is a front view showing a modified example of a semiconductor light emitting device with a case removed.

In the modified example shown in FIG. 84, the capacity of the capacitor 120 may be reduced. Accordingly, as shown in FIG. 85, the capacitor 120 may be located closer to the semiconductor light emitting element 80 and the electronic component 100. More specifically, the first electrode 121 of the capacitor 120 is located adjacent to one of the wires W1 of the semiconductor light emitting element 80 located closer to the drive conductive portion 60B in the X-direction. The second electrode 122 of the capacitor 120 is located adjacent to the electronic component 100 in the X-direction. FIG. 85 does not show the encapsulation resin 140 and the coating agent 141 for the sake of convenience.

The structure shown in FIG. 85 shortens the conductive path between the semiconductor light emitting element 80 and the electronic component 100, the conductive path between the semiconductor light emitting element 80 and the capacitor 120, and the conductive path the electronic component 100 and the capacitor 120. Accordingly, parasitic capacitance caused by the conductive path between the semiconductor light emitting element 80 and the electronic component 100, parasitic capacitance caused by the conductive path between the semiconductor light emitting element 80 and the capacitor 120, and parasitic capacitance caused by the conductive path between the electronic component 100 and the capacitor 120 are decreased.

In the modified examples shown in FIGS. 83 to 85, the semiconductor light emitting element 80 may include a first electrode 91 and a second electrode 92 formed on the lower surface 80b of the semiconductor light emitting element 80. The first electrode 91 and the second electrode 92 are, for example, aligned with each other in the Y-direction and separated from each other in the X-direction. In this case, the semiconductor light emitting element 80 is flip-chip-mounted on the common contact front surface 30a of the common conductive portion 30B and the element contact front surface 50a of the element conductive portion 50B. Therefore, the semiconductor light emitting element 80 extends over the insulation portion 13 located between the common conductive portion 30B and the element conductive portion 50B. The first electrode 91 faces the element contact front surface 50a of the element conductive portion 50B in the Z-direction. The second electrode 92 faces the first common contact front surface portion 30c in the Z-direction.

CLAUSES

The technical ideas obtainable from the above embodiments and modified examples are described below.

Clause A1

A semiconductor light emitting device, including
a substrate formed from an insulative material;
a common front surface conductive layer formed on a front surface of the substrate;
a semiconductor light emitting element disposed on a common contact front surface formed of a front surface of the common front surface conductive layer, and
an electronic component disposed on the common contact front surface and electrically connected to the semiconductor light emitting element by the common front surface conductive layer.

Clause A2

A semiconductor light emitting device, including
a substrate formed from a conductive material;
a common conductive portion formed of a portion of the substrate and including a common contact front surface formed of a front surface of the substrate;
a semiconductor light emitting element disposed on the common contact front surface; and
an electronic component disposed on the common contact front surface and electrically connected to the semiconductor light emitting element by the common conductive portion.

Clause A3

An electronic apparatus on which a semiconductor light emitting device is mounted.

Clause B1

The semiconductor light emitting device, in which
the substrate includes a substrate contact surface that is in contact with a side wall of the frame,
the substrate contact surface includes a substrate recess recessed downward from the substrate contact surface and formed from an inner surface to an outer surface of the side wall of the case, and
the vent is defined by the side wall of the frame and the substrate recess.

Clause B2

The semiconductor light emitting device, in which
a side wall of the frame includes a side wall contact surface that is in contact with the substrate,
the side wall contact surface includes a recess upwardly recessed from the side wall contact surface and formed from an inner surface to an outer surface of the side wall,
the substrate includes a substrate contact surface that is in contact with the side wall of the frame,
the substrate contact surface includes a substrate recess downwardly recessed from the substrate contact surface and formed from the inner surface to the outer surface of the side wall of the frame, and
the vent is defined by the side wall recess and the substrate recess.

Clause B3

The semiconductor light emitting device according to any one of clauses B1 and B2, in which the vent has a labyrinth structure.

Clause B4

The semiconductor light emitting device according to clause B3, in which as the labyrinth structure, the vent includes a first vent extending from an inner surface toward an outer surface of the side wall of the frame, a second vent connected to the first vent and extending in a direction that intersects an extension direction of the first vent, and a third vent connected to the second vent and extending from the inner surface toward the outer surface.

Clause B5

The semiconductor light emitting device according to any one of clauses B1 and B2, in which as viewed in a direction orthogonal to the planar direction, the vent extends in a direction inclined from a direction orthogonal to an extension direction of the side wall of the frame.

Clause B6

The semiconductor light emitting device according to any one of clauses B1 and B2, in which as viewed in the planar direction, the vent extends in a direction in which the side wall of the frame extends.

Clause B7

The semiconductor light emitting device according to any one of clauses B1 and B2, in which
the side wall recess includes an inner opening region that is open in an inner surface of the side wall of the frame,
the side wall recess includes an outer opening region that is open in an outer surface of the side wall of the frame, and
the inner opening region is smaller than the outer opening region.

Clause B8

The semiconductor light emitting device according to any one of clauses B1 and B2, in which
the side wall recess includes an inner opening region that is open in an inner surface of the side wall of the frame,
the side wall recess includes an outer opening region that is open in an outer surface of the side wall of the frame, and
the inner opening region is larger than the outer opening region.

Clause B9

The semiconductor light emitting device according to any one of clauses B1 and B2, in which
the side wall recess includes an inner opening region that is open in an inner surface of the side wall of the frame,
the side wall recess includes an outer opening region that is open in an outer surface of the side wall of the frame, and
the inner opening region is equal to the outer opening region.

Clause B10

The semiconductor light emitting device, in which
the frame is disposed inward from a peripheral edge of the substrate front surface,
as viewed in a direction orthogonal to the planar direction of the substrate, at least one of the common conductive portion, the control conductive portion, the element conductive portion, the drive conductive portion, and the control conductive portion includes a projection extending outward from the frame.

Clause C1

The semiconductor light emitting device, in which
the electronic component has a lower surface on which a first drive electrode and a second drive electrode are formed,
the second drive electrode is bonded to the common conductive portion, and the substrate includes a drive conductive portion including a drive contact front surface that is opposed and bonded to the first drive electrode.

Clause C2

The semiconductor light emitting device according to clause C1, in which the semiconductor light emitting element and the electronic component are arranged in a predetermined direction,
the common conductive portion includes a common contact front surface extending in an arrangement direction of the semiconductor light emitting element and the electronic component, in a planar direction of the substrate, when the arrangement direction of the semiconductor light emitting element and the electronic component is referred to as a first direction, and a direction orthogonal to the first direction is referred to as a second direction, the common contact front surface includes a first common contact front surface portion and a second common contact front surface portion that are arranged in the first direction, the drive contact front surface is located adjacent to the first contact front surface, and the semiconductor light emitting element and the electronic component are disposed on the first common contact front surface.

Clause D1. A semiconductor light emitting device, comprising:
 a substrate;
 a common conductive portion formed on the substrate;
 a semiconductor light emitting element mounted on the common conductive portion; and
 an electronic component mounted on the common conductive portion and electrically connected to the semiconductor light emitting element by the common conductive portion.

Clause D2. The semiconductor light emitting device according to clause D1, wherein the electronic component is configured to drive the semiconductor light emitting element.

Clause D3. The semiconductor light emitting device according to clause D2, wherein
 the semiconductor light emitting element has a lower surface on which an element lower surface electrode is formed,
 the electronic component has an upper surface on which a first drive electrode and a control electrode are formed and a lower surface on which a second drive electrode is formed, and
 the element lower surface electrode and the second drive electrode are bonded to the common conductive portion.

Clause D4. The semiconductor light emitting device according to clause D3, wherein
 the semiconductor light emitting element and the electronic component are arranged in a predetermined direction,
 the common conductive portion includes a common contact front surface extending in an arrangement direction of the semiconductor light emitting element and the electronic component, and
 the semiconductor light emitting element and the electronic component are disposed on the common contact front surface.

Clause D5. The semiconductor light emitting device according to clause D4, wherein
 the substrate includes a drive conductive portion and a control conductive portion,
 the drive conductive portion includes a drive contact front surface electrically connected to the first drive electrode by a wire,
 the control conductive portion includes a control contact front surface electrically connected to the control electrode by a wire, and
 in a planar direction of the substrate, when the arrangement direction is referred to as a first direction, and a direction orthogonal to the first direction is referred to as a second direction, the drive conductive portion and the control conductive portion are separately disposed at opposite sides of the common contact front surface in the second direction.

Clause D6. The semiconductor light emitting device according to clause D5, wherein the drive contact front surface and the control contact front surface are separately disposed at opposite sides of the electronic component in the second direction.

Clause D7. The semiconductor light emitting device according to clause D5 or D6, wherein the common contact front surface is larger than the drive contact front surface and the control contact front surface.

Clause D8. The semiconductor light emitting device according to clause D6 or D7, wherein
 the semiconductor light emitting element includes an upper surface on which an element upper surface electrode is formed,
 an element conductive portion is formed at one side of the common contact front surface in the second direction,
 the element conductive portion includes an element contact front surface electrically connected to the element upper surface electrode,
 a connection conductive portion is formed at the other side of the common contact front surface in the second direction and is electrically connected to the common conductive portion, and
 the connection conductive portion includes a connection contact front surface projecting in the second direction from one of opposite ends of the common contact front surface in the second direction that is located at a side opposite from the element conductive portion.

Clause D9. The semiconductor light emitting device according to clause D8, wherein the element conductive portion and the drive conductive portion are disposed at the same side of the common contact front surface in the second direction.

Clause D10. The semiconductor light emitting device according to clause D9, further comprising a capacitor disposed so as to span between the element contact front surface and the drive contact front surface.

Clause D11. The semiconductor light emitting device according to any one of clauses D8 to D10, wherein
 the connection conductive portion includes a connection contact back surface disposed on a back surface of the substrate at a position opposite from the connection contact front surface,
 the element conductive portion includes an element contact back surface disposed on the back surface of the substrate at a position opposite from the element contact front surface,
 the drive conductive portion includes a drive contact back surface disposed on the back surface of the substrate at a position opposite from the drive contact front surface, and
 the control conductive portion includes a control contact back surface disposed on the back surface of the substrate at a position opposite from the control contact front surface.

Clause D12. The semiconductor light emitting device according to clause D11, wherein the element contact back surface is larger than the drive contact back surface and the control contact back surface.

Clause D13. The semiconductor light emitting device according to clause D11 or D12, wherein the common conductive portion includes a common contact back surface disposed on the back surface of the substrate at a position opposite from the common contact front surface.

Clause D14. The semiconductor light emitting device according to clause D13, wherein the common contact back surface is separate from the connection contact back surface.

Clause D15. The semiconductor light emitting device according to clause D13 or D14, wherein the common contact back surface is larger than the connection contact back surface, the element contact back surface, the drive contact back surface, and the control contact back surface.

Clause D16. The semiconductor light emitting device according to any one of clauses D11 to D15, wherein
- the substrate is formed from an insulative material,
- each of the common contact front surface, the connection contact front surface, the element contact front surface, the drive contact front surface, and the control contact front surface is a surface of a conductive layer formed on a front surface of the substrate, and
- each of the connection contact back surface, the element contact back surface, the drive contact back surface, and the control contact back surface is a surface of a conductive layer formed on a back surface of the substrate.

Clause D17. The semiconductor light emitting device according to any one of clauses D11 to D15, wherein
- the substrate is formed of a conductive material,
- the common conductive portion, the connection conductive portion, the element conductive portion, the drive conductive portion, and the control conductive portion are portions of the substrate that are insulated and separated from each other by an insulation portion,
- the common contact front surface, the connection contact front surface, the element contact front surface, the drive contact front surface, and the control contact front surface are formed of a front surface of the substrate, and
- the connection contact back surface, the element contact back surface, the drive contact back surface, and the control contact back surface are formed of a back surface of the substrate.

Clause D18. The semiconductor light emitting device according to clause D17, wherein
- at least one of the common conductive portion, the connection conductive portion, the element conductive portion, the drive conductive portion, and the control conductive portion has a peripheral edge including a recess recessed in a direction orthogonal to the planar direction of the substrate, and
- the insulation portion is disposed in the recess.

Clause D19. The semiconductor light emitting device according to clause D18, wherein at least one of the common contact front surface, the connection contact front surface, the element contact front surface, the drive contact front surface, and the control contact front surface has a peripheral edge including the recess.

Clause D20. The semiconductor light emitting device according to any one of clauses D17 to D19, wherein
- at least one of the common conductive portion, the connection conductive portion, the element conductive portion, the drive conductive portion, and the control conductive portion has a peripheral edge including a flange,
- the substrate includes a substrate back surface located opposite from a surface on which the semiconductor light emitting element is mounted, and
- the insulation portion is disposed between the flange and the substrate back surface in a direction orthogonal to the planar direction of the substrate.

Clause D21. The semiconductor light emitting device according to any one of clauses D5 to D7, wherein
- the common contact front surface includes a first common contact front surface portion on which the semiconductor light emitting element is mounted and a second common contact front surface portion on which the electronic component is mounted,
- the second common contact front surface portion is disposed between the drive conductive portion and the control conductive portion in the second direction and extends more than the first common contact front surface portion toward one side in the second direction,
- the first common contact front surface portion extends from the second common contact front surface portion in the first direction, and
- the semiconductor light emitting element is disposed on the first common contact front surface portion toward the second common contact front surface portion.

Clause D22. The semiconductor light emitting device according to clause D21, wherein
- the semiconductor light emitting element has an upper surface on which an element upper surface electrode is formed,
- an element conductive portion is formed at one side of the common contact front surface in the second direction,
- the element conductive portion includes an element contact front surface electrically connected to the element upper surface electrode,
- the element conductive portion is disposed at one side of the first common contact front surface in the second direction,
- at least a portion of the semiconductor light emitting element is disposed on the first common contact front surface portion at a position closer to the electronic component than the element contact front surface,
- the element upper surface electrode and the element contact front surface are connected by a wire, and
- in plan view, the wire diagonally extends from the element upper surface electrode toward the element contact front surface so as to extend away from the electronic component.

Clause D23. The semiconductor light emitting device according to clause D22, wherein the semiconductor light emitting element and the electronic component are arranged in the first direction so that the electronic component is displaced from the semiconductor light emitting element toward one side in the second direction.

Clause D24. The semiconductor light emitting device according to clause D22 or D23, further comprising a capacitor disposed so as to span between the element contact front surface and the drive contact front surface, wherein
- the drive contact front surface includes a first drive contact front surface portion on which the capacitor is disposed and a second drive contact front surface portion electrically connected to the first drive electrode by a wire,
- the first drive contact front surface portion is located closer to the element contact front surface than the second drive contact front surface portion,
- the first drive contact front surface portion extends in the second direction, and
- the second drive contact front surface portion extends in the first direction.

Clause D25. The semiconductor light emitting device according to clause D24, wherein
- the second drive contact front surface portion is recessed relative to the first drive contact front surface portion so as to have a smaller dimension than the first drive contact front surface portion in the second direction, the first common contact front surface portion is opposed to the first drive contact front surface portion in the second direction, the second common contact front surface portion is disposed in a recess region defined by the first drive contact front surface portion and the second drive contact front surface portion, and the second common contact front surface portion is opposed to the second drive contact front surface portion in the second direction.

Clause D26. The semiconductor light emitting device according to clause D24 or D25, wherein the wire connecting the first drive electrode and the second drive contact front surface portion includes multiple wires, and the wires are arranged in the first direction as viewed in a direction orthogonal to the planar direction of the substrate.

Clause D27. The semiconductor light emitting device according to clause D26, wherein among the wires, the farthest two wires are connected to the first drive electrode and the second drive contact front surface portion so that the two wires are separated from each other more at the second drive contact front surface portion than at the first drive electrode as viewed in the direction orthogonal to the planar direction of the substrate.

Clause D28 The semiconductor light emitting device according to any one of clauses D24 to D27, wherein the semiconductor light emitting element and the electronic component are arranged in the first direction so that the electronic component is displaced from the semiconductor light emitting element toward one side in the second direction, and the capacitor is disposed at one side of the semiconductor light emitting element in the second direction.

Clause D29. The semiconductor light emitting device according to clause D28, wherein the capacitor is disposed at one side of the electronic component in the first direction without overlapping the electronic component as viewed in the second direction.

Clause D30. The semiconductor light emitting device according to any one of clauses D22 to D29, wherein the first common contact front surface portion extends more than the second common contact front surface portion toward a side opposite from the one side in the second direction, and the control contact front surface is formed in a region surrounded by the first common contact front surface portion and the second common contact front surface portion.

Clause D31. The semiconductor light emitting device according to any one of clauses D22 to D30, wherein the common conductive portion includes a common contact back surface disposed on a back surface of the substrate at a position opposite from the common contact front surface, the element conductive portion includes an element contact back surface disposed on the back surface of the substrate at a position opposite from the element contact front surface, the drive conductive portion includes a drive contact back surface disposed on the back surface of the substrate at a position opposite from the drive contact front surface, and the control conductive portion includes a control contact back surface disposed on the back surface of the substrate at a position opposite from the control contact front surface.

Clause D32. The semiconductor light emitting device according to clause D31, wherein the element contact back surface is equal to the drive contact back surface and the control contact back surface.

Clause D33. The semiconductor light emitting device according to clause D31 or D32, wherein the common contact back surface includes a first common contact back surface portion and a second common contact back surface portion, the first common contact back surface portion is disposed on the back surface of the substrate at a position opposite from the first common contact front surface portion, the second common contact back surface portion is disposed on the back surface of the substrate at a position opposite from the second common contact front surface portion, and the first common contact back surface portion is separate from the second common contact back surface portion.

Clause D34. The semiconductor light emitting device according to any one of clauses D31 to D33, wherein the common contact back surface includes a first common contact back surface portion and a second common contact back surface portion, the first common contact back surface portion is disposed on the back surface of the substrate at a position opposite from the first common contact front surface portion, the second common contact back surface portion is disposed on the back surface of the substrate at a position opposite from the second common contact front surface portion, and the first common contact back surface portion is larger than the element contact back surface, the drive contact back surface, and the control contact back surface.

Clause D35. The semiconductor light emitting device according to any one of clauses D31 to D34, further comprising a capacitor disposed so as to span between the element contact front surface and the drive contact front surface, wherein the drive contact front surface includes a first drive contact front surface portion on which the capacitor is disposed and a second drive contact front surface portion electrically connected to the first drive electrode by a wire, the drive contact back surface includes a first drive contact back surface portion and a second drive contact back surface portion, the first drive contact back surface portion is disposed on the back surface of the substrate at a position opposite from the first drive contact front surface portion, the second drive contact back surface portion is disposed on the back surface of the substrate at a position opposite from the second drive contact front surface portion, and the first drive contact back surface portion is separate from the second drive contact back surface portion.

Clause D36. The semiconductor light emitting device according to clause D35, wherein the common contact back surface includes a first common contact back surface portion and a second common contact back surface portion, the first common contact back surface portion is disposed on the back surface of the substrate at a position opposite from the first common contact front surface portion, the second common contact back surface portion is disposed on the back surface of the substrate at a position opposite from the second common contact front surface portion, and in the planar direction of the substrate, when an arrangement direction of the element conductive portion and the drive conductive portion is referred to as a third direction and a direction orthogonal to the third direction is referred to as a fourth direction, the second drive contact back surface portion and the control contact back surface are separately disposed at opposite sides of the second common contact back surface portion in the fourth direction.

Clause D37. The semiconductor light emitting device according to any one of clauses D31, 32, and 34, wherein the substrate is formed from a conductive material, the common conductive portion, the element conductive portion, the drive conductive portion, and the control conductive portion are portions of the substrate that are insulated and separated from each other by an insulation portion, the common contact front surface, the element contact front surface, the drive contact front surface, and the control contact front surface are formed of a front surface of the substrate, and the element contact back surface, the drive contact back surface, and the control contact back surface are formed of a back surface of the substrate.

Clause D38. The semiconductor light emitting device according to clause D37, wherein at least one of the common conductive portion, the element conductive portion, the drive conductive portion, and the control conductive portion includes a peripheral edge including a recess recessed in a direction orthogonal to the planar direction of the substrate, and the insulation portion is accommodated in the recess.

Clause D39. The semiconductor light emitting device according to clause D38, wherein at least one of the common contact front surface, the element contact front surface, the drive contact front surface, and the control contact front surface includes a peripheral edge including the recess.

Clause D40. The semiconductor light emitting device according to clause D39, further comprising a capacitor disposed so as to span between the element contact front surface and the drive contact front surface, wherein the drive contact front surface includes a first drive contact front surface portion on which the capacitor is disposed and a second drive contact front surface portion electrically connected to the first drive electrode by the wire, and the recess is disposed in the drive contact front surface between the first drive contact front surface portion and the second drive contact front surface portion.

Clause D41. The semiconductor light emitting device according to any one of clauses D37 to D40, wherein at least one of the common conductive portion, the element conductive portion, the drive conductive portion, and the control conductive portion includes a peripheral edge including a flange, the substrate includes a substrate back surface located opposite from a surface on which the semiconductor light emitting element is mounted, and the insulation portion is accommodated between the flange and the substrate back surface in a direction orthogonal to the planar direction of the substrate.

Clause D42. The semiconductor light emitting device according to any one of clauses D1 to D41, wherein the electronic component is covered by a light-blocking resin material.

Clause D43. The semiconductor light emitting device according to any one of clauses D1 to D42, wherein the electronic component is bonded to the common conductive portion by a conductive bonding material, and at least a portion of the conductive bonding material exposed from the electronic component is covered by an anti-sulfidation coating agent.

Clause D44. The semiconductor light emitting device according to any one of clauses D1 to D43, further comprising a case accommodating the semiconductor light emitting element and the electronic component.

Clause D45. The semiconductor light emitting device according to clause D44, wherein the semiconductor light emitting element and the electronic component are arranged in a predetermined direction, the case includes opposite side walls in an arrangement direction of the semiconductor light emitting element and the electronic component, defining a first side wall and a second side wall, the semiconductor light emitting element is located closer to the first side wall than the electronic component, and the electronic component is located closer to the second side wall than the semiconductor light emitting element.

Clause D46. The semiconductor light emitting device according to clause D44 or D45, wherein the case includes a frame and a cover, the frame is formed from a light-blocking material and has an upward opening, and the cover closes the opening of the frame.

Clause D47. The semiconductor light emitting device according to clause D46, wherein the cover is transmissive to light from the semiconductor light emitting element.

Clause D48. The semiconductor light emitting device according to clause D47, wherein the cover includes a transmissive portion and a light-blocking portion, the transmissive portion is disposed above the semiconductor light emitting element and transmissive to light from the semiconductor light emitting element, and the light-blocking portion is disposed above the electronic component and blocks light.

Clause D49. The semiconductor light emitting device according to clause D48, wherein the cover diffuses light from the semiconductor light emitting element.

Clause D50. The semiconductor light emitting device according to clause D44, wherein the case is box-shaped and includes a cover and a side wall, the cover is formed from a light-blocking material and opposed to the substrate in a direction orthogonal to the planar direction of the substrate, the side wall is formed from a light-blocking material and extends downward from an edge of the cover, the cover includes an opening in a position opposed to the semiconductor light emitting element, the opening extends through the cover in the direction orthogonal to the planar direction, a light diffusion plate is attached to the cover at a side opposite from the semiconductor light emitting element in the direction orthogonal to the planar direction to cover the opening, and the light diffusion plate transmits and diffuses light from the semiconductor light emitting element.

Clause D51. The semiconductor light emitting device according to clause D50, wherein the light diffusion plate includes a recess recessed from the opening in the direction orthogonal to the planar direction in a direction away from the semiconductor light emitting element.

Clause D52. The semiconductor light emitting device according to any one of clauses D1 to D51, further comprising a light-blocking partition wall that separates the semiconductor light emitting element and the electronic component.

Clause D53. The semiconductor light emitting device according to any one of clauses D44 to D50, further comprising a light-blocking partition wall that separates the semiconductor light emitting element and the electronic component, wherein the partition wall is arranged on the case.

Clause D54. The semiconductor light emitting device according to clause D53, wherein the case is box-shaped and includes a cover and a side wall, the cover is opposed to the substrate in a direction orthogonal to the planar direction of the substrate, the side wall extends downward from an edge of the cover, and the partition wall is disposed so that the cover extends downward.

Clause D55. The semiconductor light emitting device according to any one of clauses D44 to D51, D53, and D54, wherein the semiconductor light emitting element is accommodated in an accommodation space defined by the substrate and the case, and a vent is provided between the substrate and the case to connect the accommodation space to the outside.

Clause D56. The semiconductor light emitting device according to clause D55, wherein the side wall of the case includes an end surface opposed to the substrate in the direction orthogonal to the planar direction of the substrate, the end surface includes a side wall recess recessed from the end surface in a direction away from the substrate and formed from an inner surface to an outer surface of the side wall of the case, and the vent is defined by the substrate and the side wall recess.

Clause D57. The semiconductor light emitting device according to clause D55, wherein the substrate includes a substrate front surface opposed to the side wall of the case in the direction orthogonal to the planar direction of the substrate, the substrate front surface includes a substrate recess recessed from the substrate front surface in a direction away from the case and formed from an inner surface to an outer surface of the side wall of the case, and the vent is defined by the side wall of the case and the substrate recess.

Clause D58. The semiconductor light emitting device according to clause D55, wherein the side wall of the case includes an end surface opposed to the substrate in the direction orthogonal to the planar direction of the substrate, the end surface includes a side wall recess recessed from the end surface in a direction away from the substrate and formed from an inner surface to an outer surface of the side wall, the substrate includes a substrate front surface opposed to the side wall of the case in a direction orthogonal to the planar direction of the substrate.

the substrate front surface includes a substrate recess recessed from the substrate front surface in a direction away from the case and formed from the inner surface to the outer surface of the side wall of the case, and the vent is defined by the side wall recess and the substrate recess.

Clause D59. The semiconductor light emitting device according to any one of clauses D55 to D58, wherein the vent has a labyrinth structure.

Clause D60. The semiconductor light emitting device according to clause D59, wherein as the labyrinth structure, the vent includes a first vent extending from an inner surface toward an outer surface of the side wall of the case, a second vent connected to the first vent and extending in a direction that intersects an extension direction of the first vent, and a third vent connected to the second vent and extending from the inner surface toward the outer surface.

Clause D61. The semiconductor light emitting device according to any one of clauses D55 to D58, wherein as viewed in the direction orthogonal to the planar direction of the substrate, the vent extends in a direction inclined from a direction orthogonal to an extension direction of the side wall of the case.

Clause D62. The semiconductor light emitting device according to any one of clauses D55 to D58, wherein, as viewed in the direction orthogonal to the planar direction of the substrate, the vent extends in a direction orthogonal to an extension direction of the side wall of the case.

Clause D63. The semiconductor light emitting device according to any one of clauses D55 to D58, wherein the vent includes an inner opening region that is open in an inner surface of the side wall of the case and an outer opening region that is open in an outer surface of the side wall of the case, and the inner opening region is smaller than the outer opening region.

Clause D64. The semiconductor light emitting device according to any one of clauses D55 to D58, wherein the vent includes an inner opening region that is open in an inner surface of the side wall of the case and an outer opening region that is open in an outer surface of the side wall of the case, and the inner opening region is larger than the outer opening region.

Clause D65. The semiconductor light emitting device according to any one of clauses D55 to D58, wherein the vent includes an inner opening region that is open in an inner surface of the side wall of the case and an outer opening region that is open in an outer surface of the side wall of the case, and the inner opening region is equal to the outer opening region.

Clause D66. The semiconductor light emitting device according to clause D46, wherein the semiconductor light emitting element is accommodated in an accommodation space defined by the substrate and the case, and a vent is provided between the substrate and a side wall of the frame to connect the accommodation space to the outside.

Clause D67. The semiconductor light emitting device according to clause D66, wherein
the side wall of the frame includes an end surface opposed to the substrate in the direction orthogonal to the planar direction of the substrate,
the end surface includes a side wall recess recessed from the end surface in a direction away from the substrate and formed from an inner surface to an outer surface of the side wall, and
the vent is defined by the substrate and the side wall recess.

Clause D68. The semiconductor light emitting device according to any one of clauses D44 to D51 and D53 to D67, wherein
the substrate includes a drive conductive portion, a control conductive portion, and an element conductive portion,
the drive conductive portion includes a drive contact front surface electrically connected to a first drive electrode of the electronic component by a wire,
the control conductive portion includes a control contact front surface electrically connected to a control electrode of the electronic component by a wire,
the element conductive portion includes an element contact front surface electrically connected to an element upper surface electrode of the electronic component by a wire,
the substrate includes a substrate front surface opposed to a side wall of the case in a direction orthogonal to the planar direction of the substrate,
the side wall of the case is disposed inward from a peripheral edge of the substrate front surface, and
at least one of the common conductive portion, the element conductive portion, the drive conductive portion, and the control conductive portion includes a projection extending outward from the side wall of the case.

Clause D69. The semiconductor light emitting device according to any one of clauses D1 to D68, wherein an upper surface of the electronic component is located at a lower position than an upper surface of the semiconductor light emitting element.

Clause D70. The semiconductor light emitting device according to any one of clauses D1 to D43, further comprising a light-transmissive encapsulation resin encapsulating the semiconductor light emitting element and the electronic component,
wherein a light-blocking partition wall is disposed in the encapsulation resin between the semiconductor light emitting element and the electronic component.

Clause D71. The semiconductor light emitting device according to any one of clauses D1 to D43, wherein
the semiconductor light emitting element and the electronic component are accommodated in a frame having an upward opening,
the frame is attached to the substrate,
the frame includes a partition wall that separates the semiconductor light emitting element from the electronic component, and
the frame includes a first receptacle accommodating the semiconductor light emitting element and a second receptacle accommodating the electronic component that are separated by the partition wall.

Clause D72. The semiconductor light emitting device according to clause D71, further comprising a light-transmissive light diffusion plate covering the first receptacle from above.

Clause D73. The semiconductor light emitting device according to clause D71 or D72, wherein
the semiconductor light emitting element is encapsulated by a light-transmissive first encapsulation resin in the first receptacle, and
the electronic component is encapsulated by a second encapsulation resin in the second receptacle.

Clause D74. The semiconductor light emitting device according to clause D73, wherein the first encapsulation resin and the second encapsulation resin are formed from different materials.

Clause D75. The semiconductor light emitting device according to clause D74, wherein the second encapsulation resin is formed from a light-blocking material.

Clause D76. The semiconductor light emitting device according to any one of clauses D1 to D75, wherein the semiconductor light emitting element includes a semiconductor laser element.

Clause D77. The semiconductor light emitting device according to clause D76, wherein the semiconductor light emitting element includes a vertical cavity surface emitting laser (VCSEL) element.

DESCRIPTION OF THE REFERENCE NUMERALS 1, 1B) semiconductor light emitting device
2, 2B) electronic apparatus
10, 10B) substrate
11) substrate front surface
12) substrate back surface
13) insulation portion
13L) back-half insulation portion
13U) front-half insulation portion
20, 20B, 20C) case
21) frame
21a) first side wall
21b) second side wall
21c) third side wall
21d) fourth side wall
22) cover
22a) opening
23) accommodation space
23A) first accommodation space
23B) second accommodation space
24) partition wall
25) light-blocking wall
30, 30B) common conductive portion
30a) common contact front surface
30b) common contact back surface
30c) first common contact front surface portion
30d) second common contact front surface portion
30e) first common contact back surface portion
30f) second common contact back surface portion
31) common front surface conductive layer
32) common back surface conductive layer
33) common conductive portion
34a to 34g) projection
35a to 35e) recess
36) flange
40) connection conductive portion
40a) connection contact front surface
40b) connection contact back surface
41) contact front surface conductive layer
42) contact back surface conductive layer
43) connection joint
44a to 44c) projection 50, 50B) element conductive portion
50a) element contact front surface
50b) element contact back surface
51) element front surface conductive layer
52) element back surface conductive layer
53) element joint
54a to 54f) projection
55) recess
56) flange
60, 60B) drive conductive portion
60a) drive contact front surface
60b) drive contact back surface
60c) first drive contact front surface portion
60d) second drive contact front surface portion
60e) first drive contact back surface portion
60f) second drive contact back surface portion
60r) recess region
61) drive front surface conductive layer
62) drive back surface conductive layer
63) drive joint
64a to 64f) projection
65) recess
66) flange
70, 70B) control conductive portion
70a) control contact front surface
70b) control contact back surface
71) control front surface conductive layer
72) control back surface conductive layer
73) control joint
74a, 74b) projection
76) flange
80) semiconductor light emitting element
80a) element upper surface
80b) element lower surface
91) element upper surface electrode
92) element lower surface electrode
100) electronic component
100a) upper surface
100b) lower surface
101) first drive electrode
102) control electrode
103) second drive electrode
120) capacitor
130) light diffusion plate
131) recess
140) encapsulation resin
141) coating agent
160) vent
160A) side wall recess
160B) substrate recess
166) first vent
167) second vent
168) third vent
170) encapsulation resin
180) frame
181) first receptacle
182) second receptacle
183) partition wall
190A) first encapsulation resin
190B) second encapsulation resin
201) transmissive portion
202) light-blocking portion
P2) conductive bonding material
S1) first opening region (inner opening region)
S2) second opening region (outer opening region)
W1 to W3) wire

The invention claimed is:

1. A semiconductor light emitting device, comprising:
a substrate;
a common conductive portion formed on the substrate;
a semiconductor light emitting element mounted on the common conductive portion; and
an electronic component mounted on the common conductive portion and electrically connected to the semiconductor light emitting element by the common conductive portion, wherein
the electronic component is configured to drive the semiconductor light emitting element,
the semiconductor light emitting element has a lower surface on which an element lower surface electrode is formed,
the electronic component has an upper surface on which a first drive electrode and a control electrode are formed and a lower surface on which a second drive electrode is formed,
the element lower surface electrode and the second drive electrode are bonded to the common conductive portion,
the semiconductor light emitting element and the electronic component are arranged in a predetermined direction,
the common conductive portion includes a common contact front surface extending in thelain 1 has arrangement direction of the semiconductor light emitting element and the electronic component,
the semiconductor light emitting element and the electronic component are disposed on the common contact front surface,
the substrate includes a drive conductive portion and a control conductive portion,
the drive conductive portion includes a drive contact front surface electrically connected to the first drive electrode by a wire,
the control conductive portion includes a control contact front surface electrically connected to the control electrode by a wire, and
in a planar direction of the substrate, when the arrangement direction is referred to as a first direction, and a direction orthogonal to the first direction is referred to as a second direction, the drive conductive portion and the control conductive portion are separately disposed at opposite sides of the common contact front surface in the second direction.

2. The semiconductor light emitting device according to claim 1, wherein the drive contact front surface and the control contact front surface are separately disposed at opposite sides of the electronic component in the second direction.

3. The semiconductor light emitting device according to claim 1, wherein the common contact front surface is larger than the drive contact front surface and the control contact front surface.

4. The semiconductor light emitting device according to claim 2, wherein
the semiconductor light emitting element includes an upper surface on which an element upper surface electrode is formed,
an element conductive portion is formed at one side of the common contact front surface in the second direction, the element conductive portion includes an element contact front surface electrically connected to the element upper surface electrode, a connection conductive portion is formed at the other side of the common contact front surface in the second direction and is electrically connected to the common conductive portion, and the connection conductive portion includes a connection contact front surface projecting in the second direction from one of opposite ends of the common contact front surface in the second direction that is located at a side opposite from the element conductive portion.

5. The semiconductor light emitting device according to claim 4, wherein the element conductive portion and the drive conductive portion are disposed at the same side of the common contact front surface in the second direction.

6. The semiconductor light emitting device according to claim 5, further comprising a capacitor disposed so as to span between the element contact front surface and the drive contact front surface.

7. The semiconductor light emitting device according to claim 4,
wherein the connection conductive portion includes a connection contact back surface disposed on a back surface of the substrate at a position opposite from the connection contact front surface,
the element conductive portion includes an element contact back surface disposed on the back surface of the substrate at a position opposite from the element contact front surface,
the drive conductive portion includes a drive contact back surface disposed on the back surface of the substrate at a position opposite from the drive contact front surface, and
the control conductive portion includes a control contact back surface disposed on the back surface of the substrate at a position opposite from the control contact front surface.

8. The semiconductor light emitting device according to claim 7, wherein the element contact back surface is larger than the drive contact back surface and the control contact back surface.

9. The semiconductor light emitting device according to claim 7, wherein the common conductive portion includes a common contact back surface disposed on the back surface of the substrate at a position opposite from the common contact front surface.

10. The semiconductor light emitting device according to claim 9, wherein the common contact back surface is separate from the connection contact back surface.

11. The semiconductor light emitting device according to claim 9, wherein the common contact back surface is larger than the connection contact back surface, the element contact back surface, the drive contact back surface, and the control contact back surface.

12. The semiconductor light emitting device according to claim 7, wherein
the substrate is formed from an insulative material,
each of the common contact front surface, the connection contact front surface, the element contact front surface, the drive contact front surface, and the control contact front surface is a surface of a conductive layer formed on a front surface of the substrate, and
each of the connection contact back surface, the element contact back surface, the drive contact back surface, and the control contact back surface is a surface of a conductive layer formed on a back surface of the substrate.

13. The semiconductor light emitting device according to claim 7, wherein
the substrate is formed of a conductive material,
the common conductive portion, the connection conductive portion, the element conductive portion, the drive conductive portion, and the control conductive portion are portions of the substrate that are insulated and separated from each other by an insulation portion,
the common contact front surface, the connection contact front surface, the element contact front surface, the drive contact front surface, and the control contact front surface are formed of a front surface of the substrate, and
the connection contact back surface, the element contact back surface, the drive contact back surface, and the control contact back surface are formed of a back surface of the substrate.

14. The semiconductor light emitting device according to claim 13, wherein
at least one of the common conductive portion, the connection conductive portion, the element conductive portion, the drive conductive portion, and the control conductive portion has a peripheral edge including a recess recessed in a direction orthogonal to the planar direction of the substrate, and
the insulation portion is disposed in the recess.

15. The semiconductor light emitting device according to claim 14, wherein at least one of the common contact front surface, the connection contact front surface, the element contact front surface, the drive contact front surface, and the control contact front surface has a peripheral edge including the recess.

16. The semiconductor light emitting device according to claim 13, wherein
at least one of the common conductive portion, the connection conductive portion, the element conductive portion, the drive conductive portion, and the control conductive portion has a peripheral edge including a flange,
the substrate includes a substrate back surface located opposite from a surface on which the semiconductor light emitting element is mounted, and
the insulation portion is disposed between the flange and the substrate back surface in a direction orthogonal to the planar direction of the substrate.

\* \* \* \* \*